US012796217B2

(12) United States Patent
Sasagawa et al.

(10) Patent No.: US 12,796,217 B2
(45) Date of Patent: Nov. 10, 2026

(54) MANUFACTURING METHOD OF DISPLAY DEVICE, DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Shinya Sasagawa, Chigasaki (JP); Ryota Hodo, Atsugi (JP); Kentaro Sugaya, Isehara (JP); Yoshikazu Hiura, Atsugi (JP); Takahiro Fujie, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 376 days.

(21) Appl. No.: 18/292,169

(22) PCT Filed: Aug. 8, 2022

(86) PCT No.: PCT/IB2022/057355

§ 371 (c)(1),
(2) Date: Jan. 25, 2024

(87) PCT Pub. No.: WO2023/021365

PCT Pub. Date: Feb. 23, 2023

(65) Prior Publication Data

US 2025/0098409 A1 Mar. 20, 2025

(30) Foreign Application Priority Data

Aug. 19, 2021 (JP) ................................ 2021-134205
Sep. 15, 2021 (JP) ................................ 2021-150202
Sep. 17, 2021 (JP) ................................ 2021-151802

(51) Int. Cl.
*H10K 59/12* (2023.01)
*H10K 59/80* (2023.01)

(52) U.S. Cl.
CPC ....... *H10K 59/1201* (2023.02); *H10K 59/879* (2023.02)

(58) Field of Classification Search
CPC ......................... H10K 59/1201; H10K 59/879
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001653855 A 8/2005
CN 101043047 A 9/2007
(Continued)

OTHER PUBLICATIONS

Miyoshi.K et al., "Development of Low Temperature Curable Positive-Tone Polyimide Materials for Organic Electro Luminescence Displays", Kobunshi Ronbunshu, Apr. 1, 2011, vol. 68, No. 4, pp. 160-170.

(Continued)

*Primary Examiner* — Peniel M Gumedzoe
(74) *Attorney, Agent, or Firm* — NIXON PEABODY LLP; Jeffrey L. Costellia

(57) ABSTRACT

A display device with high display quality is provided. A first film is formed over a first pixel electrode; a first mask film is formed over the first film and a first conductive layer; the first film and the first mask film are processed to form a first layer and a first mask layer over the first pixel electrode and a second mask layer over the first conductive layer; a first insulating film is formed over the first mask layer and (Continued)

the second mask layer; a second insulating film is formed over the first insulating film with use of a photosensitive resin composite; a portion of the second insulating film that overlaps with the second mask layer is removed and a portion of the second insulating film that overlaps with the first mask layer is further removed; after performing heat treatment, part of the first mask layer is removed to expose a top surface of the first layer; and a common electrode is formed to cover the first layer, the first conductive layer, and the second insulating layer.

13 Claims, 46 Drawing Sheets

(56) References Cited

U.S. PATENT DOCUMENTS

| | | | | |
|---|---|---|---|---|
| 7,534,557 | B2 | 5/2009 | Tachikawa et al. | |
| 7,824,952 | B2 | 11/2010 | Choi et al. | |
| 7,914,976 | B2 | 3/2011 | Tachikawa et al. | |
| 8,716,040 | B2 | 5/2014 | Shin et al. | |
| 8,865,485 | B2 | 10/2014 | Shin et al. | |
| 10,170,040 | B2 | 1/2019 | Ogawa et al. | |
| 10,304,386 | B2 | 5/2019 | Ogawa et al. | |
| 11,678,550 | B2 | 6/2023 | Kato | |
| 11,895,866 | B2 | 2/2024 | Itonaga | |
| 2002/0072139 | A1 | 6/2002 | Kashiwabara | |
| 2005/0153058 | A1 | 7/2005 | Tachikawa et al. | |
| 2011/0148290 | A1 | 6/2011 | Oota | |
| 2012/0199859 | A1 | 8/2012 | Shikina et al. | |
| 2012/0205698 | A1* | 8/2012 | Yamazaki .......... | H10K 59/1201 257/E51.019 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0248867 | A1* | 9/2013 | Kim ..................... | H10K 59/122 438/34 |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0090068 | A1 | 3/2018 | Ogawa et al. | |
| 2018/0190908 | A1 | 7/2018 | Ke et al. | |
| 2020/0203662 | A1 | 6/2020 | Mollard et al. | |
| 2021/0265432 | A1 | 8/2021 | Kato | |
| 2022/0006057 | A1 | 1/2022 | Itonaga | |
| 2022/0278177 | A1 | 9/2022 | Kubota et al. | |
| 2022/0407037 | A1 | 12/2022 | Itonaga et al. | |
| 2023/0301151 | A1 | 9/2023 | Kato | |
| 2024/0099038 | A1 | 3/2024 | Kubota et al. | |

FOREIGN PATENT DOCUMENTS

| | | | |
|---|---|---|---|
| CN | 102629622 | A | 8/2012 |
| CN | 112314056 | A | 2/2021 |
| CN | 113168079 | A | 7/2021 |
| EP | 1837913 | A | 9/2007 |
| EP | 3889682 | A | 10/2021 |
| JP | 2000-036385 | A | 2/2000 |
| JP | 2003-059663 | A | 2/2003 |
| JP | 2003-332051 | A | 11/2003 |
| JP | 2008-098106 | A | 4/2008 |
| JP | 2008-108482 | A | 5/2008 |
| JP | 2008-147072 | A | 6/2008 |
| JP | 2008-251270 | A | 10/2008 |
| JP | 2012-178332 | A | 9/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-054728 | A | 4/2018 |
| JP | 2019-179696 | A | 10/2019 |
| JP | 2020-160305 | A | 10/2020 |
| KR | 10-0931279 | | 12/2009 |
| TW | 201517262 | | 5/2015 |
| WO | WO-2003/096754 | | 11/2003 |
| WO | WO-2018/087625 | | 5/2018 |
| WO | WO-2020/004086 | | 1/2020 |
| WO | WO-2020/110665 | | 6/2020 |
| WO | WO-2021/074738 | | 4/2021 |
| WO | WO-2021/100406 | | 5/2021 |
| WO | WO-2023/021365 | | 2/2023 |

OTHER PUBLICATIONS

International Search Report (Application No. PCT/IB2022/057355) Dated Oct. 25, 2022.

Written Opinion (Application No. PCT/IB2022/057355) Dated Oct. 25, 2022.

Zakhidov.A et al., “Orthogonal processing: A new strategy for organic electronics”, Chem. Sci. (Chemical Science), Apr. 7, 2011, vol. 2, No. 6, pp. 1178-1182.

Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.

Malinowski.P et al., “Photolithographic patterning of organic photodetectors with a non-fluorinated photoresist system”, Organic Electronics, Jul. 12, 2014, vol. 15, No. 10, pp. 2355-2359.

Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.

Papadopoulos.N et al., “AMOLED Displays with In-Pixel Photodetector”, Liquid Crystals and Display Technology, Jul. 9, 2020, pp. 1-19.

Ke. T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.

Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.

Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.

Ke.T et al., “Island and Hole Fabrication on OLED Stack for High-Resolution Sensor in Display Application”, IDW ’20 : Proceedings of the 27th International Display Workshops, Dec. 9, 2020, vol. 27, pp. 902-905.

Gather.M et al., “Solution-Processed Full-Color Polymer-OLED Displays Fabricated by Direct Photolithography”, SID Digest ’06 : SID International Symposium Digest of Technical Papers, Jun. 1, 2006, vol. 37, No. 1, pp. 909-911.

Malinowski.P et al., “Photolithography as Enabler of AMOLED Displays Beyond 1000 ppi”, SID Digest ’17 : SID International Symposium Digest of Technical Papers, May 1, 2017, vol. 48, No. 1, pp. 623-626.

Taiwanese Office Action (Application No. 111130113) DATED May 5, 2026.

* cited by examiner

FIG. 32A
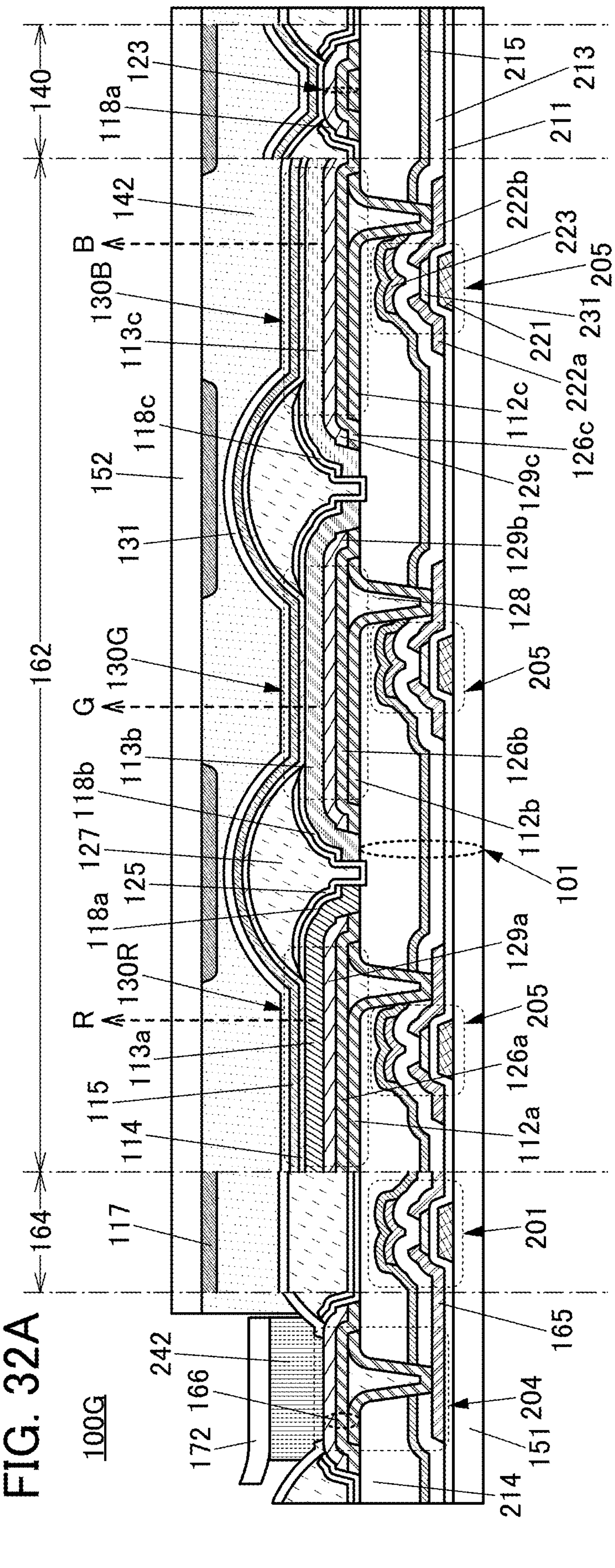
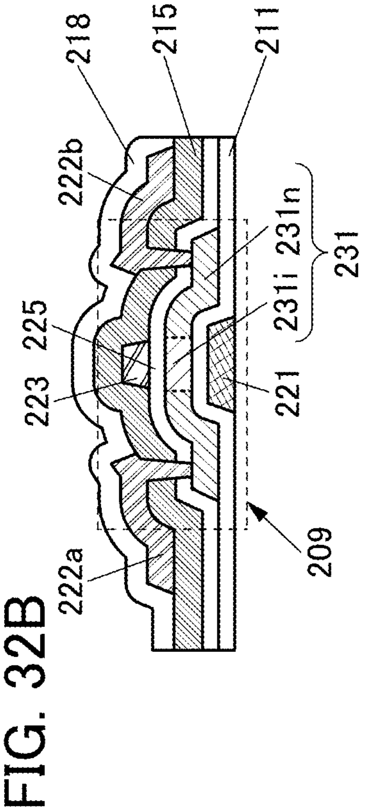
FIG. 32B
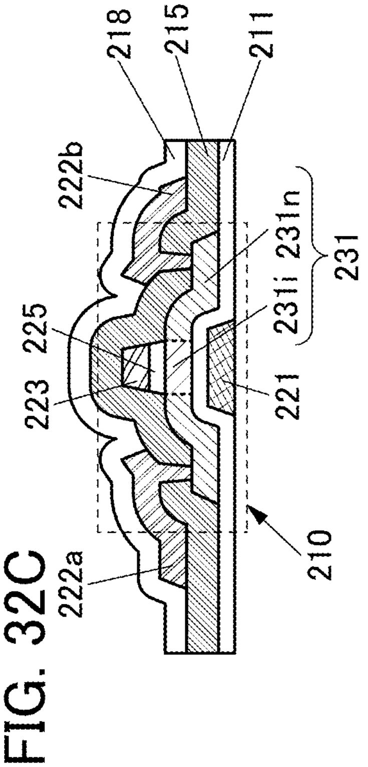
FIG. 32C

MANUFACTURING METHOD OF DISPLAY DEVICE, DISPLAY DEVICE, DISPLAY MODULE, AND ELECTRONIC DEVICE

TECHNICAL FIELD

One embodiment of the present invention relates to a display device, a display module, and an electronic device. One embodiment of the present invention relates to a method for manufacturing a display device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

Recent display devices have been expected to be applied to a variety of uses. Usage examples of large-sized display devices include a television device for home use (also referred to as TV or television receiver), digital signage, and a PID (Public Information Display). In addition, a smartphone and a tablet terminal each including a touch panel, and the like, are being developed as portable information terminals.

Furthermore, higher-resolution display devices have been required. As devices requiring high-resolution display devices, for example, devices for virtual reality (VR), augmented reality (AR), substitutional reality (SR), or mixed reality (MR) have been actively developed.

Light-emitting apparatuses including light-emitting devices (also referred to as light-emitting elements) have been developed as display devices, for example. Light-emitting devices utilizing an electroluminescence (hereinafter referred to as EL) phenomenon (also referred to as EL devices or EL elements) have features such as ease of reduction in thickness and weight, high-speed response to input signals, and driving with a constant DC voltage power source, and have been used in display devices.

Patent Document 1 discloses a display device using an organic EL device (also referred to as organic EL element) for VR.

REFERENCE

Patent Document

[Patent Document 1] PCT International Publication No. 2018/087625

SUMMARY OF THE INVENTION

Problems to be Solved by the Invention

An object of one embodiment of the present invention is to provide a display device with high display quality. An object of one embodiment of the present invention is to provide a high-resolution display device. An object of one embodiment of the present invention is to provide a high-definition display device. An object of one embodiment of the present invention is to provide a highly reliable display device.

An object of one embodiment of the present invention is to provide a method for manufacturing a high-resolution display device. An object of one embodiment of the present invention is to provide a method for manufacturing a high-definition display device. An object of one embodiment of the present invention is to provide a method for manufacturing a highly reliable display device. An object of one embodiment of the present invention is to provide a method for manufacturing a display device with high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a method for manufacturing a display device, which includes forming a first pixel electrode and a first conductive layer; forming a first film over the first pixel electrode; forming a first mask film over the first film and the first conductive layer; processing the first film and the first mask film to form a first layer and a first mask layer over the first pixel electrode and a second mask layer over the first conductive layer; forming a first insulating film over the first mask layer and the second mask layer; forming a second insulating film over the first insulating film with use of a photosensitive resin composite; performing light exposure and development on the second insulating film to expose a portion of the first insulating film that overlaps with the second mask layer; performing first etching treatment using the second insulating film as a mask to remove the portion of the first insulating film that overlaps with the second mask layer and reduce the thickness of part of the second mask layer; performing light exposure and development on the second insulating film to expose a portion of the first insulating film that overlaps with the first mask layer and form a second insulating layer covering an end portion of the first layer; performing second etching treatment using the second insulating layer as a mask to remove the portion of the first insulating film that overlaps with the first mask layer, form a first insulating layer overlapping with the second insulating layer, and reduce the thickness of part of the first mask layer; performing heat treatment and then performing third etching treatment using the second insulating layer as a mask to remove part of the first mask layer and expose a top surface of the first layer; forming a common electrode to cover the first layer, the first conductive layer, and the second insulating layer; and removing part of the second mask layer by the second etching treatment or the third etching treatment to expose a top surface of the first conductive layer.

Another embodiment of the present invention is a method for manufacturing a display device, which includes forming a first pixel electrode, a second pixel electrode, and a first conductive layer; forming a first film over the first pixel electrode and the second pixel electrode; forming a first mask film over the first film and the first conductive layer; processing the first film and the first mask film to form a first layer and a first mask layer over the first pixel electrode, form a second mask layer over the first conductive layer, and expose the second pixel electrode; forming a second film over the first mask layer and the second pixel electrode; forming a second mask film over the second film; processing the second film and the second mask film to form a second layer and a third mask layer over the second pixel electrode and expose the first mask layer and the second mask layer;

forming a first insulating film over the first mask layer to the third mask layer; forming a second insulating film over the first insulating film with use of a photosensitive resin composite; performing light exposure and development on the second insulating film to expose a portion of the first insulating film that overlaps with the second mask layer; performing first etching treatment using the second insulating film as a mask to remove the portion of the first insulating film that overlaps with the second mask layer and reduce the thickness of part of the second mask layer; performing light exposure and development on the second insulating film to expose a portion of the first insulating film that overlaps with the first mask layer and a portion of the first insulating film that overlaps with the third mask layer, and form a second insulating layer overlapping with a region interposed between the first pixel electrode and the second pixel electrode; performing second etching treatment using the second insulating layer as a mask to remove the portion of the first insulating film that overlaps with the first mask layer and the portion of the first insulating film that overlaps with the third mask layer, form a first insulating layer overlapping with the second insulating layer, and reduce the thickness of part of the first mask layer and part of the third mask layer; performing heat treatment and then performing third etching treatment using the second insulating layer as a mask to remove part of the first mask layer and part of the third mask layer and expose a top surface of the first layer and a top surface of the second layer; forming a common electrode to cover the first layer, the second layer, the first conductive layer, and the second insulating layer; and removing part of the second mask layer by the second etching treatment or the third etching treatment to expose a top surface of the first conductive layer.

The first layer preferably includes at least a first light-emitting layer.

The first layer preferably includes a first functional layer over the first light-emitting layer, and the first functional layer preferably includes at least one of a hole-injection layer, an electron-injection layer, a hole-transport layer, an electron-transport layer, a hole-blocking layer, and an electron-blocking layer.

An aluminum oxide film is preferably formed by an ALD method as each of the first mask film, the second mask film, and the first insulating film.

Another embodiment of the present invention is a display device including a first light-emitting device, a second light-emitting device, a first lens, a second lens, a first insulating layer, and a second insulating layer. The first light-emitting device includes a first pixel electrode, a first light-emitting layer over the first pixel electrode, and a common electrode over the first light-emitting layer. The second light-emitting device includes a second pixel electrode, a second light-emitting layer over the second pixel electrode, and the common electrode over the second light-emitting layer. The first lens overlaps with the first light-emitting device and the second lens overlaps with the second light-emitting device. The first insulating layer covers a side surface and part of a top surface of the first light-emitting layer and a side surface and part of a top surface of the second light-emitting layer. The second insulating layer overlaps with the side surface and the part of the top surface of the first light-emitting layer and the side surface and the part of the top surface of the second light-emitting layer with the first insulating layer therebetween. The common electrode covers the second insulating layer. In a cross-sectional view, an end portion of the second insulating layer has a tapered shape with a taper angle less than 90°.

The second insulating layer preferably covers at least part of a side surface of an end portion of the first insulating layer.

The first light-emitting device preferably includes a first functional layer between the first light-emitting layer and the common electrode, and the first functional layer preferably includes at least one of a hole-injection layer, an electron-injection layer, a hole-transport layer, an electron-transport layer, a hole-blocking layer, and an electron-blocking layer.

One embodiment of the present invention is a display module including the display device having any of the above structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above display module and at least one of a housing, a battery, a camera, a speaker, and a microphone.

Effect of the Invention

One embodiment of the present invention can provide a display device with high display quality. One embodiment of the present invention can provide a high-resolution display device. One embodiment of the present invention can provide a high-definition display device. One embodiment of the present invention can provide a highly reliable display device.

One embodiment of the present invention can provide a method for manufacturing a high-resolution display device. One embodiment of the present invention can provide a method for manufacturing a high-definition display device. One embodiment of the present invention can provide a method for manufacturing a highly reliable display device. One embodiment of the present invention can provide a method for manufacturing a display device with high yield.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 32A is a cross-sectional view illustrating an example of a display device. FIG. 32B and FIG. 32C are cross-sectional views illustrating examples of transistors.

MODE FOR CARRYING OUT THE INVENTION

Figure 1A:
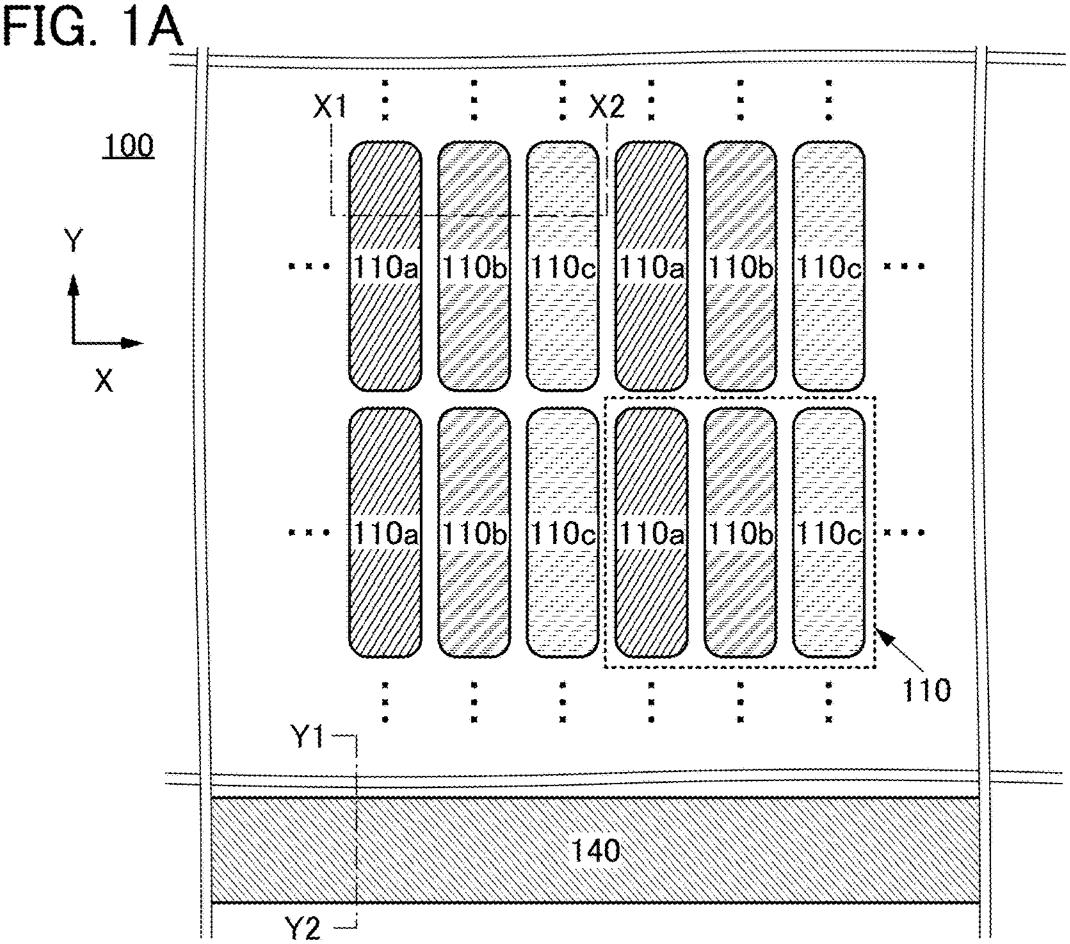
FIG. 1A is a top view illustrating an example of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases. The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be used interchangeably depending on the case or the circumstances. For example, the term "conductive layer" can be replaced with the term "conductive film". As another example, the term "insulating film" can be replaced with the term "insulating layer".

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be clearly distinguished from each other depending on the cross-sectional shape, properties, or the like in some cases. One layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. Examples of layers (also referred to as functional layers) included in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In this specification and the like, a light-receiving device (also referred to as a light-receiving element) includes at least an active layer functioning as a photoelectric conversion layer between a pair of electrodes. In this specification and the like, one of the pair of electrodes may be referred to as a pixel electrode and the other may be referred to as a common electrode.

Embodiment 1

In this embodiment, a display device of one embodiment of the present invention will be described with reference to FIG. 1 to FIG. 11.

A display device of one embodiment of the present invention includes light-emitting devices separately formed for respective emission colors and can perform full-color display.

A structure in which light-emitting layers in light-emitting devices of different colors (for example, blue (B), green (G), and red (R)) are separately formed or separately patterned is sometimes referred to as an SBS (Side By Side) structure. The SBS structure can optimize materials and structures of light-emitting devices and thus can extend freedom of choice of materials and structures, whereby the luminance and the reliability can be easily improved.

In the case of manufacturing a display device including a plurality of light-emitting devices emitting light of different colors, light-emitting layers different in emission color each need to be formed into an island shape.

Note that in this specification and the like, the term "island shape" refers to a state where two or more layers formed using the same material in the same step are physically separated from each other. For example, the term "island-shaped light-emitting layer" refers to a state where the light-emitting layer and its adjacent light-emitting layer are physically separated from each other.

For example, an island-shaped light-emitting layer can be formed by a vacuum evaporation method using a metal mask. However, this method causes a deviation from the designed shape and position of an island-shaped light-emitting layer due to various influences such as the accuracy of the metal mask, the positional deviation between the metal mask and a substrate, a warp of the metal mask, and the vapor-scattering-induced expansion of the outline of the formed film; accordingly, it is difficult to achieve high resolution and high aperture ratio of the display device. In addition, the outline of the layer may blur during vapor deposition, whereby the thickness of an end portion may be reduced. That is, the thickness of the island-shaped light-emitting layer may vary from area to area. In the case of manufacturing a display device with a large size, high definition, or high resolution, the manufacturing yield might be reduced because of low dimensional accuracy of the metal mask and deformation due to heat or the like.

In view of this, in manufacture of the display device of one embodiment of the present invention, fine patterning of a light-emitting layer is performed by a photolithography method without a shadow mask such as a metal mask. Specifically, pixel electrodes are formed independently for respective subpixels, and then a light-emitting layer is formed across the plurality of pixel electrodes. After that, the light-emitting layer is processed by a photolithography method, so that one island-shaped light-emitting layer is formed per pixel electrode. Thus, the light-emitting layer is divided for each subpixel, so that island-shaped light-emitting layers can be formed for the respective subpixels.

In the case of processing the light-emitting layer into an island shape, a structure is possible in which processing is performed by a photolithography method directly on the light-emitting layer. In the case of the above structure, damage to the light-emitting layer (e.g., processing damage) might significantly degrade the reliability. In view of this, in manufacture of the display device of one embodiment of the present invention, a method is preferably employed in which a mask layer (also referred to as a sacrificial layer, a protective layer, or the like) is formed over a functional layer (e.g., a carrier-blocking layer, a carrier-transport layer, or a carrier-injection layer, specifically, a hole-blocking layer, an electron-transport layer, an electron-injection layer, or the like), followed by the processing of the light-emitting layer and the functional layer into an island shape. By employing such a method, a highly reliable display device can be provided. A functional layer between the light-emitting layer and the mask layer can inhibit the light-emitting layer from being exposed on the outermost surface during the manufacturing process of the display device and can reduce damage to the light-emitting layer.

Note that in this specification and the like, each of a mask film and a mask layer is positioned above at least a light-emitting layer (specifically, a layer processed into an island shape among layers included in an EL layer) and has a function of protecting the light-emitting layer in the manufacturing process.

The EL layer preferably includes a first region that is a light-emitting region (also referred to as an emission area) and a second region on the outer side of the first region. The second region can also be referred to as a dummy region or a dummy area. The first region is positioned between the pixel electrode and the common electrode. The first region is covered with the mask layer during the manufacturing process of the display device, which greatly reduces damage to the first region. Accordingly, a light-emitting device with high emission efficiency and a long lifetime can be achieved. Meanwhile, the second region includes an end portion of the EL layer and the vicinity thereof, which might be damaged due to exposure to plasma, for example, in the manufacturing process of the display device. By not using the second region as the light-emitting region, variation in characteristics of the light-emitting devices can be reduced.

In the case where the light-emitting layer is processed into an island shape, a layer positioned below the light-emitting layer (e.g., a carrier-injection layer, a carrier-transport layer, or a carrier-blocking layer, specifically a hole-injection layer, a hole-transport layer, an electron-blocking layer, or the like) is preferably processed into the same island shape as the light-emitting layer. Processing a layer positioned below the light-emitting layer into the same island shape as the light-emitting layer can reduce a leakage current (sometimes referred to as a horizontal-direction leakage current, a horizontal leakage current, or a lateral leakage current) that might be generated between adjacent subpixels. For example, in the case where the hole-injection layer is shared by adjacent subpixels, a horizontal leakage current might be generated due to the hole-injection layer. Meanwhile, in the display device of one embodiment of the present invention, the light-emitting layer and the hole-injection layer can be processed into the same island shape; thus, a horizontal leakage current between adjacent subpixels is not substantially generated or a horizontal leakage current can be extremely small.

In the case of performing processing by a photolithography method, for example, the EL layer might suffer from various kinds of damage due to heating at the time of resist mask formation and exposure to an etchant or an etching gas at the time of resist mask processing or removal. In the case where a mask layer is provided over the EL layer, the EL layer might be affected by heating, an etchant, an etching gas, or the like in forming, processing, and removing the mask layer.

In addition, when steps performed after formation of the EL layer are performed at temperature higher than the upper temperature limit of the EL layer, deterioration of the EL layer proceeds, which might result in a decrease in the emission efficiency and reliability of the light-emitting device.

Thus, in one embodiment of the present invention, the upper temperature limit of a compound contained in the light-emitting device is preferably higher than or equal to 100° C. and lower than or equal to 180° C., further preferably higher than or equal to 120° C. and lower than or equal to 180° C., still further preferably higher than or equal to 140° C. and lower than or equal to 180° C.

Examples of indicators of the upper temperature limit include the glass transition point (Tg), the softening point, the melting point, the thermal decomposition temperature, and the 5% weight loss temperature. For example, as an indicator of the upper temperature limit of a layer included in the EL layer, a glass transition point of a material contained in the layer can be used. In the case where the layer is a mixed layer formed of a plurality of materials, a glass transition point of a material contained in the highest proportion can be used, for example. Alternatively, the lowest temperature among the glass transition points of the materials may be used.

In particular, the upper temperature limits of the functional layers provided over the light-emitting layer are preferably high. It is further preferable that the upper temperature limit of the functional layer provided over and in contact with the light-emitting layer be high. When the functional layer has high heat resistance, the light-emitting layer can be effectively protected and damage to the light-emitting layer can be reduced.

In addition, it is particularly preferable that the upper temperature limit of the light-emitting layer be high. In this case, the light-emitting layer can be inhibited from being damaged by heating and being decreased in emission efficiency and lifetime.

Increasing the upper temperature limit of the light-emitting device can improve the reliability of the light-emitting device. Furthermore, the allowable temperature range in the manufacturing process of the display device can be widened, thereby improving the manufacturing yield and the reliability.

It is not necessary to form all layers included in the EL layers separately between light-emitting devices emitting light of different colors, and some layers can be formed in the same step. In the method for manufacturing the display device of one embodiment of the present invention, some layers included in the EL layer are formed into an island shape separately for each color, and then at least part of the mask layer is removed. After that, other layers (sometimes referred to as common layers) included in the EL layers and a common electrode (also referred to as an upper electrode) are formed so as to be shared by the light-emitting devices of respective colors (formed as one film). For example, the carrier-injection layer and the common electrode can be formed so as to be shared by the light-emitting devices of respective colors.

Meanwhile, the carrier-injection layer is often a layer having relatively high conductivity in the EL layer. Therefore, when the carrier-injection layer is in contact with the side surface of any layer included in the EL layer formed into an island shape or the side surface of the pixel electrode, the light-emitting device might be short-circuited. Note that also in the case where the carrier-injection layer is formed into an island shape and the common electrode is formed to be shared by the light-emitting devices of respective colors, the light-emitting device might be short-circuited when the common electrode is in contact with the side surface of the EL layer or the side surface of the pixel electrode.

In view of this, the display device of one embodiment of the present invention includes an insulating layer covering at least the side surface of the island-shaped light-emitting layer. The insulating layer preferably covers part of the top surface of the island-shaped light-emitting layer.

Thus, at least some layers in the EL layer formed into an island shape and the pixel electrode can be inhibited from being in contact with the carrier-injection layer or the common electrode. Hence, a short circuit in the light-emitting device is inhibited, and the reliability of the light-emitting device can be improved.

In a cross-sectional view, an end portion of the insulating layer preferably has a tapered shape with a taper angle less than 90°. In this case, step disconnection of the common layer and the common electrode provided over the insulating layer can be prevented. Thus, connection defects caused by step disconnection can be inhibited. In addition, an increase in electric resistance, which is caused by local thinning of the common electrode due to a step, can be inhibited.

Note that in this specification and the like, a tapered shape refers to such a shape that at least part of a side surface of a component is inclined with respect to a substrate surface or a formation surface. For example, the tapered shape preferably includes a region where the angle formed by the inclined side surface and the substrate surface or the formation surface (such an angle is also referred to as a taper angle) is less than 90°. Note that the side surface, the substrate surface, and the formation surface of the component are not necessarily completely flat, and may have a substantially planar shape with a small curvature or a substantially planar shape with slight unevenness.

Note that in this specification and the like, step disconnection refers to a phenomenon in which a layer, a film, or an electrode is split because of the shape of the formation surface (e.g., a step).

Thus, in the method for manufacturing a display device of one embodiment of the present invention, an island-shaped light-emitting layer is formed not by using a fine metal mask but by processing a light-emitting layer formed on the entire surface. Accordingly, a high-resolution display device or a display device with a high aperture ratio, which has been difficult to be formed so far, can be achieved. Moreover, light-emitting layers can be formed separately for each color, enabling the display device to perform extremely clear display with high contrast and high display quality. Moreover, providing the mask layer over the light-emitting layer can reduce damage to the light-emitting layer in the manufacturing process of the display device, resulting in an improvement in reliability of the light-emitting device.

It is difficult to reduce the distance between adjacent light-emitting devices to less than 10 μm with a formation method using a fine metal mask, for example; however, the method employing a photolithography method of one embodiment of the present invention can shorten the distance between adjacent light-emitting devices, the distance between adjacent EL layers, or the distance between adjacent pixel electrodes to less than 10 μm, less than or equal to 5 μm, less than or equal to 3 μm, less than or equal to 2 μm, less than or equal to 1.5 μm, less than or equal to 1 μm, or even less than or equal to 0.5 μm, for example, in a process over a glass substrate. Using a light exposure apparatus for LSI can further shorten the distance between adjacent light-emitting devices, the distance between adjacent EL layers, or the distance between adjacent pixel electrodes to less than or equal to 500 nm, less than or equal to 200 nm, less than or equal to 100 nm, or even less than or equal to 50 nm, for example, in a process over a Si wafer. Accordingly, the area of a non-light-emitting region that may exist between two light-emitting devices can be significantly reduced, and the aperture ratio can be close to 100%. For example, the display device of one embodiment of the present invention can have an aperture ratio higher than or equal to 40%, higher than or equal to 50%, higher than or equal to 60%, higher than or equal to 70%, higher than or equal to 80%, or higher than or equal to 90%, and lower than 100%.

Increasing the aperture ratio of the display device can improve the reliability of the display device. Specifically, with reference to the lifetime of a display device including an organic EL device and having an aperture ratio of 10%, a display device having an aperture ratio of 20% (that is, having an aperture ratio two times higher than the reference) has a lifetime 3.25 times longer than the reference, and a display device having an aperture ratio of 40% (that is, having an aperture ratio four times higher than the reference) has a lifetime 10.6 times longer than the reference. Thus, the density of a current flowing through the organic EL device can be reduced with an increasing aperture ratio, and accordingly the lifetime of the display device can be increased. The display device of one embodiment of the present invention can have a higher aperture ratio and thus the display device can have higher display quality. Furthermore, the display device has excellent effect that the reliability (especially the lifetime) can be significantly improved with an increasing aperture ratio.

Furthermore, a pattern of the light-emitting layer itself (also referred to as processing size) can be made much smaller than that in the case of using a fine metal mask. For example, in the case of using a metal mask for forming light-emitting layers separately, a variation in the thickness occurs between the center and the edge of the light-emitting layer, which causes a reduction in an effective area that can be used as a light-emitting region with respect to the area of the light-emitting layer. In contrast, in the above manufacturing method, the film formed to have a uniform thickness is processed, so that island-shaped light-emitting layers can be formed to have a uniform thickness. Accordingly, even with a fine pattern, almost the whole area can be used as a light-emitting region. Thus, a display device having both a high resolution and a high aperture ratio can be manufactured. Furthermore, the display device can be reduced in size and weight.

Specifically, for example, the display device of one embodiment of the present invention can have a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

In this embodiment, cross-sectional structures of the display device of one embodiment of the present invention are mainly described, and a method for manufacturing the display device of one embodiment of the present invention will be described in detail in Embodiment 2.

FIG. 1A illustrates a top view of a display device 100. The display device 100 includes a display portion where a plurality of pixels 110 are arranged, and a connection portion 140 outside the display portion. A plurality of subpixels are arranged in a matrix in the display portion. FIG. 1A illustrates subpixels in two rows and six columns, which form the pixels 110 in two rows and two columns. The connection portion 140 can also be referred to as a cathode contact portion. The top surface shape of the subpixel illustrated in FIG. 1A corresponds to the top surface shape of a light-emitting region. In this specification and the like, a top surface shape refers to a shape in a plan view, i.e., a shape seen from above.

Examples of a top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in FIG. 1A, and the components may be placed outside the range of the subpixels. For example, transistors included in a subpixel 110*a* may be positioned within the range of a subpixel 110*b* illustrated in FIG. 1A, or some or all of the transistors may be positioned outside the range of the subpixel 110*a*.

Although FIG. 1A illustrates the subpixel 110*a*, the subpixel 110*b*, and a subpixel 110*c* that have the same or substantially the same aperture ratio (also referred to as size or size of a light-emitting region), one embodiment of the present invention is not limited thereto. The aperture ratio of each of the subpixels 110*a*, 110*b*, and 110*c* can be determined as appropriate. The subpixels 110*a*, 110*b*, and 110*c* may have different aperture ratios, or two or more of them may have the same or substantially the same aperture ratio.

The pixel 110 illustrated in FIG. 1A employs stripe arrangement. The pixel 110 illustrated in FIG. 1A is composed of three subpixels: the subpixels 110*a*, 110*b*, and 110*c*. The subpixels 110*a*, 110*b*, and 110*c* include light-emitting devices emitting light of different colors. The subpixels 110*a*, 110*b*, and 110*c* are subpixels of three colors of red (R), green (G), and blue (B) or subpixels of three colors of yellow (Y), cyan (C), and magenta (M), for example. The number of types of subpixels is not limited to three and may be four or more. The four subpixels are subpixels of four colors of R, G, B, and white (W), subpixels of four colors of R, G, B, and Y, or subpixels of four types of R, G, B, and infrared light (IR), for example.

In this specification and the like, the row direction is referred to as X direction and the column direction is referred to as Y direction, in some cases. The X direction and the Y direction intersect with each other and are, for example, orthogonal to each other (see FIG. 1A). FIG. 1A illustrates an example in which subpixels of different colors are arranged in the X direction and subpixels of the same color are arranged in the Y direction.

Although the top view in FIG. 1A illustrates an example in which the connection portion 140 is positioned in the lower side of the display portion, the position of the connection portion 140 is not particularly limited. The connection portion 140 is provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more.

Figure 1B:
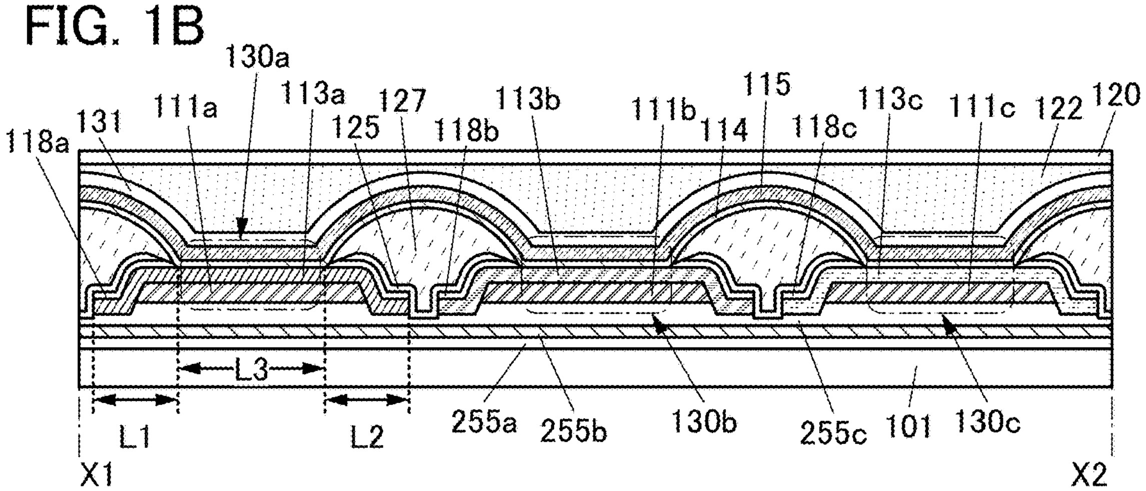
FIG. 1B is a cross-sectional view illustrating the example of the display device.
Figure 1C:
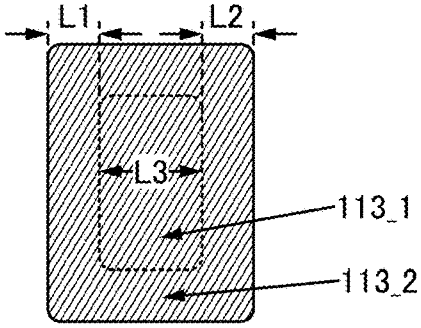
FIG. 1C is a top view illustrating an example of a first layer.
Figure 2A:
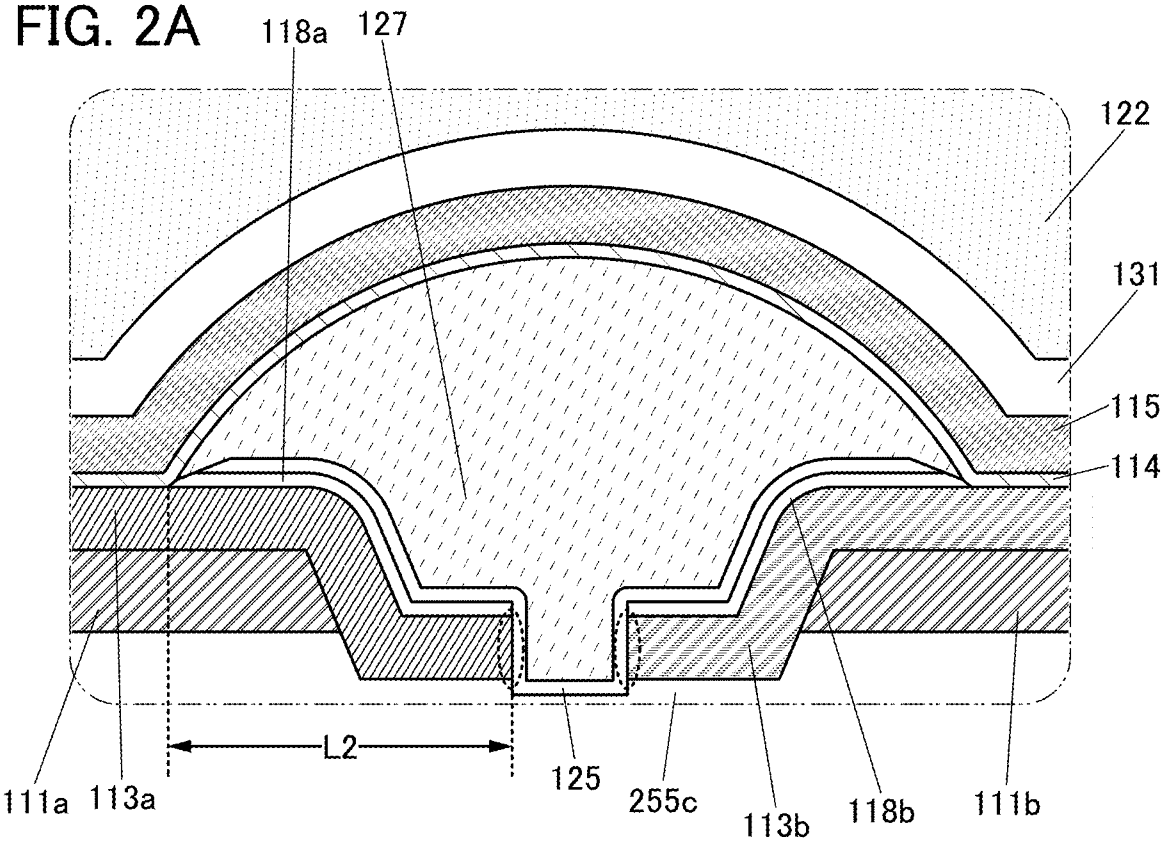
FIG. 2A and FIG. 2B are cross-sectional views illustrating an example of a display device.
Figure 2B:
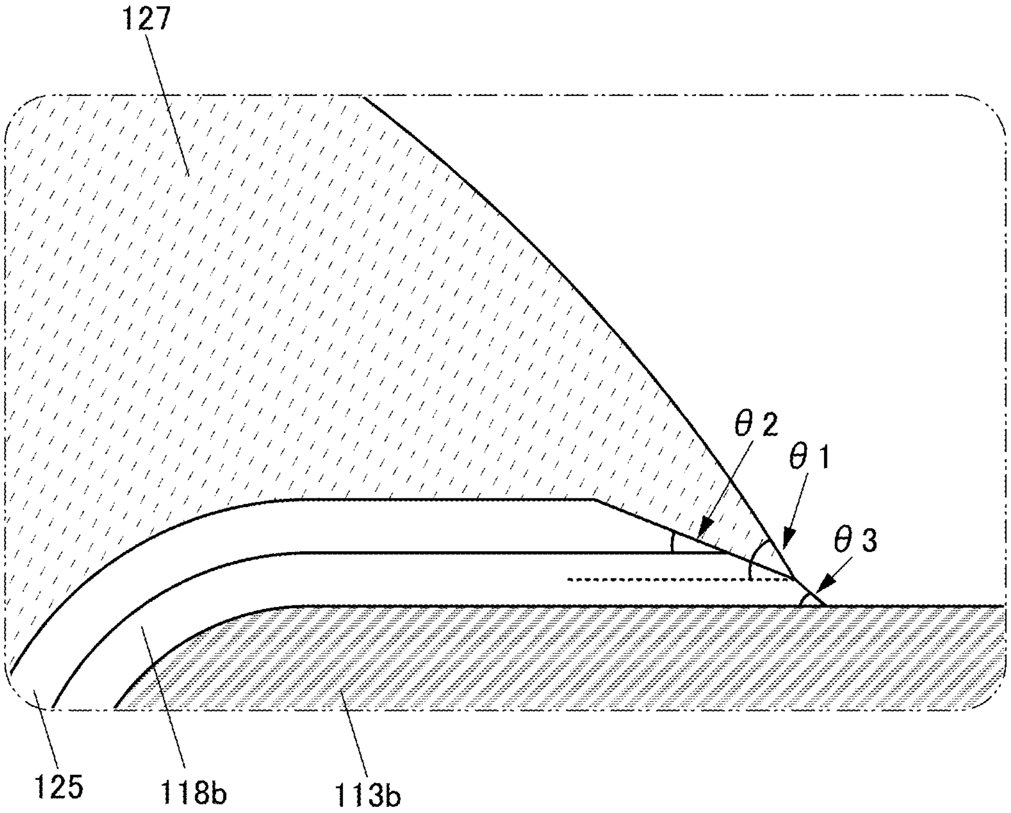

FIG. 1B illustrates a cross-sectional view along the dashed-dotted line X1-X2 in FIG. 1A. FIG. 1C illustrates a top view of a first layer 113*a*. FIG. 2A and FIG. 2B illustrate enlarged views of part of the cross-sectional view illustrated in FIG. 1B. FIG. 3 to FIG. 7 illustrate variation examples of FIG. 2. FIG. 8A and FIG. 9A to FIG. 9C illustrate variation examples of FIG. 1B. FIG. 8B and FIG. 8C are cross-sectional views illustrating variation examples of a pixel electrode. FIG. 10A and FIG. 10B illustrate cross-sectional views along the dashed-dotted line Y1-Y2 in FIG. 1A.

As illustrated in FIG. 1B, in the display device 100, an insulating layer is provided over a layer 101 including transistors, light-emitting devices 130*a*, 130*b*, and 130*c* are provided over the insulating layer, and a protective layer 131 is provided to cover these light-emitting devices. A substrate 120 is bonded onto the protective layer 131 with a resin layer 122. In a region between adjacent light-emitting devices, an insulating layer 125 and an insulating layer 127 over the insulating layer 125 are provided.

Although FIG. 1B illustrates a plurality of cross sections of the insulating layer 125 and the insulating layer 127, the insulating layer 125 and the insulating layer 127 are each one continuous layer when the display device 100 is seen from above. In other words, the display device 100 can have a structure including one insulating layer 125 and one insulating layer 127, for example. Note that the display device 100 may include a plurality of insulating layers 125 that are separated from each other, and may include a plurality of insulating layers 127 that are separated from each other.

The display device of one embodiment of the present invention can have any of a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. The insulating layer over the transistors may have a single-layer structure or a stacked-layer structure. In FIG. 1B, an insulating layer 255*a*, an insulating layer 255*b* over the insulating layer 255*a*, and an insulating layer 255*c* over the insulating layer 255*b* are illustrated as the insulating layer over the transistors. These insulating layers may have a depressed portion between adjacent light-emitting devices. In the example illustrated in FIG. 1B and the like, the insulating layer 255*c* is provided with a depressed portion. The insulating layer 255*c* does not necessarily include a depressed portion between adjacent light-emitting devices. The insulating layers (the insulating layer 255*a* to the insulating layer 255*c*) over the transistors may be regarded as part of the layer 101 including transistors.

As each of the insulating layer 255*a*, the insulating layer 255*b*, and the insulating layer 255*c*, any of a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c* and that a silicon nitride film be used as the insulating layer 255*b*. The insulating layer 255*b* preferably has a function of an etching protective film.

Note that in this specification and the like, oxynitride refers to a material that contains more oxygen than nitrogen in its composition, and nitride oxide refers to a material that contains more nitrogen than oxygen in its composition. For example, silicon oxynitride refers to a material that contains more oxygen than nitrogen in its composition, and silicon nitride oxide refers to a material that contains more nitrogen than oxygen in its composition.

Structure examples of the layer 101 including transistors will be described later in Embodiment 4.

The light-emitting devices 130*a*, 130*b*, and 130*c* emit light of different colors. Preferably, the light-emitting devices 130*a*, 130*b*, and 130*c* emit light of three colors, red (R), green (G), and blue (B), for example.

As the light-emitting device, an OLED (Organic Light-Emitting Diode) or a QLED (Quantum-dot Light-Emitting Diode) is preferably used, for example. Examples of a light-emitting substance contained in the light-emitting device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). An LED (Light Emitting Diode) such as a micro-LED can also be used as the light-emitting device.

The emission color of the light-emitting device can be infrared, red, green, blue, cyan, magenta, yellow, white, or the like. When the light-emitting device has a microcavity structure, the color purity can be increased.

Embodiment 5 can be referred to for the structure and the materials of the light-emitting device.

One of the pair of electrodes included in the light-emitting device functions as an anode, and the other electrode functions as a cathode. The case where the pixel electrode functions as an anode and the common electrode functions as a cathode is described below as an example in some cases.

The light-emitting device 130*a* includes a pixel electrode 111*a* over the insulating layer 255*c*, the island-shaped first layer 113*a* over the pixel electrode 111*a*, a common layer 114 over the island-shaped first layer 113*a*, and a common electrode 115 over the common layer 114. In the light-emitting device 130*a*, the first layer 113*a* and the common layer 114 can be collectively referred to as an EL layer.

The light-emitting device 130*b* includes a pixel electrode 111*b* over the insulating layer 255*c*, an island-shaped second layer 113*b* over the pixel electrode 111*b*, the common layer 114 over the island-shaped second layer 113*b*, and the common electrode 115 over the common layer 114. In the light-emitting device 130*b*, the second layer 113*b* and the common layer 114 can be collectively referred to as an EL layer.

The light-emitting device 130*c* includes a pixel electrode 111*c* over the insulating layer 255*c*, an island-shaped third layer 113*c* over the pixel electrode 111*c*, the common layer 114 over the island-shaped third layer 113*c*, and the common electrode 115 over the common layer 114. In the light-emitting device 130*c*, the third layer 113*c* and the common layer 114 can be collectively referred to as an EL layer.

In this specification and the like, in the EL layers included in the light-emitting devices, the island-shaped layer provided in each light-emitting device is referred to as the first layer 113*a*, the second layer 113*b*, or the third layer 113*c*, and the layer shared by the plurality of light-emitting devices is referred to as the common layer 114. Note that in this specification and the like, the first layer 113*a*, the second layer 113*b*, and the third layer 113*c* are sometimes referred to as island-shaped EL layers, EL layers formed in an island shape, or the like, in which case the common layer 114 is not included.

The first layer 113*a*, the second layer 113*b*, and the third layer 113*c* are isolated from each other. When the EL layer is provided in an island shape for each light-emitting device, a leakage current between adjacent light-emitting devices can be inhibited. This can prevent crosstalk due to unintended light emission, so that a display device with extremely high contrast can be obtained. Specifically, a display device having high current efficiency at low luminance can be obtained.

End portions of the pixel electrode 111*a*, the pixel electrode 111*b*, and the pixel electrode 111*c* each preferably have a tapered shape. Specifically, the end portions of the pixel electrode 111*a*, the pixel electrode 111*b*, and the pixel electrode 111*c* each preferably have a tapered shape with a taper angle less than 90°. In the case where the end portions of the pixel electrodes each have a tapered shape, each of the first layer 113*a*, the second layer 113*b*, and the third layer 113*c* provided along the side surfaces of the pixel electrodes also has a tapered shape (corresponding to an inclined portion described later). When the side surface of the pixel electrode has a tapered shape, coverage with the EL layer provided along the side surface of the pixel electrode can be improved.

FIG. 1B and the like exemplify a structure in which an angle formed by the insulating layer 255*b* and the sidewall of the depressed portion in the insulating layer 255*c* is a taper angle almost equal to that of the tapered shape of the pixel electrode 111*a*, the pixel electrode 111*b*, and the pixel electrode 111*c*; however, one embodiment of the present invention is not limited thereto. For example, the tapered shape of the pixel electrode 111*a*, the pixel electrode 111*b*, and the pixel electrode 111*c* may be different from the tapered shape of the depressed portion formed in the insulating layer 255*c*.

In FIG. 1B, an insulating layer (also referred to as a bank or a spacer) covering an end portion of the top surface of the pixel electrode 111*a* is not provided between the pixel electrode 111*a* and the first layer 113*a*. An insulating layer covering an end portion of the top surface of the pixel electrode 111*b* is not provided between the pixel electrode 111*b* and the second layer 113*b*. Thus, the distance between adjacent light-emitting devices can be extremely shortened. Accordingly, the display device can have a high resolution or a high definition. In addition, a mask for forming the insulating layer is not needed, which leads to a reduction in manufacturing cost of the display device.

Furthermore, light emitted from the EL layer can be extracted efficiently with a structure in which an insulating layer covering the end portion of the pixel electrode is not provided between the pixel electrode and the EL layer, i.e., a structure in which an insulating layer is not provided between the pixel electrode and the EL layer. Therefore, the display device of one embodiment of the present invention can significantly reduce the viewing angle dependence. A reduction in the viewing angle dependence leads to an increase in visibility of an image on the display device. For example, in the display device of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction.

The light-emitting device of this embodiment may have either a single structure (a structure including only one light-emitting unit) or a tandem structure (a structure including a plurality of light-emitting units). The light-emitting unit includes at least one light-emitting layer.

The first layer 113*a*, the second layer 113*b*, and the third layer 113*c* each include at least a light-emitting layer. It is preferable that any one of the first layer 113*a*, the second layer 113*b*, and the third layer 113*c* includes a light-emitting layer emitting red light, another include a light-emitting layer emitting green light, and the other include a light-emitting layer emitting blue light. For example, it is possible to employ a structure in which the first layer 113*a* includes a light-emitting layer emitting red light, the second layer 113*b* includes a light-emitting layer emitting green light, and the third layer 113*c* includes a light-emitting layer emitting blue light.

In the case of using a light-emitting device having a tandem structure, the first layer 113*a* is preferably configured to include a plurality of light-emitting units emitting red light, the second layer 113*b* is preferably configured to include a plurality of light-emitting units emitting green light, and the third layer 113*c* is preferably configured to include a plurality of light-emitting units emitting blue light. A charge-generation layer is preferably provided between the light-emitting units.

The first layer 113*a*, the second layer 113*b*, and the third layer 113*c* may each include one or more of a hole-injection layer, a hole-transport layer, a hole-blocking layer, a charge-generation layer, an electron-blocking layer, an electron-transport layer, and an electron-injection layer.

For example, the first layer 113*a*, the second layer 113*b*, and the third layer 113*c* may each include a hole-injection layer, a hole-transport layer, a light-emitting layer, and an electron-transport layer in this order. In addition, an electron-blocking layer may be provided between the hole-transport layer and the light-emitting layer. In addition, a hole-blocking layer may be provided between the electron-transport layer and the light-emitting layer. Furthermore, an electron-injection layer may be provided over the electron-transport layer.

Alternatively, the first layer 113*a*, the second layer 113*b*, and the third layer 113*c* may each include an electron-injection layer, an electron-transport layer, a light-emitting layer, and a hole-transport layer in this order, for example. In addition, a hole-blocking layer may be provided between the electron-transport layer and the light-emitting layer. In addition, an electron-blocking layer may be provided between the hole-transport layer and the light-emitting layer. Furthermore, a hole-injection layer may be provided over the hole-transport layer.

Thus, the first layer 113*a*, the second layer 113*b*, and the third layer 113*c* each preferably include a light-emitting layer and a carrier-transport layer (an electron-transport layer or a hole-transport layer) over the light-emitting layer. Alternatively, the first layer 113*a*, the second layer 113*b*, and the third layer 113*c* each preferably include a light-emitting layer and a carrier-blocking layer (a hole-blocking layer or an electron-blocking layer) over the light-emitting layer. Alternatively, the first layer 113*a*, the second layer 113*b*, and the third layer 113*c* each preferably include a light-emitting layer, a carrier-blocking layer over the light-emitting layer, and a carrier-transport layer over the carrier-blocking layer. Since the surfaces of the first layer 113*a*, the second layer 113*b*, and the third layer 113*c* are exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be improved.

The upper temperature limits of the compounds contained in the first layer 113*a*, the second layer 113*b*, and the third layer 113*c* are each preferably higher than or equal to 100° C. and lower than or equal to 180° C., further preferably higher than or equal to 120° C. and lower than or equal to 180° C., still further preferably higher than or equal to 140° C. and lower than or equal to 180° C. For example, the glass transition point (Tg) of these compounds is preferably higher than or equal to 100° C. and lower than or equal to 180° C., further preferably higher than or equal to 120° C. and lower than or equal to 180° C., still further preferably higher than or equal to 140° C. and lower than or equal to 180° C.

In particular, the upper temperature limits of the functional layers provided over the light-emitting layer are preferably high. It is further preferable that the upper temperature limit of the functional layer provided over and in contact with the light-emitting layer be high. When the functional layer has high heat resistance, the light-emitting layer can be effectively protected and damage to the light-emitting layer can be reduced.

In addition, the upper temperature limit of the light-emitting layer is preferably high. In this case, the light-emitting layer can be inhibited from being damaged by heating and being decreased in emission efficiency and lifetime.

The light-emitting layer contains a light-emitting substance (also referred to as a light-emitting organic compound, a guest material, or the like) and an organic compound (also referred to as a host material or the like). Since the light-emitting layer is configured to contain more organic compound than light-emitting substance, Tg of the organic compound can be used as an indicator of the upper temperature limit of the light-emitting layer.

The first layer 113*a*, the second layer 113*b*, and the third layer 113*c* may each include a first light-emitting unit, a charge-generation layer, and a second light-emitting unit that are stacked in this order over the pixel electrode, for example.

The second light-emitting unit preferably includes a light-emitting layer and a carrier-transport layer (an electron-transport layer or a hole-transport layer) over the light-emitting layer. Alternatively, the second light-emitting unit preferably includes a light-emitting layer and a carrier-blocking layer (a hole-blocking layer or an electron-blocking layer) over the light-emitting layer. Alternatively, the second light-emitting unit preferably includes a light-emitting layer, a carrier-blocking layer over the light-emitting layer, and a carrier-transport layer over the carrier-blocking layer. Since the surface of the second light-emitting unit is exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be improved. Note that in the case where three or more light-emitting units are provided, the uppermost light-emitting unit preferably includes a light-emitting layer and one or both of a carrier-transport layer and a carrier-blocking layer over the light-emitting layer.

The common layer 114 includes, for example, an electron-injection layer or a hole-injection layer. Alternatively, the common layer 114 may include a stack of an electron-transport layer and an electron-injection layer, or may include a stack of a hole-transport layer and a hole-injection layer. The common layer 114 is shared by the light-emitting devices 130*a*, 130*b*, and 130*c*.

FIG. 1B illustrates an example in which the end portion of the first layer 113*a* is positioned more outwardly than the end portion of the pixel electrode 111*a*. Note that although description is made using the pixel electrode 111*a* and the first layer 113*a* as an example, the same applies to the pixel electrode 111*b* and the second layer 113*b*, and the pixel electrode 111*c* and the third layer 113*c*.

In FIG. 1B, the first layer 113*a* is formed to cover the end portion of the pixel electrode 111*a*. Such a structure enables the entire top surface of the pixel electrode to be a light-emitting region, and the aperture ratio can be easily increased as compared with the structure in which the end portion of the island-shaped EL layer is positioned more inwardly than the end portion of the pixel electrode.

Covering the side surface of the pixel electrode with the EL layer inhibits contact between the pixel electrode and the common electrode 115, thereby inhibiting a short circuit of the light-emitting device. Furthermore, the distance between the light-emitting region (i.e., the region overlapping with the pixel electrode) in the EL layer and the end portion of the EL layer can be increased. Since the end portion of the EL layer might be damaged by processing, the use of a region away from the end portion of the EL layer as a light-emitting region can improve the reliability of the light-emitting device in some cases.

The first layer 113*a*, the second layer 113*b*, and the third layer 113*c* each preferably include the first region that is a light-emitting region and the second region (dummy region) on the outer side of the first region. The first region is positioned between the pixel electrode and the common electrode. The first region is covered with the mask layer during the manufacturing process of the display device, which greatly reduces damage to the first region. Accordingly, a light-emitting device with high emission efficiency and a long lifetime can be achieved. Meanwhile, the second region includes an end portion of the EL layer and the vicinity thereof, which might be damaged due to exposure to plasma, for example, in the manufacturing process of the display device. By not using the second region as the light-emitting region, variation in characteristics of the light-emitting devices can be reduced.

A width L3 illustrated in FIG. 1B and FIG. 1C corresponds to the width of a first region 113_1 (light-emitting region) in the first layer 113*a*. A width L1 and a width L2 illustrated in FIG. 1B and FIG. 1C each correspond to the width of a second region 113_2 (dummy region) in the first layer 113*a*. As illustrated in FIG. 1C, the second region 113_2 is provided to surround the first region 113_1; thus, the width of the second region 113_2 can be observed on the left and right sides in the cross-sectional views in FIG. 1B and the like. As the width of the second region 113_2, the width L1 or the width L2 can be used; for example, the shorter one of the width L1 and the width L2 can be used. The width L1 to the width L3 can be observed in a cross-sectional observation image or the like.

Figure 6A:
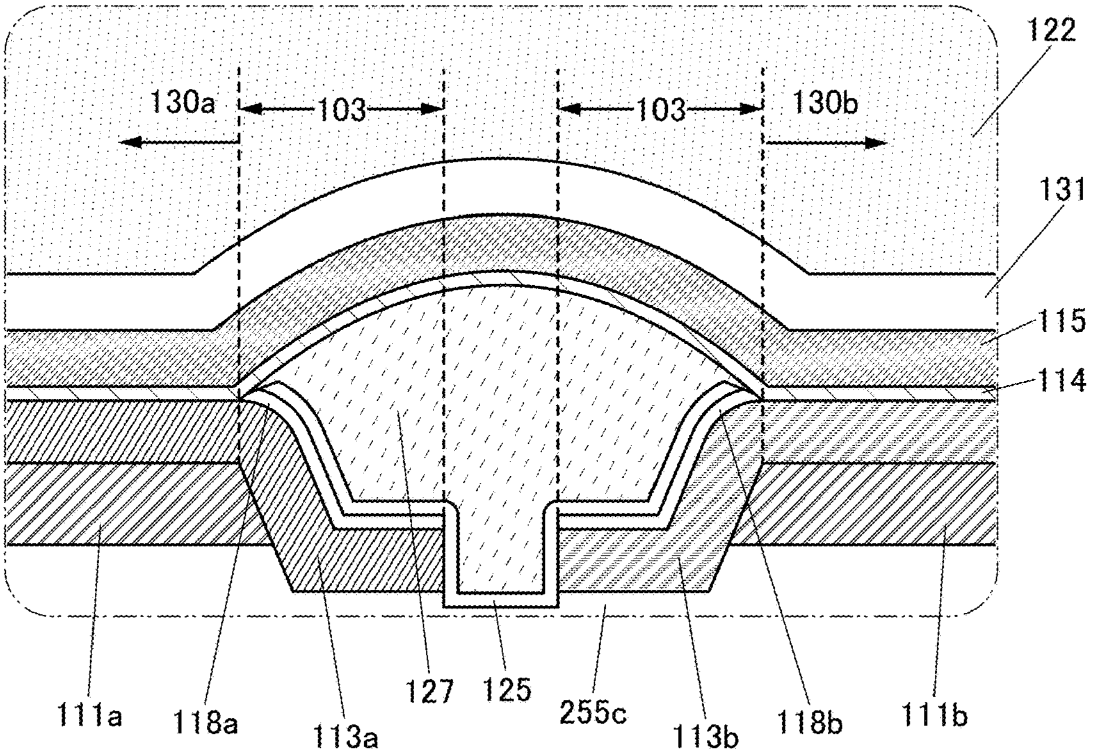
FIG. 6A and FIG. 6B are cross-sectional views illustrating examples of a display device.
Figure 6B:
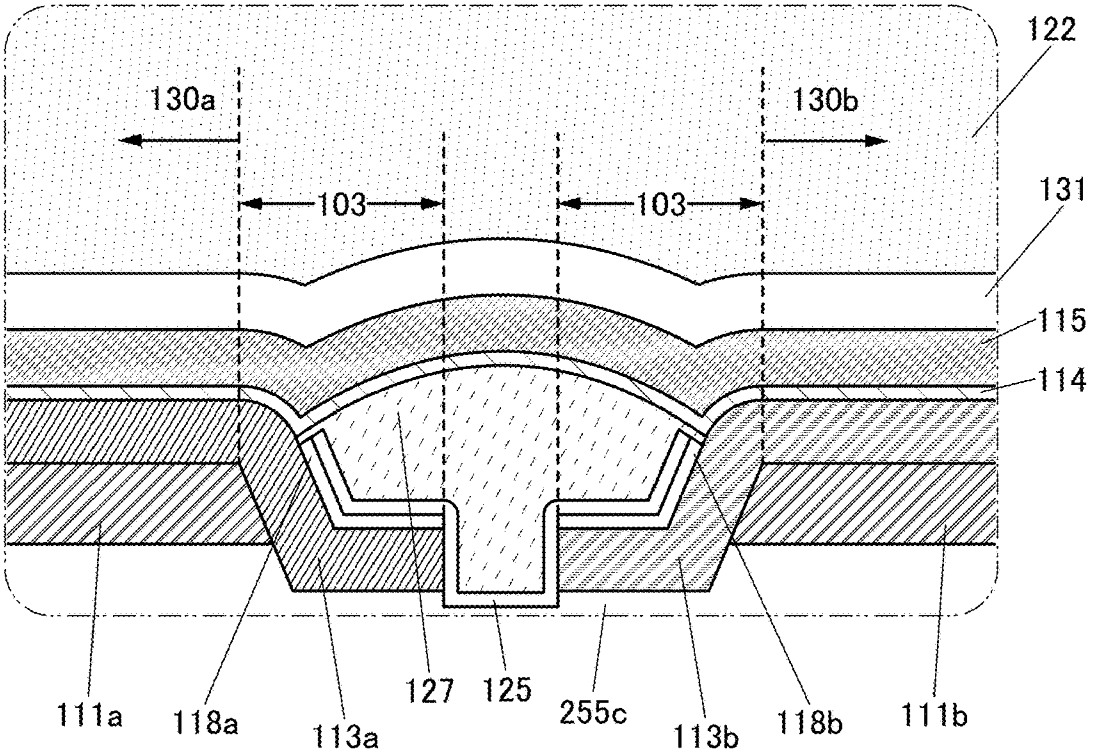

The enlarged view illustrated in FIG. 2A illustrates the width L2 of the second region 113_2. The second region 113_2 is a portion where the first layer 113*a* overlaps with at least one of a mask layer 118*a*, the insulating layer 125, and the insulating layer 127. In the first layer 113*a* or the like, a portion positioned on the outer side of the end of the top surface of the pixel electrode, like a region 103 illustrated in FIG. 6B, is a dummy region.

The width of the second region 113_2 is greater than or equal to 1 nm, preferably greater than or equal to 5 nm, greater than or equal to 50 nm, or greater than or equal to 100 nm. The width of the dummy region is preferably wider, in which case the quality of the light-emitting region can be more uniform and the light-emitting devices can have less variation in characteristics. In contrast, a narrower width of the dummy region can widen the light-emitting region and increase the aperture ratio of the pixel. Thus, the width of the second region 113_2 is preferably less than or equal to 50%, further preferably less than or equal to 40%, less than or equal to 30%, less than or equal to 20%, or less than or equal to 10% of the width L3 of the first region 113_1. Furthermore, for example, the width of the second region 113_2 in a small and high-resolution display device, such as a display device for a wearable device, is preferably less than or equal to 500 nm, further preferably less than or equal to 300 nm, less than or equal to 200 nm, or less than or equal to 150 nm.

Note that in the island-shaped EL layer, the first region (light-emitting region) is a region from which EL (Electroluminescence) emission is obtained. Furthermore, in the island-shaped EL layer, the first region (light-emitting region) and the second region (dummy region) are each a region from which PL (Photoluminescence) emission is obtained. Thus, the first region and the second region can be distinguished from each other by observing EL emission and PL emission.

The common electrode 115 is shared by the light-emitting devices 130*a*, 130*b*, and 130*c*. The common electrode 115 shared by the plurality of light-emitting devices is electrically connected to a conductive layer 123 provided in the connection portion 140 (see FIG. 10A and FIG. 10B). The conductive layer 123 is preferably formed using a conductive layer formed using the same material and in the same step as the pixel electrodes 111*a*, 111*b*, and 111*c*.

Note that FIG. 10A illustrates an example in which the common layer 114 is provided over the conductive layer 123, and the conductive layer 123 and the common electrode 115 are electrically connected to each other through the common layer 114. The common layer 114 is not necessarily provided in the connection portion 140. In FIG. 10B, the conductive layer 123 and the common electrode 115 are directly connected to each other. For example, by using a mask for specifying a film formation area (also referred to as an area mask, a rough metal mask, or the like to be distinguished from a fine metal mask), the common layer 114 can be formed in a region different from a region where the common electrode 115 is formed.

In FIG. 1B, the mask layer 118*a* is positioned over the first layer 113*a* included in the light-emitting device 130*a*, a mask layer 118*b* is positioned over the second layer 113*b* included in the light-emitting device 130*b*, and a mask layer 118*c* is positioned over the third layer 113*c* included in the light-emitting device 130*c*. The mask layers are provided to surround the first region 113_1 (light-emitting region). In other words, the mask layers have an opening in a portion overlapping with the light-emitting region. The top surface shape of the mask layer is the same as, substantially the same as, or similar to that of the second region 113_2 illustrated in FIG. 1C. The mask layer 118*a* is a remaining part of a mask layer provided in contact with the top surface of the first layer 113*a* at the time of processing the first layer 113*a*. Similarly, the mask layer 118*b* is a remaining part of a mask layer provided at the time of forming the second layer 113*b*, and the mask layer 118*c* is a remaining part of a mask layer provided at the time of forming the third layer 113*c*. Thus, the mask layer used to protect the EL layer in formation of the EL layer may partly remain in the display device of one embodiment of the present invention. For any two or all of the mask layer 118*a* to the mask layer 118*c*, the same material may be used or different materials may be used. Note that the mask layer 118*a*, the mask layer 118*b*, and the mask layer 118*c* are sometimes collectively referred to as a mask layer 118 below.

In FIG. 1B, one end portion (an outer end portion, which is opposite to the light-emitting region) of the mask layer 118*a* is aligned or substantially aligned with the end portion of the first layer 113*a*, and the other end portion of the mask layer 118*a* is positioned over the first layer 113*a*. Here, the other end portion (an inner end portion, which is on the light-emitting region side) of the mask layer 118*a* preferably overlaps with the first layer 113*a* and the pixel electrode 111*a*. In this case, the other end portion of the mask layer 118*a* is easily formed over a flat or substantially flat surface of the first layer 113*a*. Note that the same applies to the mask layer 118*b* and the mask layer 118*c*. The mask layer 118 remains between the top surface of the EL layer processed into an island shape (the first layer 113*a*, the second layer 113*b*, or the third layer 113*c*) and the insulating layer 125. The mask layer will be described in detail in Embodiment 2.

In the case where end portions are aligned or substantially aligned with each other and the case where top surface shapes are the same or substantially the same, it can be said that outlines of stacked layers at least partly overlap with each other in a top view. For example, the case of processing the upper layer and the lower layer with the use of the same mask pattern or mask patterns that are partly the same is included. Note that, in some cases, the outlines do not completely overlap with each other and the upper layer is positioned inward from the lower layer or the upper layer is positioned outward from the lower layer; such cases are also represented by the expression "end portions are substantially aligned with each other" or the expression "top surface shapes are substantially the same".

The side surfaces of the first layer 113*a*, the second layer 113*b*, and the third layer 113*c* are each covered with the insulating layer 125. The insulating layer 127 overlaps with the side surfaces of the first layer 113*a*, the second layer 113*b*, and the third layer 113*c* with the insulating layer 125 therebetween.

The top surfaces of the first layer 113*a*, the second layer 113*b*, and the third layer 113*c* are each partly covered with the mask layer 118. The insulating layer 125 and the insulating layer 127 overlap with parts of the top surfaces of the first layer 113*a*, the second layer 113*b*, and the third layer 113*c* with the mask layers 118 therebetween. Note that the top surface of each of the first layer 113*a*, the second layer 113*b*, and the third layer 113*c* is not limited to the top surface of a flat portion overlapping with the top surface of the pixel electrode, and can include the top surfaces of the inclined portion and the flat portion (see the region 103 in FIG. 6A) which are positioned on the outer side of the top surface of the pixel electrode.

The side surface and part of the top surface of each of the first layer 113*a*, the second layer 113*b*, and the third layer 113*c* are covered with at least one of the insulating layer 125, the insulating layer 127, and the mask layer 118, so that the common layer 114 (or the common electrode 115) can be inhibited from being in contact with the side surfaces of the pixel electrodes 111*a*, 111*b*, and 111*c*, the first layer 113*a*, the second layer 113*b*, and the third layer 113*c*, leading to inhibition of a short circuit of the light-emitting device. Accordingly, the reliability of the light-emitting device can be improved.

Although FIG. 1B illustrates the first layer 113*a* to the third layer 113*c* that have the same thickness, the present invention is not limited thereto. The first layer 113*a* to the third layer 113*c* may have different thicknesses. For example, the thickness is preferably set in accordance with an optical path length for intensifying light emitted from the first layer 113*a* to the third layer 113*c*. A microcavity structure can be achieved in this manner, and the color purity of each light-emitting device can be increased.

The insulating layer 125 is preferably in contact with the side surfaces of the first layer 113*a*, the second layer 113*b*, and the third layer 113*c* (see portions surrounded by dashed lines in the end portions of the first layer 113*a* and the second layer 113*b* and the vicinities thereof illustrated in FIG. 2A). The insulating layer 125 is configured to be in contact with the first layer 113*a*, the second layer 113*b*, and the third layer 113*c*, whereby film separation of the first layer 113*a*, the second layer 113*b*, and the third layer 113*c* can be prevented. When the insulating layer 125 is in close contact with the first layer 113*a*, the second layer 113*b*, or the third layer 113*c*, the first layer 113*a* and the like that are adjacent each other can be fixed or bonded to each other by the insulating layer 125. Accordingly, the reliability of the light-emitting device can be improved.

The manufacturing yield of the light-emitting device can also be improved.

As illustrated in FIG. 1B, the insulating layer 125 and the insulating layer 127 cover the side surface and part of the top surface of each of the first layer 113*a*, the second layer 113*b*, and the third layer 113*c*, whereby film separation of the EL layers can further be prevented and the reliability of the light-emitting device can be improved. The manufacturing yield of the light-emitting device can also be improved.

In the example illustrated in FIG. 1B, a stacked-layer structure of the first layer 113*a*, the mask layer 118*a*, the insulating layer 125, and the insulating layer 127 is positioned over the end portion of the pixel electrode 111*a*. Similarly, a stacked-layer structure of the second layer 113*b*, the mask layer 118*b*, the insulating layer 125, and the insulating layer 127 is positioned over the end portion of the pixel electrode 111*b*; and a stacked-layer structure of the third layer 113*c*, the mask layer 118*c*, the insulating layer 125, and the insulating layer 127 is positioned over the end portion of the pixel electrode 111*c*.

In FIG. 1B, the end portion of the pixel electrode 111*a* is covered with the first layer 113*a* and the insulating layer 125 is in contact with the side surface of the first layer 113*a*. Similarly, the end portion of the pixel electrode 111*b* is covered with the second layer 113*b*, the end portion of the pixel electrode 111*c* is covered with the third layer 113*c*, and the insulating layer 125 is in contact with the side surface of the second layer 113*b* and the side surface of the third layer 113*c*.

The insulating layer 127 is provided over the insulating layer 125 to fill a depressed portion in the insulating layer 125. The insulating layer 127 can be configured to overlap with the side surface and part of the top surface of each of the first layer 113*a*, the second layer 113*b*, and the third layer 113*c* with the insulating layer 125 therebetween. In other words, the insulating layer 127 is configured to cover the side surface and part of the top surface of each of the first layer 113*a*, the second layer 113*b*, and the third layer 113*c* with the insulating layer 125 therebetween. The insulating layer 127 preferably covers at least part of the side surface of the insulating layer 125.

The insulating layer 125 and the insulating layer 127 can fill a space between adjacent island-shaped EL layers, whereby the formation surface of the layers (e.g., the carrier-injection layer and the common electrode) provided over the island-shaped EL layers can have higher flatness with small unevenness. Consequently, coverage with the carrier-injection layer, the common electrode, and the like can be improved.

The common layer 114 and the common electrode 115 are provided over the first layer 113*a*, the second layer 113*b*, the third layer 113*c*, the mask layer 118, the insulating layer 125, and the insulating layer 127. Before the insulating layer 125 and the insulating layer 127 are provided, a step is generated due to a difference between a region where the pixel electrode and the island-shaped EL layer are provided and a region where neither the pixel electrode nor the island-shaped EL layer is provided (region between the light-emitting devices). In the display device of one embodiment of the present invention, the step can be eliminated with the insulating layer 125 and the insulating layer 127, and the coverage with the common layer 114 and the common electrode 115 can be improved. Thus, connection defects caused by step disconnection can be inhibited. In addition, an increase in electric resistance, which is caused by local thinning of the common electrode 115 due to the step, can be inhibited.

The top surface of the insulating layer 127 preferably has a shape with higher flatness, but may include a projection portion, a convex surface, a concave surface, or a depressed portion. For example, the top surface of the insulating layer 127 preferably has a smooth convex shape with high flatness.

Next, an example of materials for the insulating layer 125 and the insulating layer 127 is described.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer in forming the insulating layer 127 which is to be described later. In particular, when an inorganic insulating film such as an aluminum oxide film, a hafnium oxide film, or a silicon oxide film formed by an atomic layer deposition (ALD) method is used as the insulating layer 125, the insulating layer 125 having few pin holes and an excellent function of protecting the EL layer can be formed. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as having low permeability). Alternatively, a barrier property refers to a function of capturing or fixing (also referred to as gettering) a particular substance.

When the insulating layer 125 has a function of a barrier insulating layer or a gettering function, entry of impurities (typically, at least one of water and oxygen) that would diffuse into the light-emitting devices from the outside can be inhibited. With this structure, a highly reliable light-emitting device and a highly reliable display device can be provided.

The insulating layer 125 preferably has a low impurity concentration. Accordingly, degradation of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, it is desirable that one or both of the hydrogen concentration and the carbon concentration in the insulating layer 125 be sufficiently low.

Note that for the insulating layer 125 and the mask layers 118*a*, 118*b*, and 118*c*, the same material can be used. In this case, the boundary between the insulating layer 125 and any of the mask layers 118*a*, 118*b*, and 118*c* is unclear and thus the layers cannot be distinguished from each other in some cases. Thus, the insulating layer 125 and any of the mask layers 118*a*, 118*b*, and 118*c* are sometimes observed as one layer. In other words, in some cases, one layer is observed as being provided in contact with the side surface and part of the top surface of each of the first layer 113*a*, the second layer 113*b*, and the third layer 113*c* and the insulating layer 127 is observed as covering at least part of the side surface of the one layer.

The insulating layer 127 provided over the insulating layer 125 has a function of filling large unevenness of the insulating layer 125, which is formed between the adjacent light-emitting devices. In other words, the insulating layer 127 has an effect of improving the flatness of the formation surface of the common electrode 115.

As the insulating layer 127, an insulating layer containing an organic material can be favorably used. As the organic material, a photosensitive organic resin is preferably used, and for example, a photosensitive resin composite containing an acrylic resin is preferably used. Note that in this specification and the like, an acrylic resin refers to not only a polymethacrylic acid ester or a methacrylic resin, but also all the acrylic-based polymers in a broad sense in some cases.

Alternatively, for the insulating layer 127, it is possible to use an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. Alternatively, for the insulating layer 127, it is possible to use an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used for the photosensitive resin. As the photosensitive organic resin, either a positive material or a negative material may be used.

For the insulating layer 127, a material absorbing visible light may be used. When the insulating layer 127 absorbs light from the light-emitting device, leakage of light (stray light) from the light-emitting device to the adjacent light-emitting device through the insulating layer 127 can be inhibited. Thus, the display quality of the display device can be improved. Since no polarizing plate is required to improve the display quality, the weight and thickness of the display device can be reduced.

Examples of the material absorbing visible light include materials containing pigment of black or the like, materials containing dye, light-absorbing resin materials (e.g., polyimide), and resin materials that can be used for color filters (color filter materials). Using a resin material obtained by stacking or mixing color filter materials of two colors or three or more colors is particularly preferred, in which case the effect of blocking visible light can be enhanced. In particular, mixing color filter materials of three or more colors enables the formation of a black or nearly black resin layer.

Next, a structure of the insulating layer 127 and the vicinity thereof will be described with reference to FIG. 2A and FIG. 2B. FIG. 2A is an enlarged cross-sectional view of a region including the insulating layer 127 between the light-emitting device 130*a* and the light-emitting device 130*b*, and the vicinity of the insulating layer 127. Although the insulating layer 127 between the light-emitting device 130*a* and the light-emitting device 130*b* is described below as an example, the same applies to the insulating layer 127 between the light-emitting device 130*b* and the light-emitting device 130*c*, the insulating layer 127 between the light-emitting device 130*c* and the light-emitting device 130*a*, and the like. FIG. 2B is an enlarged view of an end portion of the insulating layer 127 over the second layer 113*b* and the vicinity thereof illustrated in FIG. 2A. Although the end portion of the insulating layer 127 over the second layer 113*b* is sometimes described below as an example, the same applies to an end portion of the insulating layer 127 over the first layer 113*a*, an end portion of the insulating layer 127 over the third layer 113*c*, and the like.

As illustrated in FIG. 2A, the first layer 113*a* is provided to cover the pixel electrode 111*a* and the second layer 113*b* is provided to cover the pixel electrode 111*b*. The mask layer 118*a* is provided in contact with part of the top surface of the first layer 113*a*, and the mask layer 118*b* is provided in contact with part of the top surface of the second layer 113*b*. The insulating layer 125 is provided in contact with the top surface and the side surface of the mask layer 118*a*, the side surface of the first layer 113*a*, the top surface of the insulating layer 255*c*, the top surface and the side surface of the mask layer 118*b*, and the side surface of the second layer 113*b*. The insulating layer 125 covers part of the top surface of the first layer 113*a* and part of the top surface of the second layer 113*b*. The insulating layer 127 is provided in contact with the top surface of the insulating layer 125. The insulating layer 127 overlaps with the side surface and part of the top surface of the first layer 113*a* and the side surface and part of the top surface of the second layer 113*b* with the insulating layer 125 therebetween, and is in contact with at least part of the side surface of the insulating layer 125. The common layer 114 is provided to cover the first layer 113*a*, the mask layer 118*a*, the second layer 113*b*, the mask layer 118*b*, the insulating layer 125, and the insulating layer 127, and the common electrode 115 is provided over the common layer 114.

The insulating layer 127 is formed in a region between two island-shaped EL layers (e.g., a region between the first layer 113*a* and the second layer 113*b* in FIG. 2A). At this time, at least part of the insulating layer 127 is placed at a position interposed between an end portion of the side surface of one of the EL layers (e.g., the first layer 113*a* in FIG. 2A) and an end portion of the side surface of the other of the EL layers (e.g., the second layer 113*b* in FIG. 2A). Providing the insulating layer 127 in such a manner can prevent formation of a disconnected portion and a locally thinned portion in the common layer 114 and the common electrode 115 that are formed over the island-shaped EL layers and the insulating layer 127.

As illustrated in FIG. 2B, the end portion of the insulating layer 127 preferably has a tapered shape with a taper angle θ1 in the cross-sectional view of the display device. The taper angle θ1 is an angle formed by the side surface of the insulating layer 127 and the substrate surface. Note that the taper angle θ1 is not limited to the angle with the substrate surface, and may be an angle formed by the side surface of the insulating layer 127 and the top surface of the flat portion of the second layer 113*b* or the top surface of the flat portion of the pixel electrode 111*b*.

The taper angle θ1 of the insulating layer 127 is less than 90°, preferably less than or equal to 60°, further preferably less than or equal to 45°, still further preferably less than or equal to 20°. When the end portion of the insulating layer 127 has such a forward tapered shape, the common layer 114 and the common electrode 115 that are provided over the insulating layer 127 can be formed with favorable coverage, thereby inhibiting step disconnection, local thinning, or the like. Accordingly, the in-place uniformity of the common layer 114 and the common electrode 115 can be improved, leading to higher display quality of the display device.

As illustrated in FIG. 2A, in a cross-sectional view of the display device, the top surface of the insulating layer 127 preferably has a convex shape. The convex shape of the top surface of the insulating layer 127 is preferably a shape gently bulged toward the center. It is also preferable that the convex portion in the center portion of the top surface of the insulating layer 127 have a shape gently connected to a tapered portion in the end portion. When the insulating layer 127 has such a shape, the common layer 114 and the common electrode 115 can be formed with good coverage over the entire top surface of the insulating layer 127.

As illustrated in FIG. 2B, the end portion of the insulating layer 127 is preferably positioned outward from the end portion of the insulating layer 125. In this case, unevenness of the formation surface of the common layer 114 and the common electrode 115 can be reduced and coverage with the common layer 114 and the common electrode 115 can be improved.

As illustrated in FIG. 2B, the end portion of the insulating layer 125 preferably has a tapered shape with a taper angle θ2 in the cross-sectional view of the display device. The taper angle θ2 is an angle formed by the side surface of the insulating layer 125 and the substrate surface. Note that the taper angle θ2 is not limited to the angle with the substrate surface, and may be an angle formed by the side surface of the insulating layer 125 and the top surface of the flat portion of the second layer 113*b* or the top surface of the flat portion of the pixel electrode 111*b*.

The taper angle θ2 of the insulating layer 125 is less than 90°, preferably less than or equal to 60°, further preferably less than or equal to 45°, still further preferably less than or equal to 20°.

As illustrated in FIG. 2B, the end portion of the mask layer 118*b* preferably has a tapered shape with a taper angle θ3 in the cross-sectional view of the display device. The taper angle θ3 is an angle formed by the side surface of the mask layer 118*b* and the substrate surface. Note that the taper angle θ3 is not limited to the angle with the substrate surface, and may be an angle formed by the side surface of the insulating layer 127 and the top surface of the flat portion of the second layer 113*b* or the top surface of the flat portion of the pixel electrode 111*b*.

The taper angle θ3 of the mask layer 118*b* is less than 90°, preferably less than or equal to 60°, further preferably less than or equal to 45°, still further preferably less than or equal to 20°. When the mask layer 118*b* has such a forward tapered shape, the common layer 114 and the common electrode 115 that are provided over the mask layer 118*b* can be formed with favorable coverage.

The end portion of the mask layer 118*a* and the end portion of the mask layer 118*b* are each preferably positioned outward from the end portion of the insulating layer 125. In this case, unevenness of the formation surface of the common layer 114 and the common electrode 115 can be reduced and coverage with the common layer 114 and the common electrode 115 can be improved.

Although the details will be described in Embodiment 2, when the insulating layer 125 and the mask layer 118 are collectively etched, the insulating layer 125 and the mask layer 118 below the end portion of the insulating layer 127 are eliminated by side etching and accordingly a cavity (also referred to as a hole) is formed in some cases. The cavity causes unevenness in the formation surface of the common layer 114 and the common electrode 115, so that step disconnection is likely to occur in the common layer 114 and the common electrode 115. Thus, the etching treatment is performed in two separate steps with heat treatment performed between the two etching steps, whereby even when a cavity is formed by the first etching treatment, the cavity can be filled with the insulating layer 127 deformed by the heat treatment. In addition, since the second etching treatment etches a thin film, the amount of side etching is small and thus a cavity is not easily formed, and even if a cavity is formed, it can be extremely small. Thus, generation of unevenness in the formation surface of the common layer 114 and the common electrode 115 can be inhibited and accordingly step disconnection of the common layer 114 and the common electrode 115 can be inhibited. Since the etching treatment is performed twice as described above, the taper angle θ2 and the taper angle θ3 might be different angles. The taper angle θ2 and the taper angle θ3 may be the same angle. Each of the taper angle θ2 and the taper angle θ3 might be an angle less than the taper angle θ1.

The insulating layer 127 covers at least part of the side surface of the mask layer 118*a* and at least part of the side surface of the mask layer 118*b* in some cases. For example, FIG. 2B illustrates an example in which the insulating layer 127 touches and covers an inclined surface positioned at an end portion of the mask layer 118*b* which is formed by the first etching treatment, and an inclined surface positioned at an end portion of the mask layer 118*b* which is formed by the second etching treatment is exposed. In some cases, these two inclined surfaces can be distinguished from each other depending on their different taper angles. There might be almost no difference between the taper angles formed at the side surfaces by the two etching steps; in this case, the inclined surfaces cannot be distinguished from each other.

Figure 3A:
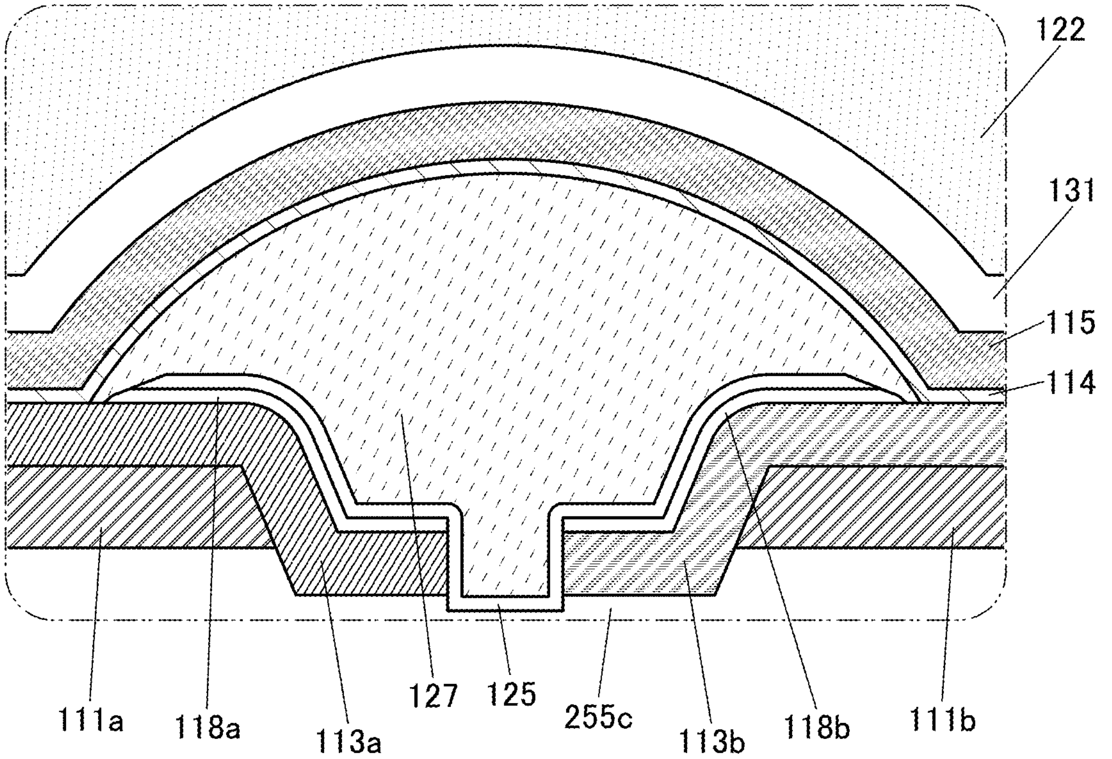
FIG. 3A and FIG. 3B are cross-sectional views illustrating an example of a display device.
Figure 3B:
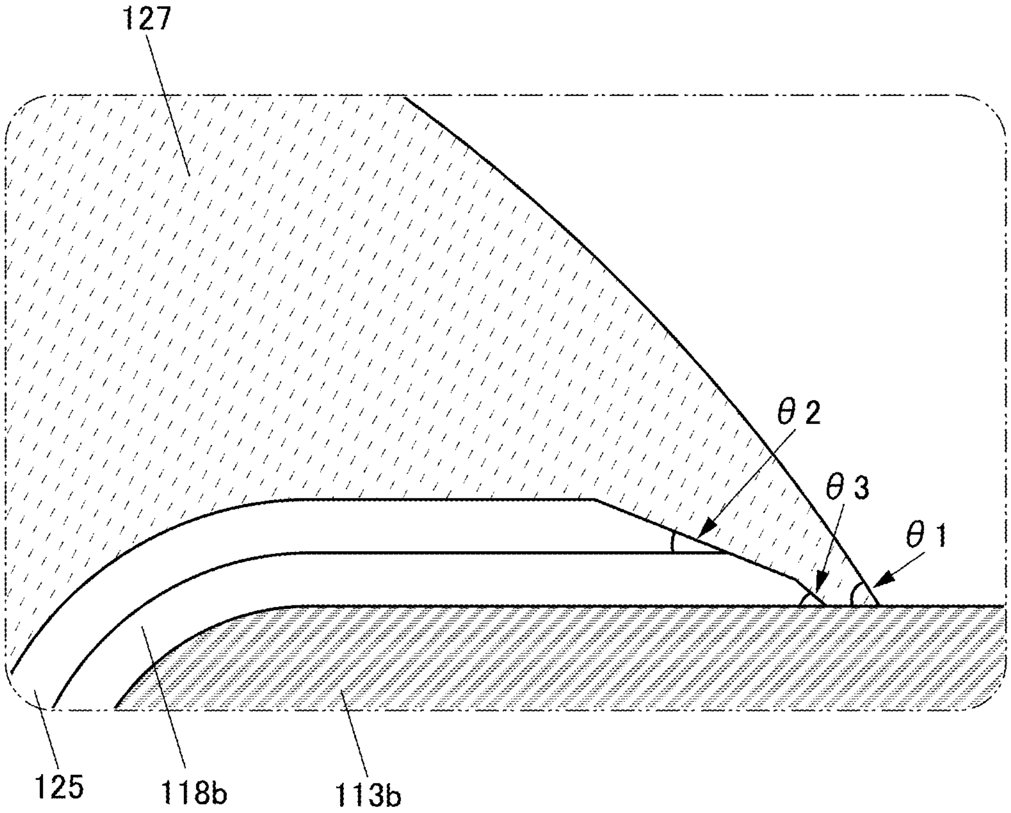

FIG. 3A and FIG. 3B illustrate an example in which the insulating layer 127 covers the entire side surface of the mask layer 118*a* and the entire side surface of the mask layer 118*b*. Specifically, in FIG. 3B, the insulating layer 127 touches and covers both of the two inclined surfaces. This is preferable because unevenness of the formation surface of the common layer 114 and the common electrode 115 can be further reduced. FIG. 3B illustrates an example in which the end portion of the insulating layer 127 is positioned outward from the end portion of the mask layer 118*b*. As illustrated in FIG. 2B, the end portion of the insulating layer 127 may be positioned inward from the end portion of the mask layer 118*b*, or may be aligned or substantially aligned with the end portion of the mask layer 118*b*. As illustrated in FIG. 3B, the insulating layer 127 is in contact with the second layer 113*b* in some cases.

FIG. 4A, FIG. 4B, FIG. 5A, and FIG. 5B illustrate examples in which the side surface of the insulating layer 127 has a concave shape (also referred to as a narrowed portion, a depressed portion, a dent, a hollow, or the like). Depending on the materials and the formation conditions (e.g., heating temperature, heating time, and heating atmosphere) of the insulating layer 127, the side surface of the insulating layer 127 has a concave shape in some cases.

Figure 4A:
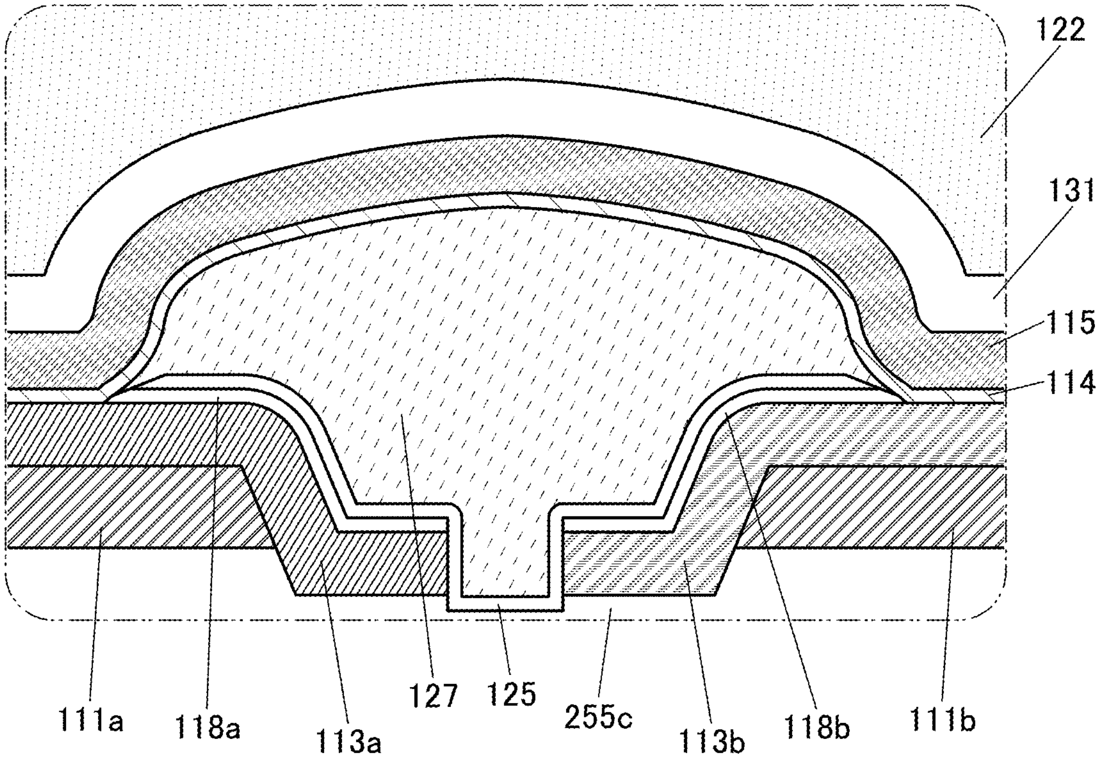
FIG. 4A and FIG. 4B are cross-sectional views illustrating an example of a display device.
Figure 4B:
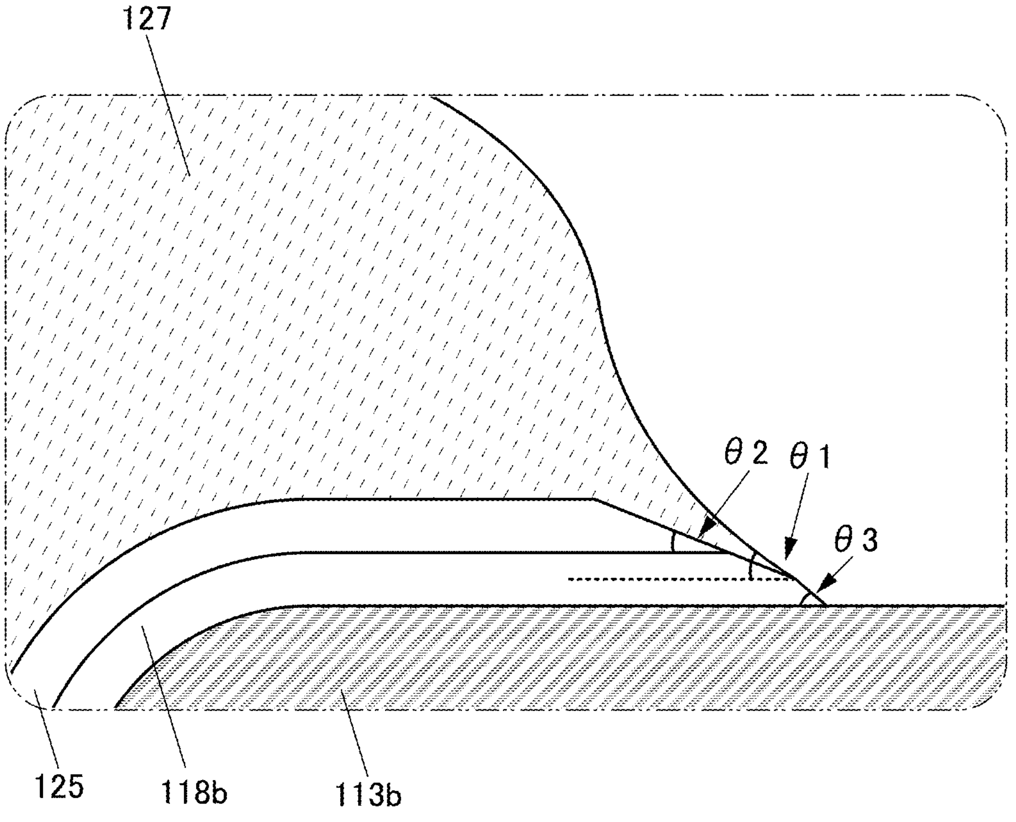
Figure 5A:
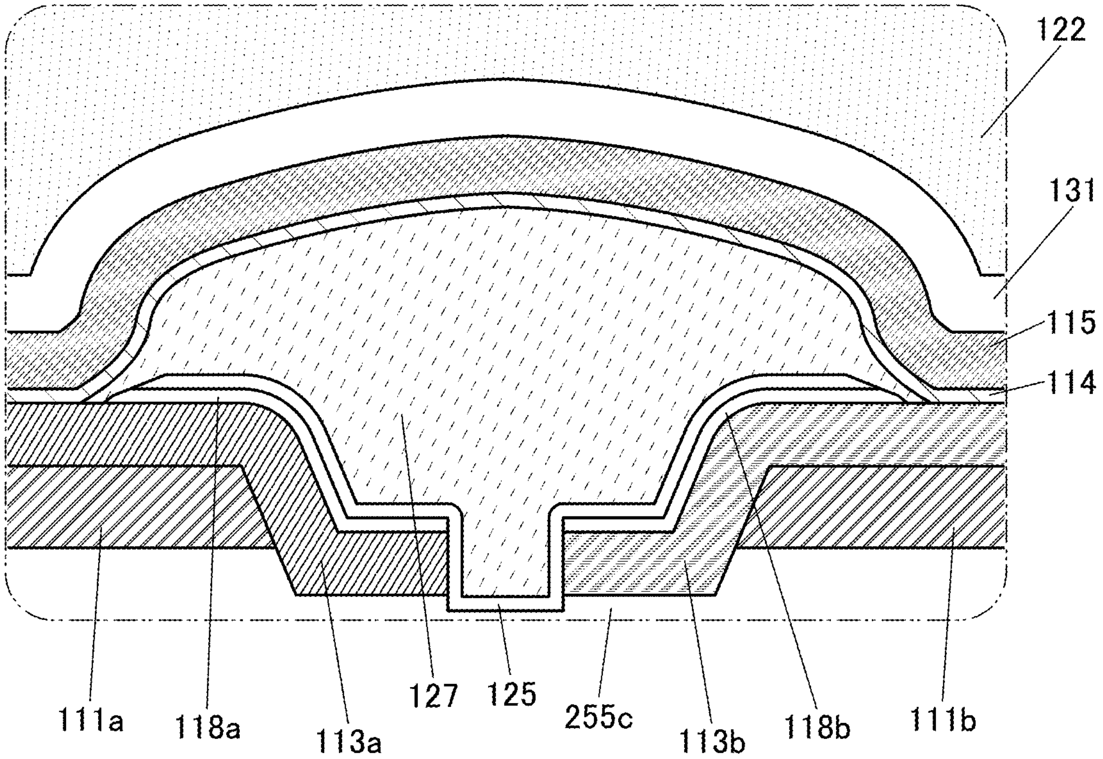
FIG. 5A and FIG. 5B are cross-sectional views illustrating an example of a display device.
Figure 5B:
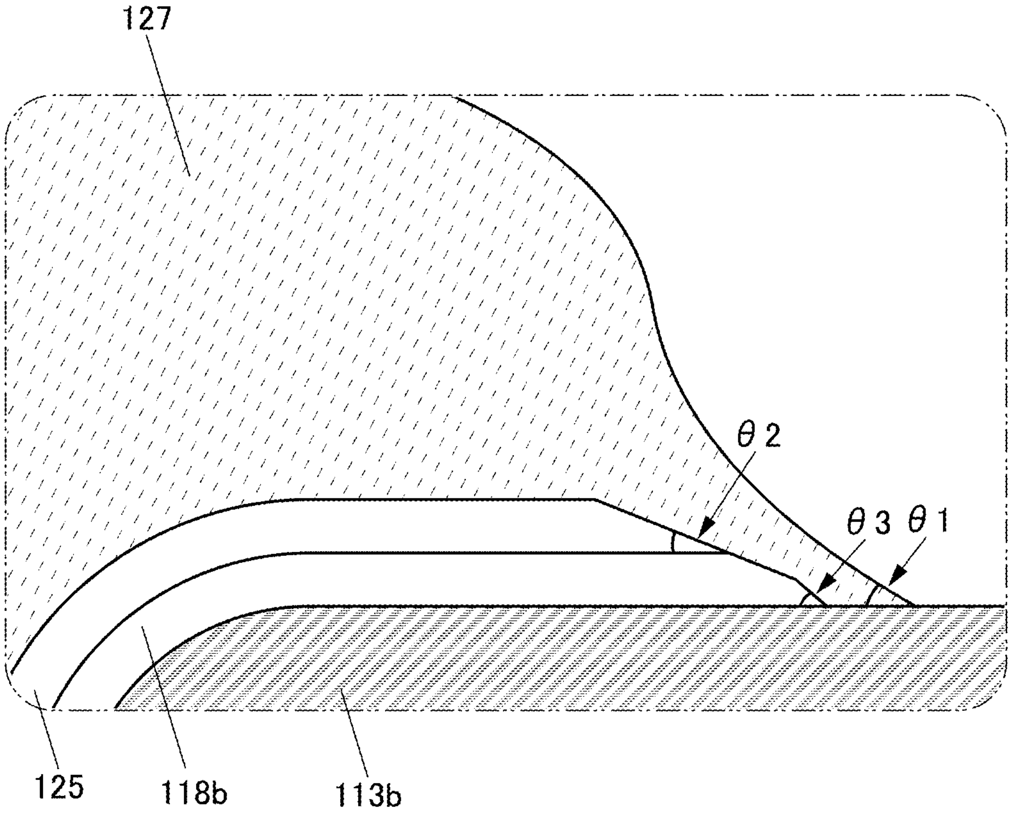

FIG. 4A and FIG. 4B illustrate an example in which the insulating layer 127 covers part of the side surface of the mask layer 118*b* and the other part of the side surface of the mask layer 118*b* is exposed. FIG. 5A and FIG. 5B illustrate an example in which the insulating layer 127 touches and covers the entire side surface of the mask layer 118*a* and the entire side surface of the mask layer 118*b*.

Also in FIG. 3 to FIG. 5, the taper angle θ1 to the taper angle Ø3 are preferably within the above range.

As illustrated in FIG. 2 to FIG. 5, one end portion of the insulating layer 127 preferably overlaps with the top surface of the pixel electrode 111*a* and the other end portion of the insulating layer 127 preferably overlaps with the top surface of the pixel electrode 111*b*. Such a structure enables the end portion of the insulating layer 127 to be formed over flat or substantially flat regions of the first layer 113*a* and the second layer 113*b*. This makes it relatively easy to form a tapered shape in each of the insulating layer 127, the insulating layer 125, and the mask layer 118. In addition, film separation of the pixel electrodes 111*a* and 111*b*, the first layer 113*a*, and the second layer 113*b* can be inhibited. Meanwhile, a portion where the top surface of the pixel electrode and the insulating layer 127 overlap with each other is preferably smaller because the light-emitting region of the light-emitting device can be wider and the aperture ratio can be higher.

Note that the insulating layer 127 does not necessarily overlap with the top surface of the pixel electrode. As illustrated in FIG. 6A, the insulating layer 127 does not necessarily overlap with the top surface of the pixel electrode, and one end portion of the insulating layer 127 may overlap with the side surface of the pixel electrode 111*a* and the other end portion of the insulating layer 127 may overlap with the side surface of the pixel electrode 111*b*. As illustrated in FIG. 6B, the insulating layer 127 does not necessarily overlap with the pixel electrode, and may be provided in a region interposed between the pixel electrode 111*a* and the pixel electrode 111*b*. In FIG. 6A and FIG. 6B, part or the whole of the top surfaces of the first layer 113*a* and the second layer 113*b* in the inclined portion and the flat portion (the region 103) positioned on the outer side of the top surface of the pixel electrode is covered with the mask layer 118, the insulating layer 125, and the insulating layer 127. Even such a structure can reduce unevenness of the formation surface of the common layer 114 and the common electrode 115 and improve the coverage with the common layer 114 and the common electrode 115, as compared with the structure in which the mask layer 118, the insulating layer 125, and the insulating layer 127 are not provided. Note that the region 103 can be referred to as a dummy region.

Figure 7A:
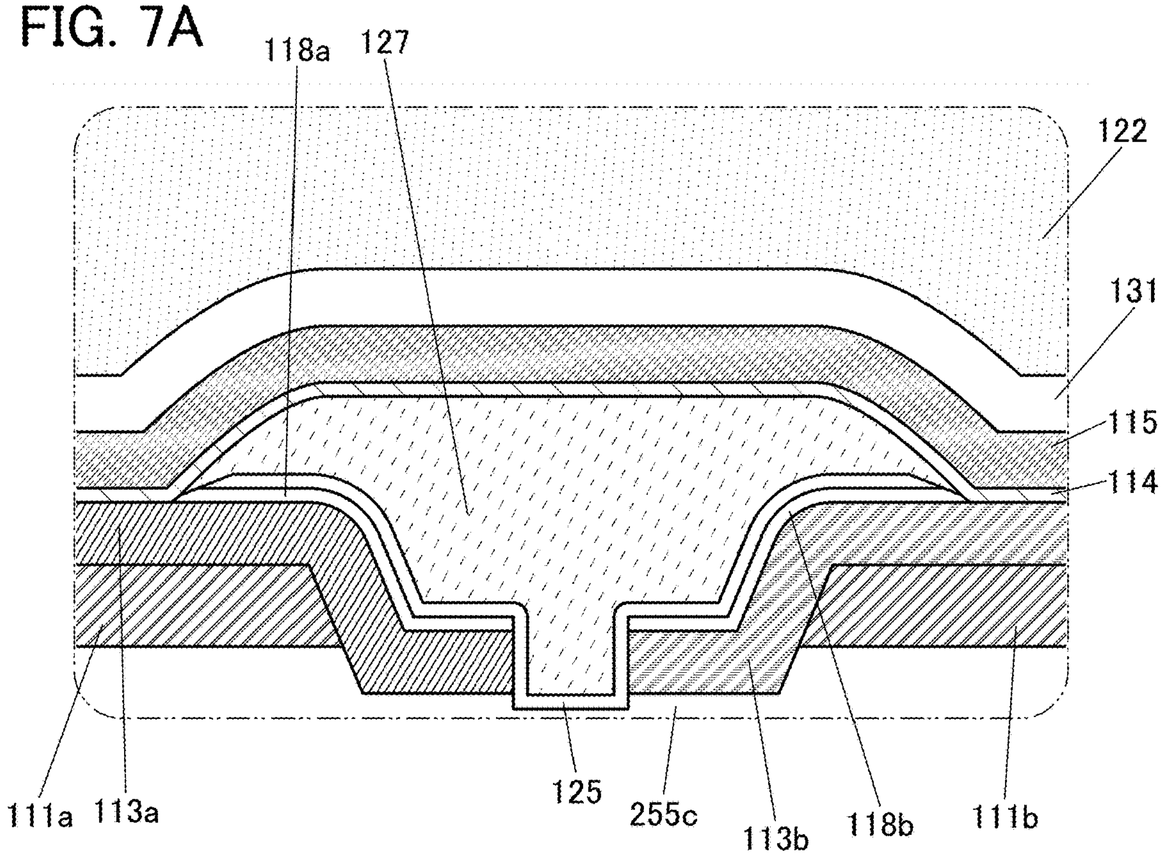
FIG. 7A and FIG. 7B are cross-sectional views illustrating examples of a display device.

As illustrated in FIG. 7A, the top surface of the insulating layer 127 may have a flat portion in a cross-sectional view of the display device.

Figure 7B:
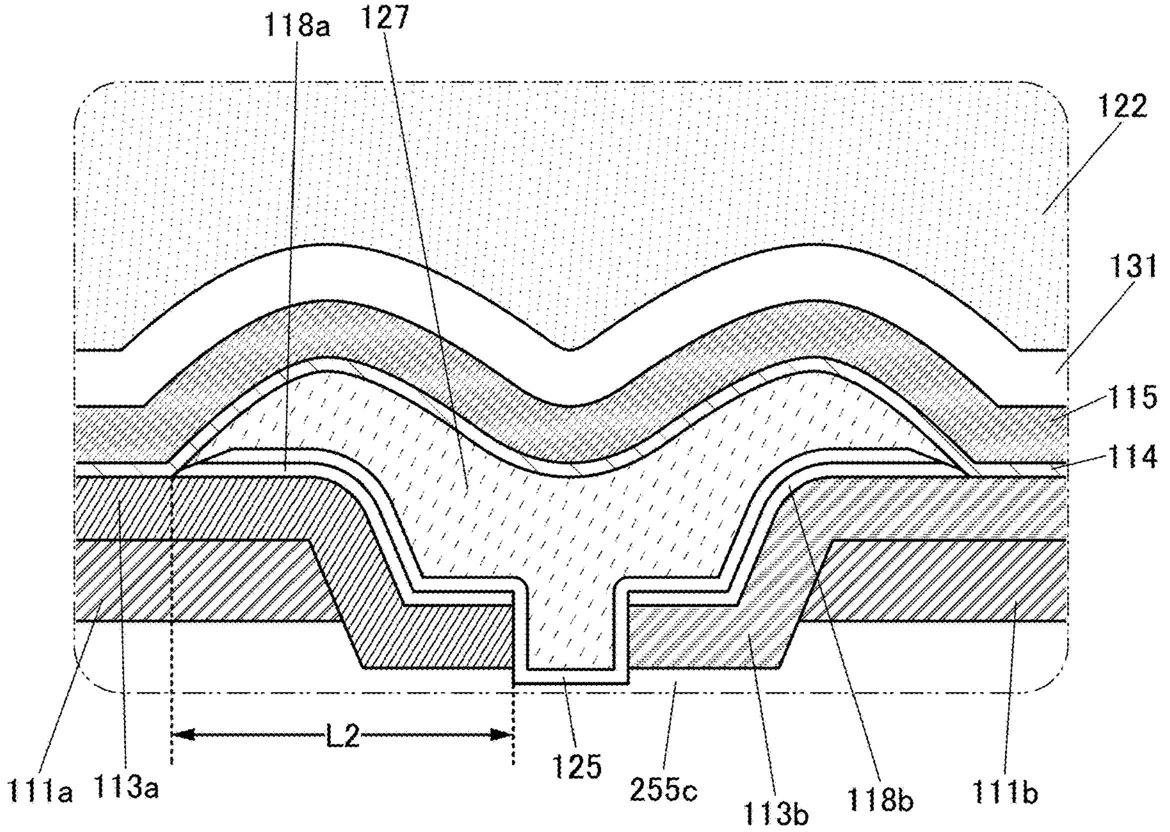

As illustrated in FIG. 7B, the top surface of the insulating layer 127 may have a concave shape in a cross-sectional view of the display device. In FIG. 7B, the top surface of the insulating layer 127 has a shape that is gently bulged toward the center, i.e., includes a convex surface, and has a shape that is recessed in the center and its vicinity, i.e., includes a concave surface. In FIG. 7B, the convex portion of the top surface of the insulating layer 127 has a shape gently connected to the tapered portion in the end portion. Even when the insulating layer 127 has such a shape, the common layer 114 and the common electrode 115 can be formed with good coverage over the entire top surface of the insulating layer 127.

To form a structure in which the insulating layer 127 includes a concave surface in its center portion as illustrated in FIG. 7B, a light exposure method using a multi-tone mask (typically, a half-tone mask or a gray-tone mask) can be employed. A multi-tone mask is a mask capable of light exposure of three light-exposure levels to provide an exposed portion, a half-exposed portion, and an unexposed portion, and is a light-exposure mask through which light is transmitted to have a plurality of intensities. The insulating layer 127 including regions with a plurality of (typically two kinds of) thicknesses can be formed with one photomask (one light exposure and development process).

Note that a method for forming a concave surface in the center portion of the insulating layer 127 is not limited to the above method. For example, an exposed portion and a half-exposed portion may be formed separately with the use of two photomasks. Alternatively, the viscosity of the resin material used for the insulating layer 127 may be adjusted; specifically, the viscosity of the material used for the insulating layer 127 may be less than or equal to 10 cP, preferably greater than or equal to 1 cP and less than or equal to 5 cP.

Although not illustrated, the concave surface in the center portion of the insulating layer 127 is not necessarily continuous, and may be disconnected between adjacent light-emitting devices. In this case, part of the insulating layer 127 in the center portion of the insulating layer 127 illustrated in FIG. 7B is eliminated, so that the surface of the insulating layer 125 is exposed. In the case of such a structure, the common layer 114 and the common electrode 115 are formed to have shapes covering the insulating layer 125.

As described above, in the structures illustrated in FIG. 2 to FIG. 7, providing the insulating layer 127, the insulating layer 125, the mask layer 118*a*, and the mask layer 118*b* enables the common layer 114 and the common electrode 115 to be formed with favorable coverage from the flat or substantially flat region of the first layer 113*a* to the flat or substantially flat region of the second layer 113*b*. It is also possible to prevent formation of a disconnected portion and a locally thinned portion in the common layer 114 and the common electrode 115. This can inhibit the common layer 114 and the common electrode 115 between light-emitting devices from having connection defects due to the disconnected portion and an increased electric resistance due to the locally thinned portion. Thus, the display quality of the display device of one embodiment of the present invention can be improved.

The protective layer 131 is preferably provided over the light-emitting devices 130*a*, 130*b*, and 130*c*. Providing the protective layer 131 can improve the reliability of the light-emitting device. The protective layer 131 may have a single-layer structure or a stacked-layer structure, and may have a stacked-layer structure including two or more layers.

There is no limitation on the conductivity of the protective layer 131. As the protective layer 131, at least one type of insulating films, semiconductor films, and conductive films can be used.

The protective layer 131 including an inorganic film can inhibit deterioration of the light-emitting device by preventing oxidation of the common electrode 115 and inhibiting entry of impurities (e.g., moisture and oxygen) into the light-emitting device, for example; thus, the reliability of the display device can be improved.

As the protective layer 131, an inorganic insulating film such as an oxide insulating film, a nitride insulating film, an oxynitride insulating film, or a nitride oxide insulating film can be used, for example. Specific examples of these inorganic insulating films are as listed in the description of the insulating layer 125. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can employ, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer. Furthermore, the protective layer 131 may include an organic film. For example, the protective layer 131 may include both an organic film and an inorganic film. Examples of an organic material that can be used for the protective layer 131 include organic insulating materials that can be used for the insulating layer 127.

The protective layer 131 may have a stacked structure of two layers which are formed by different film formation methods. Specifically, the first layer of the protective layer 131 may be formed by an ALD method, and the second layer of the protective layer 131 may be formed by a sputtering method.

A light-blocking layer may be provided on the surface of the substrate 120 on the resin layer 122 side. Moreover, a variety of optical members can be provided on the outer surface of the substrate 120. Examples of optical members include a polarizing plate, a retardation plate, a light diffusion layer (e.g., a diffusion film), an anti-reflective layer, and a light-condensing film. Furthermore, a surface protective layer such as an antistatic film inhibiting the attachment of dust, a water repellent film inhibiting the attachment of stain, a hard coat film inhibiting generation of a scratch caused by the use, or an impact-absorbing layer may be provided on the outer surface of the substrate 120. For example, it is preferable to provide, as the surface protective layer, a glass layer or a silica layer ($SiO_x$ layer) because the surface contamination and generation of damage can be inhibited. For the surface protective layer, DLC (diamond like carbon), aluminum oxide ($AlO_x$), a polyester-based material, a polycarbonate-based material, or the like may be used. For the surface protective layer, a material having a high visible-light-transmitting property is preferably used. For the surface protective layer, a material with high hardness is preferably used.

For the substrate 120, glass, quartz, ceramic, sapphire, a resin, a metal, an alloy, a semiconductor, or the like can be used. For the substrate through which light from the light-emitting device is extracted, a material that transmits the light is used. When a flexible material is used for the substrate 120, the flexibility of the display device can be increased and a flexible display can be provided. Furthermore, a polarizing plate may be used as the substrate 120.

For the substrate 120, it is possible to use polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, and the like. Glass that is thin enough to have flexibility may be used as the substrate 120.

In the case where a circularly polarizing plate overlaps with the display device, a highly optically isotropic substrate is preferably used as the substrate included in the display device. A highly optically isotropic substrate has a low birefringence (i.e., a small amount of birefringence). The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

In the case where a film is used as the substrate and the film absorbs water, the shape of the display device might be changed, e.g., creases might be caused. Thus, as the substrate, a film with a low water absorption rate is preferably used. For example, a film with a water absorption rate lower than or equal to 1% is preferably used, a film with a water absorption rate lower than or equal to 0.1% is further preferably used, and a film with a water absorption rate lower than or equal to 0.01% is still further preferably used.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. A two-liquid-mixture-type resin may be used. An adhesive sheet or the like may be used.

As materials that can be used for a gate, a source, and a drain of a transistor and conductive layers such as wirings and electrodes included in the display device, any of metals such as aluminum, titanium, chromium, nickel, copper, yttrium, zirconium, molybdenum, silver, tantalum, and tungsten, or an alloy containing any of these metals as its main component can be given, for example. A film containing any of these materials can be used in a single layer or as a stacked-layer structure.

As a conductive material having a light-transmitting property, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Further alternatively, a nitride of the metal material (e.g., titanium nitride) or the like may be used. Note that in the case of using the metal material or the alloy material (or the nitride thereof), the thickness is preferably set small enough to be able to transmit light. Furthermore, a stacked-layer film of the above materials can be used as a conductive layer. For example, a stacked film of indium tin oxide and an alloy of silver and magnesium, or the like is preferably used for increased conductivity. They can also be used for conductive layers such as wirings and electrodes included in the display device, and conductive layers (e.g., a conductive layer functioning as a pixel electrode or a counter electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

Figure 8A:
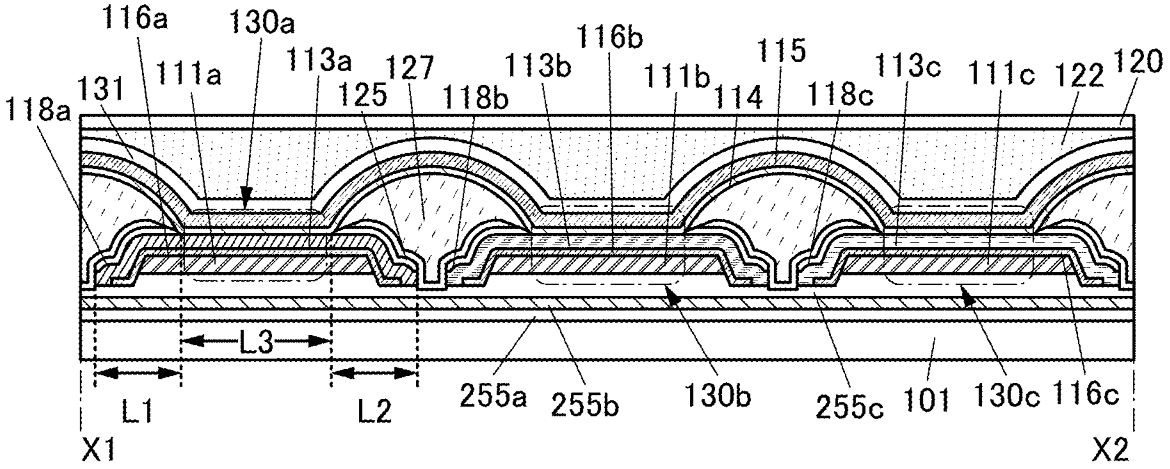
FIG. 8A is a cross-sectional view illustrating an example of a display device.
Figure 8B:
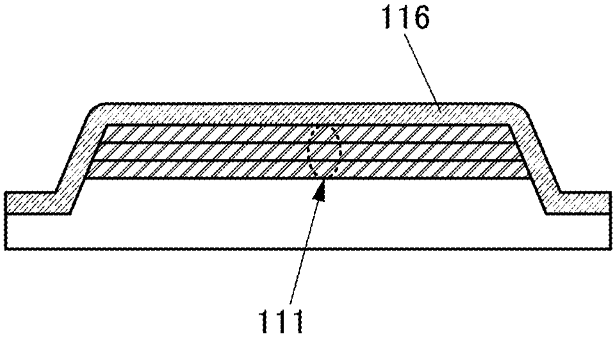
FIG. 8B and FIG. 8C are cross-sectional views illustrating examples of a pixel electrode.
Figure 8C:
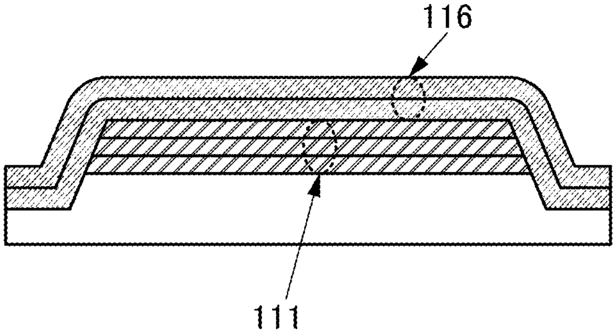

FIG. 8A illustrates a variation example of FIG. 1B. FIG. 8A illustrates an example in which top and side surfaces of the pixel electrode 111$a$, top and side surfaces of the pixel electrode 111$b$, and top and side surfaces of the pixel electrode 111$c$ are covered with a conductive layer 116$a$, a conductive layer 116$b$, and a conductive layer 116$c$, respectively. The conductive layers 116$a$, 116$b$, and 116$c$ can be regarded as part of the pixel electrodes.

In FIG. 1B, side surfaces of the pixel electrode 111$a$ are in contact with the first layer 113$a$. In the case where the pixel electrode 111$a$ has a stacked-layer structure, a plurality of conductive layers are in contact with the first layer 113$a$. This might cause the adhesion between the pixel electrode 111$a$ and the first layer 113$a$ to be partly low. The same applies to the adhesion between the pixel electrode 111$b$ and the second layer 113$b$ and the adhesion between the pixel electrode 111$c$ and the third layer 113$c$.

In the case where part of a film to be the conductive layers 116$a$, 116$b$, and 116$c$ is removed by wet etching after the formation of the pixel electrodes 111$a$, 111$b$, and 111$c$, galvanic corrosion might occur in the pixel electrodes 111$a$, 111$b$, and 111$c$ that are exposed to an etchant.

In FIG. 8A, the top and side surfaces of the pixel electrodes 111$a$, 111$b$, and 111$c$ are covered with the conductive layers 116$a$, 116$b$, and 116$c$, respectively, whereby the pixel electrodes 111$a$, 111$b$, and 111$c$ can be inhibited from being exposed to the etchant and deteriorating due to galvanic corrosion or the like. Accordingly, the range of choices of the material for the pixel electrode 111$a$ can be widened. In addition, since the first layer 113$a$ and the conductive layer 116$a$ are in contact with each other, uniform adhesion can be achieved.

In the case of a top-emission display device, an electrode having a visible-light-reflecting property (a reflective electrode) is preferably used as the pixel electrodes 111$a$, 111$b$, and 111$c$, and an electrode having a visible-light-transmitting property (a transparent electrode) is preferably used as the conductive layers 116$a$, 116$b$, and 116$c$.

In FIG. 8B, the pixel electrode 111 has a three-layer structure and the conductive layer 116 has a single-layer structure. For example, a three-layer structure of a titanium film, an aluminum film, and a titanium film is preferably used for the pixel electrode 111, and an oxide conductive layer (e.g., In—Si—Sn oxide (also referred to as ITSO)) is preferably used as the conductive layer 116. An aluminum film is suitable for a reflective electrode because of its high reflectivity. However, when aluminum and the oxide conductive layer are in contact with each other, electrochemical corrosion might occur. For this reason, a titanium film is preferably provided between the aluminum film and the oxide conductive layer.

In FIG. 8C, the pixel electrode 111 has a three-layer structure and the conductive layer 116 has a two-layer structure. For example, a three-layer structure of a titanium film, an aluminum film, and a titanium film is preferably used for the pixel electrode 111, and a two-layer structure of a titanium film and an oxide conductive layer (e.g., ITSO) is preferably used for the conductive layer 116.

Figure 9A:
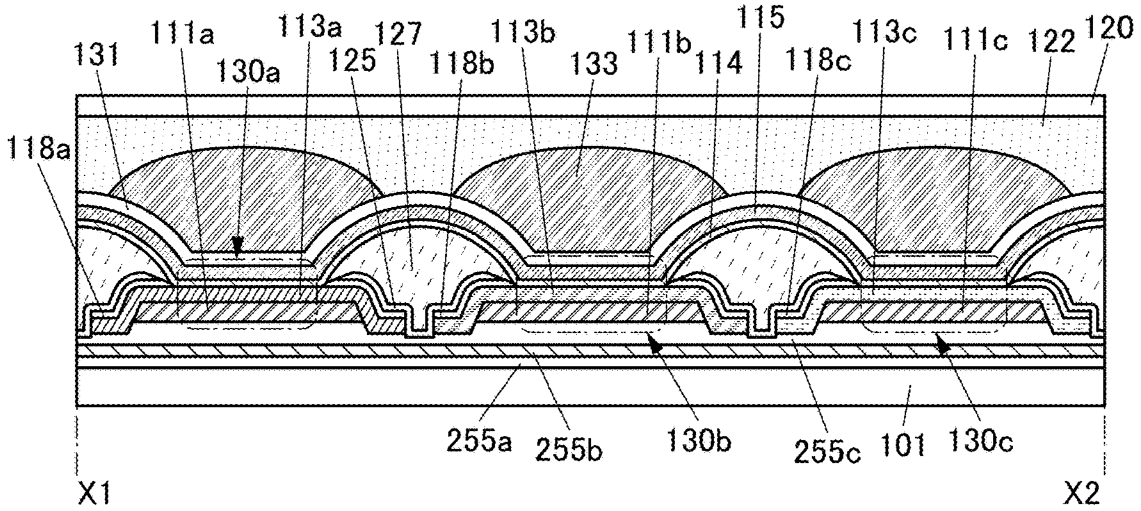
FIG. 9A to FIG. 9C are cross-sectional views illustrating examples of a display device.
Figure 9B:
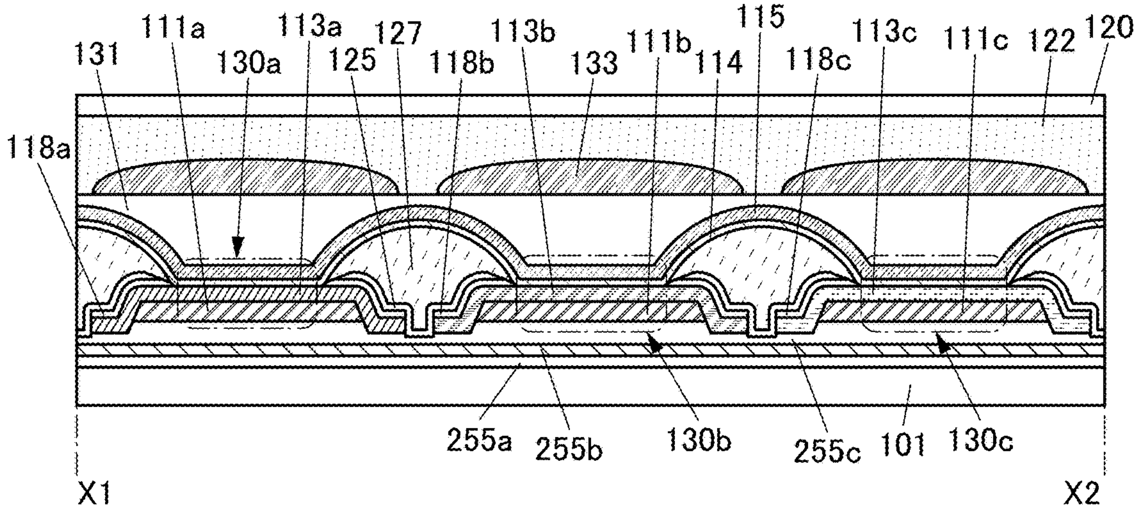
Figure 9C:
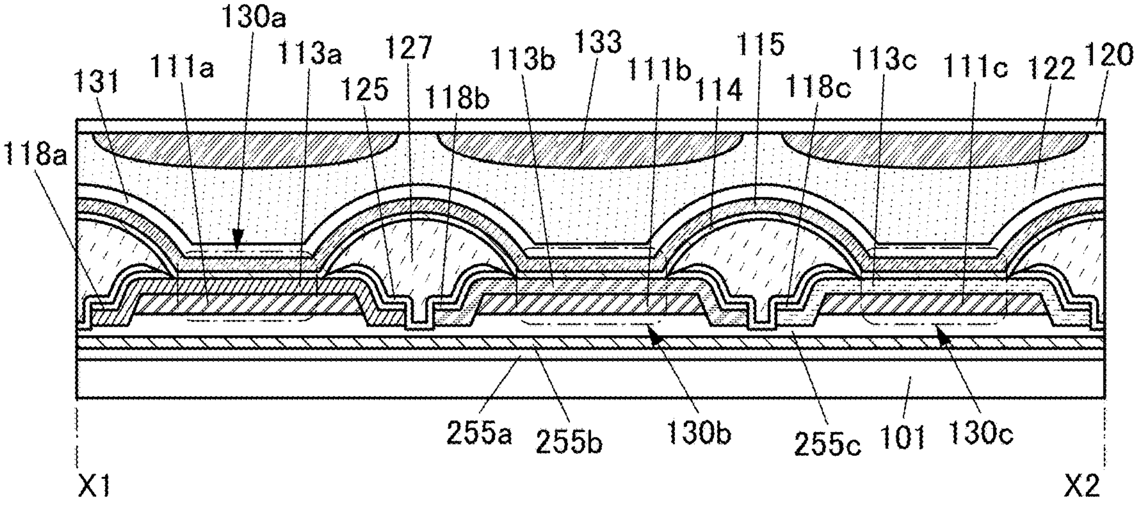
Figure 10A:
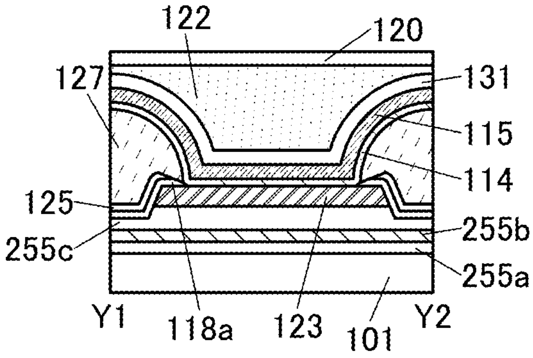
FIG. 10A and FIG. 10B are cross-sectional views illustrating examples of a display device.
Figure 10B:
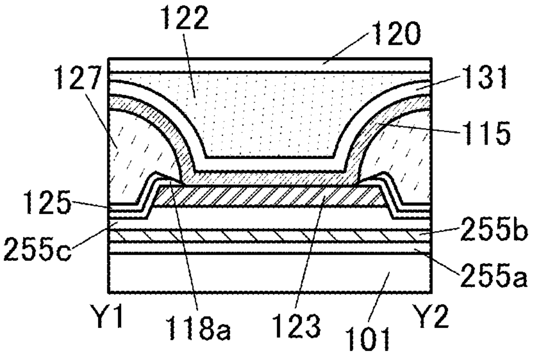

As illustrated in FIG. 9A to FIG. 9C, lens arrays 133 may be provided in the display device. The lens arrays 133 can be provided so as to overlap with the light-emitting devices. FIG. 9A and FIG. 9B illustrate an example in which the lens arrays 133 are provided over the light-emitting devices 130$a$, 130$b$, and 130$c$ with the protective layer 131 therebetween. When the lens arrays 133 are directly formed over the substrate provided with the light-emitting devices, the accuracy of positional alignment of the light-emitting devices and the lens arrays can be enhanced.

FIG. 9C illustrates an example in which the substrate 120 provided with the lens arrays 133 is bonded onto the protective layer 131 with the resin layer 122. By providing the lens arrays 133 for the substrate 120, the heat treatment temperature in the formation step of the lens arrays 133 can be increased.

Although FIG. 9B illustrates an example in which a layer having a planarization function is used as the protective layer 131, the protective layer 131 does not necessarily have a planarization function as illustrated in FIG. 9A and FIG. 9C. For example, the protective layer 131 can have a flat top surface when formed using an organic film. Alternatively, the protective layer 131 illustrated in FIG. 9A and FIG. 9C can be formed using an inorganic film, for example.

The lens array 133 may include a convex surface facing the substrate 120 side or a convex surface facing the light-emitting device side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used, for example. The lens array 133 may be directly formed over the substrate or the light-emitting device; alternatively, a lens array separately formed may be bonded thereto.

Figure 11A:
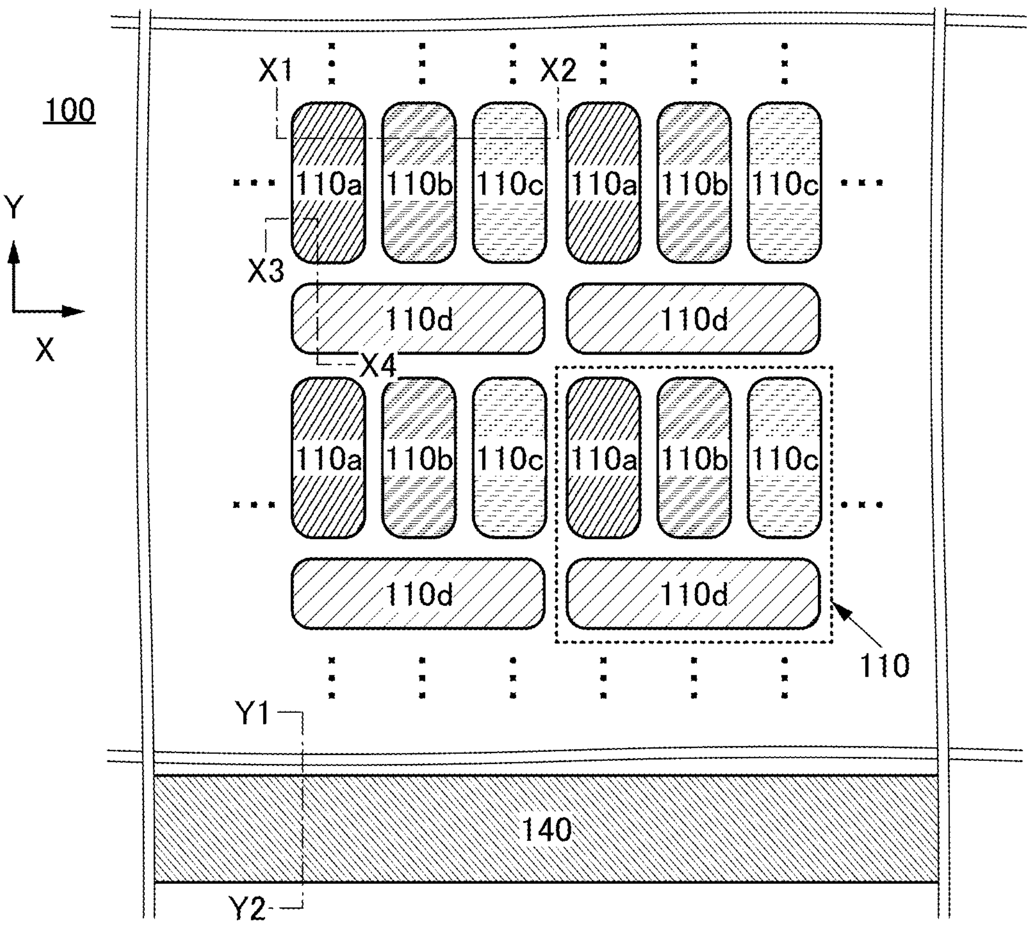
FIG. 11A is a top view illustrating an example of a display device.

FIG. 11A illustrates a top view of the display device 100 different from that in FIG. 1A. The pixel 110 illustrated in FIG. 11A is composed of four subpixels: the subpixels 110*a*, 110*b*, 110*c*, and 110*d*.

The subpixels 110*a*, 110*b*, 110*c*, and 110*d* can be configured to include light-emitting devices emitting light of different colors. The subpixels 110*a*, 110*b*, 110*c*, and 110*d* are subpixels of four colors of R, G, B, and W, subpixels of four colors of R, G, B, and Y, or subpixels of four types of R, G, B, and IR, for example.

The display device of one embodiment of the present invention may include a light-receiving device in the pixel.

Three of the four subpixels included in the pixel 110 illustrated in FIG. 11A may each be configured to include a light-emitting device and the other one may be configured to include a light-receiving device.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

The light-receiving device can detect one or both of visible light and infrared light. In the case of detecting visible light, for example, one or more of blue light, violet light, bluish violet light, green light, yellowish green light, yellow light, orange light, red light, and the like can be detected. The infrared light is preferably detected because an object can be detected even in a dark environment.

It is particularly preferable to use an organic photodiode including a layer containing an organic compound as the light-receiving device. An organic photodiode, which is easily made thin, lightweight, and large in area and has a high degree of freedom for shape and design, can be used for a variety of display devices.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device including the organic EL device.

The light-receiving device is driven by application of reverse bias between the pixel electrode and the common electrode, whereby light entering the light-receiving device can be detected and electric charge can be generated and extracted as a current.

A manufacturing method similar to that for the light-emitting device can be employed for the light-receiving device. An island-shaped active layer (also referred to as a photoelectric conversion layer) included in the light-receiving device is formed not by using a fine metal mask but by processing a film to be the active layer formed on the entire surface; thus, the island-shaped active layer can be formed to have a uniform thickness. Moreover, providing the mask layer over the active layer can reduce damage to the active layer in the manufacturing process of the display device, resulting in an improvement in reliability of the light-receiving device.

Embodiment 6 can be referred to for the structure and the materials of the light-receiving device.

Figure 11B:
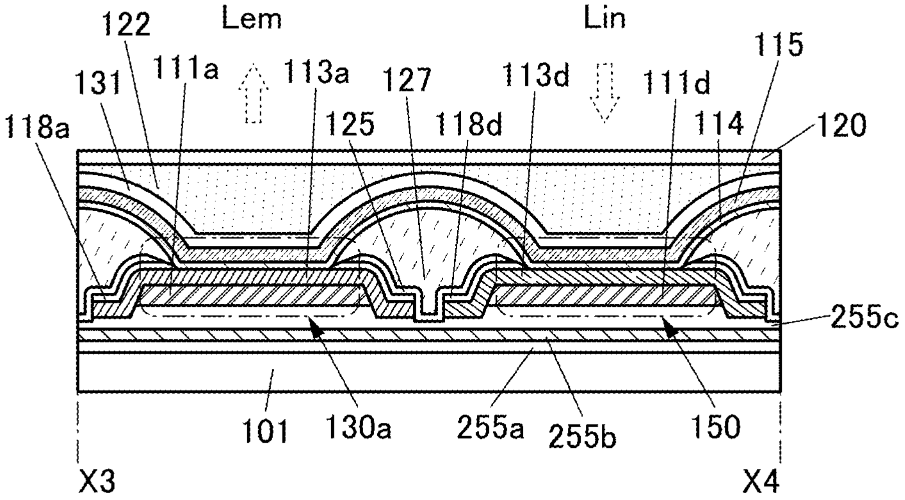
FIG. 11B is a cross-sectional view illustrating the example of the display device.

FIG. 11B illustrates a cross-sectional view along the dashed-dotted line X3-X4 in FIG. 11A. FIG. 1B can be referred to for a cross-sectional view along the dashed-dotted line X1-X2 in FIG. 11A, and FIG. 7A or FIG. 7B can be referred to for a cross-sectional view along the dashed-dotted line Y1-Y2.

As illustrated in FIG. 11B, in the display device 100, an insulating layer is provided over the layer 101 including transistors, the light-emitting device 130*a* and a light-receiving device 150 are provided over the insulating layer, the protective layer 131 is provided to cover the light-emitting device and the light-receiving device, and the substrate 120 is bonded with the resin layer 122. In a region between the light-emitting device and the light-receiving device adjacent to each other, the insulating layer 125 and the insulating layer 127 over the insulating layer 125 are provided.

FIG. 11B illustrates an example in which light is emitted from the light-emitting device 130*a* to the substrate 120 side and light enters the light-receiving device 150 from the substrate 120 side (see light Lem and light Lin).

The structure of the light-emitting device 130*a* is as described above.

The light-receiving device 150 includes a pixel electrode 111*d* over the insulating layer 255*c*, a fourth layer 113*d* over the pixel electrode 111*d*, the common layer 114 over the fourth layer 113*d*, and the common electrode 115 over the common layer 114. The fourth layer 113*d* includes at least an active layer.

Here, the fourth layer 113*d* includes at least an active layer, preferably includes a plurality of functional layers. Examples of the functional layer include carrier-transport layers (a hole-transport layer and an electron-transport layer) and carrier-blocking layers (a hole-blocking layer and an electron-blocking layer). In addition, one or more layers are preferably provided over the active layer. A layer between the active layer and the mask layer can inhibit the active layer from being exposed on the outermost surface during the manufacturing process of the display device and can reduce damage to the active layer. Accordingly, the reliability of the light-receiving device 150 can be improved. Thus, the fourth layer 113*d* preferably includes an active layer and a carrier-blocking layer (a hole-blocking layer or an electron-blocking layer) or a carrier-transport layer (an electron-transport layer or a hole-transport layer) over the active layer.

The fourth layer 113*d* is a layer that is provided in the light-receiving device 150 and is not in the light-emitting devices. Note that the functional layer other than the active layer included in the fourth layer 113*d* may include the same material as the functional layer other than the light-emitting layer included in each of the first layer 113*a* to the third layer 113*c*. Meanwhile, the common layer 114 is a continuous layer shared by the light-emitting device and the light-receiving device.

Here, a layer shared by the light-receiving device and the light-emitting device may have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The mask layer 118*a* is positioned between the first layer 113*a* and the insulating layer 125, and a mask layer 118*d* is positioned between the fourth layer 113*d* and the insulating layer 125. The mask layer 118*a* is a remaining part of a mask layer provided over the first layer 113*a* at the time of processing the first layer 113*a*. The mask layer 118*d* is a remaining part of a mask layer provided in contact with the top surface of the fourth layer 113*d* at the time of processing the fourth layer 113*d*, which is a layer including the active layer. The mask layer 118*a* and the mask layer 118*d* may contain the same material or different materials.

Although FIG. 11A illustrates an example in which an aperture ratio (also referred to as size or size of the light-emitting region or the light-receiving region) of the subpixel 110*d* is higher than those of the subpixels 110*a*, 110*b*, and 110*c*, one embodiment of the present invention is not limited thereto. The aperture ratio of each of the subpixels 110*a*, 110*b*, 110*c*, and 110*d* can be determined as appropriate. The subpixels 110*a*, 110*b*, 110*c*, and 110*d* may have different aperture ratios, or two or more of them may have the same or substantially the same aperture ratio.

The subpixel 110*d* may have a higher aperture ratio than at least one of the subpixels 110*a*, 110*b*, and 110*c*. The wide light-receiving area of the subpixel 110*d* can make it easy to detect an object in some cases. For example, in some cases, the aperture ratio of the subpixel 110*d* is higher than the aperture ratio of each of the other subpixels depending on the resolution of the display device and the circuit structure or the like of the subpixel.

The subpixel 110*d* may have a lower aperture ratio than at least one of the subpixels 110*a*, 110*b*, and 110*c*. A small light-receiving area of the subpixel 110*d* leads to a narrow image-capturing range, inhibits a blur in a capturing result, and improves the definition. This is preferable because high-resolution or high-definition image capturing can be performed.

As described above, the subpixel 110*d* can have a detection wavelength, a resolution, and an aperture ratio that are suitable for the intended use.

In the display device of one embodiment of the present invention, an island-shaped EL layer is provided in each light-emitting device, which can inhibit generation of a leakage current between the subpixels. This can prevent crosstalk due to unintended light emission, so that a display device with extremely high contrast can be obtained. An end portion of the island-shaped EL layer and the vicinity thereof, which might be damaged in the manufacturing process of the display device, are set as a dummy region not to be used as the light-emitting region, whereby variations in the characteristics of the light-emitting devices can be inhibited. Provision of the insulating layer having a tapered end portion between adjacent island-shaped EL layers can inhibit formation of step disconnection and prevent formation of a locally thinned portion in the common electrode at the time of forming the common electrode. This can inhibit the common layer and the common electrode from having connection defects due to the disconnected portion and an increased electric resistance due to the locally thinned portion. Thus, the display device of one embodiment of the present invention can have both a higher resolution and higher display quality.

This embodiment can be combined with any of the other embodiments as appropriate. In this specification, in the case where a plurality of structure examples are shown in one embodiment, the structure examples can be combined as appropriate.

Embodiment 2

In this embodiment, a method for manufacturing a display device of one embodiment of the present invention will be described with reference to FIG. 12 to FIG. 21. Note that as for a material and a formation method of each component, portions similar to the portions described in Embodiment 1 are not described in some cases. The structure of the light-emitting device will be described in detail in Embodiment 5.

FIG. 12 to FIG. 20 each illustrate a cross-sectional view along the dashed-dotted line X1-X2 and a cross-sectional view along the dashed-dotted line Y1-Y2 in FIG. 1A side by side. FIG. 21 illustrates enlarged views of the end portion of the insulating layer 127 and the vicinity thereof.

Thin films included in the display device (e.g., insulating films, semiconductor films, and conductive films) can be formed by any of a sputtering method, a chemical vapor deposition (CVD) method, a vacuum evaporation method, a pulsed laser deposition (PLD) method, an atomic layer deposition (ALD) method, and the like. Examples of a CVD method include a plasma-enhanced CVD (PECVD) method and a thermal CVD method. An example of a thermal CVD method is a metal organic chemical vapor deposition (MOCVD) method.

Alternatively, thin films included in the display device (e.g., insulating films, semiconductor films, and conductive films) can be formed by a wet film formation method such as spin coating, dipping, spray coating, ink-jetting, dispensing, screen printing, offset printing, a doctor knife method, slit coating, roll coating, curtain coating, or knife coating.

Specifically, for manufacture of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by a method such as an evaporation method (e.g., a vacuum evaporation method), a coating method (e.g., a dip coating method, a die coating method, a bar coating method, a spin coating method, or a spray coating method), or a printing method (e.g., an inkjet method, a screen printing (stencil) method, an offset printing (planography) method, a flexography (relief printing) method, a gravure printing method, or a micro-contact printing method).

Thin films included in the display device can be processed by a photolithography method or the like. Alternatively, the thin films may be processed by a nanoimprinting method, a sandblasting method, a lift-off method, or the like. Alternatively, island-shaped thin films may be directly formed by a film formation method using a shielding mask such as a metal mask.

There are the following two typical examples of photolithography methods. In one of the methods, a resist mask is formed over a thin film to be processed, the thin film is processed by etching or the like, and then the resist mask is removed. In the other method, after a photosensitive thin film is formed, light exposure and development are performed, so that the thin film is processed into a desired shape.

As light used for light exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet rays, KrF laser light, ArF laser light, or the like can be used. Light exposure may be performed by liquid immersion light exposure technique. As the light used for light exposure, extreme ultraviolet (EUV) light or X-rays may also be used. Furthermore, instead of the light used for light exposure, an electron beam can be used. It is preferable to use extreme ultraviolet light, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

Figure 12A:
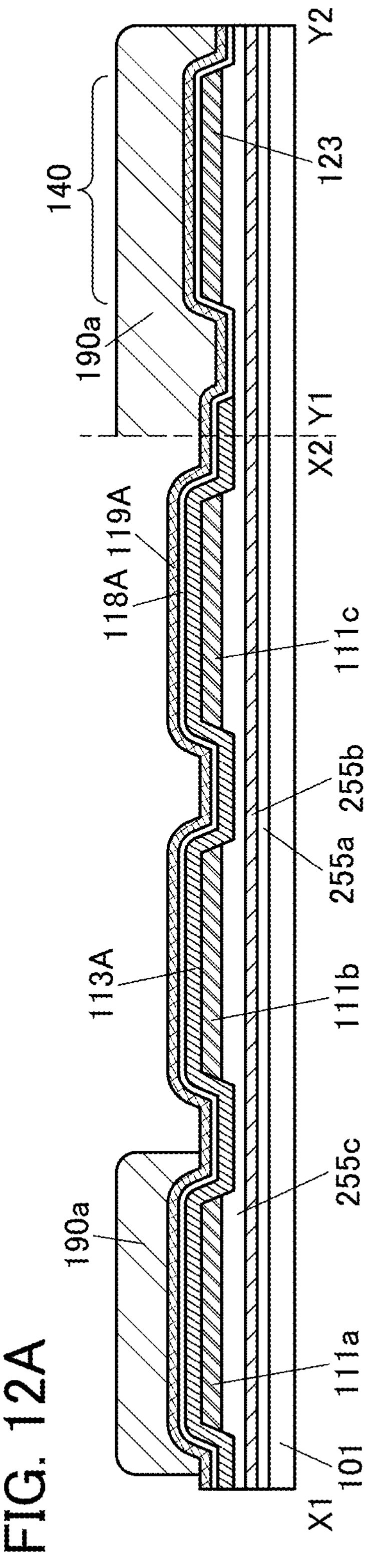
FIG. 12A to FIG. 12C are cross-sectional views illustrating an example of a method for manufacturing a display device.

First, the insulating layer 255*a*, the insulating layer 255*b*, and the insulating layer 255*c* are formed in this order over the layer 101 including transistors. Next, the pixel electrodes 111*a*, 111*b*, and 111*c* and the conductive layer 123 are formed over the insulating layer 255*c* (FIG. 12A). A conductive film to be the pixel electrodes can be formed by a sputtering method or a vacuum evaporation method, for example.

Then, the pixel electrode is preferably subjected to hydrophobic treatment. The hydrophobic treatment can change the property of the surface of a processing target from hydrophilic to hydrophobic, or can improve the hydrophobic property of the surface of the processing target. The hydrophobic treatment for the pixel electrode can improve the adhesion between the pixel electrode and a film to be formed in a later step (here, a film 113A), thereby inhibiting film separation. Note that the hydrophobic treatment is not necessarily performed.

The hydrophobic treatment can be performed by fluorine modification of the pixel electrode, for example. The fluorine modification can be performed by treatment using a gas containing fluorine, heat treatment, plasma treatment in a gas atmosphere containing fluorine, or the like. A fluorine gas can be used as the gas containing fluorine, and for example, a fluorocarbon gas can be used. As the fluorocarbon gas, a low-molecular-weight carbon fluoride gas such as a carbon tetrafluoride ($CF_4$) gas, a $C_4F_6$ gas, a $C_2F_6$ gas, a $C_4F_8$ gas, or $C_5F_8$ can be used, for example. Alternatively, as the gas containing fluorine, an $SF_6$ gas, an $NF_3$ gas, a $CHF_3$ gas, or the like can be used, for example. Moreover, a helium gas, an argon gas, a hydrogen gas, or the like can be added to any of the above gases as appropriate.

Treatment using a silylating agent is performed on the surface of the pixel electrode after plasma treatment is performed in a gas atmosphere containing a Group 18 element such as argon, so that the surface of the pixel electrode can have a hydrophobic property. As the silylating agent, hexamethyldisilazane (HMDS), trimethylsilylimidazole (TMSI), or the like can be used. Alternatively, treatment using a silane coupling agent is performed on the surface of the pixel electrode after plasma treatment is performed in a gas atmosphere containing a Group 18 element such as argon, so that the surface of the pixel electrode can have a hydrophobic property.

Plasma treatment on the surface of the pixel electrode in a gas atmosphere containing a Group 18 element such as argon can apply damage to the surface of the pixel electrode. Accordingly, a methyl group included in the silylating agent such as HMDS is likely to bond to the surface of the pixel electrode. In addition, silane coupling by the silane coupling agent is likely to occur. As described above, treatment using a silylating agent or a silane coupling agent performed on the surface of the pixel electrode after plasma treatment in a gas atmosphere containing a Group 18 element such as argon enables the surface of the pixel electrode to have a hydrophobic property.

The treatment using a silylating agent, a silane coupling agent, or the like can be performed by application of the silylating agent, the silane coupling agent, or the like by a spin coating method, a dipping method, or the like. Alternatively, the treatment using a silylating agent, a silane coupling agent, or the like can be performed by forming a film containing the silylating agent, a film containing the silane coupling agent, or the like over the pixel electrode or the like by a gas phase method, for example. In a gas phase method, first, a material containing a silylating agent, a material containing a silane coupling agent, or the like is evaporated so that the silylating agent, the silane coupling agent, or the like is contained in an atmosphere. Next, a substrate where the pixel electrode and the like are formed is put in the atmosphere. Accordingly, a film containing the silylating agent, the silane coupling agent, or the like can be formed over the pixel electrode, so that the surface of the pixel electrode can have a hydrophobic property.

Then, the film 113A to be the first layer 113*a* later is formed over the pixel electrode (FIG. 12A).

As illustrated in FIG. 12A, the film 113A is not formed over the conductive layer 123 in the cross-sectional view along the dashed-dotted line Y1-Y2. For example, by using an area mask, the film 113A can be formed only in a desired region. A light-emitting device can be manufactured through a relatively simple process, by employing a film formation step using an area mask and a processing step using a resist mask.

As described in Embodiment 1, a material with high heat resistance is used for the light-emitting device of the display device of one embodiment of the present invention. Specifically, the upper temperature limit of a compound contained in the film 113A is preferably higher than or equal to 100° C. and lower than or equal to 180° C., further preferably higher than or equal to 120° C. and lower than or equal to 180° C., still further preferably higher than or equal to 140° C. and lower than or equal to 180° C. In this case, the reliability of the light-emitting device can be improved. In addition, the upper limit of the temperature that can be applied in the manufacturing process of the display device can be increased. Therefore, the range of choices of the materials and the formation method of the display device can be widened, thereby improving the manufacturing yield and the reliability.

The film 113A can be formed by an evaporation method, specifically a vacuum evaporation method, for example. The film 113A may be formed by a method such as a transfer method, a printing method, an inkjet method, or a coating method.

Next, a mask film 118A to be the mask layer 118*a* later and a mask film 119A to be a mask layer 119*a* later are formed in this order over the film 113A and the conductive layer 123 (FIG. 12A).

Although this embodiment describes an example in which the mask film is formed with a two-layer structure of the mask film 118A and the mask film 119A, the mask film may have a single-layer structure or a stacked-layer structure of three or more layers.

Providing the mask layer over the film 113A can reduce damage to the film 113A in the manufacturing process of the display device, resulting in an improvement in reliability of the light-emitting device.

As the mask film 118A, a film highly resistant to the processing conditions of the film 113A, specifically, a film having high etching selectivity to the film 113A is used. As the mask film 119A, a film having high etching selectivity to the mask film 118A is used.

The mask film 118A and the mask film 119A are formed at a temperature lower than the upper temperature limit of the film 113A. The typical substrate temperatures in formation of the mask film 118A and the mask film 119A are lower than or equal to 200° C., preferably lower than or equal to 150° C., further preferably lower than or equal to 120° C., still further preferably lower than or equal to 100° C., yet still further preferably lower than or equal to 80° C.

Examples of indicators of the upper temperature limit include the glass transition point, the softening point, the melting point, the thermal decomposition temperature, and the 5% weight loss temperature. The upper temperature limits of the film 113A to a film 113C (i.e., the first layer 113*a* to the third layer 113*c*) can each be any of the above temperatures, preferably the lowest one among the temperatures.

As described above, a material with high heat resistance is used for the light-emitting device of the display device of one embodiment of the present invention. Thus, the substrate temperature in formation of the mask film can be higher than or equal to 100° C., higher than or equal to 120° C., or higher than or equal to 140° C. For example, an inorganic insulating film formed at a higher temperature can be a film that is denser and has a higher barrier property. Therefore, forming the mask film at such a temperature can further reduce damage to the film 113A and improve the reliability of the light-emitting device.

As each of the mask film 118A and the mask film 119A, a film that can be removed by a wet etching method is preferably used. The use of a wet etching method can reduce damage to the film 113A in processing of the mask film 118A and the mask film 119A as compared with the case of using a dry etching method.

The mask film 118A and the mask film 119A can be formed by a sputtering method, an ALD method (including a thermal ALD method and a PEALD method), a CVD method, or a vacuum evaporation method, for example. Alternatively, the aforementioned wet film formation method may be used for the formation.

The mask film 118A, which is formed over and in contact with the film 113A, is preferably formed by a formation method that causes less damage to the film 113A than a formation method of the mask film 119A. For example, the mask film 118A is preferably formed by an ALD method or a vacuum evaporation method rather than a sputtering method.

As each of the mask film 118A and the mask film 119A, it is possible to use one or more of a metal film, an alloy film, a metal oxide film, a semiconductor film, an organic insulating film, and an inorganic insulating film, for example.

For each of the mask film 118A and the mask film 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. A metal material capable of blocking ultraviolet rays is preferably used for one or both of the mask film 118A and the mask film 119A, in which case the film 113A can be inhibited from being irradiated with ultraviolet rays and deterioration of the film 113A can be inhibited.

A metal film or an alloy film is preferably used as one or both of the mask film 118A and the mask film 119A, in which case the film 113A can be inhibited from being damaged by plasma and deterioration of the film 113A can be inhibited. Specifically, the film 113A can be inhibited from being damaged by plasma in a step using a dry etching method, a step performing ashing, or the like. It is particularly preferable to use a metal film such as a tungsten film or an alloy film as the mask film 119A.

For each of the mask film 118A and the mask film 119A, it is possible to use a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In addition, in place of gallium described above, an element M (M is one or more selected from of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the mask film, a film containing a material having a light-blocking property with respect to light, particularly ultraviolet rays, can be used. For example, a film having a reflecting property with respect to ultraviolet rays or a film absorbing ultraviolet rays can be used. Although a variety of materials, such as a metal having a light-blocking property with respect to ultraviolet rays, an insulator, a semiconductor, and a metalloid, can be used as the material having a light-blocking property, a film capable of being processed by etching is preferable, and a film having good processability is particularly preferable because part or the whole of the mask film is removed in a later step.

For example, a semiconductor material such as silicon or germanium can be used as a material with a high affinity for the semiconductor manufacturing process. Alternatively, an oxide or a nitride of the semiconductor material can be used. Alternatively, a non-metallic (metalloid) material such as carbon or a compound thereof can be used. Alternatively, a metal, such as titanium, tantalum, tungsten, chromium, or aluminum, or an alloy containing one or more of them can be given. Alternatively, an oxide containing the above-described metal, such as titanium oxide or chromium oxide, or a nitride such as titanium nitride, chromium nitride, or tantalum nitride can be used.

The use of a film containing a material having a light-blocking property with respect to ultraviolet rays can inhibit the EL layer from being irradiated with ultraviolet rays in a light exposure step or the like. The EL layer is inhibited from being damaged by ultraviolet rays, so that the reliability of the light-emitting device can be improved.

Note that the film containing a material having a light-blocking property with respect to ultraviolet rays can have the same effect even when used as a material of an insulating film 125A that is described later.

As each of the mask film 118A and the mask film 119A, any of a variety of inorganic insulating films that can be used as the protective layer 131 can be used. In particular, an oxide insulating film is preferable because its adhesion to the film 113A is higher than that of a nitride insulating film. For example, an inorganic insulating material such as aluminum oxide, hafnium oxide, or silicon oxide can be used for each of the mask film 118A and the mask film 119A. As each of the mask film 118A and the mask film 119A, an aluminum oxide film can be formed by an ALD method, for example. The use of an ALD method is preferable because damage to a base (in particular, the EL layer) can be reduced.

For example, an inorganic insulating film (e.g., an aluminum oxide film) formed by an ALD method can be used as the mask film 118A, and an inorganic film (e.g., an In—Ga—Zn oxide film, a silicon film, or a tungsten film) formed by a sputtering method can be used as the mask film 119A.

Note that the same inorganic insulating film can be used for both the mask film 118A and the insulating layer 125 that is formed later. For example, an aluminum oxide film formed by an ALD method can be used for both the mask film 118A and the insulating layer 125. Here, for the mask film 118A and the insulating layer 125, the same film formation condition may be used or different film formation conditions may be used. For example, when the mask film 118A is formed under conditions similar to those for the insulating layer 125, the mask film 118A can be an insulating layer having a high barrier property against at least one of water and oxygen. Meanwhile, the mask film 118A is a layer most or all of which is to be removed in a later step, and thus is preferably easily processed. Therefore, the mask film 118A is preferably formed at a substrate temperature lower than that in formation of the insulating layer 125.

An organic material may be used for one or both of the mask film 118A and the mask film 119A. For example, as the organic material, a material that can be dissolved in a solvent chemically stable with respect to at least the uppermost film of the film 113A may be used. Specifically, a material that is dissolved in water or alcohol can be suitably used. In forming a film of such a material, it is preferable to apply the material dissolved in a solvent such as water or alcohol by a wet film formation method and then perform heat treatment for evaporating the solvent. At this time, the heat treatment is preferably performed under a reduced-pressure atmosphere, in which case the solvent can be removed at a low temperature in a short time and thermal damage to the film 113A can be accordingly reduced.

For each of the mask film 118A and the mask film 119A, an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluororesin such as perfluoropolymer may be used.

For example, an organic film (e.g., a PVA film) formed by an evaporation method or the above wet film formation method can be used as the mask film 118A, and an inorganic film (e.g., a silicon nitride film) formed by a sputtering method can be used as the mask film 119A.

Note that as described in Embodiment 1, part of the mask film sometimes remains as a mask layer in the display device of one embodiment of the present invention.

Next, a resist mask 190*a* is formed over the mask film 119A (FIG. 12A). The resist mask 190*a* can be formed by application of a photosensitive resin (photoresist), light exposure, and development.

The resist mask 190*a* may be formed using either a positive resist material or a negative resist material.

The resist mask 190*a* is provided at a position overlapping with the pixel electrode 111*a*. The resist mask 190*a* is preferably provided also at a position overlapping with the conductive layer 123. This can inhibit the conductive layer 123 from being damaged during the manufacturing process of the display device. Note that the resist mask 190*a* is not necessarily provided over the conductive layer 123.

As illustrated in the cross-sectional view along Y1-Y2 in FIG. 12A, the resist mask 190*a* is preferably provided to cover a region from an end portion of the film 113A to an end portion of the conductive layer 123 (an end portion on the film 113A side). In this case, end portions of the mask layers 118*a* and 119*a* overlap with the end portion of the film 113A even after the mask film 118A and the mask film 119A are processed. Since the mask layers 118*a* and 119*a* are provided to cover the region from the end portion of the film 113A to the end portion of the conductive layer 123 (the end portion on the film 113A side), the insulating layer 255*c* can be inhibited from being exposed even after the film 113A is processed (see the cross-sectional view along Y1-Y2 in FIG. 13B). This can prevent the insulating layers 255*a* to 255*c* and part of the insulating layer included in the layer 101 including transistors from being eliminated by etching or the like, and the conductive layer included in the layer 101 including transistors from being exposed. Thus, unintentional electrical connection between the conductive layer and another conductive layer can be inhibited. For example, a short circuit between the conductive layer and the common electrode 115 can be inhibited.

Figure 12B:
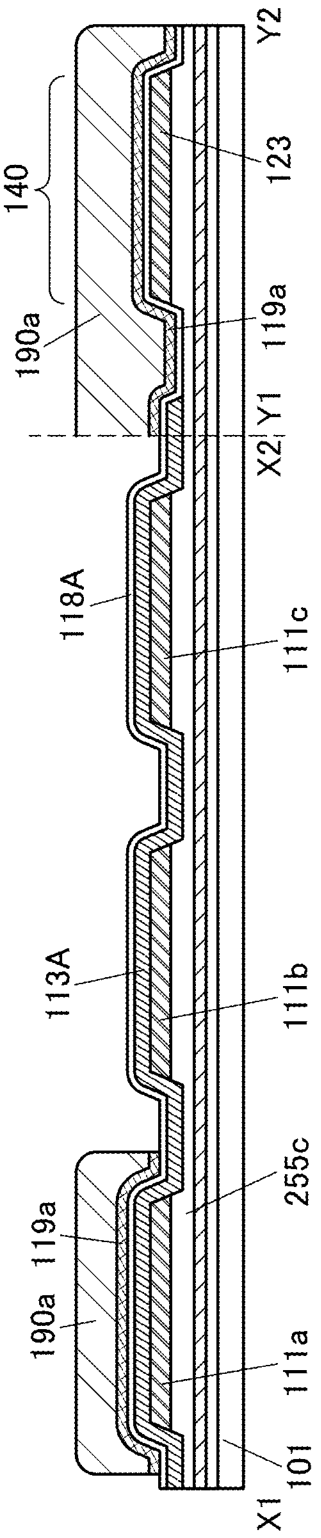
Figure 12C:
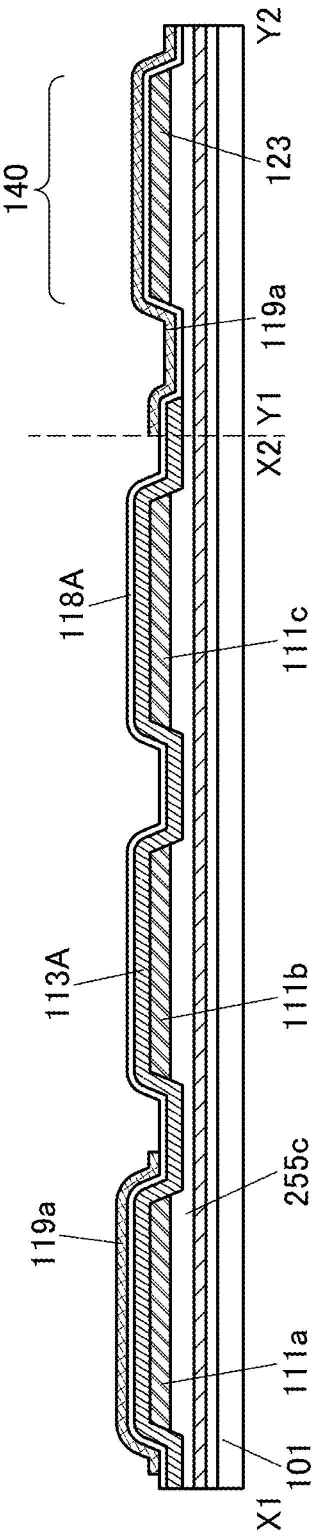
Figure 13A:
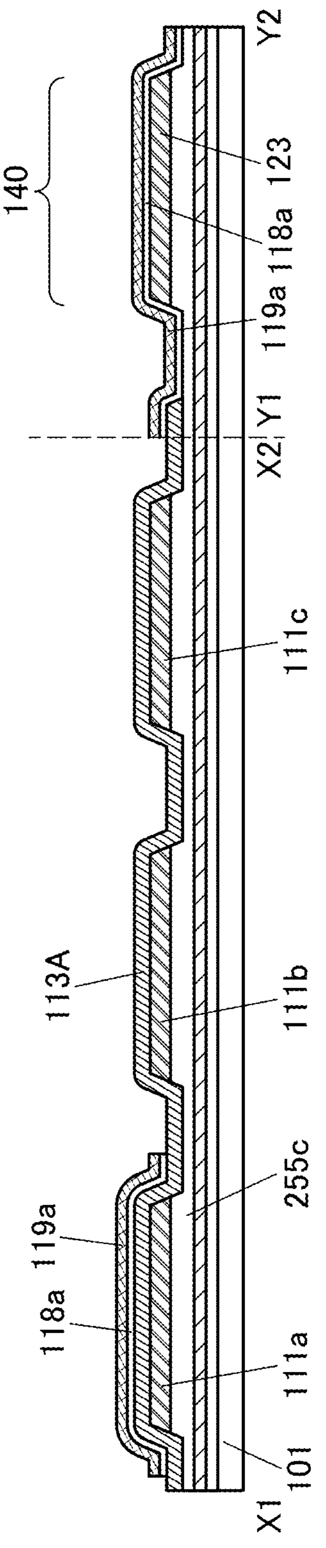
FIG. 13A to FIG. 13C are cross-sectional views illustrating an example of a method for manufacturing a display device.

Next, part of the mask film 119A is removed with the use of the resist mask 190*a*, so that the mask layer 119*a* is formed (FIG. 12B). The mask layer 119*a* remains over the pixel electrode 111*a* and the conductive layer 123. After that, the resist mask 190*a* is removed (FIG. 12C). Next, part of the mask film 118A is removed using the mask layer 119*a* as a mask (also referred to as a hard mask), so that the mask layer 118*a* is formed (FIG. 13A).

The mask film 118A and the mask film 119A can be processed by a wet etching method or a dry etching method. The mask film 118A and the mask film 119A are preferably processed by anisotropic etching.

The use of a wet etching method can reduce damage to the film 113A in processing of the mask film 118A and the mask film 119A as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, or a mixed solution containing two or more of these acids, for example.

Since the film 113A is not exposed in processing of the mask film 119A, the range of choices of the processing method is wider than that for processing of the mask film 118A. Specifically, deterioration of the film 113A can be further inhibited even when a gas containing oxygen is used as an etching gas for processing the mask film 119A.

In the case of using a dry etching method for processing the mask film 118A, deterioration of the film 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the mask film 118A, the mask film 118A can be processed by a dry etching method using $CHF_3$ and He or $CHF_3$, He, and $CH_4$. In the case where an In—Ga—Zn oxide film formed by a sputtering method is used as the mask film 119A, the mask film 119A can be processed by a wet etching method using a diluted phosphoric acid. Alternatively, the mask film 119A may be processed by a dry etching method using $CH_4$ and Ar. Alternatively, the mask film 119A can be processed by a wet etching method using a diluted phosphoric acid. When a tungsten film formed by a sputtering method is used as the mask film 119A, the mask film 119A can be processed by a dry etching method using $SF_6$, $CF_4$, and $O_2$ or $CF_4$, $Cl_2$, and $O_2$.

The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas such as He may be used. Alternatively, the resist mask 190*a* may be removed by wet etching. At this time, the mask film 118A is positioned on the outermost surface, and the film 113A is not exposed; thus, the film 113A can be inhibited from being damaged in the step of removing the resist mask 190*a*. In addition, the range of choices of the method for removing the resist mask 190*a* can be widened.

Next, the film 113A is processed to form the first layer 113*a*. For example, part of the film 113A is removed using the mask layer 119*a* and the mask layer 118*a* as a hard mask, so that the first layer 113*a* is formed (FIG. 13B).

Figure 13B:
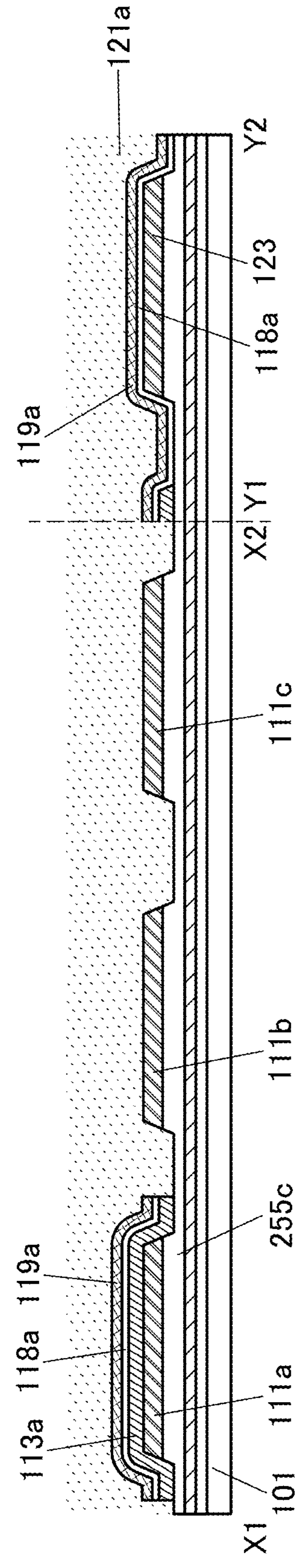

Accordingly, as illustrated in FIG. 13B, the stacked-layer structure of the first layer 113*a*, the mask layer 118*a*, and the mask layer 119*a* remains over the pixel electrode 111*a*. In addition, the pixel electrode 111*b* and the pixel electrode 111*c* are exposed.

The film 113A is preferably processed by anisotropic etching. In particular, anisotropic dry etching is preferable. Alternatively, wet etching may be employed.

FIG. 13B illustrates an example in which the film 113A is processed by a dry etching method. In a dry etching apparatus, an etching gas is brought into a plasma state. Thus, the surface of the display device under manufacturing is exposed to plasma (plasma 121*a*). Here, a metal film or an alloy film is preferably used for one or both of the mask layer 118*a* and the mask layer 119*a*, in which case a remaining portion of the film 113A (a portion to be the first layer 113*a*) can be inhibited from being damaged by the plasma and deterioration of the first layer 113*a* can be inhibited. In particular, a metal film such as a tungsten film or an alloy film is preferably used for the mask layer 119*a*.

In the case of using a dry etching method, deterioration of the film 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the film 113A can be reduced. Furthermore, a defect such as attachment of a reaction product generated at the etching can be inhibited.

In the case of using a dry etching method, it is preferable to use, as the etching gas, a gas containing one or more of $H_2$, $CF_4$, $C_4F_8$, $SF_6$, $CHF_3$, $Cl_2$, $H_2O$, $BCl_3$, and a noble gas such as He and Ar, for example. Alternatively, a gas containing oxygen and one or more of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas. As another example, a gas containing $H_2$ and Ar and a gas containing oxygen can be used as the etching gas.

A dry etching apparatus including a high-density plasma source can be used as the dry etching apparatus. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes.

FIG. 13B illustrates an example in which end portions of the first layer 113*a* are positioned outward from end portions of the pixel electrode 111*a*. A pixel with such a structure can have a high aperture ratio. Although not illustrated in FIG. 13B, a depressed portion is sometimes formed by the etching treatment in a region of the insulating layer 255*c* that does not overlap with the first layer 113*a*.

When the first layer 113*a* covers the top surface and side surfaces of the pixel electrode 111*a*, the following steps can be performed without exposing the pixel electrode 111*a*. When the end portions of the pixel electrode 111*a* are exposed, corrosion might occur in the etching step or the like. A product generated by corrosion of the electrode 111*a* might be unstable; for example, the product might be dissolved in a solution in wet etching and might be diffused in an atmosphere in dry etching. The product dissolved in a solution or diffused in an atmosphere might be attached to a surface to be processed, the side surface of the first layer 113*a*, and the like, which may adversely affect the characteristics of the light-emitting device or may form a leakage path between the plurality of light-emitting devices. In a region where the end portion of the pixel electrode 111*a* is exposed, the adhesion between contacting layers is reduced, which might facilitate film separation of the first layer 113*a* or the pixel electrode 111*a*.

Thus, when the first layer 113*a* covers the top surface and side surfaces of the pixel electrode 111*a*, the yield and characteristics of the light-emitting device can be improved, for example.

As described in Embodiment 1, when the first layer 113*a* covers the top surface and the side surface of the pixel electrode 111*a*, the first layer 113*a* is provided with a dummy region outside the light-emitting region (a region positioned between the pixel electrode 111*a* and the common electrode 115). Here, the end portion of the first layer 113*a* is sometimes damaged at the time of processing the film 113A. In addition, the end portion of the first layer 113*a* is sometimes damaged by being exposed to plasma in a later step (see plasma 121*b* in FIG. 15A and plasma 121*c* in FIG. 15C). The end portion of the first layer 113*a* and the vicinity thereof are dummy regions and not used as light-emitting regions; thus, such regions are less likely to adversely affect the characteristics of the light-emitting device even when being damaged. Meanwhile, the light-emitting region of the first layer 113*a* is covered with the mask layer, and thus is not exposed to plasma and plasma damage is sufficiently reduced. The mask layer is preferably provided to cover not only a top surface of a flat portion of the first layer 113*a* overlapping with the top surface of the pixel electrode 111*a*, but also top surfaces of an inclined portion and a flat portion of the first layer 113*a* that are positioned on the outer side of the top surface of the pixel electrode 111*a*. A portion of the first layer 113*a* with reduced damage in the manufacturing process is used as the light-emitting region in this manner; thus, a light-emitting device having high emission efficiency and a long lifetime can be achieved.

In a region corresponding to the connection portion 140, a stacked-layer structure of the mask layer 118*a* and the mask layer 119*a* remains over the conductive layer 123.

As described above, in the cross-sectional view along Y1-Y2 in FIG. 13B, the mask layers 118*a* and 119*a* are provided to cover the end portions of the first layer 113*a* and the end portions of the conductive layer 123, and the top surface of the insulating layer 255*c* is not exposed. This can prevent the insulating layers 255*a* to 255*c* and part of the insulating layer included in the layer 101 including transistors from being removed by etching or the like, and the conductive layer included in the layer 101 including transistors from being exposed. Thus, unintentional electrical connection between the conductive layer and another conductive layer can be inhibited.

As described above, in one embodiment of the present invention, the resist mask 190*a* is formed over the mask film 119A and part of the mask film 119A is removed using the resist mask 190*a*, so that the mask layer 119*a* is formed. After that, part of the film 113A is removed using the mask layer 119*a* as a hard mask, so that the first layer 113*a* is formed. Thus, it can be said that the first layer 113*a* is formed by processing the film 113A by a photolithography method. Note that part of the film 113A may be removed using the resist mask 190*a*. Then, the resist mask 190*a* may be removed.

Next, the pixel electrode is preferably subjected to hydrophobic treatment. In processing of the film 113A, the surface state of the pixel electrode changes to a hydrophilic state in some cases. The hydrophobic treatment for the pixel electrode can improve the adhesion between the pixel electrode and a film to be formed in a later step (here, a film 113B), thereby inhibiting film separation. Note that the hydrophobic treatment is not necessarily performed.

Figure 13C:
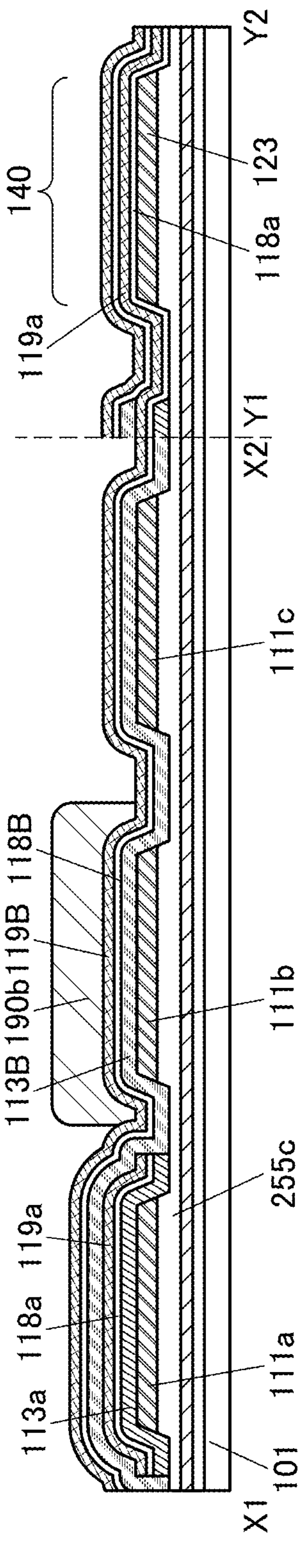

Next, the film 113B to be the second layer 113*b* later is formed over the pixel electrodes 111*b* and 111*c* and the mask layer 119*a* (FIG. 13C).

The film 113B can be formed by a method similar to a method that can be employed for forming the film 113A.

Next, over the film 113B, a mask film 118B to be the mask layer 118*b* later and a mask film 119B to be a mask layer 119*b* later are formed in this order, and then a resist mask 190*b* is formed (FIG. 13C). The materials and the formation methods of the mask film 118B and the mask film 119B are similar to conditions applicable to the mask film 118A and the mask film 119A. The materials and the formation method of the resist mask 190*b* are similar to conditions applicable to the resist mask 190*a*.

The resist mask 190*b* is provided at a position overlapping with the pixel electrode 111*b*.

Figure 14A:
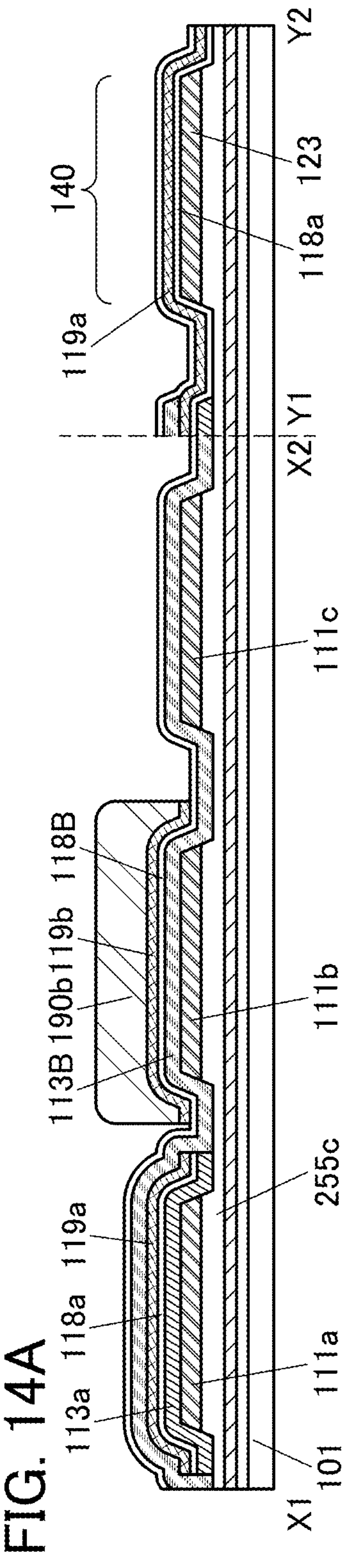
FIG. 14A to FIG. 14C are cross-sectional views illustrating an example of a method for manufacturing a display device.
Figure 14B:
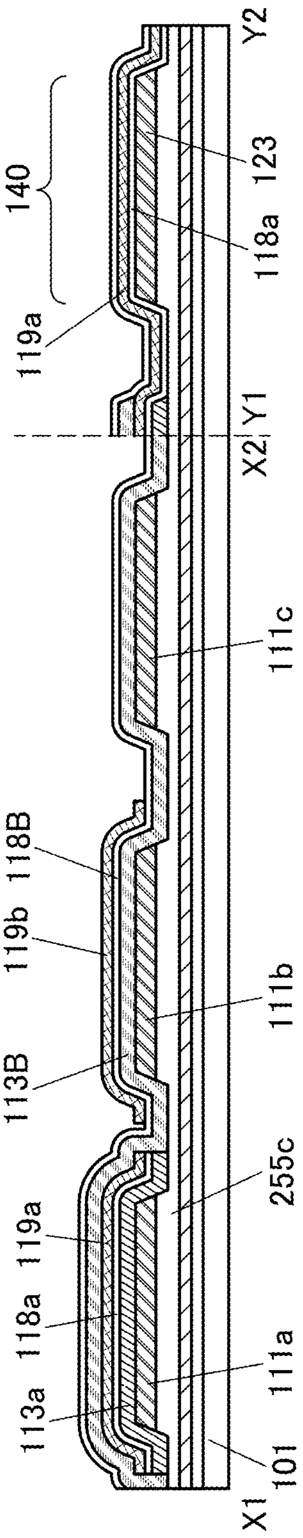
Figure 14C:
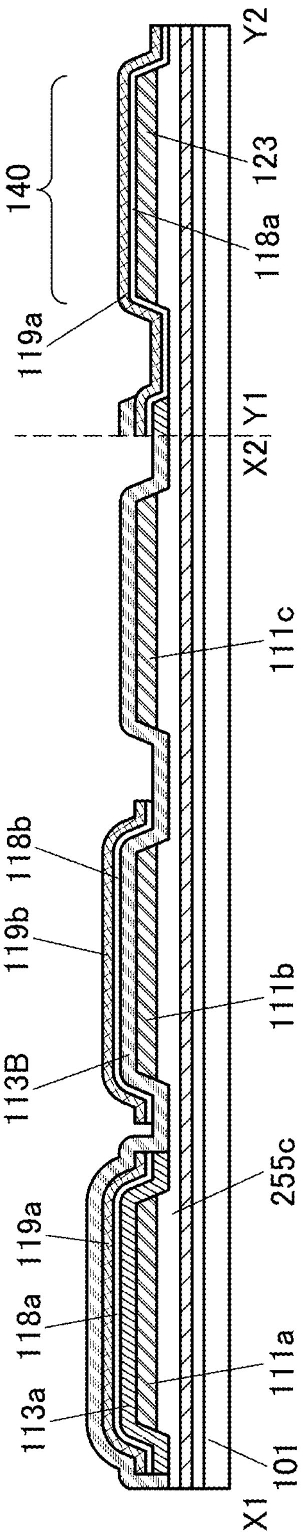

Next, part of the mask film 119B is removed with the use of the resist mask 190*b*, so that the mask layer 119*b* is formed (FIG. 14A). The mask layer 119*b* remains over the pixel electrode 111*b*. After that, the resist mask 190*b* is removed (FIG. 14B). Next, part of the mask film 118B is removed using the mask layer 119*b* as a mask, so that the mask layer 118*b* is formed (FIG. 14C). Next, the film 113B is processed to form the second layer 113*b*. For example, part of the film 113B is removed using the mask layer 119*b* and the mask layer 118*b* as a hard mask, so that the second layer 113*b* is formed (FIG. 15A).

Figure 15A:
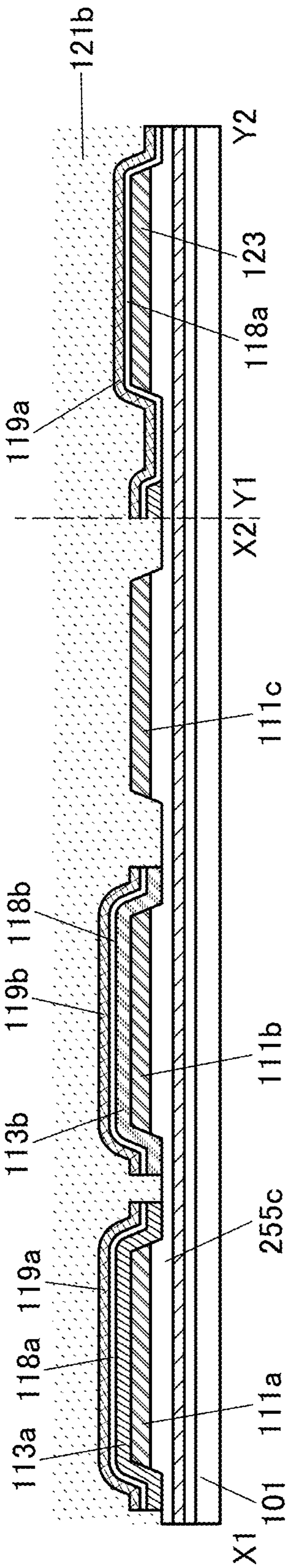
FIG. 15A to FIG. 15C are cross-sectional views illustrating an example of a method for manufacturing a display device.

FIG. 15A illustrates an example in which the film 113B is processed by a dry etching method. A surface of the display device under manufacturing is exposed to plasma (the plasma 121*b*). Here, a metal film or an alloy film is preferably used for one or both of the mask layer 118*a* and the mask layer 119*a*, in which case the first layer 113*a* can be inhibited from being damaged by the plasma and deterioration of the first layer 113*a* can be inhibited. A metal film or an alloy film is preferably used for one or both of the mask layer 118*b* and the mask layer 119*b*, in which case a remaining portion of the film 113B (the second layer 113*b*) can be inhibited from being damaged by the plasma and deterioration of the second layer 113*b* can be inhibited. In particular, a metal film such as a tungsten film or an alloy film is preferably used for the mask layer 119*b*.

Accordingly, as illustrated in FIG. 15A, the stacked-layer structure of the second layer 113*b*, the mask layer 118*b*, and the mask layer 119*b* remains over the pixel electrode 111*b*. In addition, the mask layer 119*a* and the pixel electrode 111*c* are exposed.

Next, the pixel electrode is preferably subjected to hydrophobic treatment. In processing of the film 113B, the surface state of the pixel electrode changes to a hydrophilic state in some cases. The hydrophobic treatment for the pixel electrode can improve the adhesion between the pixel electrode and a film to be formed in a later step (here, the film 113C), thereby inhibiting film separation. Note that the hydrophobic treatment is not necessarily performed. Next, the film 113C to be the third layer 113*c* later is formed over the pixel electrode 111*c* and the mask layers 119*a* and 119*b* (FIG. 15B).

The film 113C can be formed by a method similar to a method that can be employed for forming the film 113A.

Figure 15B:
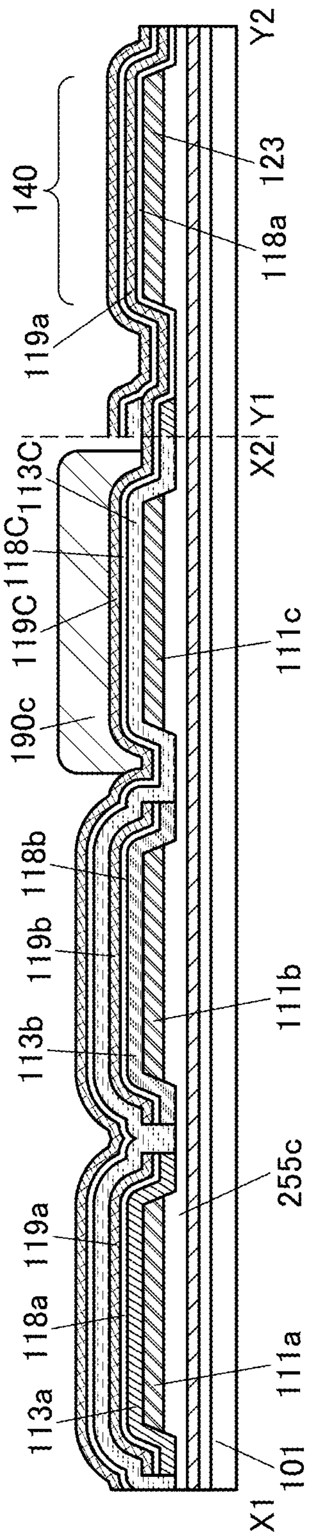

Next, over the film 113C, a mask film 118C to be the mask layer 118*c* later and a mask film 119C to be a mask layer 119*c* later are formed in this order, and then a resist mask 190*c* is formed (FIG. 15B). The materials and the formation methods of the mask film 118C and the mask film 119C are similar to conditions applicable to the mask film 118A and the mask film 119A. The materials and the formation method of the resist mask 190*c* are similar to conditions applicable to the resist mask 190*a*.

The resist mask 190*c* is provided at a position overlapping with the pixel electrode 111*c*.

Next, part of the mask film 119C is removed with the use of the resist mask 190*c*, so that the mask layer 119*c* is formed. The mask layer 119*c* remains over the pixel electrode 111*c*. After that, the resist mask 190*c* is removed. Next, part of the mask film 118C is removed using the mask layer 119*c* as a mask, so that the mask layer 118*c* is formed. Next, the film 113C is processed to form the third layer 113*c*. For example, part of the film 113C is removed using the mask layer 119*c* and the mask layer 118*c* as a hard mask, so that the third layer 113*c* is formed (FIG. 15C).

Figure 15C:
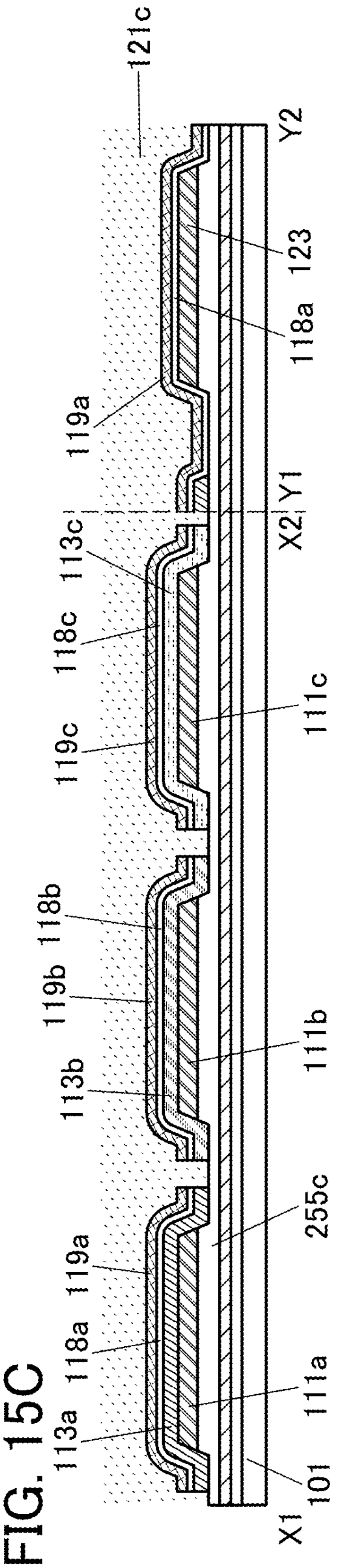

FIG. 15C illustrates an example in which the film 113C is processed by a dry etching method. A surface of the display device under manufacturing is exposed to plasma (the plasma 121*c*). Here, a metal film or an alloy film is preferably used for one or both of the mask layer 118*a* and the mask layer 119*a* and one or both of the mask layer 118*b* and the mask layer 119*b*, in which case the first layer 113*a* and the second layer 113*b* can be inhibited from being damaged by the plasma and deterioration of the first layer 113*a* and the second layer 113*b* can be inhibited. A metal film or an alloy film is preferably used for one or both of the mask layer 118*c* and the mask layer 119*c*, in which case a remaining portion of the film 113C (the third layer 113*c*) can be inhibited from being damaged by the plasma and deterioration of the third layer 113*c* can be inhibited. In particular, a metal film such as a tungsten film or an alloy film is preferably used for the mask layer 119*c*.

Accordingly, as illustrated in FIG. 15C, the stacked-layer structure of the third layer 113*c*, the mask layer 118*c*, and the mask layer 119*c* remains over the pixel electrode 111*c*. In addition, the mask layers 119*a* and 119*b* are exposed.

Note that side surfaces of the first layer 113*a*, the second layer 113*b*, and the third layer 113*c* are preferably perpendicular or substantially perpendicular to their formation surfaces. For example, the angle between the formation surfaces and these side surfaces is preferably greater than or equal to 60° and less than or equal to 90°.

As described above, the distance between adjacent two layers among the first layer 113*a*, the second layer 113*b*, and the third layer 113*c* formed by a photolithography method can be shortened to less than or equal to 8 μm, less than or equal to 5 μm, less than or equal to 3 μm, less than or equal to 2 μm, or less than or equal to 1 μm. Here, the distance can be determined by, for example, the distance between facing end portions of adjacent two layers among the first layer 113*a*, the second layer 113*b*, and the third layer 113*c*. When the distance between the island-shaped EL layers is shortened in this manner, a display device with a high resolution and a high aperture ratio can be provided.

In the case of manufacturing a display device including both the light-emitting device and the light-receiving device as illustrated in FIG. 11A and FIG. 11B, the fourth layer 113*d* included in the light-receiving device is formed in a manner similar to those for the first layer 113*a* to the third layer 113*c*. There is no particular limitation on the formation order of the first layer 113*a* to the fourth layer 113*d*. For example, when a layer with high adhesion to the pixel electrode is formed earlier, film separation in the process can be inhibited. For example, in the case where the first layer 113*a* to the third layer 113*c* have higher adhesion to the pixel electrodes than the fourth layer 113*d*, the first layer 113*a* to the third layer 113*c* are preferably formed earlier. The thickness of the layer formed earlier sometimes has an influence on the distance between the substrate and a mask for specifying a film formation area in the subsequent step of forming a layer. Forming a thinner layer earlier can inhibit shadowing (formation of a layer in a shadow portion). For example, in the case where a light-emitting device with a tandem structure is formed, the first layer 113*a* to the third layer 113*c* often become thicker than the fourth layer 113*d*; thus, it is preferable to form the fourth layer 113*d* earlier. In the case where a film is formed by a wet method using a high molecular material, it is preferable to form the film earlier. For example, when a high molecular material is used for an active layer, the fourth layer 113*d* is preferably formed earlier. As described above, the formation order is determined depending on the materials and film formation methods, whereby the manufacturing yield of the display device can be increased.

Figures 16A, 16B, 16C:
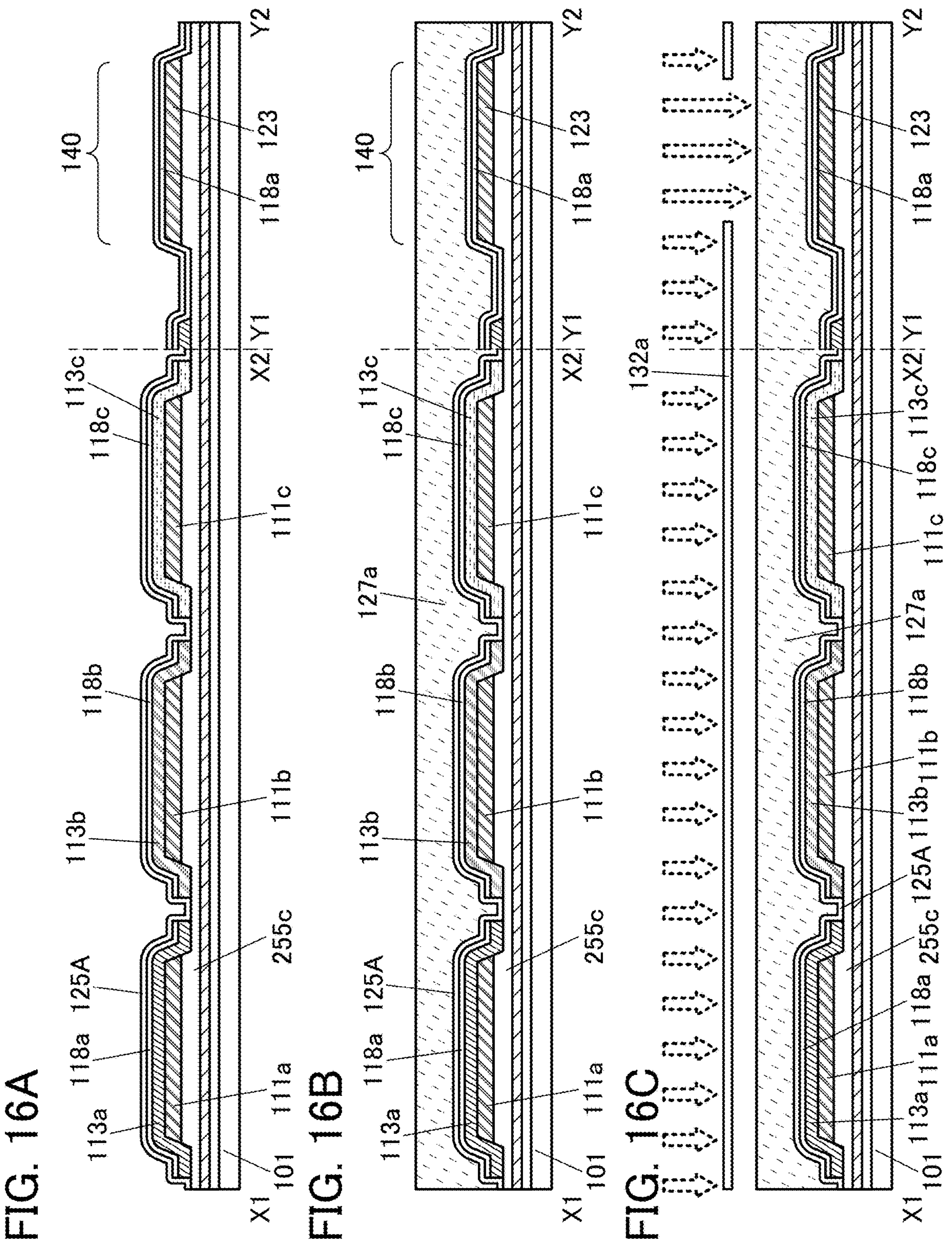
FIG. 16A to FIG. 16C are cross-sectional views illustrating an example of a method for manufacturing a display device.

Next, the mask layers 119*a*, 119*b*, and 119*c* are preferably removed (FIG. 16A). The mask layers 118*a*, 118*b*, 118*c*, 119*a*, 119*b*, and 119*c* remain in the display device in some cases, depending on the later steps. Removing the mask layers 119*a*, 119*b*, and 119*c* at this stage can inhibit the mask layers 119*a*, 119*b*, and 119*c* from remaining in the display device. For example, in the case where a conductive material is used for each of the mask layers 119*a*, 119*b*, and 119*c*, removing the mask layers 119*a*, 119*b*, and 119*c* in advance can inhibit generation of a leakage current due to the remaining mask layers 119*a*, 119*b*, and 119*c*, formation of a capacitor, and the like.

Although this embodiment describes an example in which the mask layers 119*a*, 119*b*, and 119*c* are removed, the mask layers 119*a*, 119*b*, and 119*c* are not necessarily removed. For example, in the case where the mask layers 119*a*, 119*b*, and 119*c* each contain the aforementioned material having a light-blocking property with respect to ultraviolet rays, the process preferably proceeds to the next step without removing the mask layers, in which case the island-shaped EL layers can be protected from ultraviolet rays.

The step of removing the mask layers can be performed by a method similar to that for the step of processing the mask layers. In particular, the use of a wet etching method can reduce damage to the first layer 113*a*, the second layer 113*b*, and the third layer 113*c* at the time of removing the mask layers compared with the case of using a dry etching method.

In the case where a metal film or an alloy film is used for each of the mask layers 119*a*, 119*b*, and 119*c*, the mask layers 119*a*, 119*b*, and 119*c* can inhibit plasma damage to the EL layers. Thus, film processing can be performed by a dry etching method in the steps before the removal of the mask layers 119*a*, 119*b*, and 119*c*. In contrast, in the step of removing the mask layers 119*a*, 119*b*, and 119*c* and in the steps after the removal, the film inhibiting plasma damage to the EL layers does not exist; thus, film processing is preferably performed by a method that does not use plasma, such as a wet etching method.

The mask layer may be removed by being dissolved in a solvent such as water or alcohol. Examples of alcohol include ethyl alcohol, methyl alcohol, isopropyl alcohol (IPA), and glycerin.

After the mask layers are removed, drying treatment may be performed to remove water contained in the first layer 113*a*, the second layer 113*b*, and the third layer 113*c* and water adsorbed onto the surfaces of the first layer 113*a*, the second layer 113*b*, and the third layer 113*c*. For example, heat treatment in an inert gas atmosphere such as a nitrogen atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. A reduced-pressure atmosphere is preferable because drying at a lower temperature is possible.

Next, the insulating film 125A to be the insulating layer 125 later is formed to cover the pixel electrodes, the first layer 113*a*, the second layer 113*b*, the third layer 113*c*, the mask layer 118*a*, the mask layer 118*b*, and the mask layer 118*c* (FIG. 16A).

As described later, an insulating film 127*a* is formed in contact with a top surface of the insulating film 125A. Thus, the top surface of the insulating film 125A preferably has high adhesion to a resin composite (e.g., a photosensitive resin composite containing an acrylic resin) that is used for the insulating film 127*a*. To improve the adhesion, the top surface of the insulating film 125A is preferably made hydrophobic (or more hydrophobic) by surface treatment. For example, the treatment is preferably performed using a silylating agent such as hexamethyldisilazane (HMDS). By making the top surface of the insulating film 125A hydrophobic in this manner, the insulating film 127*a* can be formed with high adhesion. Note that the above-described hydrophobic treatment may be performed as the surface treatment.

Then, the insulating film 127*a* is formed over the insulating film 125A (FIG. 16B).

The insulating film 125A and the insulating film 127*a* are preferably formed by a formation method that causes less damage to the first layer 113*a*, the second layer 113*b*, and the third layer 113*c*. In particular, the insulating film 125A, which is formed in contact with the side surfaces of the first layer 113*a*, the second layer 113*b*, and the third layer 113*c*, is preferably formed by a formation method that causes less damage to the first layer 113*a*, the second layer 113*b*, and the third layer 113*c* than the method for forming the insulating film 127*a*.

The insulating film 125A and the insulating film 127*a* are formed at a temperature lower than the upper temperature limits of the first layer 113*a*, the second layer 113*b*, and the third layer 113*c*. When the insulating film 125A is formed at a high substrate temperature, the formed film, even with a small thickness, can have a low impurity concentration and a high barrier property against at least one of water and oxygen.

The insulating film 125A and the insulating film 127*a* are preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As described above, a material with high heat resistance is used for the light-emitting device of the display device of one embodiment of the present invention. Thus, the substrate temperature in formation of the insulating film 125A and the insulating film 127*a* can be higher than or equal to 100° C., higher than or equal to 120° C., or higher than or equal to 140° C. For example, an inorganic insulating film formed at a higher temperature can be a film that is denser and has a higher barrier property. Therefore, forming the insulating film 125A at such a temperature can further reduce damage to the first layer 113*a*, the second layer 113*b*, and the third layer 113*c* and improve the reliability of the light-emitting device.

As the insulating film 125A, an insulating film is preferably formed within the above substrate temperature range to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125A is preferably formed by an ALD method, for example. The use of an ALD method is preferable because damage due to film formation can be reduced and a film with good coverage can be formed. As the insulating film 125A, an aluminum oxide film is preferably formed by an ALD method, for example.

Alternatively, the insulating film 125A may be formed by a sputtering method, a CVD method, or a PECVD method that provides a higher film formation speed than an ALD method. In this case, a highly reliable display device can be manufactured with high productivity.

The insulating film 127*a* is preferably formed by the aforementioned wet film formation method. For example, the insulating film 127*a* is preferably formed by spin coating using a photosensitive resin, specifically, a photosensitive resin composite containing an acrylic resin.

Heat treatment (also referred to as pre-baking) is preferably performed after formation of the insulating film 127*a*. The heat treatment is performed at a temperature lower than the upper temperature limits of the first layer 113*a*, the second layer 113*b*, and the third layer 113*c*. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, a solvent contained in the insulating film 127*a* can be removed.

Then, as illustrated in FIG. 16C, light exposure is performed in the connection portion 140. Specifically, in the connection portion 140, part of the insulating film 127*a* is irradiated with visible light or ultraviolet rays as light exposure.

In the case where a positive photosensitive resin composite containing an acrylic resin is used for the insulating film 127*a*, a region where the insulating layer 127 is not formed in a later step is irradiated with visible light or ultraviolet rays using a mask 132*a*. The insulating layer 127 is formed in regions interposed between two of the pixel electrodes 111*a*, 111*b*, and 111*c*, and around the conductive layer 123. Thus, as illustrated in FIG. 16C, a region of the insulating film 127*a* that overlaps with the conductive layer 123 is irradiated with visible light or ultraviolet rays using the mask 132*a*.

Light used for light exposure preferably includes the i-line (wavelength: 365 nm). The light used for light exposure may include at least one of the g-line (wavelength: 436 nm) and the h-line (wavelength: 405 nm).

Although FIG. 16C illustrates an example in which a positive photosensitive resin is used for the insulating film 127*a* and a region where the insulating layer 127 is not formed is irradiated with visible light or ultraviolet rays, the present invention is not limited thereto. For example, a structure may be employed in which a negative photosensitive resin is used for the insulating film 127*a*. In this case, a region where the insulating layer 127 is formed is irradiated with visible light or ultraviolet rays.

Figures 17A, 17B, 17C:
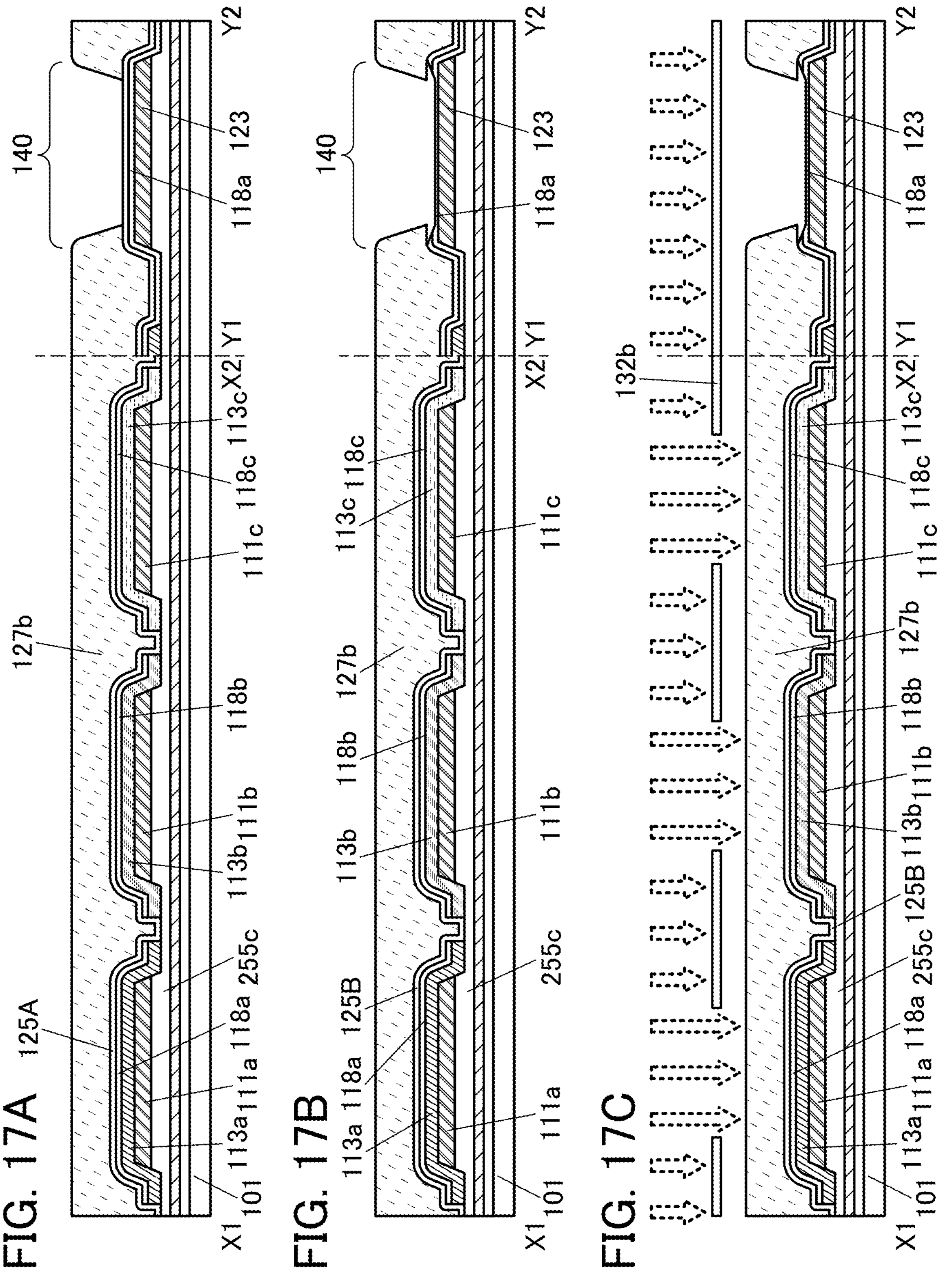
FIG. 17A to FIG. 17C are cross-sectional views illustrating an example of a method for manufacturing a display device.

Next, as illustrated in FIG. 17A, the region of the insulating film 127*a* exposed to light is removed by development, so that an insulating layer 127*b* is formed. The insulating layer 127*b* is formed in the whole display portion and a region surrounding the conductive layer 123. Here, in the case where an acrylic resin is used for the insulating film 127*a*, an alkaline solution is preferably used as a developer, and for example, an aqueous solution of tetramethyl ammonium hydroxide (TMAH) can be used.

There is no particular limitation on the development method, and a dip method, a spin method, a puddle method, a vibration method, or the like can be employed. Note that in order to stabilize the etching rate, a method in which new liquid is constantly supplied is preferably employed. Alternatively, a method in which supply and holding (development) of liquid are repeated (also referred to as a step puddle method) is preferably employed. The step puddle method is preferable because liquid consumption can be reduced and the etching rate can be stabilized as compared to the method in which new liquid is constantly supplied.

Then, a residue (what is called scum) due to the development may be removed. For example, the residue can be removed by ashing using oxygen plasma.

Next, as illustrated in FIG. 17B, etching treatment is performed using the insulating layer 127*b* as a mask, so that part of the insulating film 125A is removed to form an insulating layer 125B and the thickness of part of the mask layer 118*a* is reduced. In the connection portion 140, a surface of the thinned portion of the mask layer 118*a* is exposed. Note that the etching treatment using the insulating layer 127*b* as a mask is referred to as first etching treatment below in some cases.

The first etching treatment can be performed by dry etching or wet etching. Note that the insulating film 125A is preferably formed using a material similar to that for of the mask layer 118*a*, in which case the first etching treatment can be performed collectively.

In the case of performing dry etching, a chlorine-based gas is preferably used. As the chlorine-based gas, any of $Cl_2$, $BCl_3$, $SiCl_4$, $CCl_4$, and the like can be used alone or two or more of the gases can be mixed and used. Furthermore, one or more of an oxygen gas, a hydrogen gas, a helium gas, an argon gas, and the like can be mixed as appropriate with the chlorine-based gas. By employing dry etching, the thin region of the mask layer 118*a* can be formed with a favorable in-plane uniformity.

The first etching treatment is preferably performed by wet etching. The use of a wet etching method can reduce damage to the first layer 113*a*, the second layer 113*b*, and the third layer 113*c* compared with the case of using a dry etching method. The process can be simplified by using a method and an apparatus similar to those for second etching treatment described later.

For example, the wet etching can be performed using an alkaline solution or the like. For example, for wet etching of an aluminum oxide film, it is preferable to use an aqueous solution of tetramethyl ammonium hydroxide (TMAH) that is an alkaline solution. In this case, the wet etching can be performed by a puddle method. It is also preferable to employ the step puddle method described above.

As illustrated in FIG. 17B, in the first etching treatment, the etching treatment is stopped when the mask layer 118*a* is thinned, before the mask layer is completely removed. The mask layer 118*a* in the connection portion 140 is processed also in the second etching treatment and third etching treatment described later. When the mask layer 118*a* is completely removed in the first etching treatment, the insulating layer 125B and the mask layer below end portions of the insulating layer 127 are eliminated due to side etching in the second etching treatment and the third etching treatment, which might cause a cavity. When the mask layer 118*a* remains over the conductive layer 123 in this manner, excess etching of the mask layer 118*a* and damage of the conductive layer 123 can be prevented.

Although the mask layer 118*a* is thinned in FIG. 17B, the present invention is not limited thereto. For example, depending on the thickness of the insulating film 125A and the thickness of the mask layer 118*a*, the first etching treatment might be stopped after only part of the insulating film 125A is thinned. In the case where the insulating film 125A is formed using a material similar to that for the mask layer 118*a* and accordingly the boundary between the insulating film 125A and the mask layer 118*a* is unclear, whether the insulating film 125A is removed or thinned and whether the mask layer 118*a* is thinned cannot be determined in some cases.

Although FIG. 17B illustrates an example in which the shape of the insulating layer 127*b* is not changed from that in FIG. 17A, the present invention is not limited thereto. For example, the end portion of the insulating layer 127*b* sags and covers the end portion of the insulating layer 125B in some cases. In another case, the end portion of the insulating layer 127*b* is in contact with the top surface of the mask layer 118*a*, for example. As described above, in the case where light exposure is not performed on the insulating layer 127*b* after development, the shape of the insulating layer 127*b* is sometimes easily changed.

Then, as illustrated in FIG. 17C, light exposure is performed in the display portion. Specifically, in the display portion, part of the insulating layer 127*b* is irradiated with visible light or ultraviolet rays as light exposure.

As described above, the insulating layer 127 is formed in regions interposed between two of the pixel electrodes 111*a*, 111*b*, and 111*c*, and around the conductive layer 123. Thus, as illustrated in FIG. 17C, irradiation with visible light or ultraviolet rays is performed over the pixel electrode 111*a*, the pixel electrode 111*b*, and the pixel electrode 111*c* with the use of a mask 132*b*.

Note that the width of the insulating layer 127 to be formed later can be controlled by the region exposed to light here. In this embodiment, the insulating layer 127 is processed so as to include a portion overlapping with the top surface of the pixel electrode (FIG. 2A and FIG. 2B). As illustrated in FIG. 6A or FIG. 6B, the insulating layer 127 does not necessarily include a portion overlapping with the top surface of the pixel electrode.

Light used for the exposure can be similar to the light used in the step illustrated in FIG. 16C.

Here, when a barrier insulating layer (e.g., an aluminum oxide film) against oxygen is provided as one or both of the mask layer 118 (the mask layers 118*a*, 118*b*, and 118*c*) and the insulating film 125A, diffusion of oxygen into the first layer 113*a*, the second layer 113*b*, and the third layer 113*c* can be suppressed. When the EL layer is irradiated with light (visible light or ultraviolet rays), the organic compound contained in the EL layer is brought into an excited state and a reaction between the organic compound and oxygen contained in the atmosphere is promoted in some cases. Specifically, when the EL layer is irradiated with light (visible light or ultraviolet rays) in an atmosphere containing oxygen, oxygen might be bonded to the organic compound contained in the EL layer. By providing the mask layer 118 and the insulating film 125A over the island-shaped EL layer, bonding of oxygen in the atmosphere to the organic compound contained in the EL layer can be suppressed.

Figure 18A:
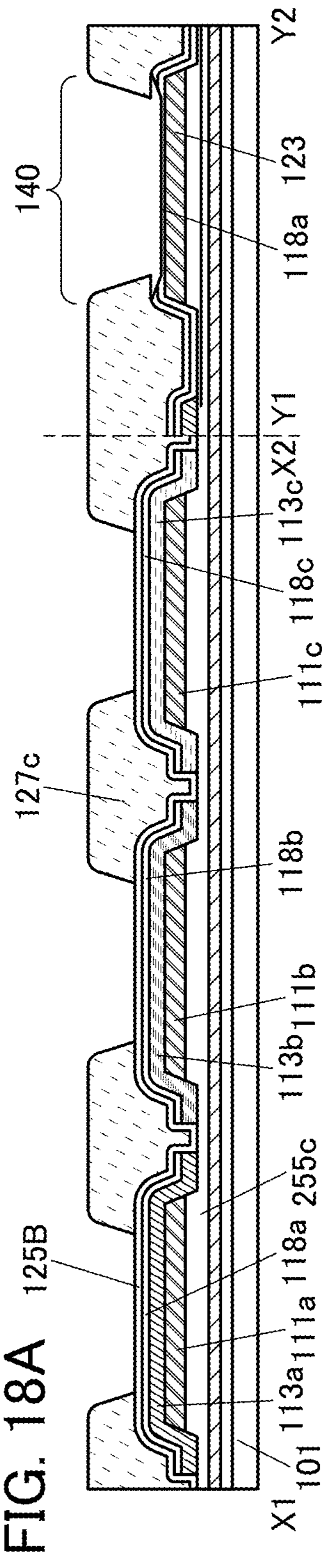
FIG. 18A to FIG. 18C are cross-sectional views illustrating an example of a method for manufacturing a display device.
Figure 21A:
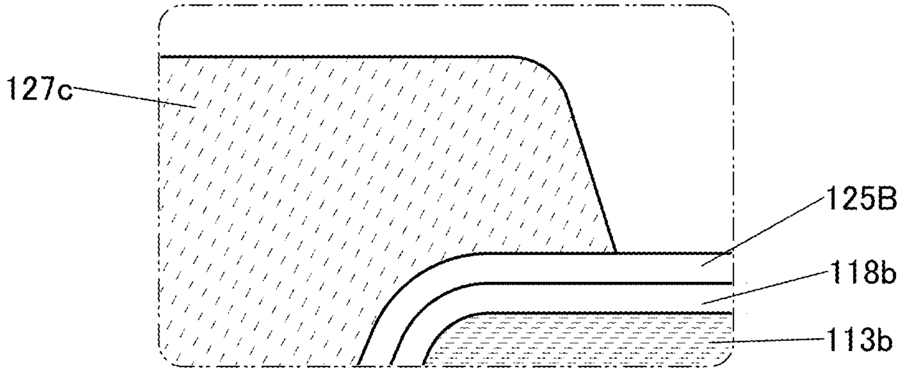
FIG. 21A to FIG. 21D are cross-sectional views illustrating an example of a method for manufacturing a display device.

Next, as illustrated in FIG. 18A and FIG. 21A, the region of the insulating layer 127*b* exposed to light is removed by development, so that an insulating layer 127*c* is formed.

Note that FIG. 21A is an enlarged view of end portions of the second layer 113*b* and the insulating layer 127*b* illustrated in FIG. 18A and the vicinities thereof. The insulating layer 127*c* is formed in regions interposed between two of the pixel electrodes 111*a*, 111*b*, and 111*c*, and a region surrounding the conductive layer 123.

Then, a residue (what is called scum) due to the development may be removed. For example, the residue can be removed by ashing using oxygen plasma.

Etching may be performed to adjust the surface level of the insulating layer 127*c*. The insulating layer 127*c* may be processed by ashing using oxygen plasma, for example.

Figure 18B:
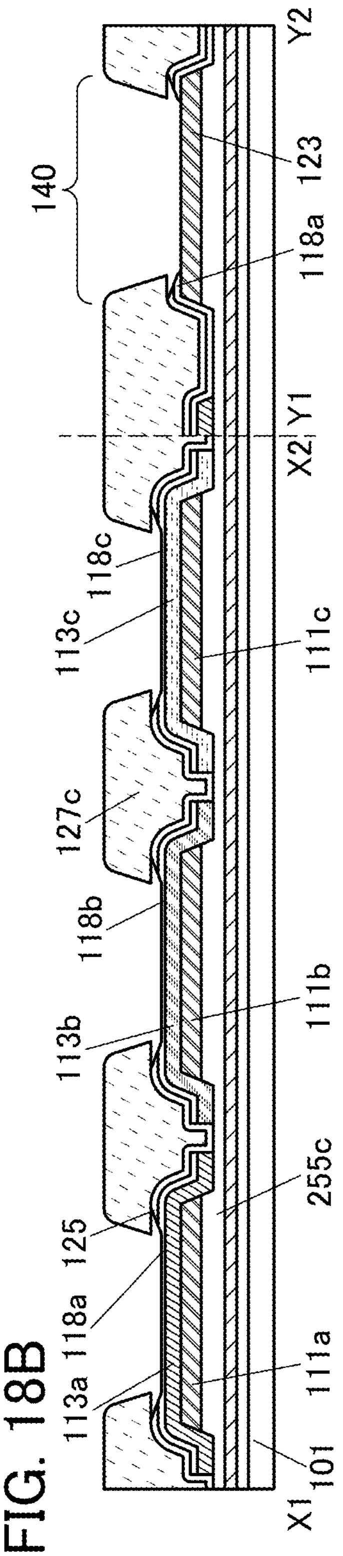
Figure 21B:
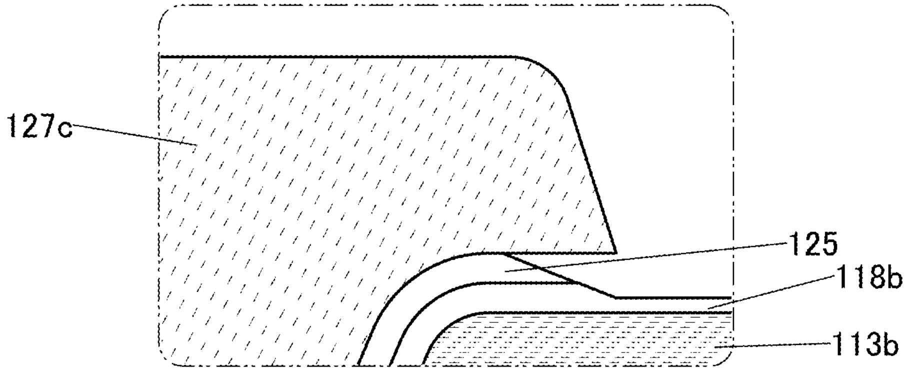

Next, as illustrated in FIG. 18B and FIG. 21B, etching treatment is performed using the insulating layer 127*c* as a mask, so that part of the insulating layer 125B is removed to reduce the thickness of parts of the mask layers 118*a*, 118*b*, and 118*c*. Accordingly, the insulating layer 125 is formed below the insulating layer 127*c*. In addition, the surfaces of the thinned portions of the mask layers 118*a*, 118*b*, and 118*c* are exposed. FIG. 21B is an enlarged view of the end portions of the second layer 113*b* and the insulating layer 127*c* illustrated in FIG. 18B and the vicinities thereof. Note that the etching treatment using the insulating layer 127*c* as a mask is referred to as second etching treatment below in some cases.

The second etching treatment can be performed by dry etching or wet etching. Note that the insulating film 125A is preferably formed using a material similar to that for of the mask layers 118*a*, 118*b*, and 118*c*, in which case the second etching treatment can be performed collectively. The second etching treatment is preferably performed in a manner similar to that for the first etching treatment.

As illustrated in FIG. 21B, when etching is performed using the insulating layer 127*b* having a tapered side surface as a mask, the side surface of the insulating layer 125 and the upper end portions of the side surfaces of the mask layers 118*a*, 118*b*, and 118*c* can easily have tapered shapes.

The second etching treatment is preferably performed by wet etching. The use of a wet etching method can reduce damage to the first layer 113*a*, the second layer 113*b*, and the third layer 113*c* compared with the case of using a dry etching method.

As illustrated in FIG. 18B and FIG. 21B, in the second etching treatment, the etching treatment is stopped when the mask layers 118*a*, 118*b*, and 118*c* are thinned, before the mask layers are completely removed. When the mask layers 118*a*, 118*b*, and 118*c* remain over the first layer 113*a*, the second layer 113*b*, and the third layer 113*c*, respectively, the first layer 113*a*, the second layer 113*b*, and the third layer 113*c* can be prevented from being damaged by treatment in a later step.

Although the mask layers 118*a*, 118*b*, and 118*c* are thinned in FIG. 18B and FIG. 21B, the present invention is not limited thereto. For example, depending on the thickness of the insulating film 125A and the thicknesses of the mask layers 118*a*, 118*b*, and 118*c*, the second etching treatment might be stopped before the insulating layer 125B is processed into the insulating layer 125. Specifically, the second etching treatment might be stopped after only part of the insulating layer 125B is thinned. In the case where the insulating film 125A is formed using a material similar to that for each of the mask layers 118*a*, 118*b*, and 118*c* and accordingly the boundary between the insulating film 125A (or the insulating layer 125B or the insulating layer 125) and each of the mask layers 118*a*, 118*b*, and 118*c* is unclear, whether the insulating layer 125 is formed or whether the mask layers 118*a*, 118*b*, and 118*c* are thinned cannot be determined in some cases.

Although FIG. 18B and FIG. 21B illustrate an example in which the shape of the insulating layer 127*c* is not changed from that in FIG. 18A and FIG. 21A, the present invention is not limited thereto. For example, the end portion of the insulating layer 127*c* sags and covers the end portion of the insulating layer 125 in some cases. In another case, the end portion of the insulating layer 127*c* is in contact with the top surfaces of the mask layers 118*a*, 118*b*, and 118*c*, for example. As described above, in the case where light exposure is not performed on the insulating layer 127*c* after development, the shape of the insulating layer 127*c* is sometimes easily changed.

Note that FIG. 18B illustrates an example in which the mask layer 118*a* in the connection portion 140 is completely removed and the conductive layer 123 is exposed in the second etching treatment. The present invention is not limited thereto, and the mask layer 118*a* may have a thinned portion in the connection portion 140 at the time of FIG. 18B and the conductive layer 123 is not necessarily exposed.

Figure 18C:
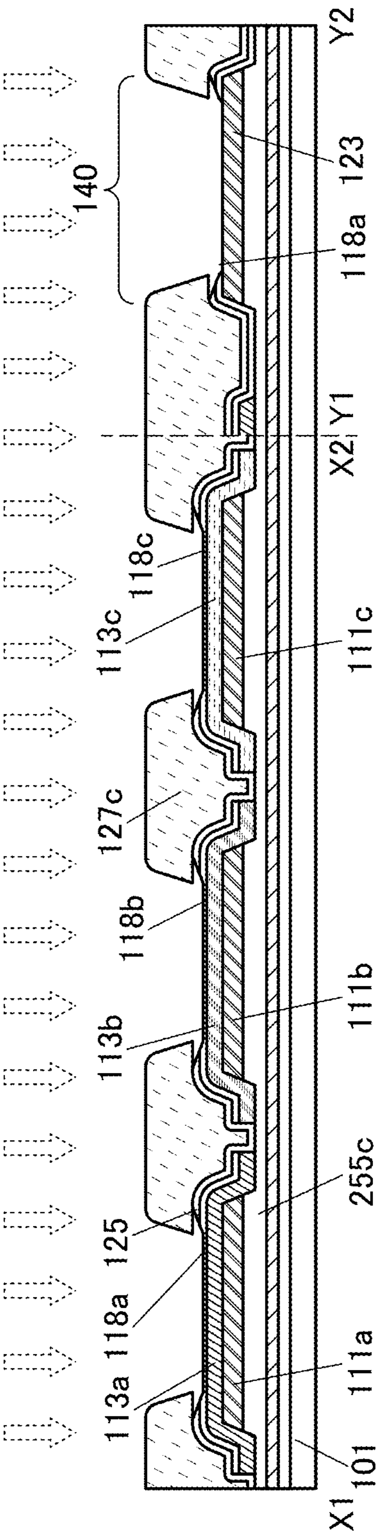

Here, the case where the light exposure and development of the insulating film 127*a* in the display portion and the connection portion 140 are performed in the same step is considered. Specifically, irradiation with visible light or ultraviolet rays is performed over the pixel electrode 111*a*, the pixel electrode 111*b*, and the pixel electrode 111*c* through the insulating film 127*a* illustrated in FIG. 16B. Then, development is performed, so that the insulating layer 127*c* is formed in regions interposed between two of the pixel electrodes 111*a*, 111*b*, and 111*c*, and around the conductive layer 123 (FIG. 18C). Next, etching treatment is performed on the insulating film 125A, so that part of the insulating film 125A is removed in the display portion and the connection portion 140.

Since the etching treatment is performed before post-baking, there might be limitation on the apparatus and method that can be used. For example, the insulating film 125A is preferably etched by a puddle method using a development apparatus and a developer. This allows the insulating film 125A to be processed without providing a new apparatus in addition to the apparatuses used for light exposure, development, and post-baking. For example, in the case where an aluminum oxide film is used as the insulating film 125A, the insulating film 125A can be processed by wet etching using a developer including TMAH.

Here, wet etching is preferably performed by a method that consumes a small amount of etchant; for example, a puddle method is preferred. Note that the etching area of the insulating film 125A in the connection portion 140 is extremely larger than the etching area of the insulating film 125A in the display portion. Therefore, in the connection portion 140, a shortage of the etchant is caused by the puddle method, for example, and the etching rate is likely to be lower than that in the display portion. The difference in etching rate between the display portion and the connection portion 140 causes a problem of unstable processing of the insulating film 125A. For example, when the etching time is determined in accordance with the etching rate in the connection portion 140, the insulating film 125A in the display portion might be etched excessively. When the etching time is determined in accordance with the etching rate in the display portion, the insulating film 125A in the connection portion 140 might remain without being sufficiently etched. Meanwhile, in a method for constantly supplying a new liquid so as not cause a difference in etching rate (e.g., a spin method), a large amount of etchant is consumed.

Thus, in a method for manufacturing a display device of one embodiment of the present invention, light exposure and development of the insulating film 127*a* in the connection portion 140 are performed separately from light exposure and development of the insulating layer 127*b* in the display portion. This allows the etching conditions (e.g., etching time) of the insulating film 125A in the connection portion 140 to be controlled independently from those in the display portion, thereby inhibiting both excess etching of the insulating film 125A in the display portion and insufficient etching of the insulating film 125A in the connection portion 140, so that the insulating film 125A can be processed into a desired shape.

Next, light exposure is preferably performed on the entire substrate so that the insulating layer 127*c* is irradiated with visible light or ultraviolet rays (FIG. 18C). The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after development can improve the transparency of the insulating layer 127*c* in some cases. In addition, it is sometimes possible to lower the substrate temperature required for heat treatment in a later step for changing the shape of the insulating layer 127*c* into a tapered shape.

In the case where a resin that is cured or promoted to be cured by light irradiation is used as a material of the insulating layer 127, the insulating layer 127 can be sufficiently cured by performing light irradiation at least once after development and the shape stability can be improved.

Here, when a barrier insulating layer (e.g., an aluminum oxide film) against oxygen is provided as the mask layer 118*a*, the mask layer 118*b*, and the mask layer 118*c*, diffusion of oxygen into the first layer 113*a*, the second layer 113*b*, and the third layer 113*c* can be suppressed. When the EL layer is irradiated with light (visible light or ultraviolet rays), the organic compound contained in the EL layer is brought into an excited state and a reaction between the organic compound and oxygen contained in the atmosphere is promoted in some cases. Specifically, when the EL layer is irradiated with light (visible light or ultraviolet rays) in an atmosphere containing oxygen, oxygen might be bonded to the organic compound contained in the EL layer. By providing the mask layer 118*a*, the mask layer 118*b*, and the mask layer 118*c* over the island-shaped EL layers, bonding of oxygen in the atmosphere to the organic compound contained in the EL layer can be suppressed.

In contrast, as described later, when light exposure is not performed on the insulating layer 127*c*, the shape of the insulating layer 127*c* can be easily changed or the insulating layer 127 can be easily changed into a tapered shape in a later step in some cases. In addition, the end portion of the insulating layer 127 may have a smaller taper angle. Furthermore, the end portion of the insulating layer 127 may cover the entire side surface of the mask layer, and further, may be positioned outward from the end portion of the mask layer. Thus, it is sometimes preferable not to perform light exposure on the insulating layer 127*c* or 127 after development.

For example, in the case where a photocurable resin is used as a material of the insulating layer 127*c*, performing light exposure on the insulating layer 127*c* can start polymerization and cure the insulating layer 127*c*. Note that without performing light exposure on the insulating layer 127*c* at this stage, at least one of post-baking and third etching treatment that are described later may be performed while the insulating layer 127*c* remains in a state where its shape is relatively easily changed. Thus, generation of unevenness in the formation surface of the common layer 114 and the common electrode 115 can be inhibited and step disconnection of the common layer 114 and the common electrode 115 can be inhibited. Note that light exposure may be performed on the insulating layer 127*c* (or the insulating layer 127) after the post-baking, the third etching treatment, formation of the common electrode, or formation of the protective layer 131, which is described later. Note that light exposure may be performed after development and before the first etching treatment or the second etching treatment. On the other hand, depending on the material (e.g., a positive material) of the insulating layer 127*c* and the etching treatment conditions, the insulating layer 127*b* or the insulating layer 127*c* might be dissolved in an etchant during the etching treatment due to light exposure. For this reason, light exposure is preferably performed after the second etching treatment and before the post-baking. Hence, the insulating layer 127 having an intended shape can be stably formed with high reproducibility.

Here, irradiation with visible light or ultraviolet rays illustrated in FIG. 18C is preferably performed in an atmosphere containing no oxygen or an atmosphere containing a small amount of oxygen. For example, the irradiation with visible light or ultraviolet rays is preferably performed in an inert gas atmosphere such as a nitrogen atmosphere, a reduced-pressure atmosphere having a lower oxygen content than an air atmosphere, or a pressurized atmosphere having a lower oxygen content than an air atmosphere. If the irradiation with visible light or ultraviolet rays is performed in an atmosphere containing a large amount of oxygen, the compound contained in the EL layer might be oxidized and the properties might be changed. In contrast, by performing the irradiation with visible light or ultraviolet rays in an atmosphere containing no oxygen or an atmosphere containing a small amount of oxygen, a change of the properties of the EL layer can be prevented; hence, a display device with higher reliability can be provided. Note that the same applies to the light-exposure step illustrated in FIG. 16C and FIG. 17C.

Figure 19A:
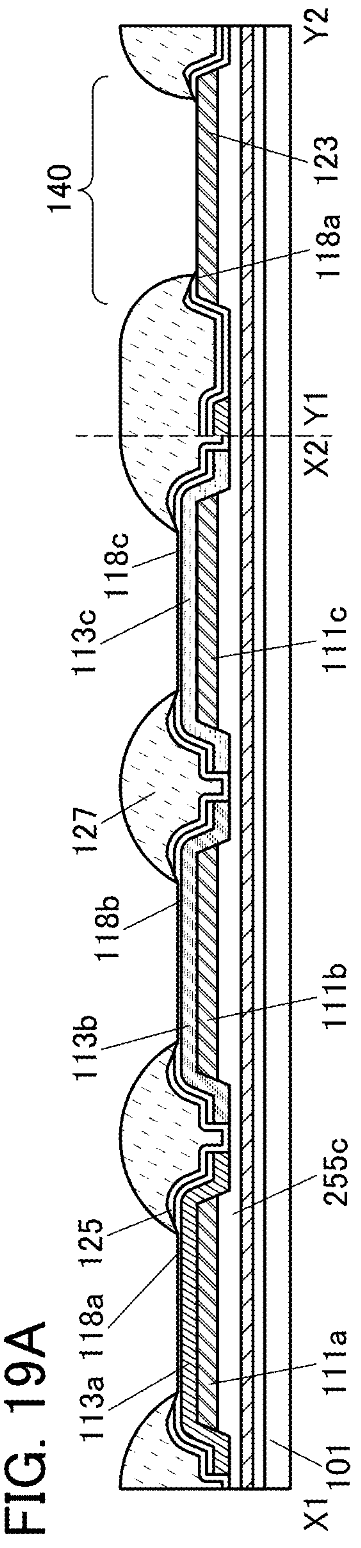
FIG. 19A and FIG. 19B are cross-sectional views illustrating an example of a method for manufacturing a display device.
Figure 21C:
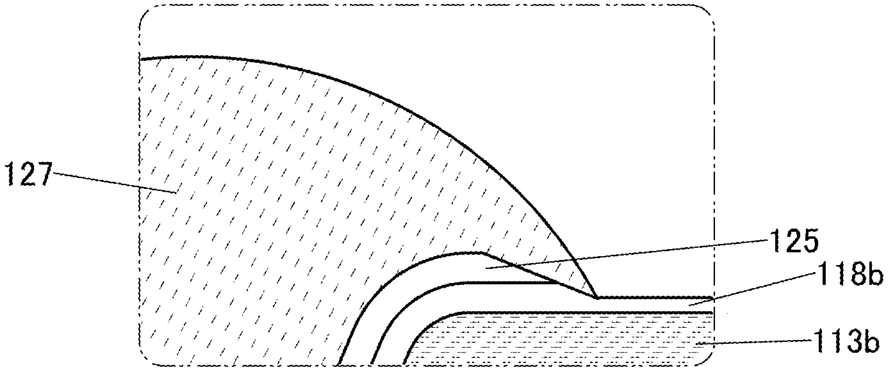

After that, heat treatment (also referred to as post-baking) is performed. As illustrated in FIG. 19A and FIG. 21C, by performing the heat treatment, the insulating layer 127*c* can be transformed into the insulating layer 127 having a tapered side surface. As described above, in some cases, the insulating layer 127*c* is already changed in shape and has a tapered side surface at the time when the second etching treatment is finished. The heat treatment is performed at a temperature lower than the upper temperature limit of the EL layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be either an air atmosphere or an inert gas atmosphere. Alternatively, the heating atmosphere may be either an atmospheric pressure atmosphere or a reduced pressure atmosphere. A reduced-pressure atmosphere is preferable because drying at a lower temperature is possible. The heat treatment in this step is preferably performed at a higher substrate temperature than the heat treatment (pre-baking) after formation of the insulating film 127*a*. In this case, the adhesion between the insulating layer 127 and the insulating layer 125 and the corrosion resistance of the insulating layer 127 can be improved. Note that FIG. 21C is an enlarged view of the end portions of the second layer 113*b* and the insulating layer 127 illustrated in FIG. 19A and the vicinities thereof.

As described above, a material with high heat resistance is used for the light-emitting device of the display device of one embodiment of the present invention. Therefore, the temperature of the pre-baking and the temperature of the post-baking can each be higher than or equal to 100° C., higher than or equal to 120° C., or higher than or equal to 140° C. Thus, the adhesion between the insulating layer 127 and the insulating layer 125 can be further improved, and the corrosion resistance of the insulating layer 127 can be further increased. Moreover, the range of choice for materials that can be used for the insulating layer 127 can be widened. By adequately removing the solvent and the like included in the insulating layer 127, entry of impurities such as water and oxygen into the EL layer can be suppressed.

The first etching treatment does not remove the mask layers 118*a*, 118*b*, and 118*c* completely to make the thinned mask layers 118*a*, 118*b*, and 118*c* remain, thereby preventing the first layer 113*a*, the second layer 113*b*, and the third layer 113*c* from being damaged by the heat treatment and deteriorating. Thus, the reliability of the light-emitting device can be improved.

As illustrated in FIG. 4A and FIG. 4B, the side surface of the insulating layer 127 might have a concave shape depending on the materials for the insulating layer 127, or the temperature, time, and atmosphere of the post-baking. For example, the insulating layer 127 is more likely to be changed in shape to have a concave shape as the temperature is higher or the time is longer in the post-baking conditions. In addition, as described above, in the case where light exposure is not performed on the insulating layer 127*c* after development, the shape of the insulating layer 127 is sometimes easily changed at the time of the post-baking.

Figure 19B:
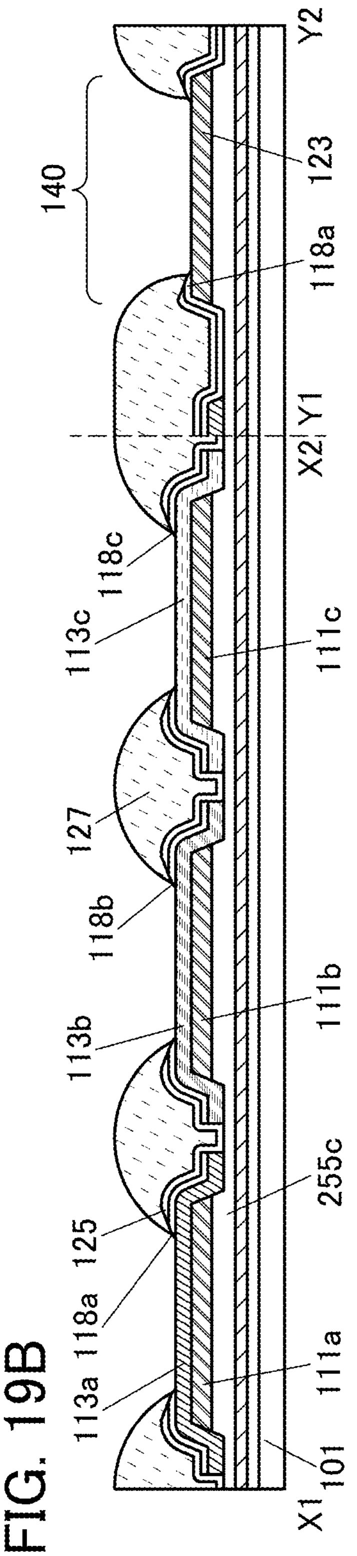
Figure 21D:
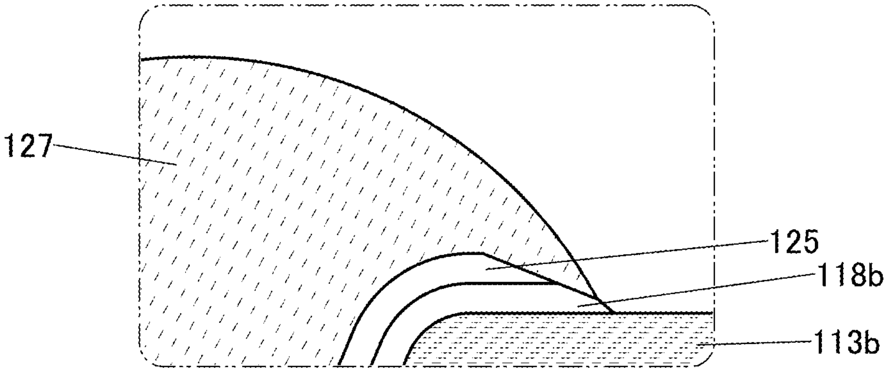

Next, as illustrated in FIG. 19B and FIG. 21D, etching treatment is performed using the insulating layer 127 as a mask to remove parts of the mask layers 118*a*, 118*b*, and 118*c*. Note that part of the insulating layer 125 is also removed in some cases. Consequently, openings are formed in the mask layers 118*a*, 118*b*, and 118*c*, and the top surfaces of the first layer 113*a*, the second layer 113*b*, the third layer 113*c*, and the conductive layer 123 are exposed. Note that FIG. 21D is an enlarged view of the end portions of the second layer 113*b* and the insulating layer 127 illustrated in FIG. 19B and the vicinities thereof. Note that the etching treatment using the insulating layer 127 as a mask is referred to as third etching treatment below in some cases.

The end portion of the insulating layer 125 is covered with the insulating layer 127. FIG. 19B and FIG. 21D illustrate an example in which part of the end portion of the mask layer 118*b* (specifically, the tapered portion formed by the second etching treatment) is covered with the insulating layer 127 and the tapered portion formed by the third etching treatment is exposed. That is, the structure corresponds to that illustrated in FIG. 2A and FIG. 2B.

When the first etching treatment and the second etching treatment are not performed and the insulating layer 125 and the mask layer are collectively etched after the post-baking, the insulating layer 125 and the mask layer below the end portion of the insulating layer 127 are eliminated by side etching and accordingly a cavity is formed in some cases. The cavity causes unevenness in the formation surface of the common layer 114 and the common electrode 115, so that step disconnection is likely to occur in the common layer 114 and the common electrode 115. Even when a cavity is formed owing to side etching of the insulating layer 125 and the mask layer by the first etching treatment or the second etching treatment, the post-baking performed subsequently can make the insulating layer 127 fill the cavity. After that, since the third etching treatment etches the thinned mask layer, the amount of side etching is small and thus a cavity is not easily formed, and even if a cavity is formed, it can be extremely small. Therefore, the flatness of the formation surface of the common layer 114 and the common electrode 115 can be improved.

Note that as illustrated in FIG. 3A, FIG. 3B, FIG. 5A, and FIG. 5B, the insulating layer 127 may cover the entire end portion of the mask layer 118*b*. For example, the end portion of the insulating layer 127 sags and covers the end portion of the mask layer 118*b* in some cases. Alternatively, for example, the end portion of the insulating layer 127 is in contact with the top surface of at least one of the first layer 113*a*, the second layer 113*b*, and the third layer 113*c* in some cases. As described above, in the case where light exposure is not performed on the insulating layer 127*b* after development, the shape of the insulating layer 127 is easily changed in some cases.

The second etching treatment is preferably performed by wet etching. The use of a wet etching method can reduce damage to the first layer 113*a*, the second layer 113*b*, and the third layer 113*c* compared with the case of using a dry etching method. The wet etching can be performed using an alkaline solution or the like.

As described above, providing the insulating layer 127, the insulating layer 125, the mask layer 118*a*, the mask layer 118*b*, and the mask layer 118*c* can inhibit the common layer 114 and the common electrode 115 between the light-emitting devices from having connection defects due to a disconnected portion and an increase in electric resistance due to a locally thinned portion. Thus, the display quality of the display device of one embodiment of the present invention can be improved.

After parts of the first layer 113*a*, the second layer 113*b*, and the third layer 113*c* are exposed, additional heat treatment may be performed. The heat treatment can remove water contained in the EL layer, water adsorbed onto the surface of the EL layer, and the like. In addition, the heat treatment changes the shape of the insulating layer 127 in some cases.

Specifically, the insulating layer 127 may be extended to cover at least one of the end portion of the insulating layer 125, the end portions of the mask layers 118*a*, 118*b*, and 118*c*, and the top surfaces of the first layer 113*a*, the second layer 113*b*, and the third layer 113*c*. For example, the insulating layer 127 may have a shape illustrated in FIG. 3A and FIG. 3B. For example, heat treatment in an inert gas atmosphere or a reduced pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. A reduced-pressure atmosphere is preferable because dehydration at a lower temperature is possible. Note that the temperature range of the heat treatment is preferably determined as appropriate in consideration of the upper temperature limit of the EL layer. In consideration of the upper temperature limit of the EL layer, temperatures higher than or equal to 70° C. and lower than or equal to 120° C. are particularly preferable in the above temperature range.

Figure 20A:
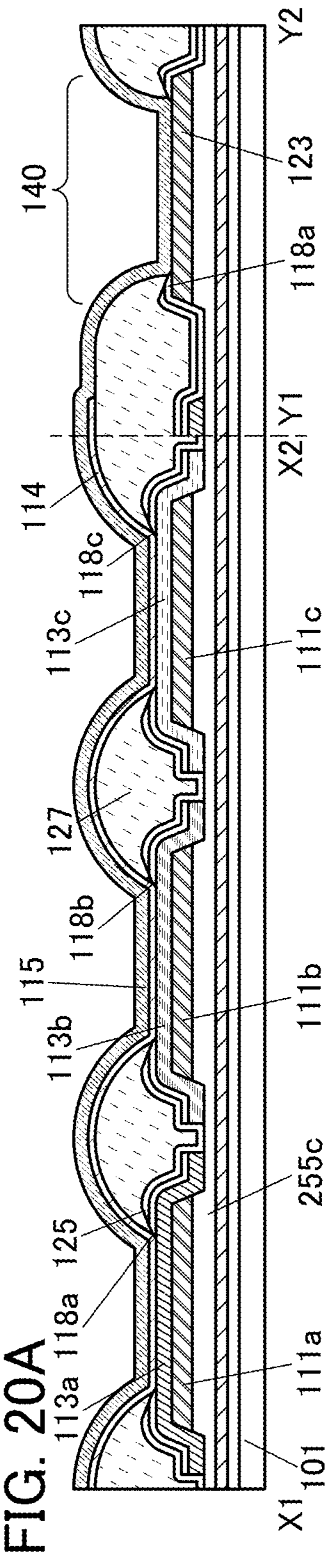
FIG. 20A and FIG. 20B are cross-sectional views illustrating an example of a method for manufacturing a display device.
Figure 20B:
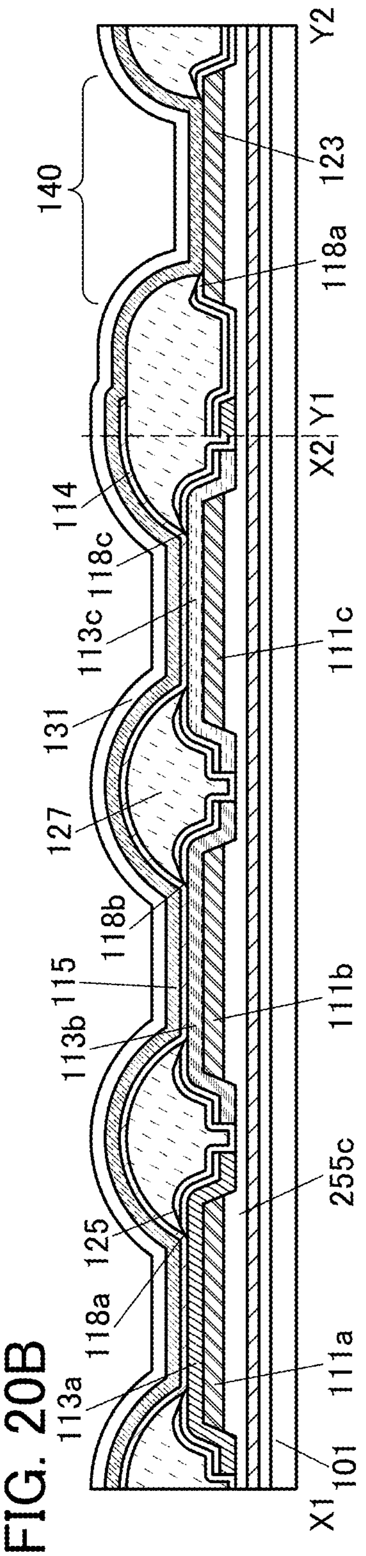

Next, the common layer 114 and the common electrode 115 are formed in this order over the insulating layer 127, the first layer 113*a*, the second layer 113*b*, and the third layer 113*c* (FIG. 20A), and the protective layer 131 is further formed (FIG. 20B). Then, the substrate 120 is bonded onto the protective layer 131 with the resin layer 122, whereby the display device can be manufactured (FIG. 1B).

The common layer 114 can be formed by a method such as an evaporation method (including a vacuum evaporation method), a transfer method, a printing method, an inkjet method, or a coating method.

The common electrode 115 can be formed by a sputtering method or a vacuum evaporation method, for example. Alternatively, a film formed by an evaporation method and a film formed by a sputtering method may be stacked.

Examples of methods for forming the protective layer 131 include a vacuum evaporation method, a sputtering method, a CVD method, and an ALD method.

As described above, in the method for manufacturing a display device of one embodiment of the present invention, the island-shaped first layer 113*a*, the island-shaped second layer 113*b*, and the island-shaped third layer 113*c* are formed not by using a fine metal mask but by processing a film formed on the entire surface; thus, each of the layers can be formed to have a uniform thickness. Consequently, a high-resolution display device or a display device with a high aperture ratio can be obtained. Furthermore, even when the resolution or the aperture ratio is high and the distance between subpixels is extremely short, contact between the first layer 113*a*, the second layer 113*b*, and the third layer 113*c* can be inhibited in adjacent subpixels.

Accordingly, generation of a leakage current between subpixels can be inhibited. This can prevent crosstalk due to unintended light emission, so that a display device with extremely high contrast can be obtained.

Provision of the insulating layer 127 having a tapered end portion between adjacent island-shaped EL layers can inhibit formation of step disconnection and prevent formation of a locally thinned portion in the common electrode 115 at the time of forming the common electrode 115. This can inhibit the common layer 114 and the common electrode 115 from having connection defects due to the disconnected portion and an increased electric resistance due to the locally thinned portion. Thus, the display device of one embodiment of the present invention can have both a higher resolution and higher display quality.

In addition, light exposure and development of a film to be the insulating layer 127 in the connection portion 140 are performed separately from light exposure and development of the film in the display portion, whereby the processing conditions of the film to be the insulating layer 125 in the connection portion 140 can be controlled independently from those in the display portion. As a result, the insulating layer 125 can be processed into a desired shape to reduce defects in manufacturing the display device.

This embodiment can be combined with any of the other embodiments as appropriate.

Embodiment 3

In this embodiment, a display device of one embodiment of the present invention will be described with reference to FIG. 22 and FIG. 23.

[Pixel Layout]

Pixel layouts different from that in FIG. 1A will be mainly described in this embodiment. There is no particular limitation on the arrangement of subpixels, and any of a variety of methods can be employed. Examples of the arrangement of subpixels include stripe arrangement, S-stripe arrangement, matrix arrangement, delta arrangement, Bayer arrangement, and PenTile arrangement.

The top surface shape of the subpixel illustrated in a diagram in this embodiment corresponds to the top surface shape of a light-emitting region (or a light-receiving region).

The range of the circuit layout for forming the subpixels is not limited to the range of the subpixels illustrated in a diagram and may be placed outside the range of the subpixels.

Figure 22A:
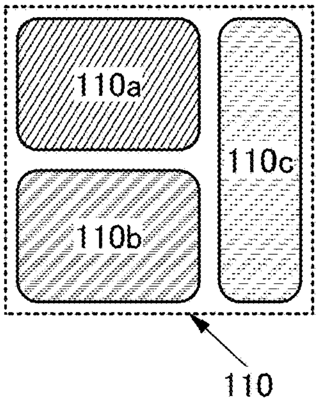
FIG. 22A to FIG. 22F are diagrams illustrating examples of pixels.

The pixel 110 illustrated in FIG. 22A employs S-stripe arrangement. The pixel 110 illustrated in FIG. 22A is composed of three subpixels: the subpixels 110*a*, 110*b*, and 110*c*.

Figure 22B:
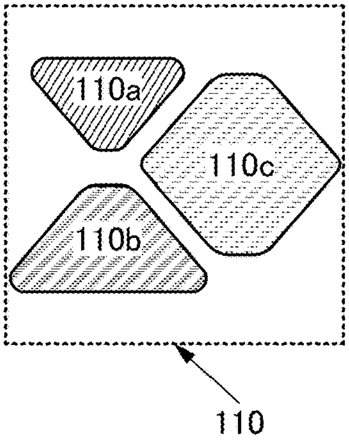

The pixel 110 illustrated in FIG. 22B includes the subpixel 110*a* whose top surface has a rough triangle or rough trapezoidal shape with rounded corners, the subpixel 110*b* whose top surface has a rough triangle or rough trapezoidal shape with rounded corners, and the subpixel 110*c* whose top surface has a rough tetragonal or rough hexagonal shape with rounded corners. The subpixel 110*b* has a larger light-emitting area than the subpixel 110*a*. In this manner, the shapes and sizes of the subpixels can be determined independently. For example, the size of a subpixel including a light-emitting device with higher reliability can be smaller.

Figure 22C:
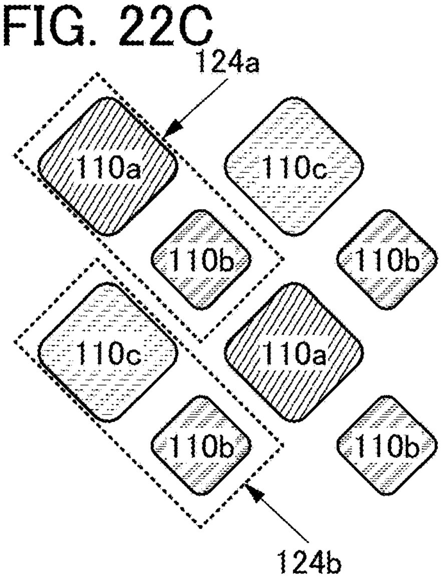

Pixels 124*a* and 124*b* illustrated in FIG. 22C employ PenTile arrangement. FIG. 22C illustrates an example in which the pixels 124*a* including the subpixel 110*a* and the subpixel 110*b* and the pixels 124*b* including the subpixel 110*b* and the subpixel 110*c* are alternately arranged.

Figure 22D:
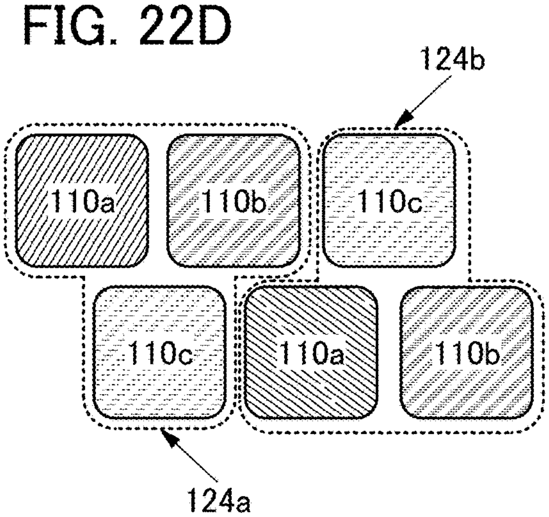
Figure 22E:
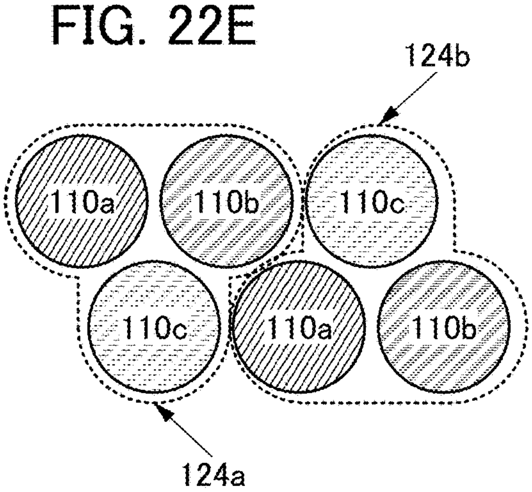

The pixels 124*a* and 124*b* illustrated in FIG. 22D and FIG. 22E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row).

FIG. 22D illustrates an example in which the top surface of each subpixel has a rough tetragonal shape with rounded corners, and FIG. 22E illustrates an example in which the top surface of each subpixel has a circular shape.

Figure 22F:
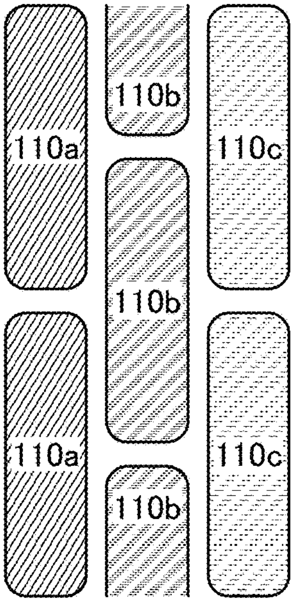

FIG. 22F illustrates an example in which subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in a top view.

For example, in each pixel illustrated in FIG. 22A to FIG. 22F, it is preferable that the subpixel 110*a* be a subpixel R emitting red light, the subpixel 110*b* be a subpixel G emitting green light, and the subpixel 110*c* be a subpixel B emitting blue light. Note that the structure of the subpixels is not limited to this, and the colors and arrangement order of the subpixels can be determined as appropriate. For example, the subpixel 110*b* may be the subpixel R emitting red light and the subpixel 110*a* may be the subpixel G emitting green light.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel has a polygonal shape with rounded corners, an elliptical shape, a circular shape, or the like, in some cases.

Furthermore, in the method for manufacturing the display device of one embodiment of the present invention, the EL layer is processed into an island shape using a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape after being processed. As a result, the top surface of the EL layer may have a polygonal shape with rounded corners, an elliptical shape, a circular shape, or the like. For example, when a resist mask whose top surface has a square shape is intended to be formed, a resist mask whose top surface has a circular shape may be formed, and the top surface of the EL layer may have a circular shape.

Note that to obtain a desired top surface shape of the EL layer, a technique of correcting a mask pattern in advance so that a transferred pattern agrees with a design pattern (OPC (Optical Proximity Correction) technique) may be used. Specifically, with the OPC technique, a pattern for correction is added to a corner portion or the like of a figure on a mask pattern.

As illustrated in FIG. 23A to FIG. 23I, the pixel can include four types of subpixels.

Figure 23A:
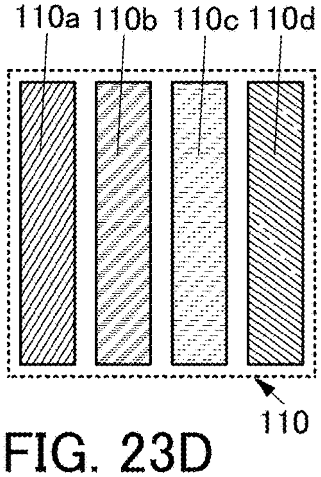
FIG. 23A to FIG. 23K are diagrams illustrating examples of pixels.
Figure 23B:
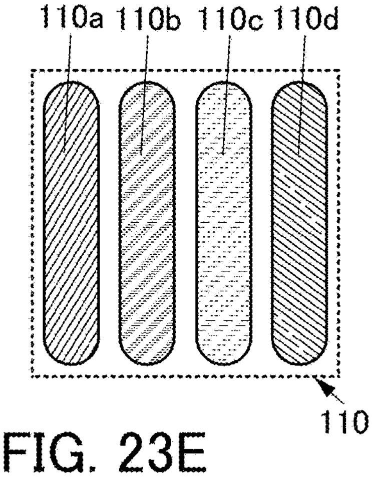
Figure 23C:
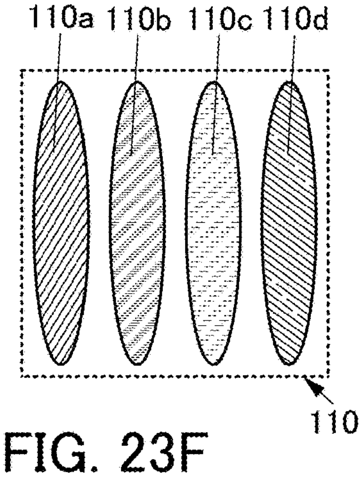

The pixels 110 illustrated in FIG. 23A to FIG. 23C employ stripe arrangement.

FIG. 23A illustrates an example in which each subpixel has a rectangular top surface shape, FIG. 23B illustrates an example in which each subpixel has a top surface shape formed by combining two half circles and a rectangle, and FIG. 23C illustrates an example in which each subpixel has an elliptical top surface shape.

Figure 23D:
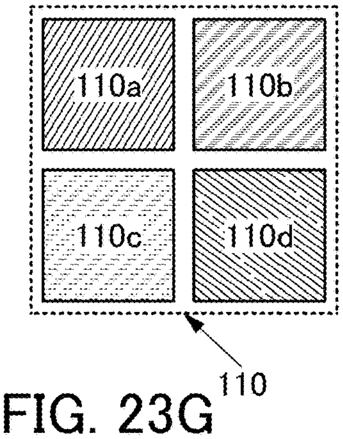
Figure 23E:
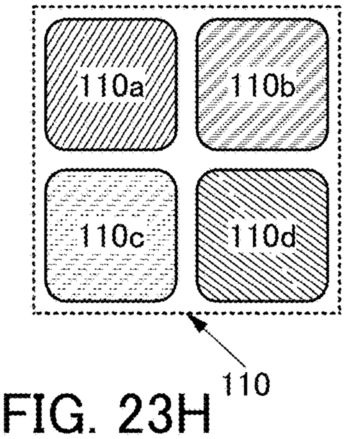
Figure 23F:
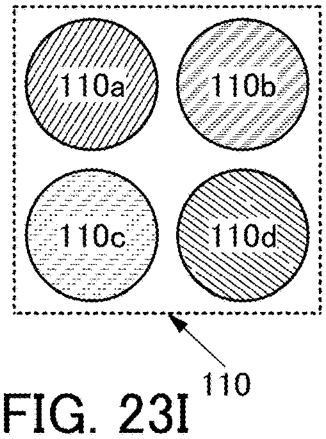

The pixels 110 illustrated in FIG. 23D to FIG. 23F employ matrix arrangement.

FIG. 23D illustrates an example in which each subpixel has a square top surface shape, FIG. 23E illustrates an example in which each subpixel has a rough square top surface shape with rounded corners, and FIG. 23F illustrates an example in which each subpixel has a circular top surface shape.

Figure 23G:
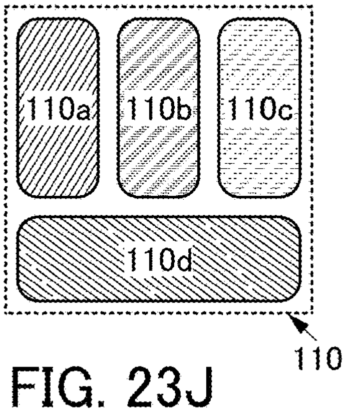
Figure 23H:
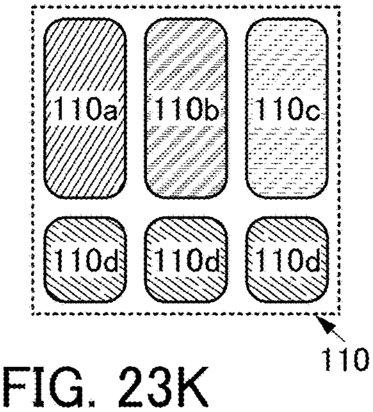

FIG. 23G and FIG. 23H each illustrate an example in which one pixel 110 is composed of two rows and three columns.

The pixel 110 illustrated in FIG. 23G includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 23H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and the subpixel 110*d* in the center column (second column), and the subpixel 110*c* and the subpixel 110*d* in the right column (third column). Matching the positions of the subpixels in the upper row and the lower row as illustrated in FIG. 23H enables efficient removal of dust and the like that would be produced in the manufacturing process. Thus, a display device with high display quality can be provided.

Figure 23I:
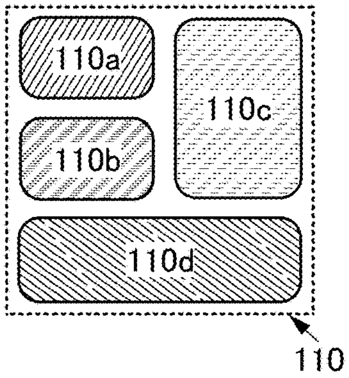

FIG. 23I illustrates an example in which one pixel 110 is composed of three rows and two columns.

The pixel 110 illustrated in FIG. 23I includes the subpixel 110*a* in the upper row (first row), the subpixel 110*b* in the center row (second row), the subpixel 110*c* across the first and second rows, and one subpixel (the subpixel 110*d*) in the lower row (third row). In other words, the pixel 110 includes the subpixels 110*a* and 110*b* in the left column (first column), the subpixel 110*c* in the right column (second column), and the subpixel 110*d* across these two columns.

The pixels 110 illustrated in FIG. 23A to FIG. 23I are each composed of four subpixels: the subpixels 110*a*, 110*b*, 110*c*, and 110*d*.

The subpixels 110*a*, 110*b*, 110*c*, and 110*d* can include light-emitting devices emitting light of different colors. The subpixels 110*a*, 110*b*, 110*c*, and 110*d* are subpixels of four colors of R, G, B, and white (W), subpixels of four colors of R, G, B, and Y, or subpixels of R, G, B, and infrared light (IR), for example.

In the pixels 110 illustrated in FIG. 23A to FIG. 23I, it is preferable that the subpixel 110*a* be the subpixel R emitting red light, the subpixel 110*b* be the subpixel G emitting green light, the subpixel 110*c* be the subpixel B emitting blue light, and the subpixel 110*d* be any of a subpixel W emitting white light, a subpixel Y emitting yellow light, and a subpixel IR emitting near-infrared light, for example. In the case of such a structure, stripe arrangement is employed as the layout of R, G, and B in the pixels 110 illustrated in FIG. 23G and FIG. 23H, leading to higher display quality. In addition, what is called S-stripe arrangement is employed as the layout of R, G, and B in the pixel 110 illustrated in FIG. 23I, leading to higher display quality.

The pixel 110 may include a subpixel including a light-receiving device.

In the pixels 110 illustrated in FIG. 23A to FIG. 23I, any one of the subpixel 110*a* to the subpixel 110*d* may be a subpixel including a light-receiving device.

In the pixels 110 illustrated in FIG. 23A to FIG. 23I, for example, it is preferable that the subpixel 110*a* be the subpixel R emitting red light, the subpixel 110*b* be the subpixel G emitting green light, the subpixel 110*c* be the subpixel B emitting blue light, and the subpixel 110*d* be a subpixel S including a light-receiving device. In the case of such a structure, stripe arrangement is employed as the layout of R, G, and B in the pixels 110 illustrated in FIG. 23G and FIG. 23H, leading to higher display quality. In addition, what is called S-stripe arrangement is employed as the layout of R, G, and B in the pixel 110 illustrated in FIG. 23I, leading to higher display quality.

There is no particular limitation on the wavelength of light detected by the subpixel S including a light-receiving device. The subpixel S can have a structure in which one or both of visible light and infrared light are detected.

Figure 23J:
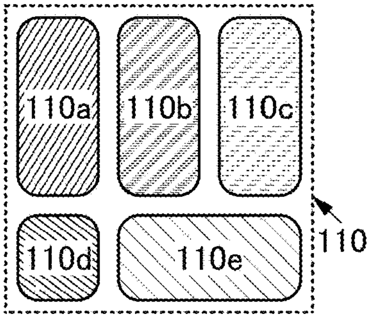
Figure 23K:
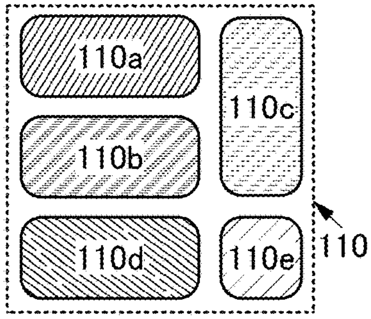

As illustrated in FIG. 23J and FIG. 23K, the pixel can include five types of subpixels.

FIG. 23J illustrates an example in which one pixel 110 is composed of two rows and three columns.

The pixel 110 illustrated in FIG. 23J includes three subpixels (the subpixels 110*a*, 110*b*, and 110*c*) in the upper row (first row) and two subpixels (the subpixel 110*d* and a subpixel 110*e*) in the lower row (second row). In other words, the pixel 110 includes the subpixels 110*a* and 110*d* in the left column (first column), the subpixel 110*b* in the center column (second column), the subpixel 110*c* in the right column (third column), and the subpixel 110*e* across the second and third columns.

FIG. 23K illustrates an example in which one pixel 110 is composed of three rows and two columns.

The pixel 110 illustrated in FIG. 23K includes the subpixel 110*a* in the upper row (first row), the subpixel 110*b* in the center row (second row), the subpixel 110*c* across the first and second rows, and two subpixels (the subpixels 110*d* and 110*e*) in the lower row (third row). In other words, the pixel 110 includes the subpixels 110*a*, 110*b*, and 110*d* in the left column (first column), and the subpixels 110*c* and 110*e* in the right column (second column).

In the pixels 110 illustrated in FIG. 23J and FIG. 23K, for example, it is preferable that the subpixel 110*a* be the subpixel R emitting red light, the subpixel 110*b* be the subpixel G emitting green light, and the subpixel 110*c* be the subpixel B emitting blue light. In the case of such a structure, stripe arrangement is employed as the layout of R, G, and B in the pixel 110 illustrated in FIG. 23J, leading to higher display quality. In addition, what is called S-stripe arrangement is employed as the layout of R, G, and B in the pixel 110 illustrated in FIG. 23K, leading to higher display quality.

In the pixels 110 illustrated in FIG. 23J and FIG. 23K, for example, it is preferable to use the subpixel S including a light-receiving device as at least one of the subpixel 110*d* and the subpixel 110*e*. In the case where light-receiving devices are used in both the subpixel 110*d* and the subpixel 110*e*, the light-receiving devices may have different structures. For example, the wavelength ranges of detected light may be different at least partly. Specifically, one of the subpixel 110*d* and the subpixel 110*e* may include a light-receiving device mainly detecting visible light and the other may include a light-receiving device mainly detecting infrared light.

In the pixels 110 illustrated in FIG. 23J and FIG. 23K, it is referable that, for example, the subpixel S including a light-receiving device be used as one of the subpixel 110*d* and the subpixel 110*e* and a subpixel including a light-emitting device that can be used as a light source be used as the other. For example, it is preferable that one of the subpixel 110*d* and the subpixel 110*e* be the subpixel IR emitting infrared light and the other be the subpixel S including a light-receiving device detecting infrared light.

In a pixel including the subpixels R, G, B, IR, and S, while an image is displayed using the subpixels R, G, and B, reflected light of infrared light emitted by the subpixel IR that is used as a light source can be detected by the subpixel S.

As described above, the pixel composed of the subpixels each including the light-emitting device can employ any of a variety of layouts in the display device of one embodiment of the present invention. The display device of one embodiment of the present invention can have a structure in which the pixel includes both a light-emitting device and a light-receiving device. Also in this case, any of a variety of layouts can be employed.

This embodiment can be combined with any of the other embodiments as appropriate.

Embodiment 4

In this embodiment, display devices of one embodiment of the present invention will be described with reference to FIG. 24 to FIG. 34.

The display device in this embodiment can be a high-resolution display device.

Accordingly, the display device in this embodiment can be used for display portions of information terminals (wearable devices) such as watch-type and bracelet-type information terminals and display portions of wearable devices capable of being worn on the head, such as a VR device like a head-mounted display (HMD) and a glasses-type AR device.

The display device of this embodiment can be a high-definition display device or a large-sized display device. Accordingly, the display device in this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Module]

Figure 24A:
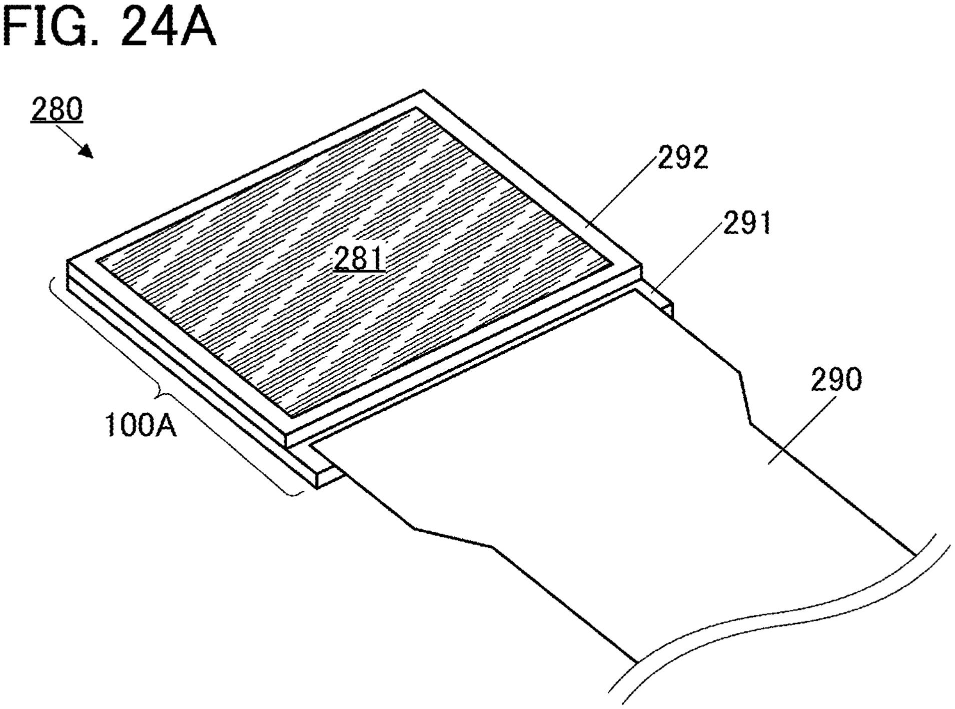
FIG. 24A and FIG. 24B are perspective views illustrating an example of a display device.

FIG. 24A shows a perspective view of a display module 280. The display module 280 includes a display device 100A and an FPC 290. Note that the display device included in the display module 280 is not limited to the display device 100A and may be any of a display device 100B to a display device 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 24B:
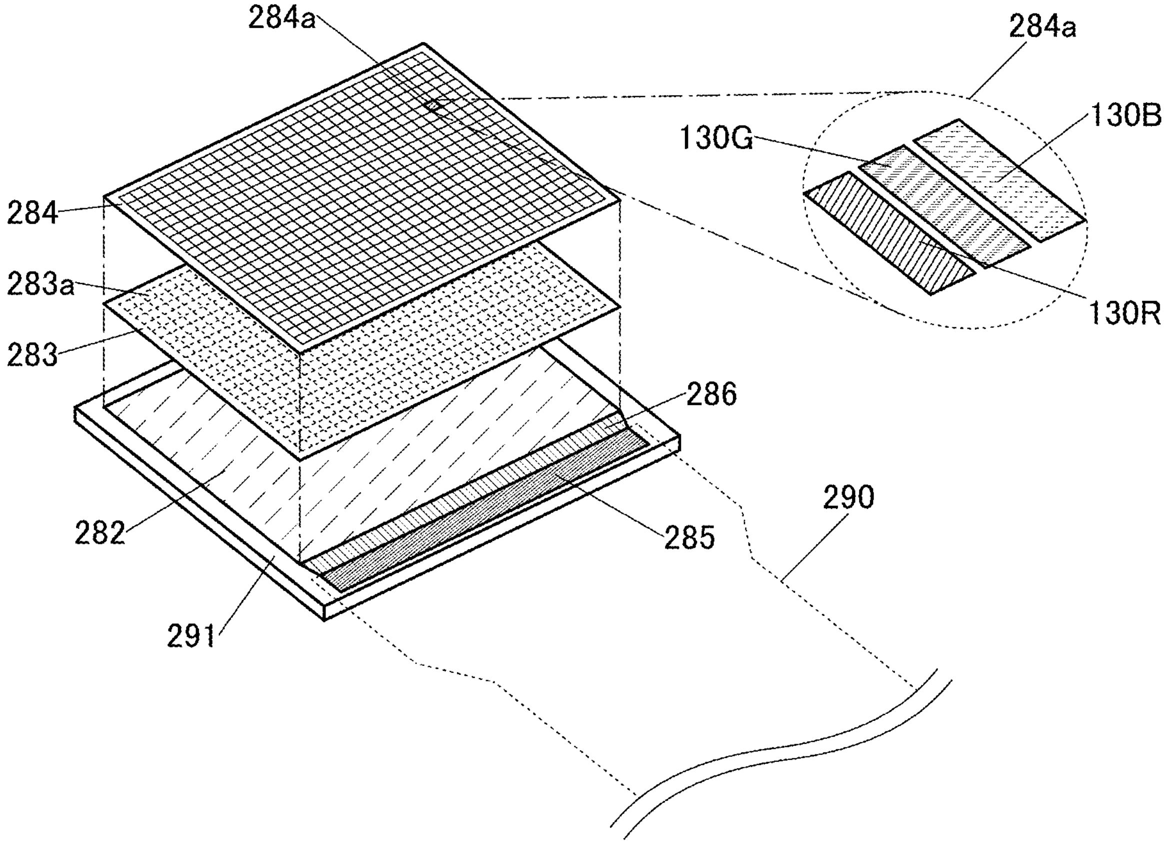

FIG. 24B shows a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 24B. The pixel 284*a* can employ any of the structures described in the above embodiments. FIG. 24B illustrates an example in which a structure similar to that of the pixel 110 illustrated in FIG. 1A is employed.

The pixel circuit portion 283 includes a plurality of pixel circuits 283*a* arranged periodically.

One pixel circuit 283*a* is a circuit that controls driving of a plurality of elements included in one pixel 284*a*. One pixel circuit 283*a* can be provided with three circuits each controlling light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display device is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as an HMD or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used for a display portion of a wearable electronic device, such as a wrist watch.

[Display Device 100A]

Figure 25A:
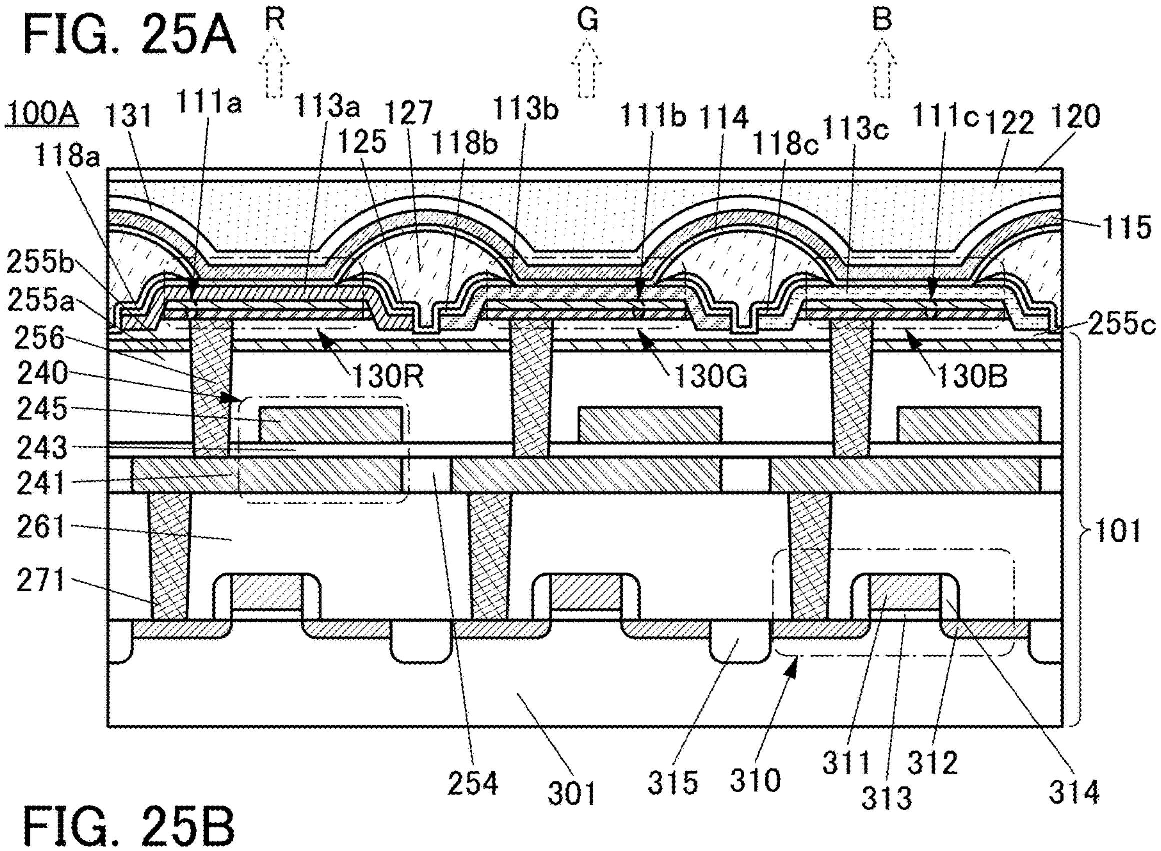
FIG. 25A to FIG. 25C are cross-sectional views illustrating examples of a display device.

The display device 100A illustrated in FIG. 25A includes a substrate 301, a light-emitting device 130R, a light-emitting device 130G, a light-emitting device 130B, a capacitor 240, and a transistor 310.

The substrate 301 corresponds to the substrate 291 in FIG. 24A and FIG. 24B. A stacked-layer structure from the substrate 301 to the insulating layer 255*c* corresponds to the layer 101 including transistors in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned between these conductive layers. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

Note that a conductive layer surrounding the outer surface of the display portion 281 (or the pixel portion 284) is preferably provided in at least one layer of the conductive layers included in the layer 101 including transistors. The conductive layer can be referred to as a guard ring. By providing the conductive layer, elements such as a transistor and a light-emitting device can be inhibited from being broken by high voltage application due to ESD (electronic discharge) or charging caused by a step using plasma.

The insulating layer 255*a* is provided to cover the capacitor 240, the insulating layer 255*b* is provided over the insulating layer 255*a*, and the insulating layer 255*c* is provided over the insulating layer 255*b*. The light-emitting device 130R, the light-emitting device 130G, and the light-emitting device 130B are provided over the insulating layer 255*c*. FIG. 25A illustrates an example in which the light-emitting device 130R, the light-emitting device 130G, and the light-emitting device 130B each have a structure similar to the stacked-layer structure illustrated in FIG. 1B. An insulator is provided in a region between adjacent light-emitting devices. In FIG. 25A and the like, the insulating layer 125 and the insulating layer 127 over the insulating layer 125 are provided in this region.

The mask layer 118*a* is positioned over the first layer 113*a* included in the light-emitting device 130R, the mask layer 118*b* is positioned over the second layer 113*b* included in the light-emitting device 130G, and the mask layer 118*c* is positioned over the third layer 113*c* included in the light-emitting device 130B.

The pixel electrode 111*a*, the pixel electrode 111*b*, and the pixel electrode 111*c* are each electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 271 embedded in the insulating layer 261. A top surface of the insulating layer 255*c* and a top surface of the plug 256 are level or substantially level with each other. A variety of conductive materials can be used for the plugs. FIG. 25A and the like illustrate an example in which the pixel electrode has a two-layer structure of a reflective electrode and a transparent electrode over the reflective electrode.

The protective layer 131 is provided over the light-emitting device 130R, the light-emitting device 130G, and the light-emitting device 130B. The substrate 120 is bonded onto the protective layer 131 with the resin layer 122. Embodiment 1 can be referred to for the details of the light-emitting devices and the components thereover up to the substrate 120. The substrate 120 corresponds to the substrate 292 in FIG. 24A.

Figure 25B:
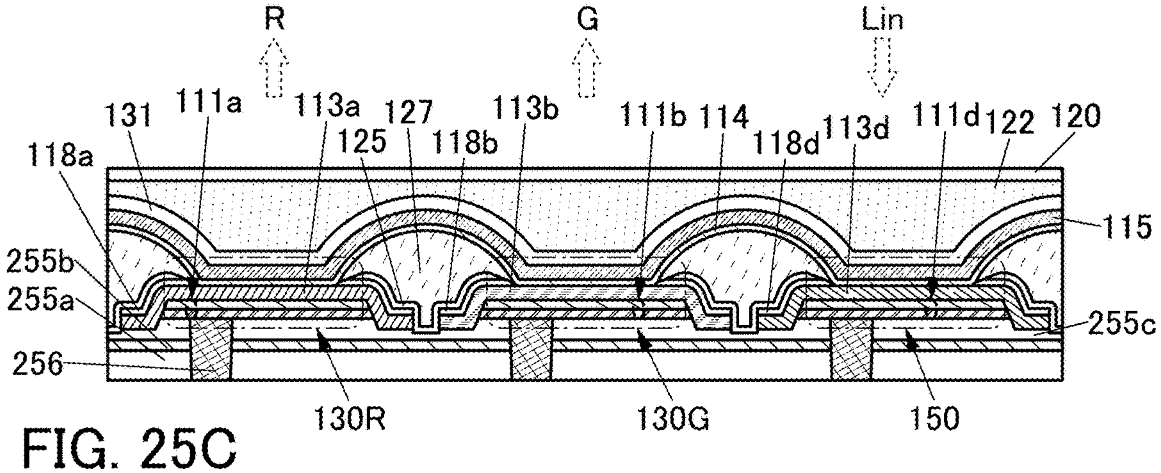
Figure 25C:
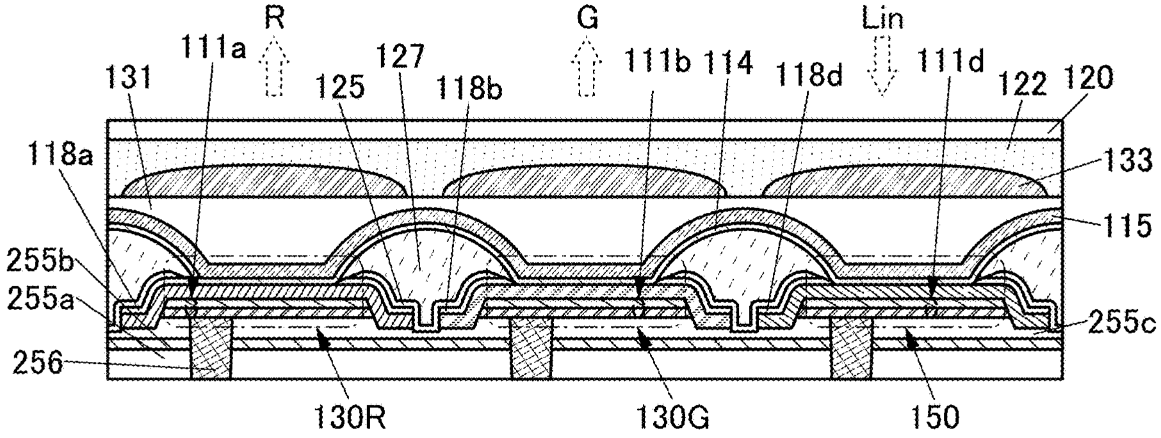

The display devices illustrated in FIG. 25B and FIG. 25C are each an example in which the light-emitting devices 130R and 130G and the light-receiving device 150 are included. Although not illustrated, the display device also includes the light-emitting device 130B. In FIG. 25B and FIG. 25C, the layers below the insulating layer 255*a* are omitted. The display devices illustrated in FIG. 25B and FIG. 25C can each employ any of the structures of the layer 101 including transistors, which are illustrated in FIG. 25A and FIG. 26 to FIG. 30, for example.

The light-receiving device 150 includes the pixel electrode 111*d*, the fourth layer 113*d*, the common layer 114, and the common electrode 115 which are stacked. Embodiment 1 and Embodiment 6 can be referred to for the details of the display device including the light-receiving device.

As illustrated in FIG. 25C, a lens array 133 may be provided in the display device. The lens array 133 can be provided to overlap with one or both of a light-emitting device and a light-receiving device.

FIG. 25C illustrates an example in which the lens array 133 is provided over the light-emitting devices 130R and 130G and the light-receiving device 150 with the protective layer 131 therebetween. The lens array 133 is directly formed over the substrate provided with the light-emitting device (and the light-receiving device), whereby the accuracy of positional alignment of the light-emitting device or the light-receiving device and the lens array can be enhanced.

In FIG. 25C, light emitted by the light-emitting device passes through the lens array 133 and is extracted to the outside of the display device.

Alternatively, the substrate 120 may be provided with the lens array 133 and bonded onto the protective layer 131 with the resin layer 122. By providing the lens array 133 for the substrate 120, the heat treatment temperature in the formation step of the lens array 133 can be increased.

The lens array 133 may include a convex surface facing the substrate 120 side or a convex surface facing the light-emitting device side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used, for example. The lens array 133 may be directly formed over the substrate or the light-emitting device. Alternatively, a lens array separately formed may be bonded thereto.

[Display Device 100B]

Figure 26:
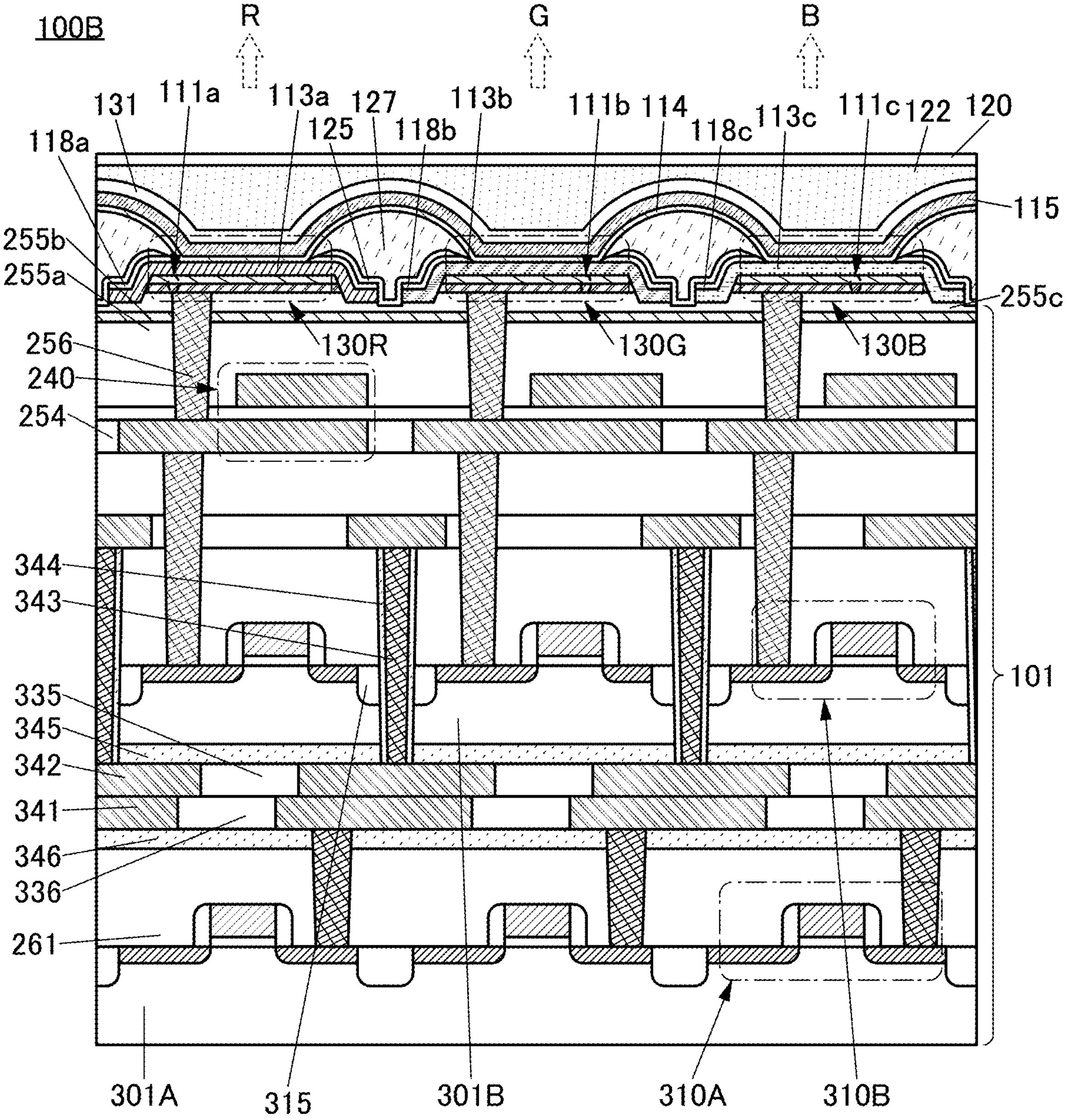
FIG. 26 is a cross-sectional view illustrating an example of a display device.

The display device 100B illustrated in FIG. 26 has a structure in which a transistor 310A and a transistor 310B whose channels are formed in a semiconductor substrate are stacked. Note that in the description of the display device below, portions similar to those of the above-described display device are not described in some cases.

In the display device 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used as the protective layer 131 or an insulating layer 332 can be used.

The substrate 301B is provided with a plug 343 that penetrates the substrate 301B and the insulating layer 345. An insulating layer 344 is preferably provided to cover a side surface of the plug 343. The insulating layer 344 is an insulating layer functioning as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Meanwhile, a conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layer 341 and the conductive layer 342. In that case, it is possible to employ Cu—Cu (copper-to-copper) direct bonding (a technique for achieving electrical continuity by connecting Cu (copper) pads).

[Display Device 100C]

Figure 27:
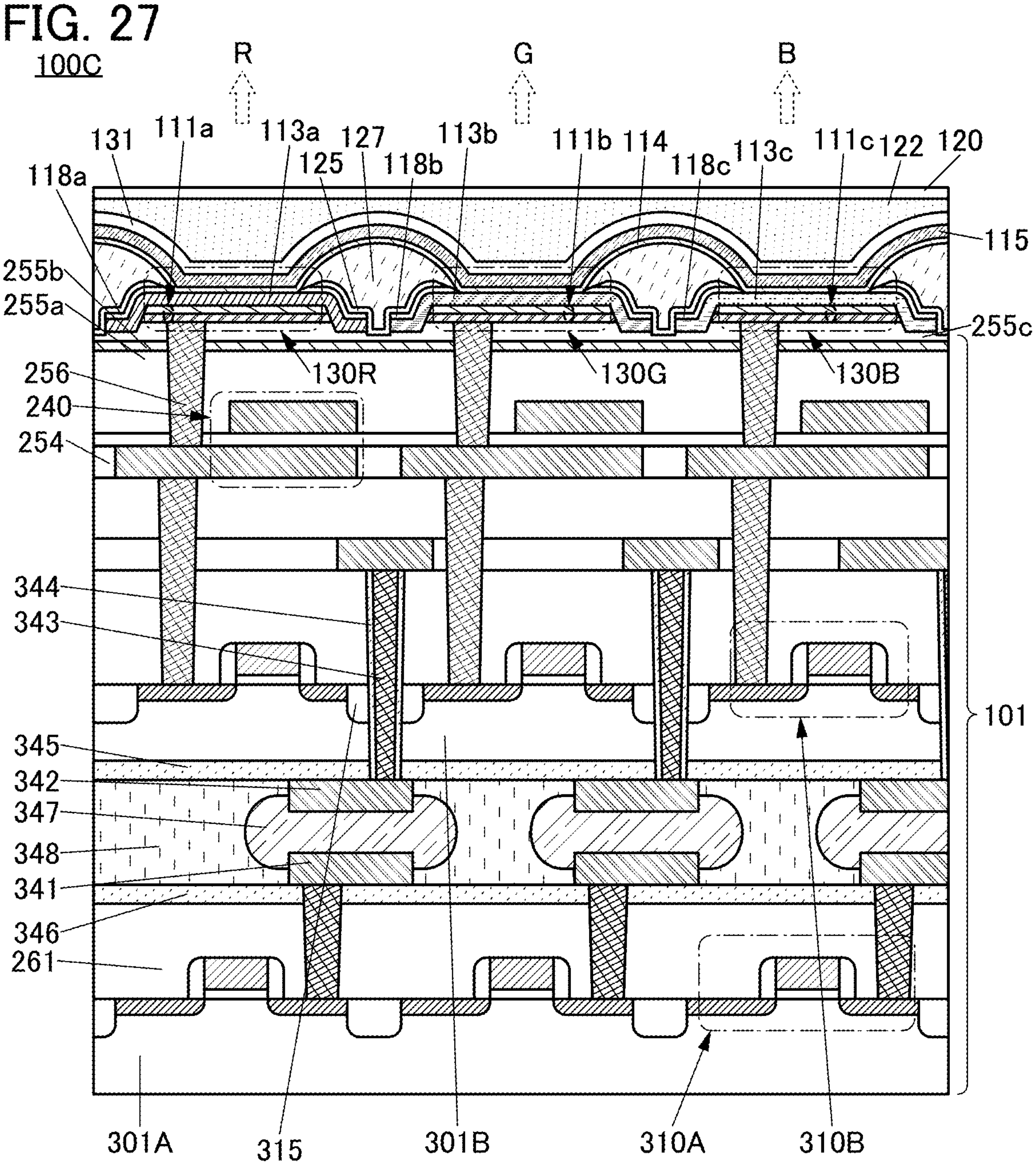
FIG. 27 is a cross-sectional view illustrating an example of a display device.

The display device 100C illustrated in FIG. 27 has a structure in which the conductive layer 341 and the conductive layer 342 are bonded to each other through a bump 347.

As illustrated in FIG. 27, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. For another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Device 100D]

Figure 28:
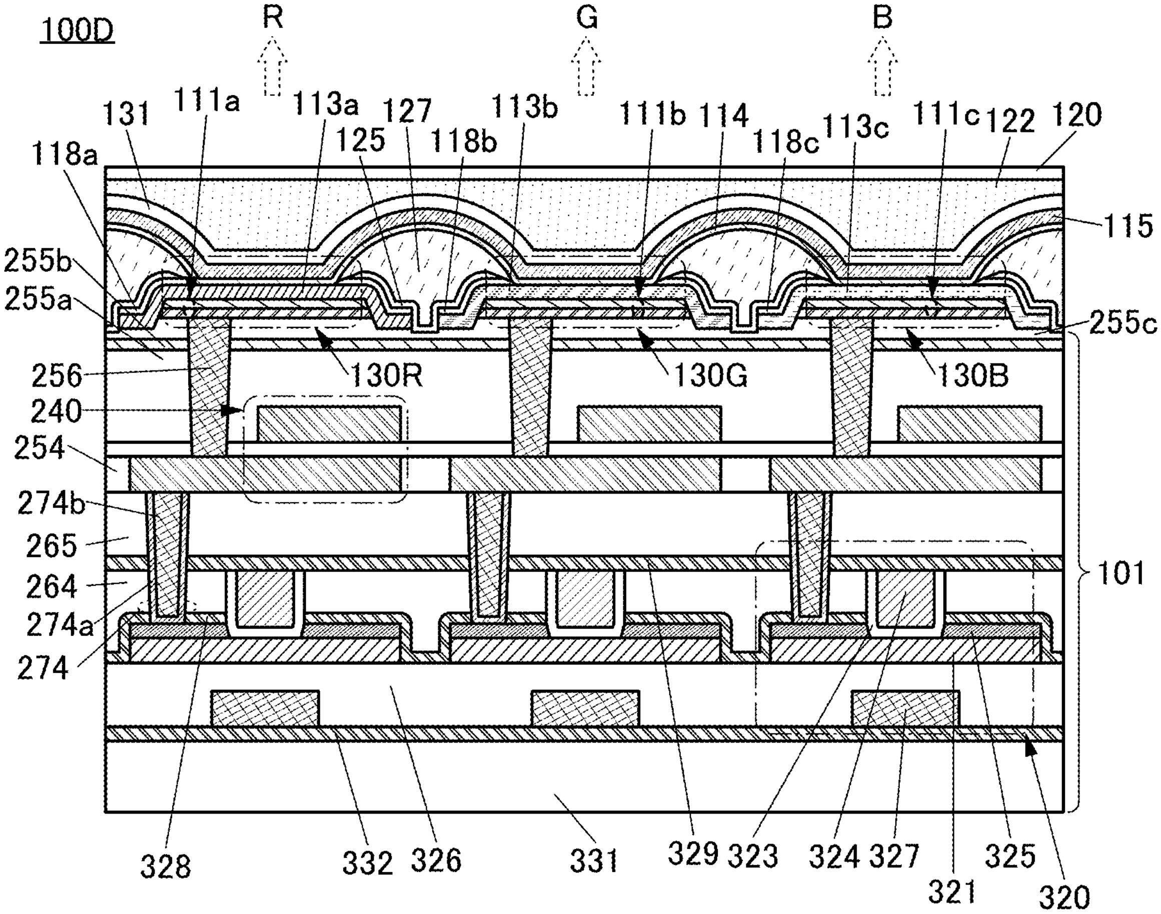
FIG. 28 is a cross-sectional view illustrating an example of a display device.

The display device 100D illustrated in FIG. 28 differs from the display device 100A mainly in a structure of a transistor.

A transistor 320 is a transistor (OS transistor) that includes a metal oxide (also referred to as an oxide semiconductor) in its semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 24A and FIG. 24B. A stacked-layer structure from the substrate 331 to the insulating layer 255*c* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. A top surface of the insulating layer 326 is preferably planarized.

The semiconductor layer 321 is provided over the insulating layer 326. The semiconductor layer 321 preferably includes a metal oxide film having semiconductor characteristics (also referred to as an oxide semiconductor). The pair of conductive layers 325 is provided over and in contact with the semiconductor layer 321 and functions as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with side surfaces of the insulating layer 264, the insulating layer 328, and the conductive layer 325 and a top surface of the semiconductor layer 321, and the conductive layer 324 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so as to be level or substantially level with each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like into the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* covering a side surface of an opening formed in the insulating layer 265, the insulating layer 329, the insulating layer 264, and the insulating layer 328 and part of a top surface of the conductive layer 325, and a conductive layer 274*b* in contact with a top surface of the conductive layer 274*a*. For the conductive layer 274*a*, a conductive material that does not easily allow diffusion of hydrogen and oxygen is preferably used.

[Display Device 100E]

Figure 29:
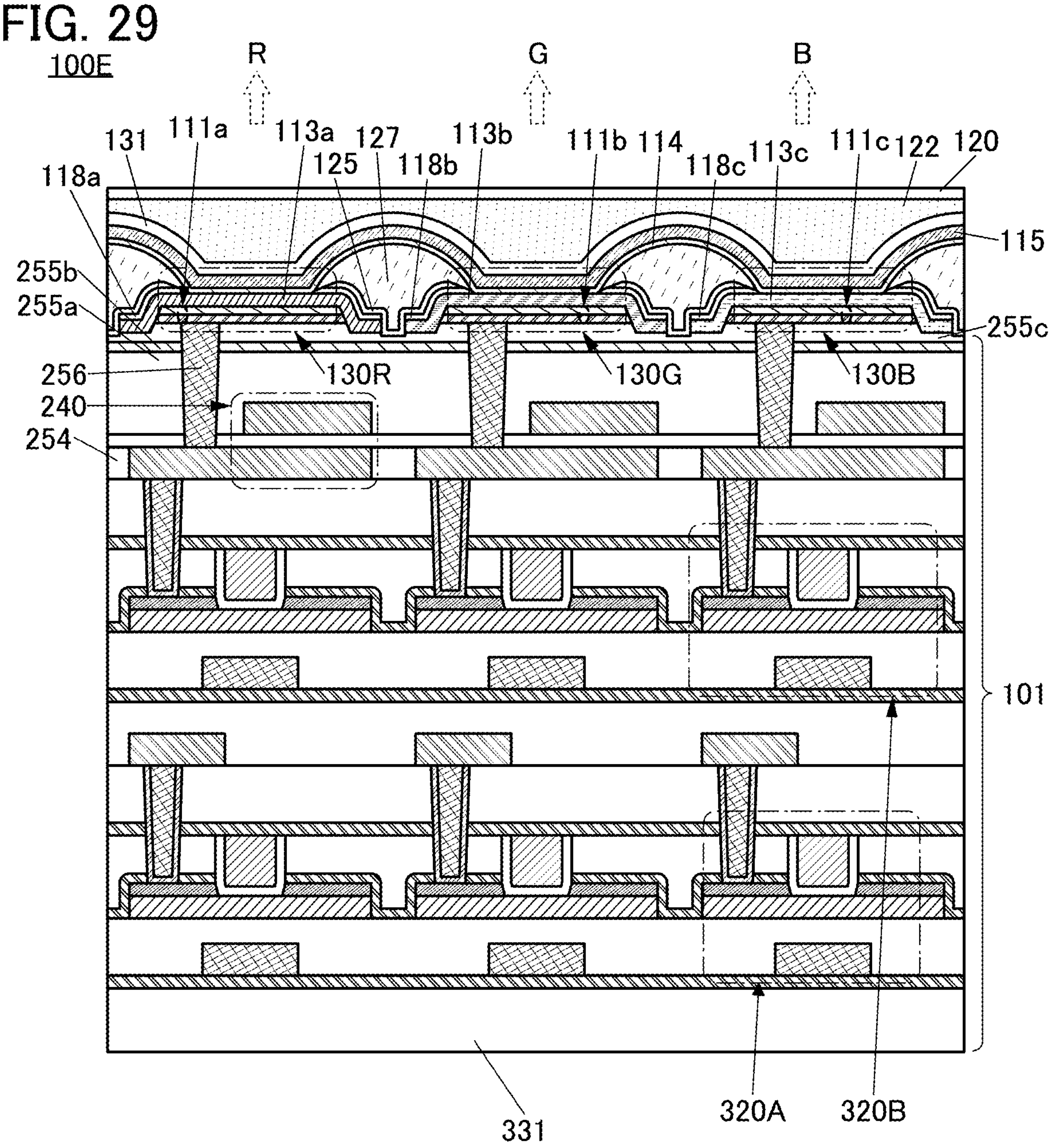
FIG. 29 is a cross-sectional view illustrating an example of a display device.

The display device 100E illustrated in FIG. 29 has a structure in which a transistor 320A and a transistor 320B each including an oxide semiconductor in a semiconductor where a channel is formed are stacked.

The display device 100D can be referred to for the transistor 320A, the transistor 320B, and the components around them.

Although the structure in which two transistors including an oxide semiconductor are stacked is described, the present invention is not limited thereto. For example, three or more transistors may be stacked.

[Display Device 100F]

Figure 30:
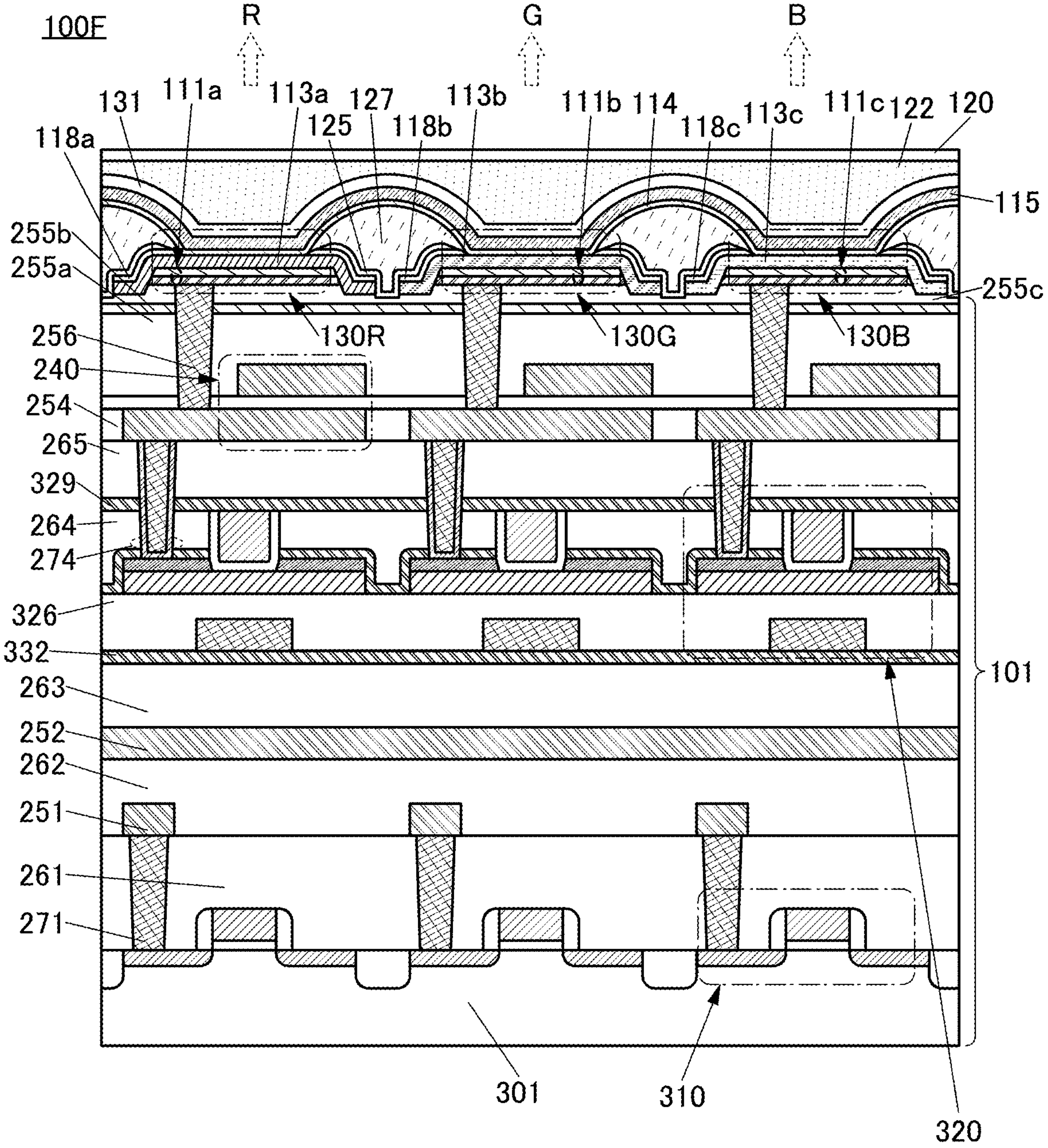
FIG. 30 is a cross-sectional view illustrating an example of a display device.

The display device 100F illustrated in FIG. 30 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting device; thus, the display device can be downsized as compared to the case where the driver circuit is provided around a display region.

[Display Device 100G]

Figure 31:
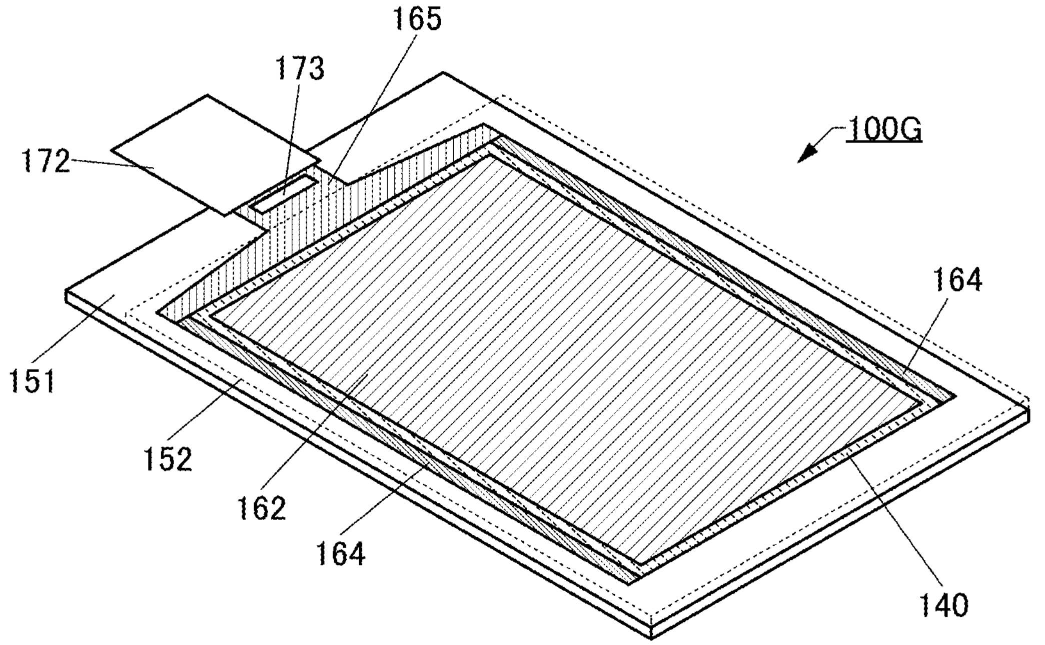
FIG. 31 is a perspective view illustrating an example of a display device.

FIG. 31 is a perspective view of a display device 100G, and FIG. 32A is a cross-sectional view of the display device 100G.

In the display device 100G, a substrate 152 and a substrate 151 are bonded to each other. In FIG. 31, the substrate 152 is denoted by a dashed line.

The display device 100G includes a display portion 162, the connection portion 140, a circuit 164, a wiring 165, and the like. FIG. 31 illustrates an example in which an IC 173 and an FPC 172 are mounted on the display device 100G.

Thus, the structure illustrated in FIG. 31 can also be regarded as a display module including the display device 100G, the IC (integrated circuit), and the FPC.

The connection portion 140 is provided outside the display portion 162. The connection portion 140 can be provided along one or more sides of the display portion 162. The number of the connection portions 140 can be one or more. FIG. 31 illustrates an example in which the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 31 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display device 100G and the display module are not necessarily provided with an IC. The IC may be mounted on the FPC by a COF method or the like.

FIG. 32A illustrates an example of cross sections of part of a region including the FPC 172, part of the circuit 164, part of the display portion 162, part of the connection portion 140, and part of a region including an end portion of the display device 100G.

The display device 100G illustrated in FIG. 32A includes a transistor 201, a transistor 205, the light-emitting device 130R emitting red light, the light-emitting device 130G emitting green light, the light-emitting device 130B emitting blue light, and the like between the substrate 151 and the substrate 152.

The light-emitting devices 130R, 130G, and 130B each have a structure similar to the stacked-layer structure illustrated in FIG. 1B except the structure of the pixel electrode. Embodiment 1 can be referred to for the details of the light-emitting devices.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to a conductive layer 222*b* included in the transistor 205 through an opening provided in the insulating layer 214. An end portion of the conductive layer 126*a* is positioned outward from an end portion of the conductive layer 112*a*. The end portion of the conductive layer 126*a* and an end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

The conductive layers 112*a*, 112*b*, and 112*c* are formed to cover the openings provided in the insulating layer 214. A layer 128 is embedded in each of the depressed portions of the conductive layers 112*a*, 112*b*, and 112*c*.

The layer 128 has a function of filling the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 127 can be used, for example.

Top surfaces and side surfaces of the conductive layers 126*a* and 129*a* are covered with the first layer 113*a*. Similarly, top surfaces and side surfaces of the conductive layers 126*b* and 129*b* are covered with the second layer 113*b*, and top surfaces and side surfaces of the conductive layers 126*c* and 129*c* are covered with the third layer 113*c*. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

A side surface and part of a top surface of each of the first layer 113*a*, the second layer 113*b*, and the third layer 113*c* are covered with the insulating layers 125 and 127. The mask layer 118*a* is positioned between the first layer 113*a* and the insulating layer 125. The mask layer 118*b* is positioned between the second layer 113*b* and the insulating layer 125, and the mask layer 118*c* is positioned between the third layer 113*c* and the insulating layer 125. The common layer 114 is provided over the first layer 113*a*, the second layer 113*b*, the third layer 113*c*, and the insulating layers 125 and 127, and the common electrode 115 is provided over the common layer 114. The common layer 114 and the common electrode 115 are each a continuous film provided to be shared by a plurality of light-emitting devices.

The protective layer 131 is provided over the light-emitting devices 130R, 130G, and 130B. The protective layer 131 and the substrate 152 are bonded to each other with an adhesive layer 142. The substrate 152 is provided with a light-blocking layer 117. A solid sealing structure, a hollow sealing structure, or the like can be employed to seal the light-emitting devices. In FIG. 32A, a solid sealing structure is employed in which a space between the substrate 152 and the substrate 151 is filled with the adhesive layer 142. Alternatively, a hollow sealing structure may be employed, in which the space is filled with an inert gas (e.g., nitrogen or argon). Here, the adhesive layer 142 may be provided not to overlap with the light-emitting device. The space may be filled with a resin different from that of the frame-like adhesive layer 142.

The protective layer 131 is provided at least in the display portion 162, and preferably provided to cover the entire display portion 162. The protective layer 131 is preferably provided to cover not only the display portion 162 but also the connection portion 140 and the circuit 164. It is also preferable that the protective layer 131 be provided to extend to an end portion of the display device 100G. Meanwhile, a connection portion 204 has a portion not provided with the protective layer 131 so that the FPC 172 and a conductive layer 166 are electrically connected to each other.

A connection portion 204 is provided in a region of the substrate 151 not overlapping with the substrate 152. In the connection portion 204, the wiring 165 is electrically connected to the FPC 172 through a conductive layer 166 and a connection layer 242. In the illustrated example, the conductive layer 166 has a stacked-layer structure of a conductive film obtained by processing the same conductive film as the conductive layers 112*a*, 112*b*, and 112*c*, a conductive film obtained by processing the same conductive film as the conductive layers 126*a*, 126*b*, and 126*c*, and a conductive film obtained by processing the same conductive film as the conductive layers 129*a*, 129*b*, and 129*c*. On the top surface of the connection portion 204, the conductive layer 166 is exposed. Thus, the connection portion 204 and the FPC 172 can be electrically connected to each other through the connection layer 242.

For example, the protective layer 131 is formed over the entire surface of the display device 100G and then a region of the protective layer 131 overlapping with the conductive layer 166 is removed, so that the conductive layer 166 can be exposed.

A stacked-layer structure of at least one organic layer and a conductive layer may be provided over the conductive layer 166, and the protective layer 131 may be provided over the stacked-layer structure. Then, a peeling trigger (a portion that can be a trigger of peeling) may be formed in the stacked-layer structure using a laser or a sharp cutter (e.g., a needle or a utility knife) to selectively remove the stacked-layer structure and the protective layer 131 thereover, so that the conductive layer 166 may be exposed. For example, the protective layer 131 can be selectively removed when an adhesive roller is pressed to the substrate 151 and then moved relatively while being rolled. Alternatively, an adhesive tape may be attached to the substrate 151 and then peeled. Since the adhesion between the organic layer and the conductive layer or between the organic layers is low, separation occurs at the interface between the organic layer and the conductive layer or in the organic layer. Thus, a region of the protective layer 131 overlapping with the conductive layer 166 can be selectively removed. Note that when the organic layer and the like remain over the conductive layer 166, the remaining organic layer and the like can be removed by an organic solvent or the like.

As the organic layer, it is possible to use at least one of the organic layers (the layer functioning as the light-emitting layer, the carrier-blocking layer, the carrier-transport layer, or the carrier-injection layer) used for the first layer 113*a*, the second layer 113*b*, and the third layer 113*c*, for example. The organic layer may be formed concurrently with the first layer 113*a*, the second layer 113*b*, and the third layer 113*c*, or may be provided separately. The conductive layer can be formed using the same step and the same material as those for the common electrode 115. An ITO film is preferably formed as the common electrode 115 and the conductive layer, for example. Note that in the case where a stacked-layer structure is used for the common electrode 115, at least one of the layers included in the common electrode 115 is provided as the conductive layer.

A top surface of the conductive layer 166 may be covered with a mask so that the protective layer 131 is not provided over the conductive layer 166. As the mask, a metal mask (area metal mask) or a tape or a film having adhesiveness or attachability may be used. The protective layer 131 is formed while the mask is placed and then the mask is removed, so that the conductive layer 166 can be kept exposed even after the protective layer 131 is formed.

With such a method, a region not provided with the protective layer 131 can be formed in the connection portion 204, and the conductive layer 166 and the FPC 172 can be electrically connected to each other through the connection layer 242 in the region.

The conductive layer 123 is provided over the insulating layer 214 in the connection portion 140. In the illustrate example, the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. An end portion of the conductive layer 123 is covered with the mask layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are in direct contact with each other to be electrically connected to each other.

The display device 100G has a top-emission structure. Light emitted by the light-emitting device is emitted toward the substrate 152 side. For the substrate 152, a material having a high visible-light-transmitting property is preferably used. The pixel electrode contains a material reflecting visible light, and the counter electrode (the common electrode 115) contains a material transmitting visible light.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material that does not easily allow diffusion of impurities such as water and hydrogen is preferably used for at least one of the insulating layers that cover the transistors.

This allows the insulating layer to function as a barrier layer. Such a structure can effectively inhibit diffusion of impurities into the transistors from the outside and improve the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably has a function of an etching protective layer. Accordingly, a depressed portion can be inhibited from being formed in the insulating layer 214 in processing the conductive layer 112*a*, the conductive layer 126*a*, the conductive layer 129*a*, or the like. Alternatively, a depressed portion may be provided in the insulating layer 214 in processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate or bottom-gate transistor structure may be employed. Alternatively, gates may be provided above and below the semiconductor layer where a channel is formed.

The structure in which the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, referred to as an OS transistor) is preferably used for the display device of this embodiment.

As the oxide semiconductor having crystallinity, a CAAC (c-axis aligned crystalline)-OS, an nc (nanocrystalline)-OS, and the like are given.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of a Si transistor such as an LTPS transistor, a circuit required to be driven at a high frequency (e.g., a source driver circuit) can be formed on the same substrate as the display portion. This allows simplification of an external circuit mounted on the display device and a reduction in component cost and mounting cost.

An OS transistor has much higher field-effect mobility than a transistor using amorphous silicon. In addition, an OS transistor has an extremely low leakage current between a source and a drain in an off state (hereinafter also referred to as off-state current), and charge accumulated in a capacitor that is connected in series to the transistor can be retained for a long period. Furthermore, the power consumption of the display device can be reduced with the OS transistor.

To increase the emission luminance of the light-emitting device included in a pixel circuit, it is necessary to increase the amount of current flowing through the light-emitting device. For that purpose, the source-drain voltage of the driving transistor included in the pixel circuit needs to be increased. Since an OS transistor has a higher withstand voltage between the source and the drain than a Si transistor, a high voltage can be applied between the source and the drain of the OS transistor. Thus, by using an OS transistor as a driving transistor included in the pixel circuit, the amount of current flowing through the light-emitting device can be increased, resulting in an increase in emission luminance of the light-emitting device.

When a transistor operates in a saturation region, a change in source-drain current relative to a change in gate-source voltage can be smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting device can be controlled.

Accordingly, the number of gray levels in the pixel circuit can be increased.

Regarding saturation characteristics of current flowing when a transistor operates in a saturation region, even in the case where the source-drain voltage of an OS transistor increases gradually, more stable current (saturation current) can be fed through the OS transistor than through a Si transistor. Thus, by using an OS transistor as the driving transistor, a stable current can be fed through the light-emitting device even when the current-voltage characteristics of the EL device vary, for example. In other words, when the OS transistor operates in the saturation region, the source-drain current hardly changes with an increase in the source-drain voltage; hence, the emission luminance of the light-emitting device can be stable.

As described above, by using an OS transistor as the driving transistor included in the pixel circuit, it is possible to achieve "inhibition of black floating", "increase in emission luminance", "increase in the number of gray levels", "inhibition of variation in light-emitting devices", and the like.

A metal oxide used for the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case where the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. In addition, in the case where the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. Furthermore, in the case where the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistors included in the circuit 164 and the transistors included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display device can have low power consumption and high drive capability. A structure in which an LTPS transistor and an OS transistor are used in combination is referred to as LTPO in some cases. As a more suitable example, a structure in which the OS transistor is used as a transistor or the like functioning as a switch for controlling conduction or non-conduction between wirings, and the LTPS transistor is used as a transistor or the like for controlling current, can be given.

For example, one transistor included in the display portion 162 functions as a transistor for controlling current flowing through the light-emitting device and can also be referred to as a driving transistor. One of a source and a drain of the driving transistor is electrically connected to the pixel electrode of the light-emitting device. An LTPS transistor is preferably used as the driving transistor. Thus, current flowing through the light-emitting device in the pixel circuit can be increased.

In contrast, another transistor included in the display portion 162 functions as a switch for controlling selection or non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., lower than or equal to 1 fps); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting device having an MML (metal maskless) structure. This structure can significantly reduce the leakage current that might flow through a transistor, and the leakage current that might flow between adjacent light-emitting devices (also referred to as a lateral leakage current, a side leakage current, or the like). With the structure, a viewer can observe any one or more of image crispness, image sharpness, a high chroma, and a high contrast ratio in an image displayed on the display device. Note that when the leakage current that might flow through a transistor and the lateral leakage current between light-emitting devices are extremely low, light leakage or the like (what is called black blurring) that might occur in black display can be reduced as much as possible.

In particular, in the case where a light-emitting device having the MML structure employs the above-described SBS structure, a layer provided between light-emitting devices (for example, an organic layer shared by the light-emitting devices, also referred to as a common layer) is disconnected; accordingly, lateral leakage can be eliminated or reduced as much as possible.

FIG. 32B and FIG. 32C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between at least the conductive layer 223 and the channel formation region 231*i*. Furthermore, an insulating layer 218 covering the transistor may be provided.

FIG. 32B illustrates an example of the transistor 209 in which the insulating layer 225 covers a top surface and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 32C, the insulating layer 225 overlaps with the channel formation region 231*i* of the semiconductor layer 231 and does not overlap with the low-resistance regions 231*n*. The structure illustrated in FIG. 32C can be formed by processing the insulating layer 225 using the conductive layer 223 as a mask, for example. In FIG. 32C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

The light-blocking layer 117 is preferably provided on the surface of the substrate 152 that faces the substrate 151. The light-blocking layer 117 can be provided between adjacent light-emitting devices, in the connection portion 140, and in the circuit 164, for example. A variety of optical members can be arranged on the outer surface of the substrate 152.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Device 100H]

Figures 33A, 33B, 33C, 33D:
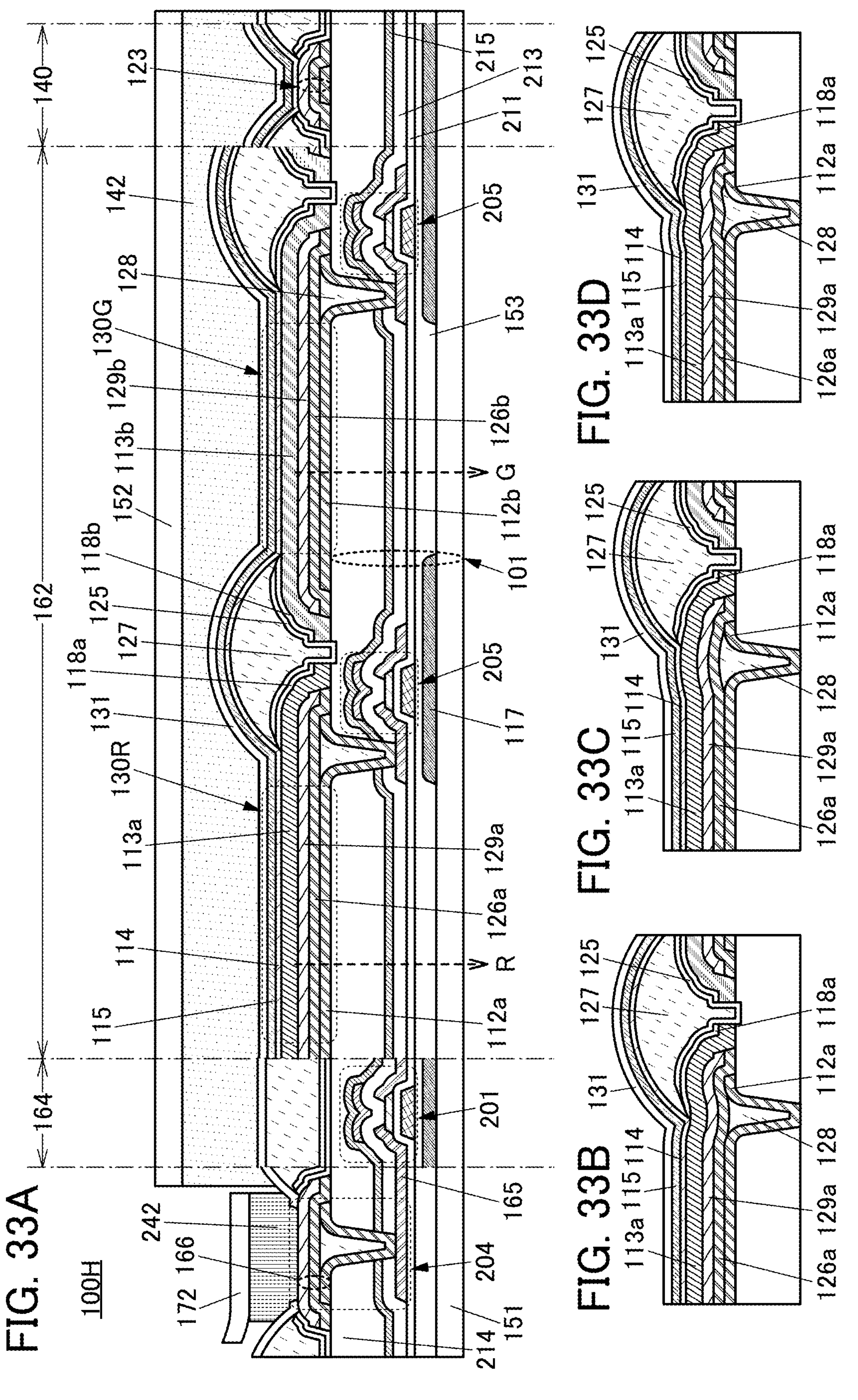
FIG. 33A to FIG. 33D are cross-sectional views illustrating examples of a display device.

A display device 100H illustrated in FIG. 33A is different from the display device 100G mainly in being a bottom-emission display device.

Light emitted by the light-emitting device is emitted toward the substrate 151 side. For the substrate 151, a material having a high visible-light-transmitting property is preferably used. In contrast, there is no limitation on the light-transmitting property of a material used for the substrate 152.

The light-blocking layer 117 is preferably formed between the substrate 151 and the transistor 201 and between the substrate 151 and the transistor 205. FIG. 33A illustrates an example in which the light-blocking layer 117 is provided over the substrate 151, an insulating layer 153 is provided over the light-blocking layer 117, and the transistors 201 and 205 and the like are provided over the insulating layer 153.

The light-emitting device 130R includes the conductive layer 112*a*, the conductive layer 126*a* over the conductive layer 112*a*, and the conductive layer 129*a* over the conductive layer 126*a*.

The light-emitting device 130G includes the conductive layer 112*b*, the conductive layer 126*b* over the conductive layer 112*b*, and the conductive layer 129*b* over the conductive layer 126*b*.

A material having a high visible-light-transmitting property is used for each of the conductive layers 112*a*, 112*b*, 126*a*, 126*b*, 129*a*, and 129*b*. A material reflecting visible light is preferably used for the common electrode 115.

Although FIG. 32A, FIG. 33A, and the like illustrate an example in which a top surface of the layer 128 includes a flat portion, the shape of the layer 128 is not particularly limited. FIG. 33B to FIG. 33D illustrate variation examples of the layer 128.

As illustrated in FIG. 33B and FIG. 33D, the top surface of the layer 128 can have a shape such that its center and the vicinity thereof are recessed, i.e., a shape including a concave surface, in a cross-sectional view.

As illustrated in FIG. 33C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of a top surface of the conductive layer 112*a* may be equal to or substantially equal to each other, or may be different from each other. For example, the level of the top surface of the layer 128 may be either lower or higher than the level of the top surface of the conductive layer 112*a*.

FIG. 33B can be regarded as illustrating an example in which the layer 128 fits in the depressed portion of the conductive layer 112*a*. By contrast, as illustrated in FIG. 33D, the layer 128 may exist also outside the depressed portion of the conductive layer 112*a*, that is, the layer 128 may be formed to have a top surface wider than the depressed portion.

[Display device 100J]

Figure 34:
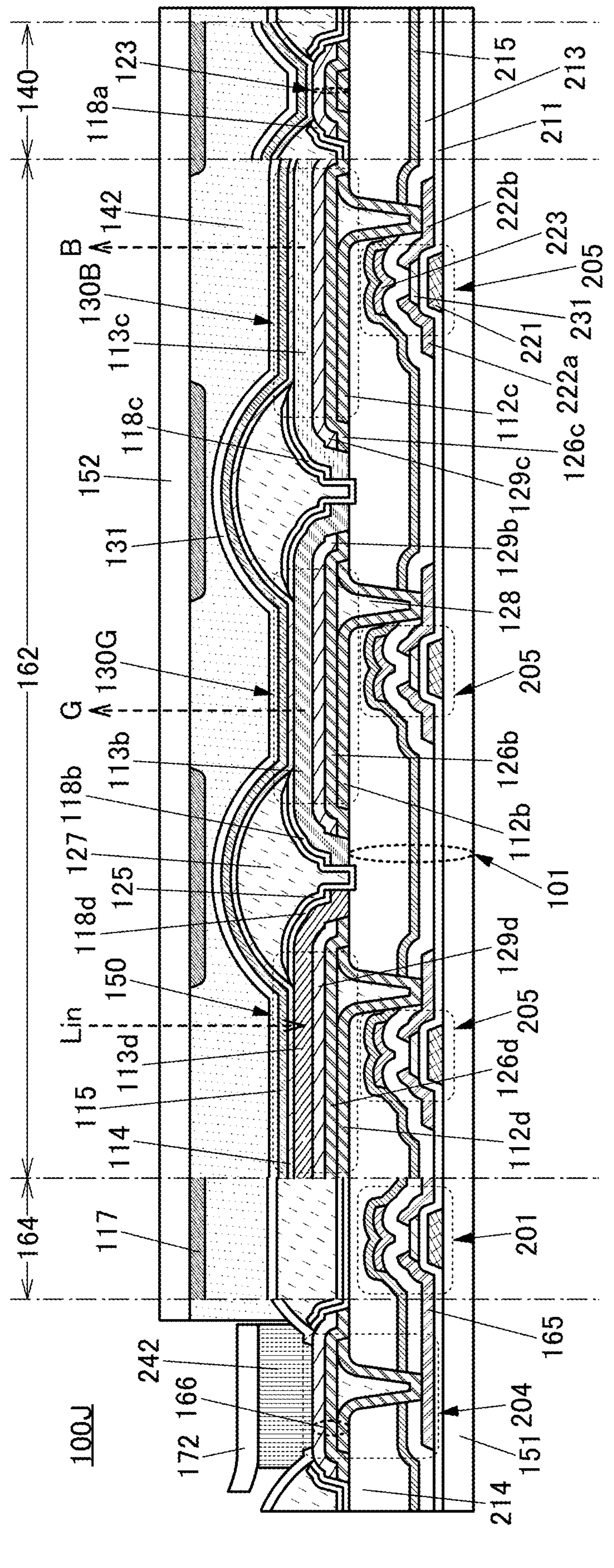
FIG. 34 is a cross-sectional view illustrating an example of a display device.

A display device 100J illustrated in FIG. 34 is different from the display device 100G mainly in including the light-receiving device 150.

The light-receiving device 150 includes a conductive layer 112*d*, a conductive layer 126*d* over the conductive layer 112*d*, and a conductive layer 129*d* over the conductive layer 126*d*.

The conductive layer 112*d* is connected to the conductive layer 222*b* included in the transistor 205 through an opening provided in the insulating layer 214.

A top surface and a side surface of the conductive layer 126*d* and a top surface and a side surface of the conductive layer 129*d* are covered with the fourth layer 113*d*. The fourth layer 113*d* includes at least an active layer.

A side surface and part of a top surface of the fourth layer 113*d* are covered with the insulating layers 125 and 127. The mask layer 118*d* is positioned between the fourth layer 113*d* and the insulating layer 125. The common layer 114 is provided over the fourth layer 113_d_ and the insulating layers 125 and 127, and the common electrode 115 is provided over the common layer 114. The common layer 114 is a continuous film provided to be shared by the light-receiving device and the light-emitting devices.

The display device 100J can employ any of the pixel layouts that are described in Embodiment 3 with reference to FIG. 23A to FIG. 23K, for example. Embodiment 1 and Embodiment 6 can be referred to for the details of the display device including the light-receiving device.

This embodiment can be combined with any of the other embodiments as appropriate.

Embodiment 5

In this embodiment, a light-emitting device that can be used for a display device of one embodiment of the present invention will be described.

In this specification and the like, a structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, or white, for example. When the light-emitting device has a microcavity structure, the color purity can be increased.

[Light-Emitting Device]

Figure 35A:
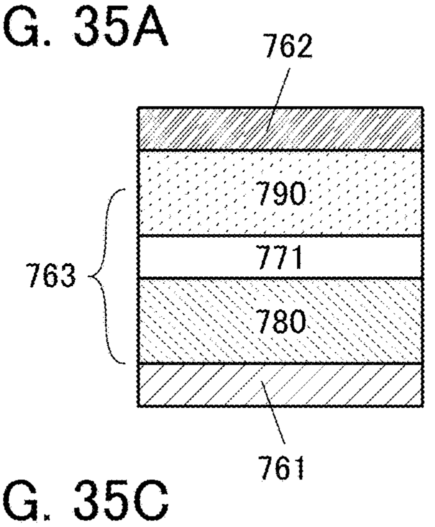
FIG. 35A to FIG. 35F are diagrams illustrating structure examples of a light-emitting device.

As illustrated in FIG. 35A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790. The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). Furthermore, the layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layer 780 and the layer 790 are replaced with each other.

The structure including the layer 780, the light-emitting layer 771, and the layer 790, which is provided between the pair of electrodes, can function as a single light-emitting unit, and the structure in FIG. 35A is referred to as a single structure in this specification.

Figure 35B:
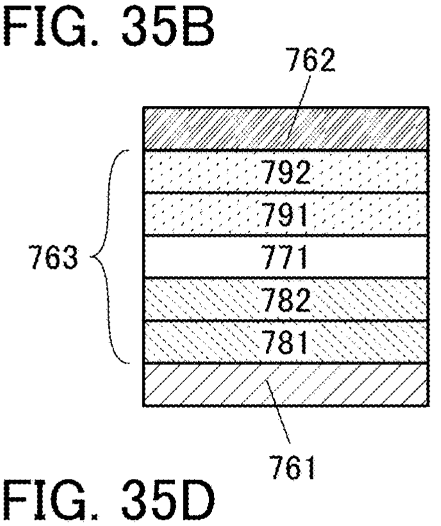

FIG. 35B is a variation example of the EL layer 763 included in the light-emitting device illustrated in FIG. 35A. Specifically, the light-emitting device illustrated in FIG. 35B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layer structure, carriers can be efficiently injected into the light-emitting layer 771, and the efficiency of the recombination of carriers in the light-emitting layer 771 can be increased.

Figure 35C:
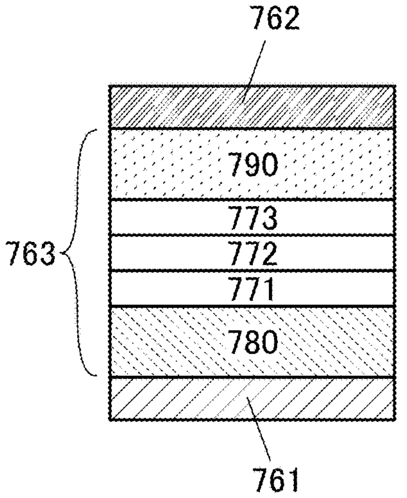
Figure 35D:
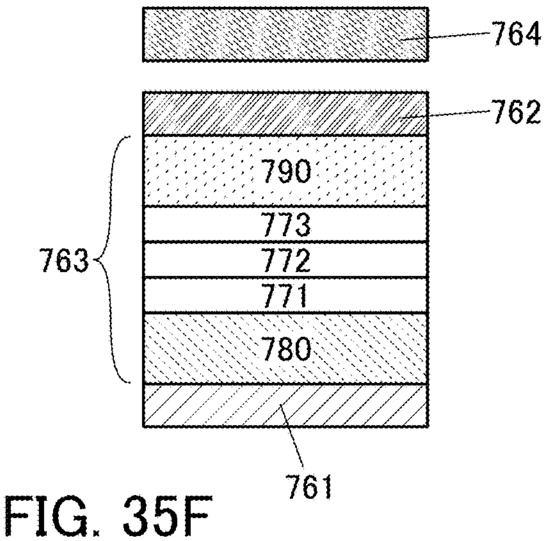

Note that structures in which a plurality of light-emitting layers (the light-emitting layer 771, a light-emitting layer 772, and a light-emitting layer 773) are provided between the layer 780 and the layer 790 as illustrated in FIG. 35C and FIG. 35D are other variations of the single structure.

Figure 35E:
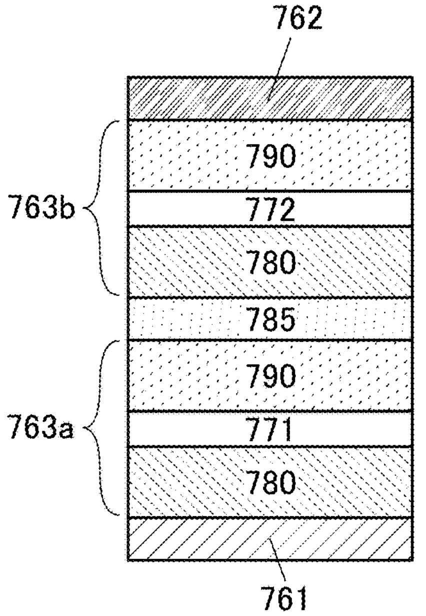
Figure 35F:
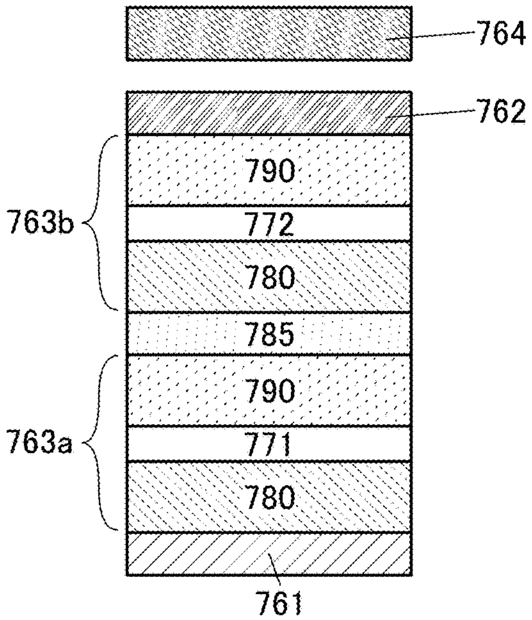

Structures in which a plurality of light-emitting units (an EL layer 763_a_ and an EL layer 763_b_) are connected in series with a charge-generation layer 785 therebetween as illustrated in FIG. 35E and FIG. 35F are referred to as a tandem structure in this specification. Note that the tandem structure may be referred to as a stack structure. The tandem structure enables a light-emitting device capable of high-luminance light emission.

In FIG. 35C and FIG. 35D, light-emitting substances that emit light of the same color, or moreover, the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. A color conversion layer may be provided as a layer 764 illustrated in FIG. 35D.

Light-emitting substances that emit light of different colors may be used for the light-emitting layer 771, the light-emitting layer 772, and the light-emitting layer 773. White light can be obtained when the light-emitting layer 771, the light-emitting layer 772, and the light-emitting layer 773 emit light of complementary colors. A color filter (also referred to as a coloring layer) may be provided as the layer 764 illustrated in FIG. 35D. When white light passes through the color filter, light of a desired color can be obtained.

The light-emitting device emitting white light preferably contains two or more kinds of light-emitting substances. To obtain white light emission, two or more kinds of light-emitting substances are selected such that they emit light of complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

In FIG. 35E and FIG. 35F, light-emitting substances that emit light of the same color, or moreover, the same light-emitting substance may be used for the light-emitting layer 771 and the light-emitting layer 772. Alternatively, light-emitting substances that emit light of different colors may be used for the light-emitting layer 771 and the light-emitting layer 772. White light can be obtained when the light-emitting layer 771 and the light-emitting layer 772 emit light of complementary colors. FIG. 35F illustrates an example in which the layer 764 is further provided. One or both of a color conversion layer and a color filter (a coloring layer) can be used as the layer 764.

Also in FIG. 35C, FIG. 35D, FIG. 35E, and FIG. 35F, the layer 780 and the layer 790 may each independently have a stacked-layer structure of two or more layers as illustrated in FIG. 35B.

Next, materials that can be used for the light-emitting device will be described.

A conductive film transmitting visible light is used as the electrode through which light is extracted, which is either the lower electrode 761 or the upper electrode 762. A conductive film reflecting visible light is preferably used as the electrode through which light is not extracted. In the case where a display device includes a light-emitting device emitting infrared light, a conductive film transmitting visible light and infrared light is used as the electrode through which light is extracted, and a conductive film reflecting visible light and infrared light is preferably used as the electrode through which light is not extracted.

A conductive film transmitting visible light may be used also for an electrode through which no light is extracted. In that case, this electrode is preferably provided between a reflective layer and the EL layer 763. In other words, light emitted by the EL layer 763 may be reflected by the reflective layer to be extracted from the display device.

As a material that forms the pair of electrodes of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not exemplified above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes included in the light-emitting device preferably includes an electrode having properties of transmitting and reflecting visible light (a transflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at a wavelength longer than or equal to 400 nm and shorter than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

Either a low molecular compound or a high molecular compound can be used for the light-emitting device, and an inorganic compound may also be included. Each layer included in the light-emitting device can be formed by a method such as an evaporation method (including a vacuum evaporation method), a transfer method, a printing method, an inkjet method, or a coating method.

The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (a guest material). As one or more kinds of organic compounds, one or both of a substance having a high hole-transport property (a hole-transport material) and a substance having a high electron-transport property (an electron-transport material) can be used. As one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (a phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 763 may further include a layer containing any of a substance having a high hole-injection property, a substance having a high hole-transport property, a hole-blocking material, a substance having a high electron-transport property, a substance having a high electron-injection property, an electron-blocking material, a substance having a bipolar property (a substance having a high electron-transport property and a high hole-transport property), and the like.

The hole-injection layer is a layer that injects holes from the anode into the hole-transport layer, and is a layer that contains a substance having a high hole-injection property. Examples of a substance having a high hole-injection property include an aromatic amine compound and a composite material containing a hole-transport material and an acceptor material (an electron-accepting material).

As the hole-transport material, it is possible to use a substance having a high hole-transport property which can be used for the hole-transport layer and will be described later.

As the acceptor material, an oxide of a metal belonging to any of Group 4 to Group 8 of the periodic table can be used, for example. Specifically, molybdenum oxide, vanadium oxide, niobium oxide, tantalum oxide, chromium oxide, tungsten oxide, manganese oxide, and rhenium oxide are given. Among these, molybdenum oxide is particularly preferable since it is stable in the air, has a low hygroscopic property, and is easy to handle. An organic acceptor material containing fluorine can also be used. Organic acceptor materials such as a quinodimethane derivative, a chloranil derivative, and a hexaazatriphenylene derivative can also be used.

For example, a hole-transport material and a material containing an oxide of a metal belonging to any of Group 4 to Group 8 of the periodic table (typically, molybdenum oxide) may be used as the substance having a high hole-injection property.

The hole-transport layer is a layer that transports holes injected from the anode by the hole-injection layer, into the light-emitting layer. The hole-transport layer is a layer that contains a hole-transport material. As the hole-transport material, a substance having a hole mobility of $1\times10^{-6}$ $cm^2/Vs$ or higher is preferable. Note that other substances can also be used as long as they have a property of transporting more holes than electrons. As the hole-transport material, substances with a high hole-transport property, such as a T-electron rich heteroaromatic compound (e.g., a carbazole derivative, a thiophene derivative, and a furan derivative) and an aromatic amine (a compound having an aromatic amine skeleton), are preferred.

The electron-blocking layer is provided in contact with the light-emitting layer. The electron-blocking layer is a layer that has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer is a layer that transports electrons injected from the cathode by the electron-injection layer, into the light-emitting layer. The electron-transport layer is a layer that contains an electron-transport material. As the electron-transport material, a substance having an electron mobility of $1\times10^{-6}$ $cm^2/Vs$ or higher is preferable. Note that other substances can also be used as long as they have a property of transporting more electrons than holes. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and π-electron deficient heteroaromatic compound such as a nitrogen-containing heteroaromatic compound.

The hole-blocking layer is provided in contact with the light-emitting layer. The hole-blocking layer is a layer that has an electron-transport property and contains a material capable of blocking holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer is a layer that injects electrons from the cathode into the electron-transport layer, and is a layer that contains a substance having a high electron-injection property. As the substance having a high electron-injection property, an alkali metal, an alkaline earth metal, or a compound thereof can be used. As the substance having a high electron-injection property, a composite material containing an electron-transport material and a donor material (electron-donating material) can also be used.

The difference between the LUMO level of the substance having a high electron-injection property and the work function value of the material used for the cathode is preferably small (specifically, smaller than or equal to 0.5 eV).

For the electron-injection layer, it is possible to use an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato) lithium (abbreviation: Liq), 2-(2-pyridyl) phenolatolithium (abbreviation: LiPP), 2-(2-pyridyl)-3-pyridinolato lithium (abbreviation: LiPPy), 4-phenyl-2-(2-pyridyl) phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be provided as the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a: 2',3'-c]phenazine (abbreviation: HATNA), 2,4,6-tris[3'-(pyridin-3-yl) biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a light-emitting device having a tandem structure, a charge-generation layer (also referred to as an intermediate layer) is provided between two light-emitting units. The intermediate layer has a function of injecting electrons into one of the two light-emitting units and injecting holes into the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (an electron-accepting material) can be used. For the charge-generation layer, a layer containing an electron-transport material and a donor material can be used. Forming such a charge-generation layer can inhibit an increase in the driving voltage that would be caused by stacking light-emitting units.

This embodiment can be combined with any of the other embodiments as appropriate.

Embodiment 6

In this embodiment, a light-receiving device that can be used for the display device of one embodiment of the present invention and a display device having a light-emitting and light-receiving function will be described.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used for a variety of display devices.

[Light-Receiving Device]

Figure 36A:
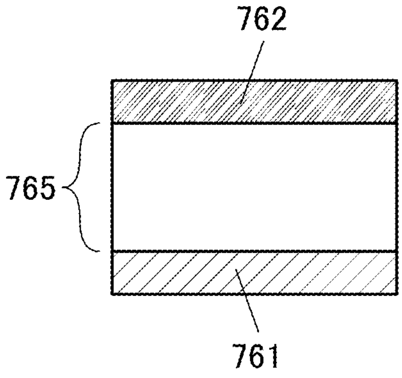
FIG. 36A and FIG. 36B are diagrams illustrating structure examples of a light-receiving device.

As illustrated in FIG. 36A, the light-receiving device includes a layer 765 between a pair of electrodes (the lower electrode 761 and the upper electrode 762). The layer 765 includes at least one active layer, and may further include another layer.

Figure 36B:
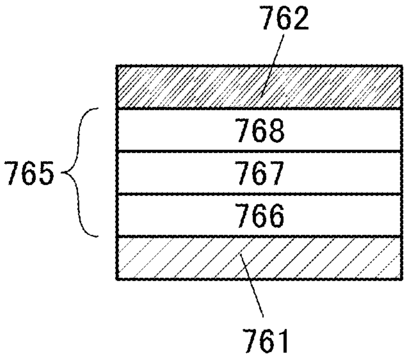

FIG. 36B is a variation example of the layer 765 included in the light-receiving device illustrated in FIG. 36A. Specifically, the light-receiving device illustrated in FIG. 36B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the structures of the layers 766 and 768 are replaced with each other.

Here, the display device of one embodiment of the present invention may include a layer used in common to the light-receiving device and the light-emitting device (also referred to as a continuous layer shared by the light-receiving device and the light-emitting device). Such a layer may have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer used in common to the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

Next, materials that can be used for the light-receiving device will be described.

Either a low molecular compound or a high molecular compound can be used for the light-receiving device, and an inorganic compound may also be included. Each layer included in the light-receiving device can be formed by a method such as an evaporation method (including a vacuum evaporation method), a transfer method, a printing method, an inkjet method, or a coating method.

The active layer included in the light-receiving device includes a semiconductor. Examples of the semiconductor include an inorganic semiconductor such as silicon and an organic semiconductor including an organic compound. This embodiment describes an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer include electron-accepting organic semiconductor materials such as fullerene (e.g., $C_{60}$ and $C_{70}$) and fullerene derivatives. Examples of the fullerene derivative include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di[1,4]methanonaphthaleno[1,2:2',3',56,60:2",3"][5,6]fullerene-C60 (abbreviation: ICBA).

Other examples of an n-type semiconductor material include perylenetetracarboxylic acid derivatives such as N,N'-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper (II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as Poly[[4,8-bis[5-(2-ethylhexyl)-2-thienyl]benzo[1,2-b: 4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

For example, the active layer is preferably formed by co-evaporation of an n-type semiconductor and a p-type semiconductor. Alternatively, the active layer may be formed by stacking an n-type semiconductor and a p-type semiconductor.

Three or more kinds of materials may be used for the active layer. For example, a third material may be mixed with an n-type semiconductor material and a p-type semiconductor material in order to extend the absorption wavelength range. The third material may be a low molecular compound or a high molecular compound.

In addition to the active layer, the light-receiving device may further include a layer containing a substance with a high hole-transport property, a substance with a high electron-transport property, a substance with a bipolar property (a substance with a high electron-transport property and a high hole-transport property), or the like. Without limitation to the above, the light-receiving device may further include a layer containing a substance with a high hole-injection property, a hole-blocking material, a substance with a high electron-injection property, an electron-blocking material, or the like. Layers other than the active layer included in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

[Display Device Having Light Detection Function]

In the display device of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the approach or contact of a target (e.g., a finger, a hand, or a pen) can be detected.

Furthermore, in the display device of one embodiment of the present invention, the light-emitting devices can be used as a light source of the sensor. In the display device of one embodiment of the present invention, when an object reflects (or scatters) light emitted by the light-emitting device included in the display portion, the light-receiving device can detect reflected light (or scattered light); thus, image capturing or touch detection is possible even in a dark place.

Accordingly, a light-receiving portion and a light source do not need to be provided separately from the display device; hence, the number of components of an electronic device can be reduced. For example, a biometric authentication device, a capacitive touch panel for scroll operation, or the like is not necessarily provided separately from the electronic device. Thus, with the use of the display device of one embodiment of the present invention, the electronic device can be provided with reduced manufacturing cost.

Specifically, the display device of one embodiment of the present invention includes a light-emitting device and a light-receiving device in a pixel. In the display device of one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device including the organic EL device.

In the display device including light-emitting devices and a light-receiving device in each pixel, the pixel has a light-receiving function; thus, the display device can detect a contact or approach of an object while displaying an image. For example, all the subpixels included in the display device can display an image; alternatively, some of the subpixels can emit light as a light source, some of the rest of the subpixels can detect light, and the other subpixels can display an image.

In the case where the light-receiving device is used as an image sensor, the display device can capture an image with the use of the light-receiving device. For example, the display device of this embodiment can be used as a scanner.

For example, image capturing for personal authentication with the use of a fingerprint, a palm print, the iris, the shape of a blood vessel (including the shape of a vein and the shape of an artery), a face, or the like can be performed using the image sensor.

For example, an image of the periphery, surface, or inside (e.g., fundus) of an eye of a user of a wearable device can be captured using the image sensor. Therefore, the wearable device can have a function of detecting one or more selected from blinking, movement of an iris, and movement of an eyelid of the user.

The light-receiving device can be used for a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect the approach or contact of an object (e.g., a finger, a hand, or a pen).

The touch sensor can detect an object when the display device and the object come in direct contact with each other. The near touch sensor can detect an object even when the object is not in contact with the display device. For example, the display device is preferably capable of detecting an object when the distance between the display device and the object is greater than or equal to 0.1 mm and less than or equal to 300 mm, preferably greater than or equal to 3 mm and less than or equal to 50 mm. With this structure, the display device can be operated without direct contact of an object. In other words, the display device can be operated in a contactless (touchless) manner. With the above structure, the display device can have a reduced risk of being dirty or damaged, or can be operated without the object directly touching a dirt (e.g., dust or a virus) attached to the display device.

The refresh rate can be variable in the display device of one embodiment of the present invention. For example, the refresh rate is adjusted (adjusted in the range from 1 Hz to 240 Hz, for example) in accordance with contents displayed on the display device, whereby power consumption can be reduced. The driving frequency of the touch sensor or the near touch sensor may be changed in accordance with the refresh rate. For example, when the refresh rate of the display device is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

Figure 36C:
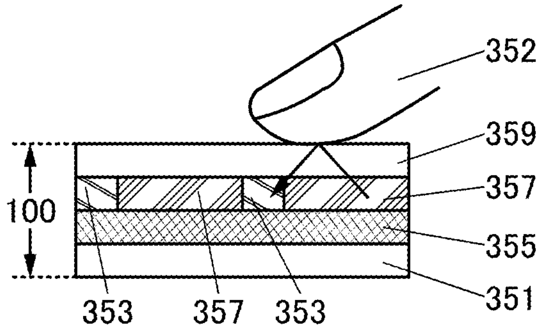
FIG. 36C to FIG. 36E are diagrams illustrating structure examples of a display device.
Figure 36D:
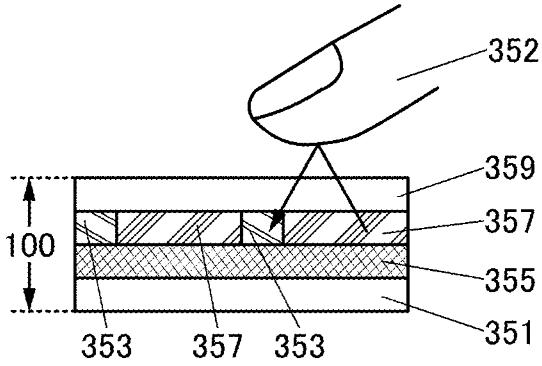
Figure 36E:
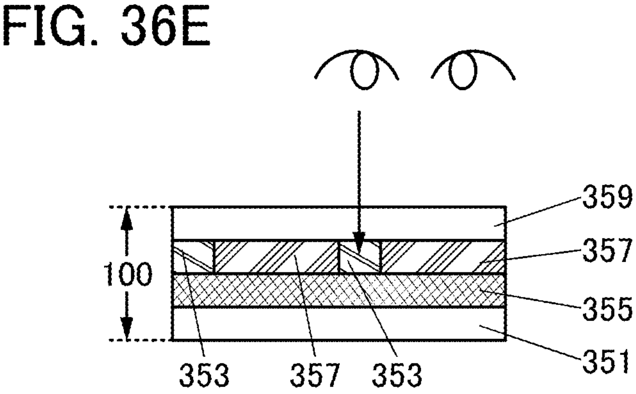

The display device 100 illustrated in FIG. 36C to FIG. 36E includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure including neither a switch nor a transistor may be employed.

For example, after light emitted by the light-emitting device in the layer 357 including the light-emitting device is reflected by a finger 352 in contact with the display device 100 as illustrated in FIG. 36C, the light-receiving device in the layer 353 including the light-receiving device detects the reflected light. Thus, the contact of the finger 352 with the display device 100 can be detected.

The display device may have a function of detecting an object that is approaching (i.e., that is not in contact with) the display device as illustrated in FIG. 36D and FIG. 36E or capturing an image of such an object. FIG. 36D illustrates an example in which a human finger is detected, and FIG. 36E illustrates an example in which information on the periphery, surface, or inside of the human eye (e.g., the number of blinks, movement of an eyeball, and movement of an eyelid) is detected.

This embodiment can be combined with any of the other embodiments as appropriate.

Embodiment 7

In this embodiment, electronic devices of one embodiment of the present invention will be described with reference to FIG. 37 to FIG. 39.

Electronic devices in this embodiment each include the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can have high resolution, and thus can be suitably used for an electronic device including a relatively small display portion. Examples of such an electronic device include watch-type and bracelet-type information terminals (wearable devices) and wearable devices capable of being worn on a head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. The pixel density (resolution) of the display device of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. By using the display device having one or both of such high definition and high resolution, the electronic device can have more improved realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device capable of being worn on a head are described with reference to FIG. 37A to FIG. 37D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables a user to feel a higher sense of immersion.

Figure 37A:
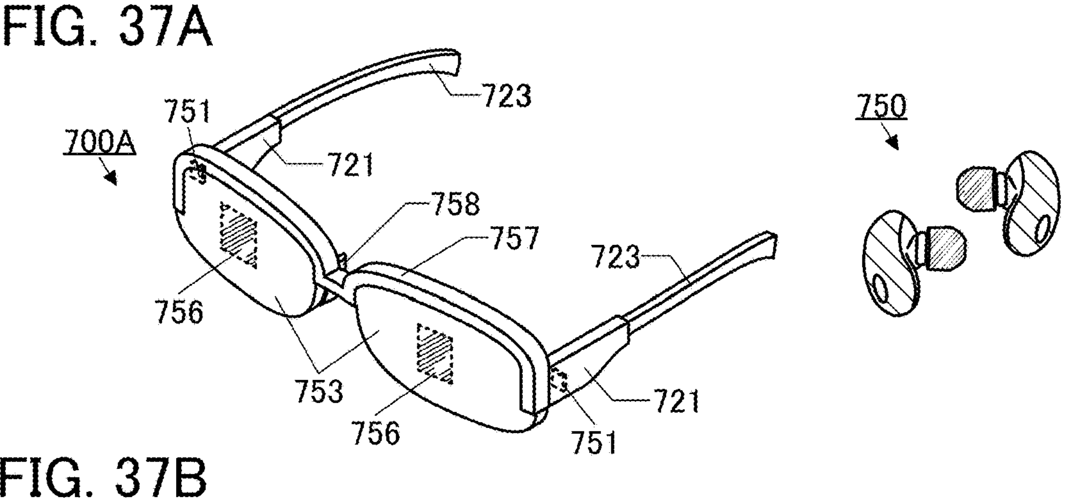
FIG. 37A to FIG. 37D are diagrams illustrating examples of electronic devices.
Figure 37B:
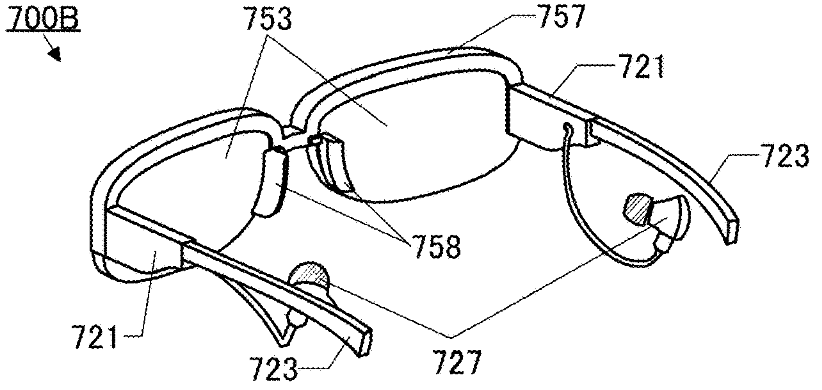

An electronic device 700A illustrated in FIG. 37A and an electronic device 700B illustrated in FIG. 37B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic device can perform display with extremely high resolution.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In each of the electronic device 700A and the electronic device 700B, a camera capable of capturing images of the front side may be provided as the image capturing portion. Furthermore, when the electronic device 700A and the electronic device 700B are each provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Note that instead of the wireless communication device or in addition to the wireless communication device, a connector to which a cable for supplying a video signal and a power supply potential can be connected may be provided.

The electronic device 700A and the electronic device 700B are each provided with a battery so that they can be charged wirelessly and/or by wire.

A touch sensor module may be provided in the housing 721. The touch sensor module has a function of detecting touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be used for the touch sensor module. For example, any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

Figure 37C:
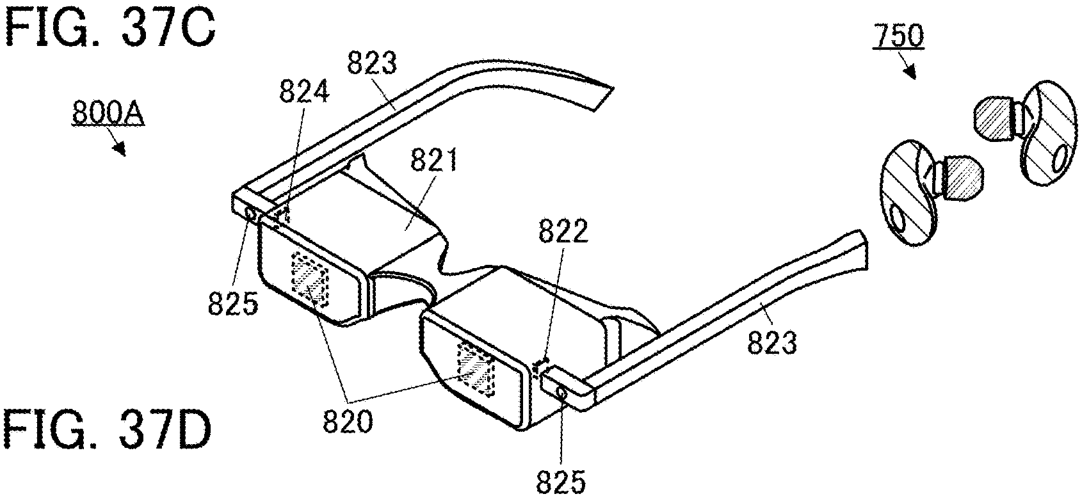
Figure 37D:
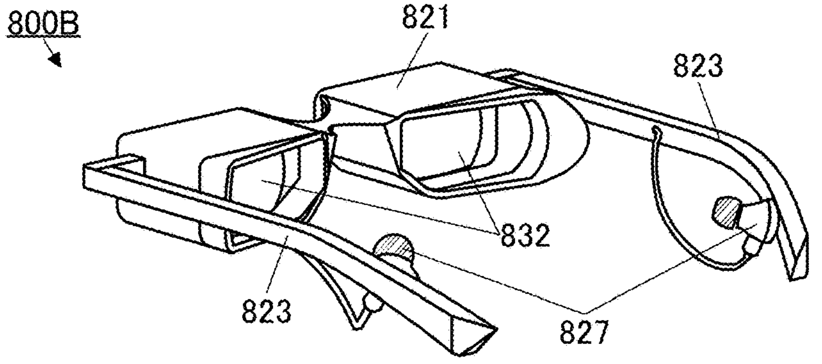

An electronic device 800A illustrated in FIG. 37C and an electronic device 800B illustrated in FIG. 37D each include a pair of display portions 820, a housing 821, a communication portion 822, a pair of wearing portions 823, a control portion 824, a pair of image capturing portions 825, and a pair of lenses 832.

The display device of one embodiment of the present invention can be used for the display portions 820. Thus, the electronic device can perform display with extremely high resolution. This enables a user to feel high sense of immersion.

The display portions 820 are provided at a position inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B each preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B each preferably include a mechanism for adjusting focus by changing the distance between the lenses 832 and the display portions 820.

The electronic device 800A or the electronic device 800B can be worn on the user's head with the wearing portions 823. FIG. 37C and the like illustrate examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be employed for any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 37A has a function of transmitting information to the earphones 750 with the wireless communication function. As another example, the electronic device 800A illustrated in FIG. 37C has a function of transmitting information to the earphones 750 with the wireless communication function.

The electronic device may include an earphone portion. The electronic device 700B illustrated in FIG. 37B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 37D includes earphone portions 827. For example, the earphone portion 827 and the control portion 824 can be connected to each other by wire. Part of a wiring that connects the earphone portion 827 and the control portion 824 may be positioned inside the housing 821 or the wearing portion 823. The earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 38A:
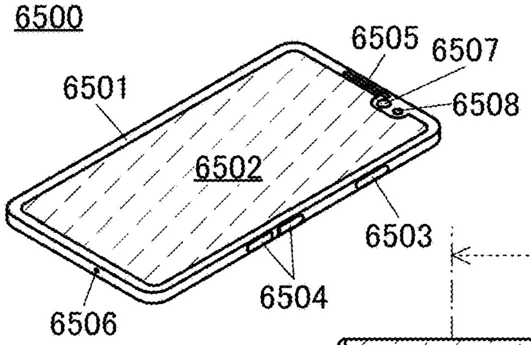
FIG. 38A to FIG. 38F are diagrams illustrating examples of electronic devices.

An electronic device 6500 illustrated in FIG. 38A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502.

Figure 38B:
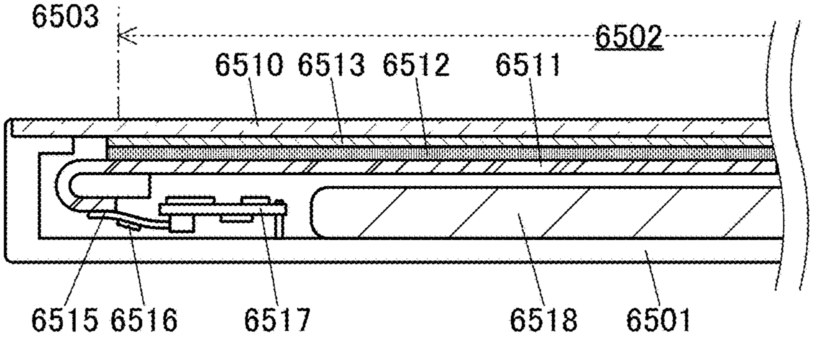

FIG. 38B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are placed in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

Figure 38C:
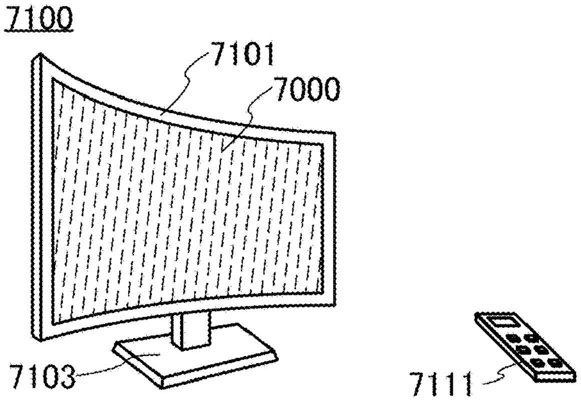

A flexible display of one embodiment of the present invention can be used as the display panel 6511. Thus, an extremely lightweight electronic device can be obtained. Since the display panel 6511 is extremely thin, the battery 6518 with high capacity can be mounted while an increase in thickness of the electronic device is suppressed. Moreover, part of the display panel 6511 is folded back so that a connection portion with the FPC 6515 is provided on the back side of the pixel portion, whereby an electronic device with a narrow bezel can be obtained. FIG. 38C illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 38C can be performed with an operation switch provided in the housing 7101 and a separate remote control 7111. Alternatively, the display portion 7000 may include a touch sensor, and the television device 7100 may be operated by touch on the display portion 7000 with a finger or the like. The remote control 7111 may include a display portion for displaying information output from the remote control 7111.

With operation keys or a touch panel provided in the remote control 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) information communication can be performed.

Figure 38D:
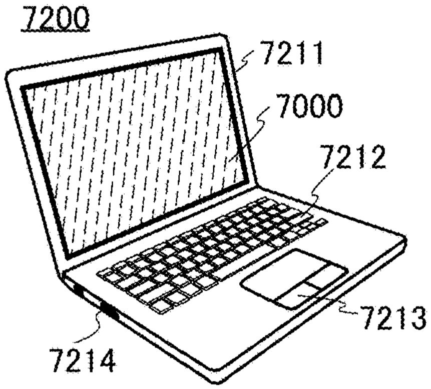

FIG. 38D illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 38E:
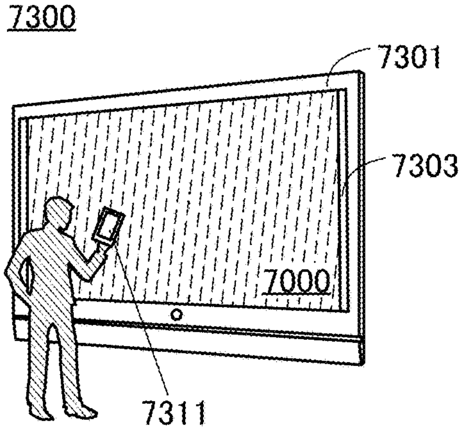
Figure 38F:
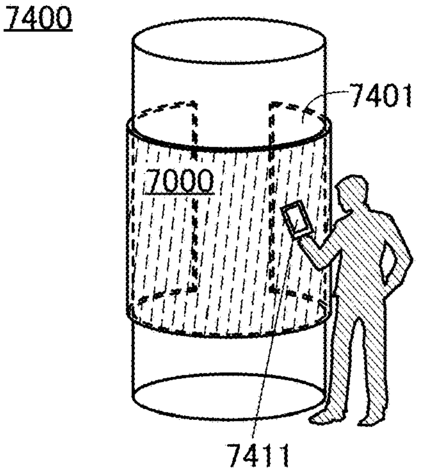

FIG. 38E and FIG. 38F illustrate examples of digital signage.

Digital signage 7300 illustrated in FIG. 38E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 38F is digital signage 7400 attached to a cylindrical pillar 7401. The digital signage 7400 includes the display portion 7000 provided along a curved surface of the pillar 7401.

The display device of one embodiment of the present invention can be used for the display portion 7000 in each of FIG. 38E and FIG. 38F.

A larger area of the display portion 7000 can increase the amount of information that can be provided at a time. The larger the display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIG. 38E and FIG. 38F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operating the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 39A to FIG. 39G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 39A to FIG. 39G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image and storing the taken image in a storage medium (an external storage medium or a storage medium incorporated in the camera), a function of displaying the taken image on the display portion, or the like.

The electronic devices illustrated in FIG. 39A to FIG. 39G are described in detail below.

Figure 39A:
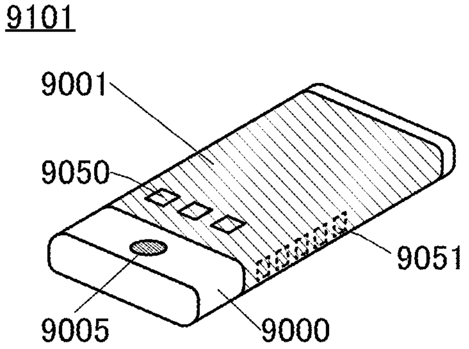
FIG. 39A to FIG. 39G are diagrams illustrating examples of electronic devices.

FIG. 39A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 39A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 39B:
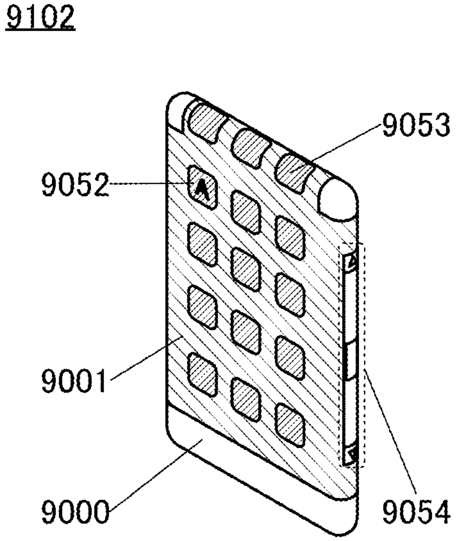

FIG. 39B is a perspective view illustrating a portable information terminal 9102. The portable information terminal 9102 has a function of displaying information on three or more surfaces of the display portion 9001. Shown here is an example in which information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 39C:
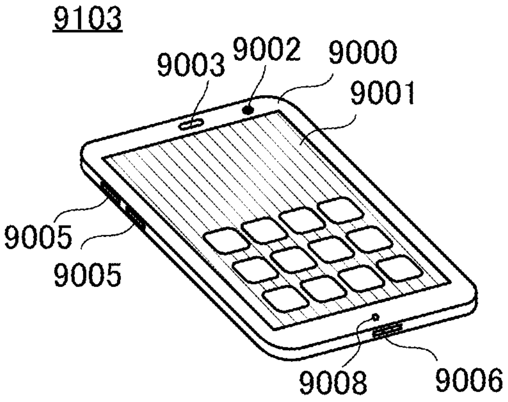

FIG. 39C is a perspective view illustrating a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 39D:
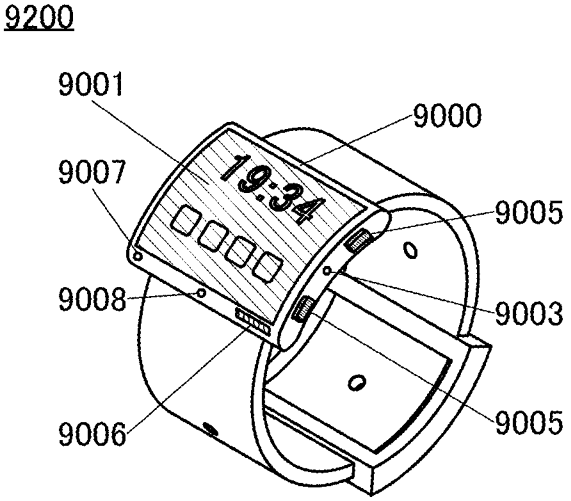

FIG. 39D is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 39E:
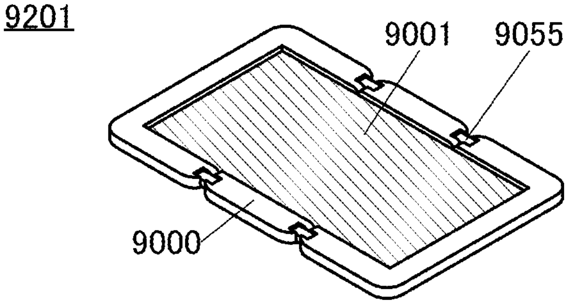
Figure 39F:
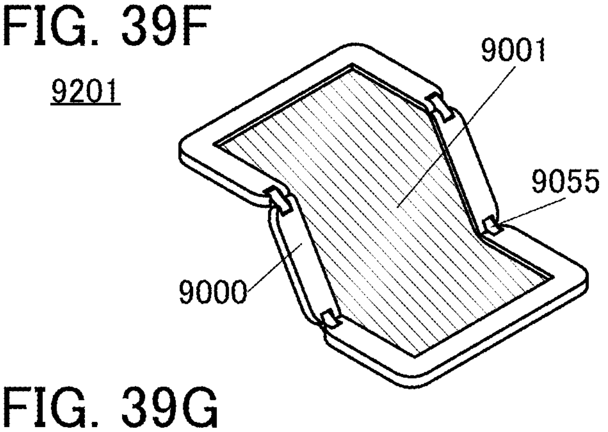
Figure 39G:
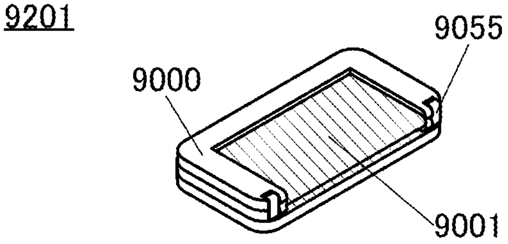

FIG. 39E to FIG. 39G are perspective views illustrating a foldable portable information terminal 9201. FIG. 39E is a perspective view of an opened state of the portable information terminal 9201, FIG. 39G is a perspective view of a folded state thereof, and FIG. 39F is a perspective view of a state in the middle of change from one of FIG. 39E and FIG. 39G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

Example 1

In this example, the etching rate of an aluminum oxide film in wet etching was evaluated.

First, an aluminum oxide film was formed over a substrate by an ALD method.

Next, the aluminum oxide film was subjected to wet etching by a puddle method using a development apparatus. An etchant used in etching was an alkaline developer of TMAH with a concentration of 2.38%.

The reaction in the wet etching can be represented by the following reaction formula.

$$Al_2O_3 + 2(TMA)(OH) + 3H_2O \rightarrow 2(TMA)[Al(OH)_4]$$

The wet etching was performed in the following manner: the developer was discharged on the substrate; the aluminum oxide film was etched while the developer was maintained by the surface tension; washing with carbonated water was performed; and drying was performed. In this example, two conditions of dividing treatment and sequential treatment were employed.

In the dividing treatment, a series of steps from discharging of the developer to drying was repeated three times. The developer was maintained for 40 seconds in a step; the total etching time in three steps was 120 seconds. The dividing treatment method can be referred to as a step puddle method.

In the sequential treatment, a series of steps from discharging of the developer to drying was performed only once. The developer was maintained for 120 seconds.

Figure 40:
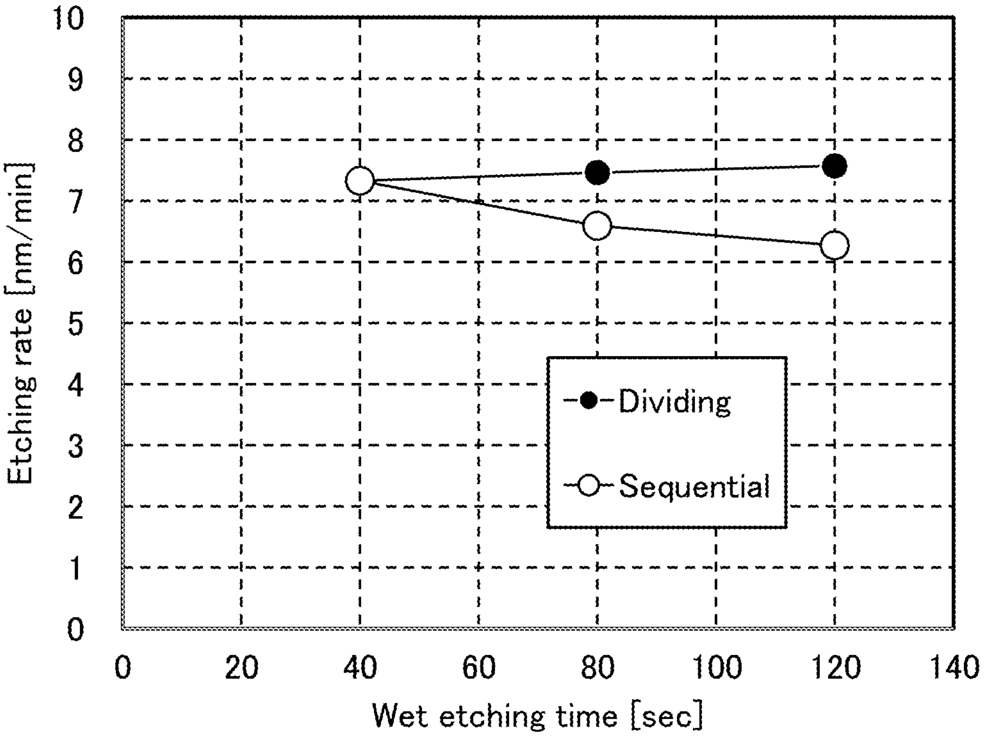
FIG. 40 is a graph showing results in Example 1.

FIG. 40 shows the etching rates of the aluminum oxide film in the dividing treatment and the sequential treatment. In FIG. 40, the etching rate in the dividing treatment and the etching rate in the sequential treatment at a wet etching time of 40 sec are shown to overlap with each other.

The etching rate in the sequential treatment was found to decrease with a longer treatment time. By contrast, in the dividing treatment, the amount of change in the etching rate was smaller than that in the sequential treatment. This is probably because the 40-second etching is repeated three times in the dividing treatment and a new developer is supplied every time, which makes the etching rate stable.

Example 2

In this example, results of image display by a manufactured display device of one embodiment of the present invention will be described.

The display device manufactured in this example is a top-emission OLED display employing the cross-sectional structure illustrated in FIG. 1B. A display region has a diagonal size of approximately 1.50 inches and a resolution of 3207 ppi. The frame frequency is 120 Hz. S-stripe arrangement is employed for a pixel (see FIG. 22A). A gate driver is incorporated in the display device and a source driver is externally attached.

The display device manufactured in this example was manufactured by the method for manufacturing a display device described in Embodiment 2. That is, the display device manufactured in this example includes a light-emitting device with the MML (metal maskless) structure.

An OS transistor was used in the layer 101 including transistors. For the mask layers 118*a*, 118*b*, and 118*c*, an aluminum oxide film was used. For the mask layers 119*a*, 119*b*, and 119*c*, a tungsten film was used and removed before formation of the insulating film 125A so as not to remain in the completed display device.

As the insulating film 125A, an aluminum oxide film was formed by an ALD method at a substrate temperature of 100° C. to a thickness of approximately 15 nm (FIG. 16A).

As the insulating film 127*a*, a positive photosensitive resin composite containing an acrylic resin was applied to a thickness of approximately 400 nm (FIG. 16B). The pre-baking temperature was 90° C.

As described in Embodiment 2, first, light exposure and development were performed on the insulating film 127*a* in the connection portion 140 (FIG. 16C and FIG. 17A), and the insulating film 125A was processed by wet etching (FIG. 17B).

In this example, two kinds of display devices were manufactured: a display device in which the insulating film 125A was etched by sequential treatment, and a display device in which the insulating film 125A was etched by dividing treatment. For details of the sequential treatment and the dividing treatment, Example 1 can be referred to.

After that, light exposure and development were performed on the insulating layer 127*b* in a display portion (FIG. 17C and FIG. 18A), and the insulating layer 125B was processed by wet etching (FIG. 18B). The post-baking (FIG. 19A) temperature was 100° C. Etching after the post-baking was also performed by wet etching (FIG. 19B).

Figure 41A:
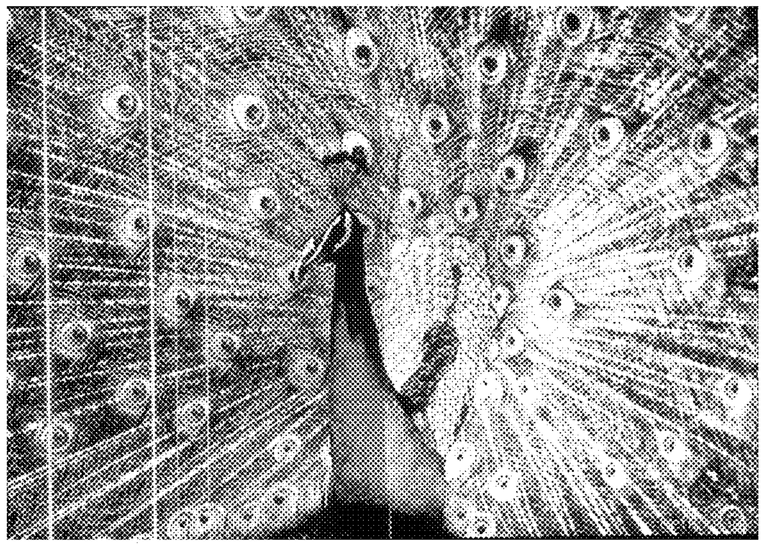
FIG. 41A to FIG. 41D are photographs of light emission of a display device in Example 2.
Figure 41B:
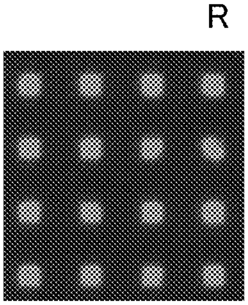
Figure 41C:
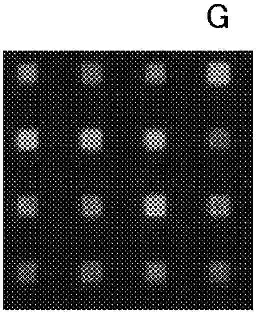
Figure 41D:
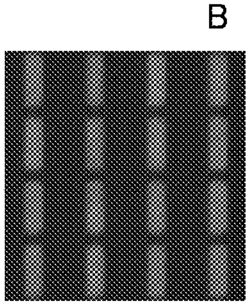

FIG. 41A is a photograph showing display results of the display device manufactured by etching the insulating film 125A by the sequential treatment. As shown in FIG. 41A, favorable display was achieved. In addition, full-white display was performed at an extremely high luminance of 5450 $cd/m^2$ in a bright region. The manufactured display device achieved an extremely high aperture ratio of 47.4%. FIG. 41B is an optical micrograph of the subpixel R that is emitting red light; FIG. 41C is an optical micrograph of the subpixel G that is emitting green light; and FIG. 41D is an optical micrograph of the subpixel B that is emitting blue light. As shown in FIG. 41B to FIG. 41D, favorable light emission was observed in the subpixels of all colors.

Figure 42A:
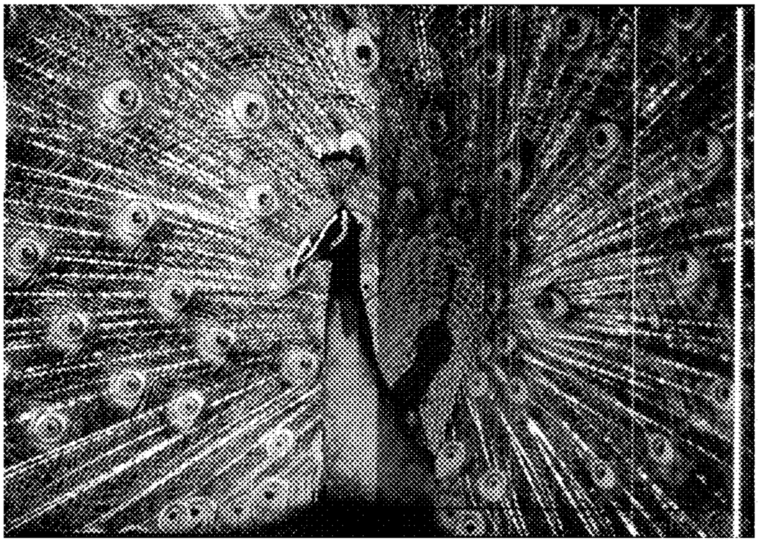
FIG. 42A to FIG. 42D are photographs of light emission of a display device in Example 2.
Figure 42B:
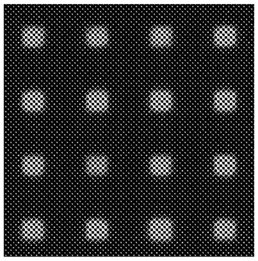
Figure 42C:
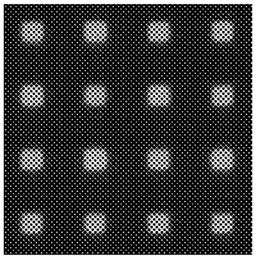
Figure 42D:
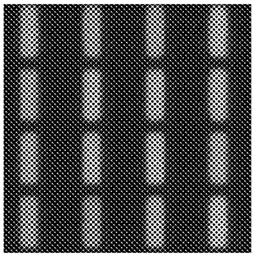

FIG. 42A is a photograph showing display results of the display device manufactured by etching the insulating film 125A by the dividing treatment. As shown in FIG. 42A, favorable display was achieved. In addition, full-white display was performed at an extremely high luminance of 5500 cd/$m^2$ in a bright region. The manufactured display device achieved an extremely high aperture ratio of 47.0%. FIG. 42B is an optical micrograph of the subpixel R that is emitting red light; FIG. 42C is an optical micrograph of the subpixel G that is emitting green light; and FIG. 42D is an optical micrograph of the subpixel B that is emitting blue light. As shown in FIG. 42B to FIG. 42D, uniform light emission was observed in the subpixels of all colors.

In the display device shown in FIG. 41A to FIG. 41D, which was manufactured by etching the insulating film 125A by the sequential treatment, an island-shaped EL layer including a red-light-emitting layer was formed first (which corresponds to the first layer 113*a*); then, an island-shaped EL layer including a green-light-emitting layer was formed (which corresponds to the second layer 113*b*); lastly, an island-shaped EL layer including a blue-light-emitting layer was formed (which corresponds to the third layer 113*c*). In the display device shown in FIG. 42A to FIG. 42D, which was manufactured by etching the insulating film 125A by the dividing treatment, an island-shaped EL layer including a blue-light-emitting layer was formed first (which corresponds to the first layer 113*a*); then, an island-shaped EL layer including a green-light-emitting layer was formed (which corresponds to the second layer 113*b*); lastly, an island-shaped EL layer including a red-light-emitting layer was formed (which corresponds to the third layer 113*c*). In this example, as shown in FIG. 41 and FIG. 42, the display device capable of displaying an image on the entire surface was able to be manufactured regardless of the formation order of an island-shaped EL layer of each color.

In manufacturing of the display device in this example, light exposure and development of the insulating film 127*a* in the connection portion 140 were performed separately from light exposure and development of the insulating layer 127*b* in the display portion. This allows the etching conditions of the insulating film 125A in the connection portion 140 to be controlled independently from those in the display portion, thereby inhibiting both excess etching of the insulating film 125A in the display portion and insufficient etching of the insulating film 125A in the connection portion 140, so that the insulating film 125A can be processed into a desired shape. As a result, the display device that has reduced luminance variations in pixels, high luminance, high resolution, and a high aperture ratio was able to be manufactured.

Example 3

In this example, results of image display by a manufactured display device of one embodiment of the present invention will be described.

The display device manufactured in this example is a top-emission OLED display employing the cross-sectional structure illustrated in FIG. 1B. A display region has a diagonal size of approximately 1.50 inches and a resolution of 3207 ppi. The number of pixels is 3840 (H)×2880 (V), and the pitch of pixels is 7.92 μm×7.92 μm. The frame frequency is 120 Hz. S-stripe arrangement is employed for a pixel (see FIG. 22A). A gate driver is incorporated in the display device and a source driver is externally attached.

Figure 43:
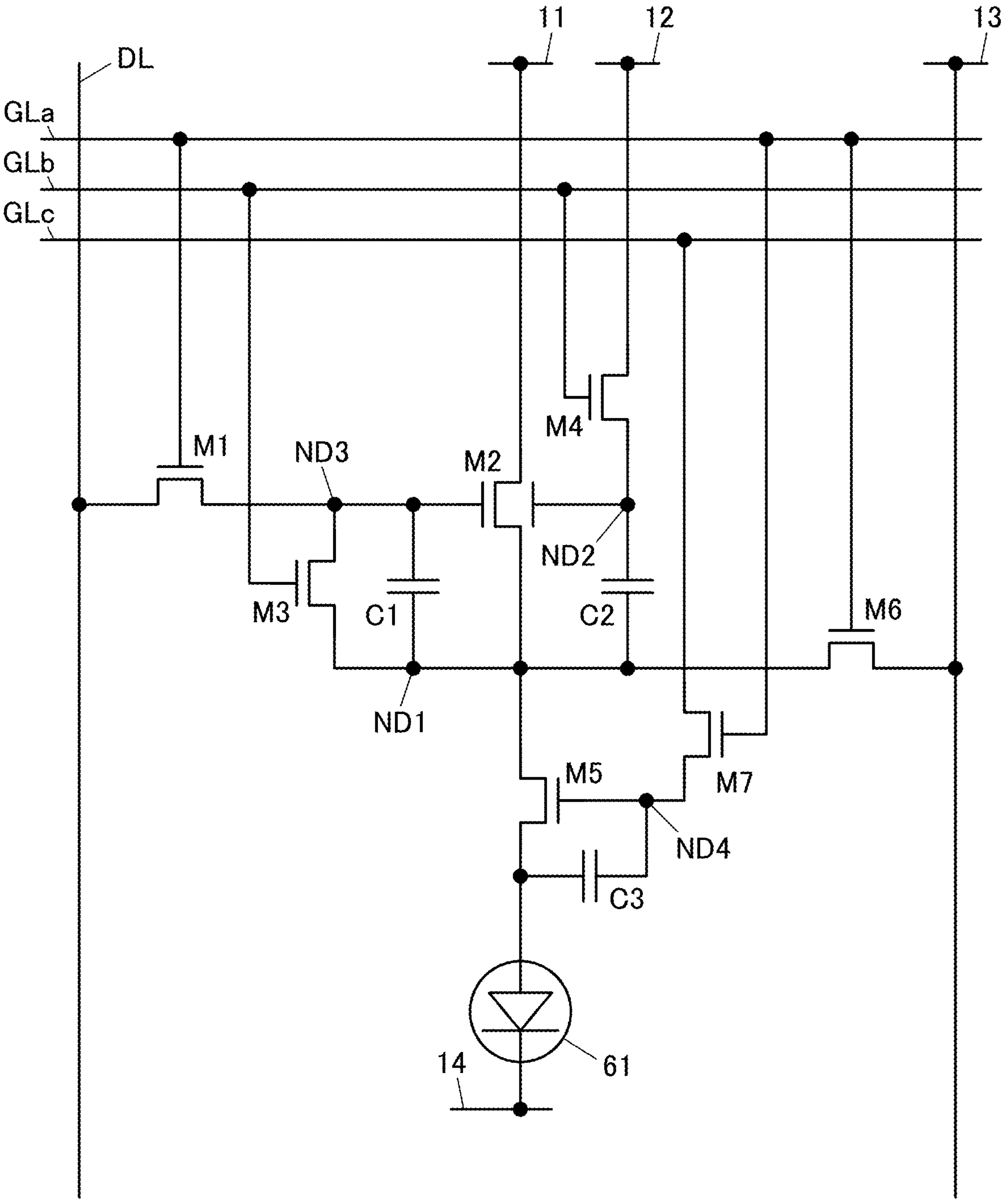
FIG. 43 is a circuit diagram of a pixel circuit of a display device in Example 3.

FIG. 43 shows a pixel circuit in the display device in this example.

The pixel circuit shown in FIG. 43 includes a light-emitting device 61, a transistor M1 to a transistor M7, and a capacitor C1 to a capacitor C3.

The transistor M1 to the transistor M7 are enhancement (normally-off) n-channel field-effect transistors. In this example, OS transistors were used as the transistor M1 to the transistor M7. In this example, an OS transistor with a channel length of 200 nm and a channel width of 130 nm was used. The OS transistor, which has favorable transistor characteristics even when having a short channel length, is suitable for a display device having a small pixel size as the display device in this example. In addition, the OS transistor has an extremely low off-state current even when having a short channel length, which can considerably reduce light leakage that might occur in black display, resulting in a reduction in the power consumption of the display device. Furthermore, the OS transistor has a high withstand voltage, enabling application of a high voltage between a source and a drain thereof, so that the amount of current flowing through the light-emitting device can be increased and the emission luminance of the light-emitting device can be increased. Specifically, in the display device in this example, the power supply voltage can be higher than or equal to 10 V.

A gate of the transistor M1 is electrically connected to a wiring GLa, one of a source and a drain of the transistor M1 is electrically connected to a wiring DL, and the other of the source and the drain of the transistor M1 is electrically connected to a gate of the transistor M2. The transistor M1 has a function of selecting whether to establish electrical continuity between the gate of the transistor M2 and the wiring DL.

The gate of the transistor M2 is electrically connected to one terminal of the capacitor C1, one of a source and a drain of the transistor M2 is electrically connected to a wiring 11, and the other of the source and the drain of the transistor M2 is electrically connected to the other terminal of the capacitor C1. The transistor M2 has a back gate. The back gate of the transistor M2 is electrically connected to one terminal of the capacitor C2. The other terminal of the capacitor C2 is electrically connected to the other of the source and the drain of the transistor M2.

A gate of the transistor M3 is electrically connected to a wiring GLb, one of a source and a drain of the transistor M3 is electrically connected to the one terminal of the capacitor C1, and the other of the source and the drain of the transistor M3 is electrically connected to the other terminal of the capacitor C1. The transistor M3 has a function of selecting whether to establish electrical continuity between the gate and the source of the transistor M2.

A gate of the transistor M4 is electrically connected to the wiring GLb, one of a source and a drain of the transistor M4 is electrically connected to a wiring 12, and the other of the source and the drain of the transistor M4 is electrically connected to the one terminal of the capacitor C2. The transistor M4 has a function of selecting whether to establish electrical continuity between the wiring 12 and the one terminal of the capacitor C2.

A gate of the transistor M5 is electrically connected to one terminal of the capacitor C3, and one of a source and a drain of the transistor M5 is electrically connected to the other of the source and the drain of the transistor M2. The other of the source and the drain of the transistor M5 is electrically connected to the other terminal of the capacitor C3 and one terminal (e.g., an anode terminal) of the light-emitting device 61. The other terminal (e.g., a cathode terminal) of the light-emitting device 61 is electrically connected to a wiring 14.

A gate of the transistor M6 is electrically connected to the wiring GLa, one of a source and a drain of the transistor M6 is electrically connected to the other of the source and the drain of the transistor M2, and the other of the source and the drain of the transistor M6 is electrically connected to a wiring 13. The transistor M6 has a function of selecting whether to establish electrical continuity between the other of the source and the drain of the transistor M2 and the wiring 13.

A gate of the transistor M7 is electrically connected to the wiring GLa, one of a source and a drain of the transistor M7 is electrically connected to a wiring GLc, and the other of the source and the drain of the transistor M7 is electrically connected to the gate of the transistor M5. The transistor M7 has a function of selecting whether to establish electrical continuity between the gate of the transistor M5 and the wiring GLc.

A region where the other terminals of the capacitor C1 and the capacitor C2, the other of the source and the drain of the transistor M2, the other of the source and the drain of the transistor M3, the one of the source and the drain of the transistor M5, and the one of the source and the drain of the transistor M6 are electrically connected to one another is also referred to as a node ND1.

A region where the one terminal of the capacitor C2, the back gate of the transistor M2, and the other of the source and the drain of the transistor M4 are electrically connected to one another is also referred to as a node ND2.

A region where the other of the source and the drain of the transistor M1, the one of the source and the drain of the transistor M3, the one terminal of the capacitor C1, and the gate of the transistor M2 are electrically connected to one another is also referred to as a node ND3.

A region where the gate of the transistor M5, the one terminal of the capacitor C3, and the other of the source and the drain of the transistor M7 are electrically connected to one another is also referred to as a node ND4.

The capacitor C1 has a function of retaining a potential difference between the other of the source and the drain of the transistor M2 and the gate of the transistor M2 at the time when the node ND3 is in a floating state. The capacitor C2 has a function of retaining a potential difference between the other of the source and the drain of the transistor M2 and the back gate of the transistor M2 at the time when the node ND2 is in a floating state. The capacitor C3 has a function of retaining a potential difference between the other of the source and the drain of the transistor M5 and the gate of the transistor M5 at the time when the node ND4 is in a floating state.

Note that the transistor M2 has a function of controlling the amount of current flowing through the light-emitting device 61. That is, the transistor M2 has a function of controlling the amount of light emitted from the light-emitting device 61.

The transistor M5 has a function of switching electrical continuity and discontinuity between the transistor M2 and the light-emitting device 61. The light-emitting device 61 does not emit light when the transistor M5 is in the off state, and the light-emitting device 61 can emit light when the transistor M5 is in the on state.

The display device manufactured in this example was manufactured by the method for manufacturing a display device described in Embodiment 2. That is, the display device manufactured in this example includes a light-emitting device with the MML (metal maskless) structure.

For the mask layers 118*a*, 118*b*, and 118*c*, an aluminum oxide film was used. For the mask layers 119*a*, 119*b*, and 119*c*, a tungsten film was used and removed before formation of the insulating film 125A so as not to remain in the completed display device.

As the insulating film 125A, an aluminum oxide film was formed by an ALD method at a substrate temperature of 100° C. to a thickness of approximately 30 nm (FIG. 16A).

As the insulating film 127*a*, a positive photosensitive resin composite containing an acrylic resin was applied to a thickness of approximately 400 nm (FIG. 16B). The pre-baking temperature was 90° C.

As described in Embodiment 2, first, light exposure and development were performed on the insulating film 127*a* in the connection portion 140 (FIG. 16C and FIG. 17A), and the insulating film 125A was processed by wet etching (FIG. 17B).

In this example, the insulating film 125A was etched by dividing treatment. For details of the dividing treatment, Example 1 can be referred to.

After that, light exposure and development were performed on the insulating layer 127*b* in a display portion (FIG. 17C and FIG. 18A), and the insulating layer 125B was processed by wet etching (FIG. 18B). The post-baking (FIG. 19A) temperature was 100° C. Etching after the post-baking was also performed by wet etching (FIG. 19B).

Figure 44A:
FIG. 44A and FIG. 44B photographs of light emission of a display device in Example 3.

FIG. 44A is a photograph showing display results of the display device in this example.

Figure 44B:
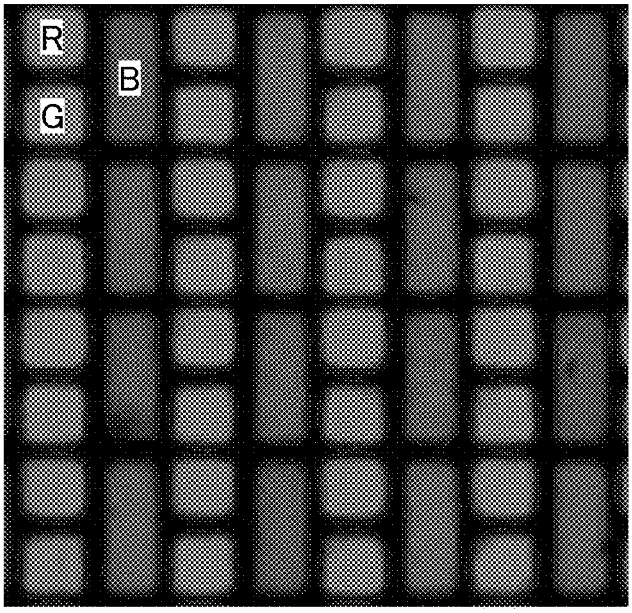

As shown in FIG. 44A, favorable display was achieved. In addition, full-white display was performed at an extremely high luminance of 5091 cd/$m^2$ in a bright region. The manufactured display device achieved an extremely high aperture ratio of 54.2%. FIG. 44B shows pixels that perform full-white display in the display device in this example. As shown in FIG. 44B, favorable light emission was observed in the subpixels of all colors.

In manufacturing of the display device in this example, light exposure and development of the insulating film 127*a* in the connection portion 140 were performed separately from light exposure and development of the insulating layer 127*b* in the display portion. This allows the etching conditions of the insulating film 125A in the connection portion 140 to be controlled independently from those in the display portion, thereby inhibiting both excess etching of the insulating film 125A in the display portion and insufficient etching of the insulating film 125A in the connection portion 140, so that the insulating film 125A can be processed into a desired shape. As a result, the display device that has reduced luminance variations in pixels, high luminance, high resolution, and a high aperture ratio was able to be manufactured.

Example 4

Described in this example are the results of evaluating the reliability of light-emitting devices that were fabricated and can be used for the display device of one embodiment of the present invention.

Specifically, in this example, evaluation light-emitting devices were fabricated over the same substrate as the display device manufactured in Example 2, and the reliability thereof was evaluated.

Figure 45:
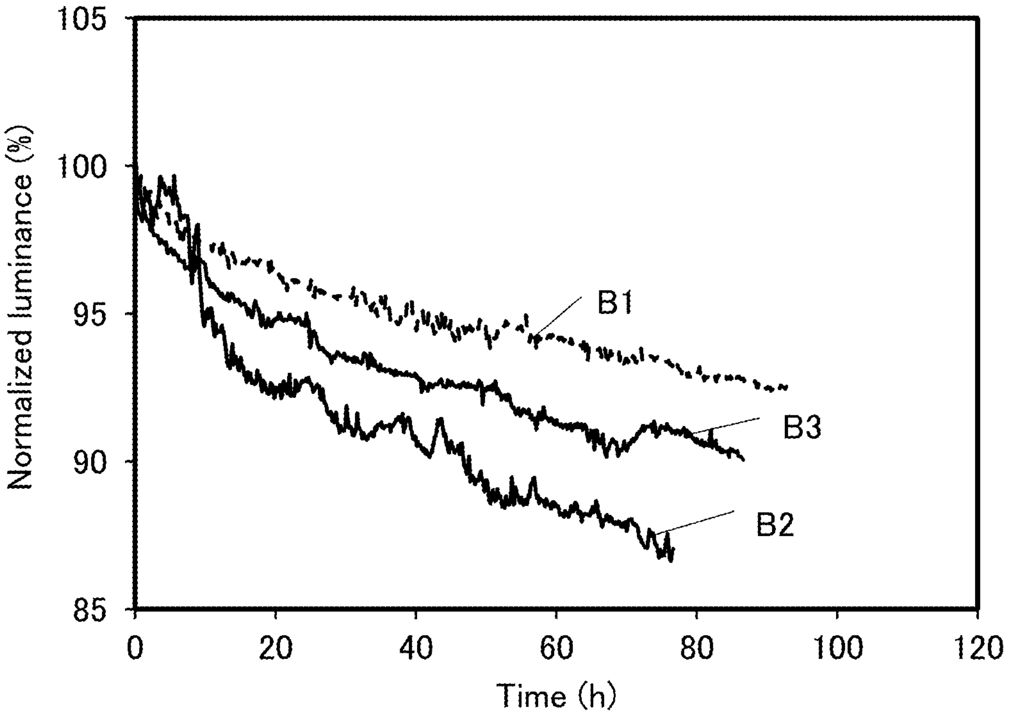
FIG. 45 is a graph showing reliability test results of light-emitting devices in Example 4.
Figure 46:
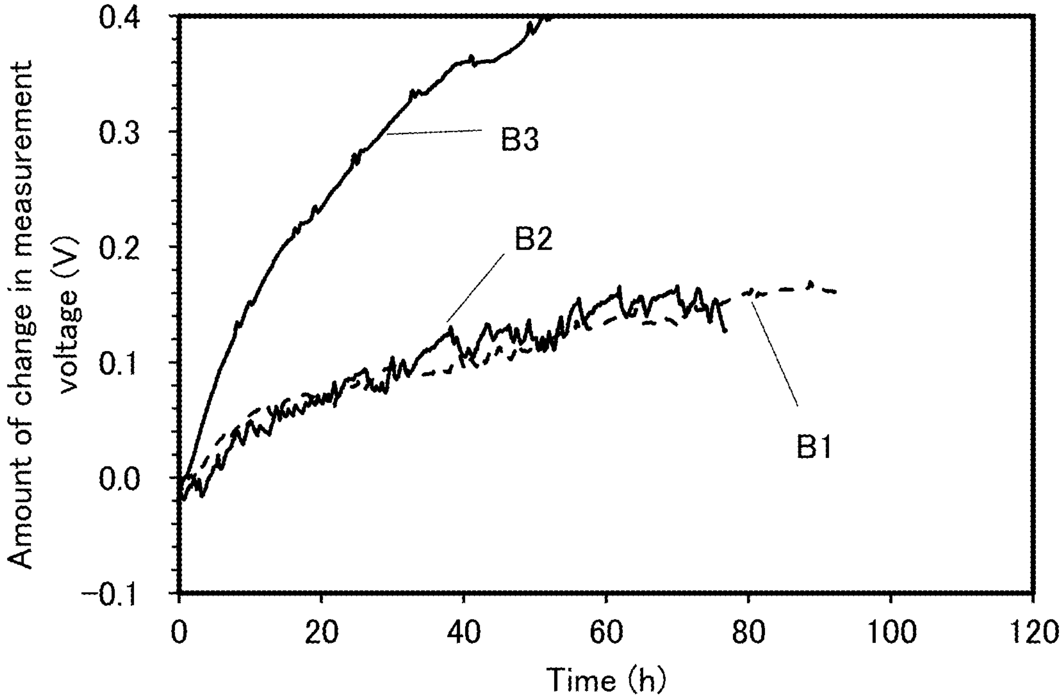
FIG. 46 is a graph showing reliability test results of light-emitting devices in Example 4.
Figure 47:
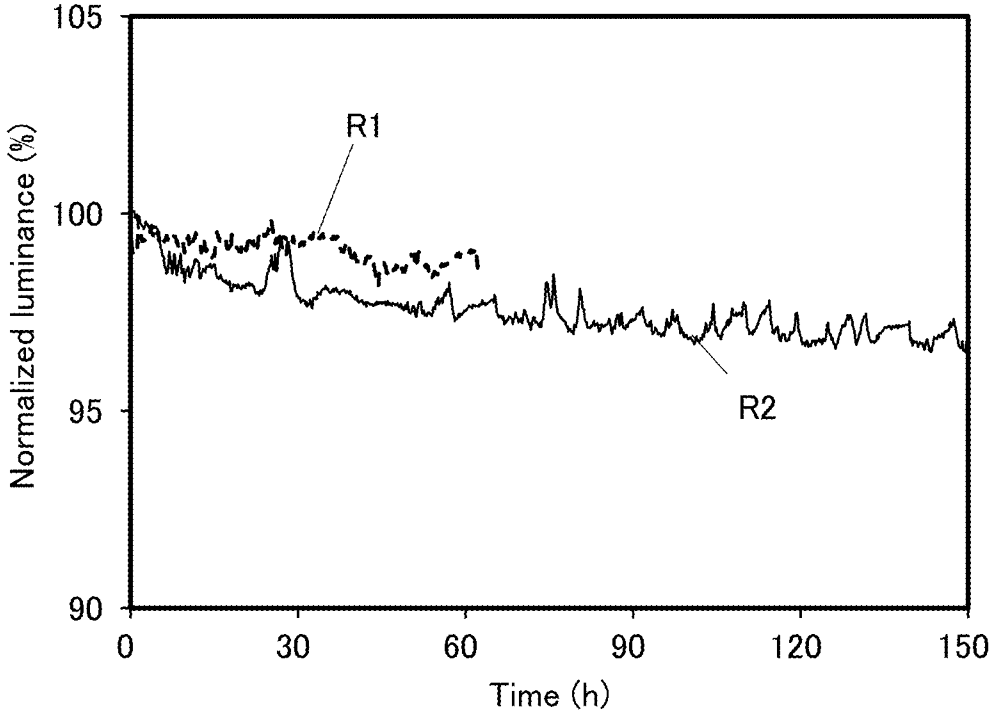
FIG. 47 is a graph showing reliability test results of light-emitting devices in Example 4.
Figure 48:
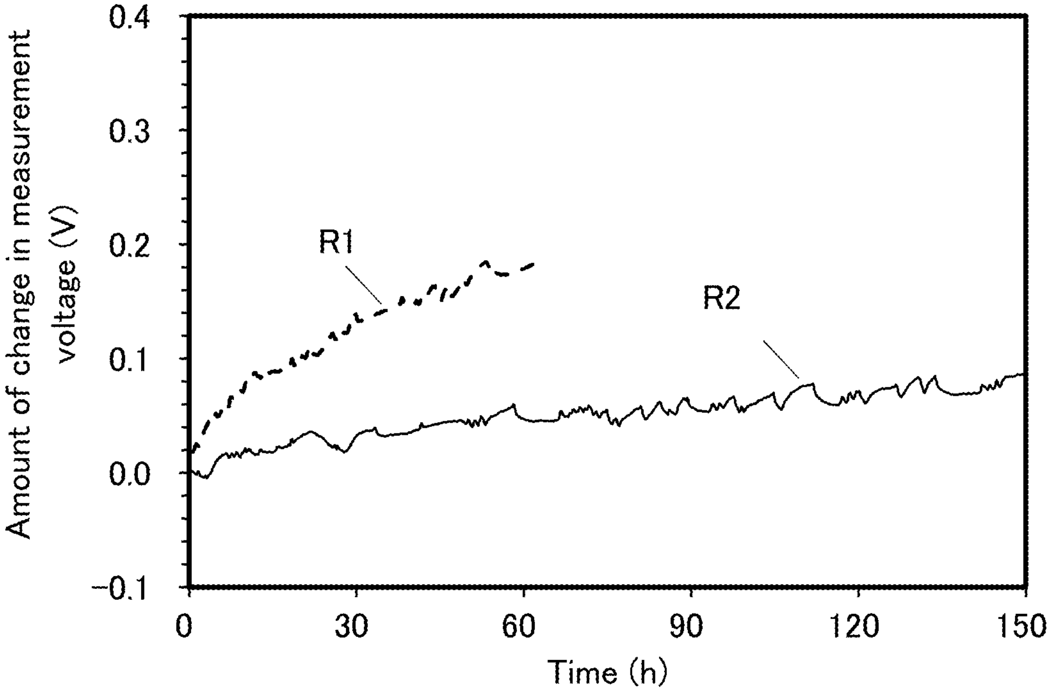
FIG. 48 is a graph showing reliability test results of light-emitting devices in Example 4.

FIG. 45 and FIG. 46 show reliability test results of light-emitting devices that emit blue light. FIG. 47 and FIG. 48 show reliability test results of light-emitting devices that emit red light. In FIG. 45 and FIG. 47, the vertical axis represents normalized luminance (%) with the initial luminance being 100%, and the horizontal axis represents driving time (h). In FIG. 46 and FIG. 48, the vertical axis represents the amount of change in measurement voltage (V) from the initial voltage (when the driving time is 0 hour), and the horizontal axis represents driving time (h). In the reliability test, the light-emitting devices were driven at room temperature at a current density of 50 $mA/cm^2$.

A light-emitting device B1 emitting blue light and a light-emitting device R1 emitting red light are evaluation light-emitting devices fabricated over the same substrate as the display device described with reference to FIG. 42A to FIG. 42D in Example 2. As described in Example 2, in the display device illustrated in FIG. 42A to FIG. 42D, island-shaped EL layers were formed in the order of blue, green, and red. The display device illustrated in FIG. 42A to FIG. 42D has an aperture ratio of 47.0% (the total aperture ratio of subpixels of three colors of red, green, and blue), a blue subpixel has an aperture ratio of 24.8%, and a red subpixel has an aperture ratio of 11.2%.

A light-emitting device B2 emitting blue light and a light-emitting device R2 emitting red light are evaluation light-emitting devices fabricated over the same substrate as the display device described with reference to FIG. 41A to FIG. 41D in Example 2. As described in Example 2, in the display device illustrated in FIG. 41A to FIG. 41D, island-shaped EL layers were formed in the order of red, green, and blue. The display device illustrated in FIG. 41A to FIG. 41D has an aperture ratio of 47.4%, a blue subpixel has an aperture ratio of 25.6%, and a red subpixel has an aperture ratio of 10.9%.

A light-emitting device B3 emitting blue light is an evaluation light-emitting device fabricated over the same substrate as the display device manufactured by forming island-shaped EL layers in the order of red, green, and blue. The display device has an aperture ratio of 57.9%, and a blue subpixel has an aperture ratio of 31.6%.

FIG. 45 shows that the light-emitting device B1 has the lowest luminance decay among the three light-emitting devices emitting blue light. FIG. 46 shows that the light-emitting device B1 has a small amount of change in voltage and is unlikely to increase in driving voltage. The results in FIG. 45 and FIG. 46 indicate that the reliability of a blue-light-emitting device can be increased by forming island-shaped EL layers in the order of blue, green, and red rather than by forming island-shaped EL layers in the order of red, green, and blue.

The comparison between the two red-light-emitting devices in FIG. 47 shows that the light-emitting device R1 has lower luminance decay than the light-emitting device R2. The comparison between the two red-light-emitting devices in FIG. 48 shows that the light-emitting device R2 has a smaller amount of change in voltage than the light-emitting device R1.

The results in FIG. 45 to FIG. 48 indicate that the luminance decay of each of a blue-light-emitting device and a red-light-emitting device can be decreased by forming island-shaped EL layers in the order of blue, green, and red rather than by forming island-shaped EL layers in the order of red, green, and blue.

REFERENCE NUMERALS

DL: wiring, GLa: wiring, GLb: wiring, GLc: wiring, 11: wiring, 12: wiring, 13: wiring, 14: wiring, 61: light-emitting device, 100A: display device, 100B: display device, 100C: display device, 100D: display device, 100E: display device, 100F: display device, 100G: display device, 100H: display device, 100J: display device, 100: display device, 101: layer, 103: region, 110*a*: subpixel, 110*b*: subpixel, 110*c*: subpixel, 110*d*: subpixel, 110*e*: subpixel, 110: pixel, 111*a*: pixel electrode, 111*b*: pixel electrode, 111*c*: pixel electrode, 111*d*: pixel electrode, 111: pixel electrode, 112*a*: conductive layer, 112*b*: conductive layer, 112*c*: conductive layer, 112*d*: conductive layer, 113_1: first region, 113_2: second region, 113*a*: first layer, 113A: film, 113*b*: second layer, 113B: film, 113*c*: third layer, 113C: film, 113*d*: fourth layer, 114: common layer, 115: common electrode, 116*a*: conductive layer, 116*b*: conductive layer, 116*c*: conductive layer, 116: conductive layer, 117: light-blocking layer, 118*a*: mask layer, 118A: mask film, 118*b*: mask layer, 118B: mask film, 118*c*: mask layer, 118C: mask film, 118*d*: mask layer, 119*a*: mask layer, 119A: mask film, 119*b*: mask layer, 119B: mask film, 119*c*: mask layer, 119C: mask film, 120: substrate, 121*a*: plasma, 121*b*: plasma, 121*c*: plasma, 122: resin layer, 123: conductive layer, 124*a*: pixel, 124*b*: pixel, 125A: insulating film, 125B: insulating layer, 125: insulating layer, 126*a*: conductive layer, 126*b*: conductive layer, 126*c*: conductive layer, 126*d*: conductive layer, 127*a*: insulating film, 127*b*: insulating layer, 127*c*: insulating layer, 127: insulating layer, 128: layer, 129*a*: conductive layer, 129*b*: conductive layer, 129*c*: conductive layer, 129*d*: conductive layer, 130*a*: light-emitting device, 130B: light-emitting device, 130*b*: light-emitting device, 130*c*: light-emitting device, 130G: light-emitting device, 130R: light-emitting device, 131: protective layer, 132*a*: mask, 132*b*: mask, 133: lens array, 140: connection portion, 142: adhesive layer, 150: light-receiving device, 151: substrate, 152: substrate, 153: insulating layer, 162: display portion, 164: circuit, 165: wiring, 166: conductive layer, 172: FPC, 173: IC, 190*a*: resist mask, 190*b*: resist mask, 190*c*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 700A: electronic device, 700B: electronic device, 721: housing, 723: wearing portion, 727: earphone portion, 750: earphone, 751: display panel, 753: optical member, 756: display region, 757: frame, 758: nose pad, 761: lower electrode, 762: upper electrode, 763*a*: EL layer, 763*b*: EL layer, 763: EL layer, 764: layer, 765: layer, 766: layer, 767: active layer, 768: layer, 771: light-emitting layer, 772: light-emitting layer, 773: light-emitting layer, 780: layer, 781: layer, 782: layer, 785: charge-generation layer, 790: layer, 791: layer, 792: layer, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A method for manufacturing a display device, comprising:

forming a first pixel electrode and a first conductive layer;

forming a first film over the first pixel electrode;

forming a first mask film over the first film and the first conductive layer;

processing the first film and the first mask film to form a first layer and a first mask layer over the first pixel electrode and a second mask layer over the first conductive layer;

forming a first insulating film over the first mask layer and the second mask layer;

forming a second insulating film over the first insulating film with use of a photosensitive resin composite;

performing light exposure and development on the second insulating film to expose a portion of the first insulating film that overlaps with the second mask layer;

performing first etching treatment using the second insulating film as a mask to remove the portion of the first insulating film that overlaps with the second mask layer and reduce a thickness of part of the second mask layer;

performing light exposure and development on the second insulating film to expose a portion of the first insulating film that overlaps with the first mask layer and form a second insulating layer covering an end portion of the first layer;

performing second etching treatment using the second insulating layer as a mask to remove the portion of the first insulating film that overlaps with the first mask layer, form a first insulating layer overlapping with the second insulating layer, and reduce a thickness of part of the first mask layer;

performing heat treatment and then performing third etching treatment using the second insulating layer as a mask to remove part of the first mask layer and expose a top surface of the first layer;

forming a common electrode to cover the first layer, the first conductive layer, and the second insulating layer; and removing part of the second mask layer by the second etching treatment or the third etching treatment to expose a top surface of the first conductive layer.

2. The method for manufacturing a display device, according to claim 1, wherein the first layer comprises at least a first light-emitting layer.

3. The method for manufacturing a display device, according to claim 2, wherein the first layer comprises a first functional layer over the first light-emitting layer, and wherein the first functional layer comprises at least one of a hole-injection layer, an electron-injection layer, a hole-transport layer, an electron-transport layer, a hole-blocking layer, and an electron-blocking layer.

4. The method for manufacturing a display device, according to claim 1, wherein an aluminum oxide film is formed by an ALD method as each of the first mask film and the first insulating film.

5. A method for manufacturing a display device, comprising:

forming a first pixel electrode, a second pixel electrode, and a first conductive layer;

forming a first film over the first pixel electrode and the second pixel electrode;

forming a first mask film over the first film and the first conductive layer;

processing the first film and the first mask film to form a first layer and a first mask layer over the first pixel electrode, form a second mask layer over the first conductive layer, and expose the second pixel electrode;

forming a second film over the first mask layer and the second pixel electrode;

forming a second mask film over the second film;

processing the second film and the second mask film to form a second layer and a third mask layer over the second pixel electrode and expose the first mask layer and the second mask layer;

forming a first insulating film over the first mask layer to the third mask layer;

forming a second insulating film over the first insulating film with use of a photosensitive resin composite;

performing light exposure and development on the second insulating film to expose a portion of the first insulating film that overlaps with the second mask layer;

performing first etching treatment using the second insulating film as a mask to remove the portion of the first insulating film that overlaps with the second mask layer and reduce a thickness of part of the second mask layer;

performing light exposure and development on the second insulating film to expose a portion of the first insulating film that overlaps with the first mask layer and a portion of the first insulating film that overlaps with the third mask layer, and form a second insulating layer overlapping with a region interposed between the first pixel electrode and the second pixel electrode;

performing second etching treatment using the second insulating layer as a mask to remove the portion of the first insulating film that overlaps with the first mask layer and the portion of the first insulating film that overlaps with the third mask layer, form a first insulating layer overlapping with the second insulating layer, and reduce a thickness of part of the first mask layer and part of the third mask layer;

performing heat treatment and then performing third etching treatment using the second insulating layer as a mask to remove part of the first mask layer and part of the third mask layer and expose a top surface of the first layer and a top surface of the second layer;

forming a common electrode to cover the first layer, the second layer, the first conductive layer, and the second insulating layer; and removing part of the second mask layer by the second etching treatment or the third etching treatment to expose a top surface of the first conductive layer.

6. The method for manufacturing a display device, according to claim 5, wherein the first layer comprises at least a first light-emitting layer.

7. The method for manufacturing a display device, according to claim 6, wherein the first layer comprises a first functional layer over the first light-emitting layer, and wherein the first functional layer comprises at least one of a hole-injection layer, an electron-injection layer, a hole-transport layer, an electron-transport layer, a hole-blocking layer, and an electron-blocking layer.

8. The method for manufacturing a display device, according to claim 5, wherein an aluminum oxide film is formed by an ALD method as each of the first mask film and the first insulating film.

9. A display device comprising:

a first light-emitting device;

a second light-emitting device;

a first lens;

a second lens;

a first insulating layer; and a second insulating layer, wherein the first light-emitting device comprises a first pixel electrode, a first light-emitting layer over the first pixel electrode, and a common electrode over the first light-emitting layer, wherein the second light-emitting device comprises a second pixel electrode, a second light-emitting layer over the second pixel electrode, and the common electrode over the second light-emitting layer, wherein the first lens overlaps with the first light-emitting device, wherein the second lens overlaps with the second light-emitting device, wherein the first insulating layer covers a side surface and part of a top surface of the first light-emitting layer and a side surface and part of a top surface of the second light-emitting layer, wherein the second insulating layer overlaps with the side surface and the part of the top surface of the first light-emitting layer and the side surface and the part of the top surface of the second light-emitting layer with the first insulating layer therebetween, wherein the common electrode covers the second insulating layer, and wherein in a cross-sectional view, an end portion of the second insulating layer has a tapered shape with a taper angle less than 90°.

10. The display device according to claim 9, wherein the second insulating layer covers at least part of a side surface of an end portion of the first insulating layer.

11. The display device according to claim 9, wherein the first light-emitting device comprises a first functional layer between the first light-emitting layer and the common electrode, and wherein the first functional layer comprises at least one of a hole-injection layer, an electron-injection layer, a hole-transport layer, an electron-transport layer, a hole-blocking layer, and an electron-blocking layer.

12. A display module comprising:

the display device according to claim 9; and at least one of a connector and an integrated circuit.

13. An electronic device comprising:

the display module according to claim 12; and at least one of a housing, a battery, a camera, a speaker, and a microphone.

* * * * *